United States Patent [19]

Hardin et al.

[11] Patent Number: 5,740,084
[45] Date of Patent: Apr. 14, 1998

[54] VERIFICATION OF HOMOMORPHISM BETWEEN TWO SYSTEM MODELS

[75] Inventors: Ronald H. Hardin, Pataskala, Ohio; Robert P. Kurshan, New York, N.Y.

[73] Assignee: Lucent Technologies Inc., Murray Hill, N.J.

[21] Appl. No.: 384,100

[22] Filed: Feb. 6, 1995

Related U.S. Application Data

[63] Continuation-in-part of Ser. No. 906,082, Jun. 29, 1992, Pat. No. 5,483,470.

[51] Int. Cl.⁶ .................................................. G06F 17/00
[52] U.S. Cl. .................................................. 364/578
[58] Field of Search .............................. 364/578, 514 R

[56] References Cited

U.S. PATENT DOCUMENTS 5,163,016  11/1992  Har'El et al. ........................ 364/578
5,483,470  1/1996   Alur et al. ........................... 364/578

*Primary Examiner*—Ellis B. Ramirez

[57] ABSTRACT

The invention concerns ascertaining whether the successful accomplishment of a defined task by a simpler model of a complex system implies that the complex system will also accomplish the defined task. The invention performs the ascertainment by checking language containment of the two models.

3 Claims, 19 Drawing Sheets

$$\downarrow (x_1=1) \equiv \downarrow (1,0,0),(1,0,1),(1,1,0),(1,1,1)$$

$$\begin{matrix} v \\ \downarrow \\ \omega \end{matrix} (x_1=1) + (x_2=1) * (x_3=1) = M(v,\omega)$$

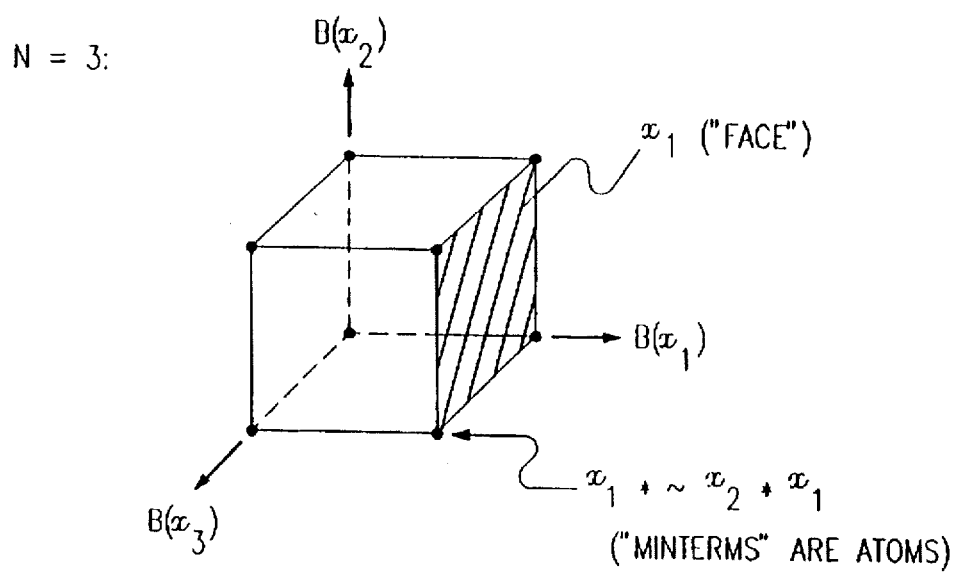
FIG. 2E
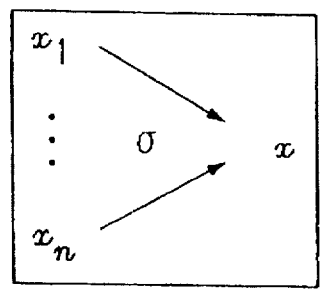
FIG. 2F
FIG. 4A

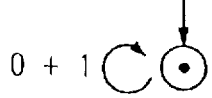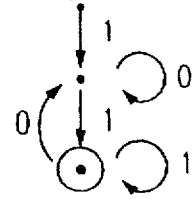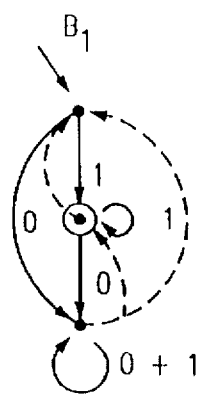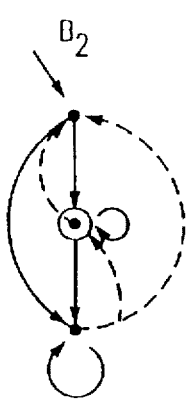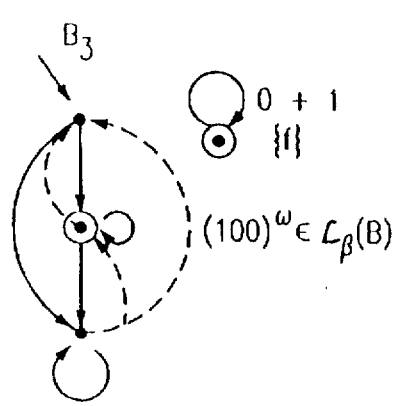
FIG. 6A
FIG. 6B
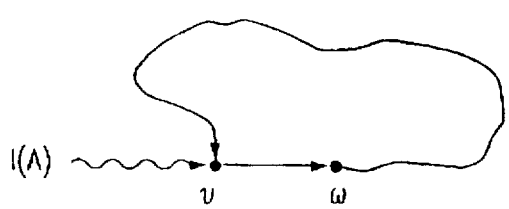
FIG. 6C

7.6.22 EXAMPLE $P_1$ AND $P_2$ ARE ASYNCHRONOUSLY EQUIVALENT, AS $\mathcal{L}(P_1)$ AND $\mathcal{L}(P_2)$ DIFFER ONLY BY ELEMENTS WHICH DIFFER IN THE NUMBER OF REPETITIONS OF CONSECUTIVE SELECTIONS.

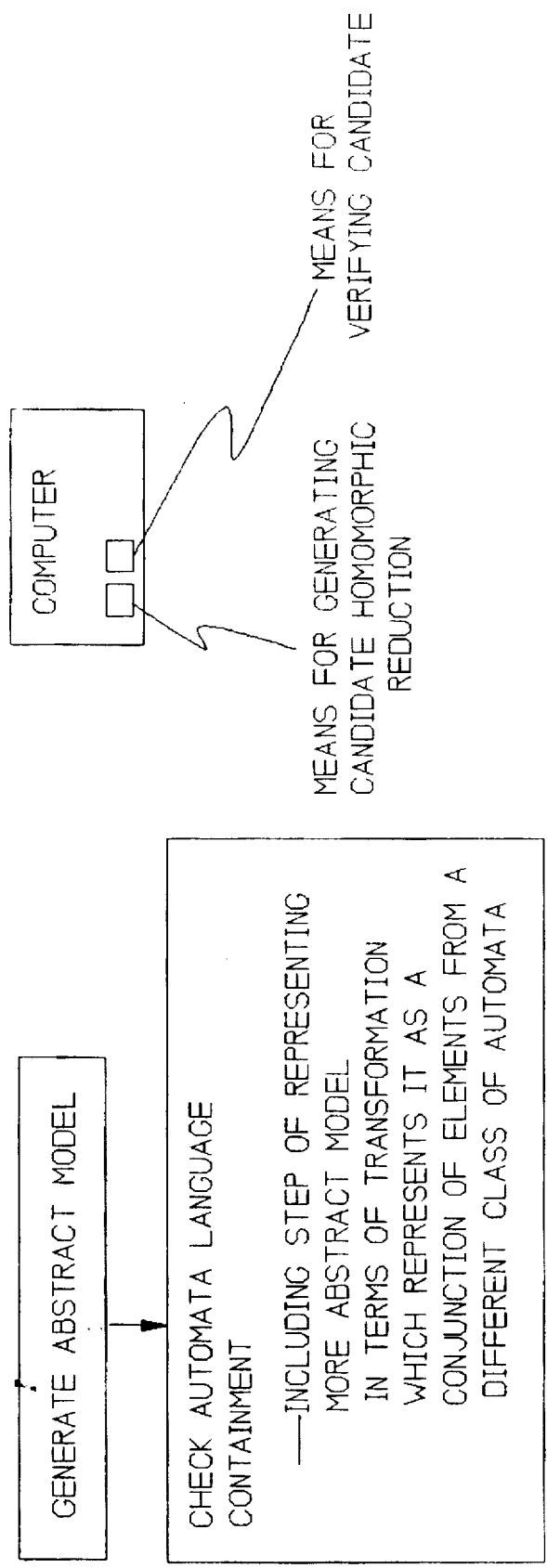

VERIFICATION OF HOMOMORPHISM BETWEEN TWO SYSTEM MODELS

VERIFICATION OF HOMOMORPHISM BETWEEN TWO SYSTEM MODELS

This is a continuation-in-part of "Timing Verification by Successive Approximation," in which the inventors are Alur, Kurshan, and Yannakakis, and which was filed on Jun. 29, 1992, and which was assigned Ser. No. 07/906,082 (Now U.S. Pat. No. 5,483,470). This application is hereby incorporated by reference.

The invention relates to verifying whether a given model, which accomplishes a specified task, is homomorphic to a larger model, thereby implying that the larger model also accomplishes the specified task.

BACKGROUND OF THE INVENTION

The designer of a complex system generally wishes to verify that the system will perform as expected, prior to actually constructing the system. The designer commonly generates a model of the system, in order to simulate operation of the system.

Frequently, the model takes the form of a complex state machine. However, a complex state machine can reside in an astronomical number of states, and it is generally unfeasible to examine all states, in the testing process.

Example of Large Number of States

An illustration of a large number of states can be found in random access memory, RAM (which is not necessarily a state machine, but which illustrates the magnitude of the problem). Consider a RAM which contains one million bytes, giving a total of eight million bits of storage capacity. The number of possible different combinations of stored bits is $2^{8,000,000}$, which is an utterly enormous number. The RAM, or even a model of it, cannot be tested by storing all possible bit combinations.

Luckily, in the case of RAM, all possible combinations need not necessarily be used. It may be sufficient to write a specific word into every memory location (instead of every possible combination of words), and then read each word, to verify that the words have been stored properly. This process involves one million write operations, plus one million read operations, together with the analysis of each read operation.

This simpler test can be done in a reasonable length of time. However, success of this test does not necessarily guarantee perfect functioning of the system. For example, it is possible (but unlikely) that use of a different word will produce errors. This fact will not be detected by use of the original word. As another example, it is possible that storing two different words at adjacent locations may cause an error, and this fact would also not be detected by the original word.

Large State Machines

State machines also possess large numbers of possible states, and it is not feasible, or even possible, in many cases, to cycle the state machine through all states.

The invention is concerned with verifying whether a given simpler model, perhaps of a state machine, which accomplishes a specified task, is homomorphic to a larger model, thereby implying that the larger model also accomplishes the specified task.

SUMMARY OF THE INVENTION

In using one form of the invention, a designer postulates a simplified (or more abstract) model of a larger system. The invention checks automata language containment by representing the more abstract model in terms of a particular transformation which represents it as a conjunction of elements from a different class of automata.

BRIEF DESCRIPTION OF THE DRAWINGS

FIG. 1.2 illustrates a data-flow diagram for a hypothetical traffic signal.

FIG. 1.3 illustrates state transition diagrams for the dataflow diagram of FIG. 1.2

FIG. 1.4 illustrates an omega-automaton which defines the task "no cars collide."

FIG. 1.5 illustrates an automaton which models the requirement that all cars on Avenue A eventually succeed in crossing the intersection.

FIG. 1.5A illustrates a reduced state model.

FIG. 1.5B illustrates reduced state space of a component.

FIG. 1.5C illustrates application of state minimization to the model of FIG. 1.5B.

FIG. 1.5D illustrates an error track.

FIG. 1.5E illustrates two automata.

FIG. 2.1A illustrates conditions for transitions.

FIG. 2.2 is a static representation of an automata transition structure, in terms of Boolean predicates.

FIG. 2.3 illustrates parallel composition of the transition structures M and M'.

FIG. 2.4 is a matrix representation of a transition structure.

FIG. 2.5 illustrates that a Boolean algebra may be represented as an N-cube.

FIG. 4.1A illustrates abstraction of detailed events.

FIG. 5.2 illustrates a deterministic binary counter.

FIG. 5.2 illustrates change of language accepted by an input.

FIG. 6.1B illustrates a state diagram for use with Example 6.2.47.

FIG. 6.1C illustrates a process involved in a proof of Theorem 6.2.49.

FIG. 6.1D illustrates paths in state space along recur edges.

FIG. 7.2 illustrates the concept of delay.

FIG. 7.3 illustrates a canonical pair of states.

FIG. 7.4 illustrates a two-level signal alternating between $x_0$ and $x_1$.

FIGS. 7.5 and 7.6 illustrate lockup-free Moore processes.

FIGS. 7.6A and 7.6B illustrate asynchronous equivalence.

FIG. 8.2 illustrates graphically the situation described in Theorem 8.3.16.

FIG. 8.2A illustrates relationships between different languages.

FIGS. 8.3 and 8.4 illustrate a development methodology for use with the invention.

FIG. 8.4A illustrates setting of a bit each time a recur edge is crossed, and unsetting each time a non-recur edge is crossed.

FIG. 8.5 illustrates graphically a situation involved in the proof of Theorem 8.10.6.

FIG. 8.6 illustrates reduction of a graph.

FIG. 8.6A defines the task "All cars on each road eventually get through the intersection."

FIG. 8.6B illustrates reduction of a circular queue.

Figure 1A:
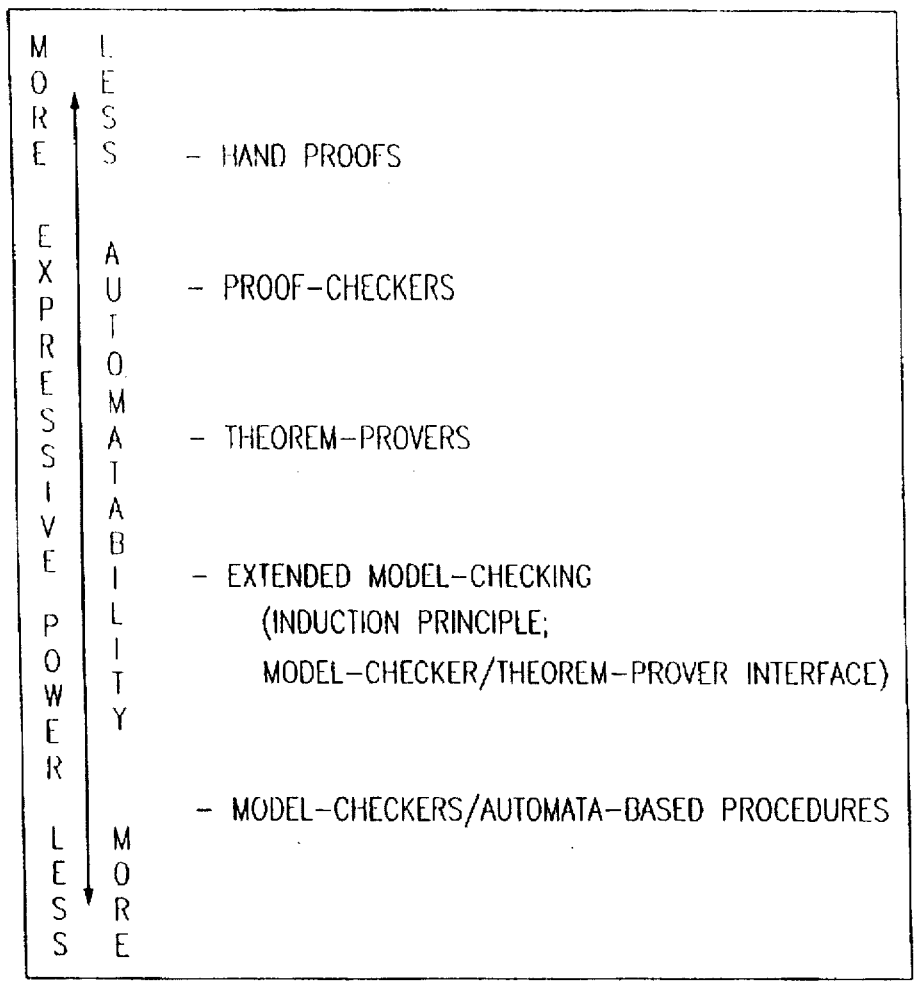
FIG. 1.1 illustrates ascending level of complexity in different model checking processes.
Figure 1B:
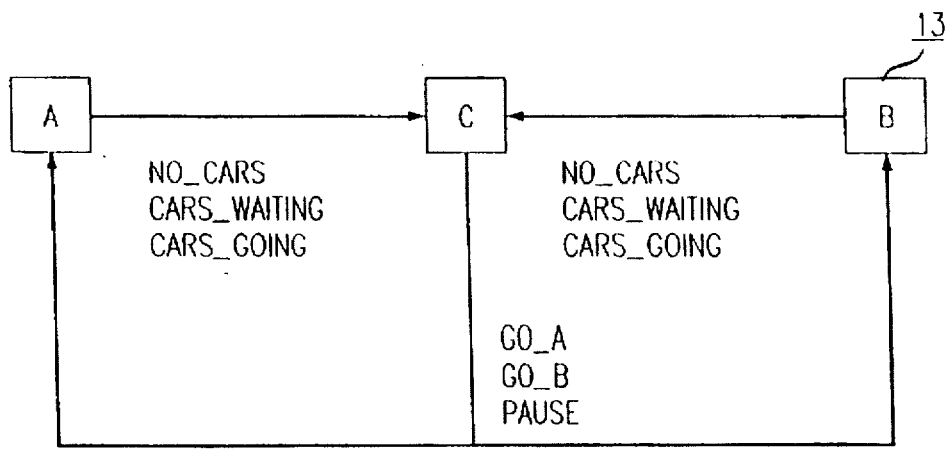
Figure 1C:
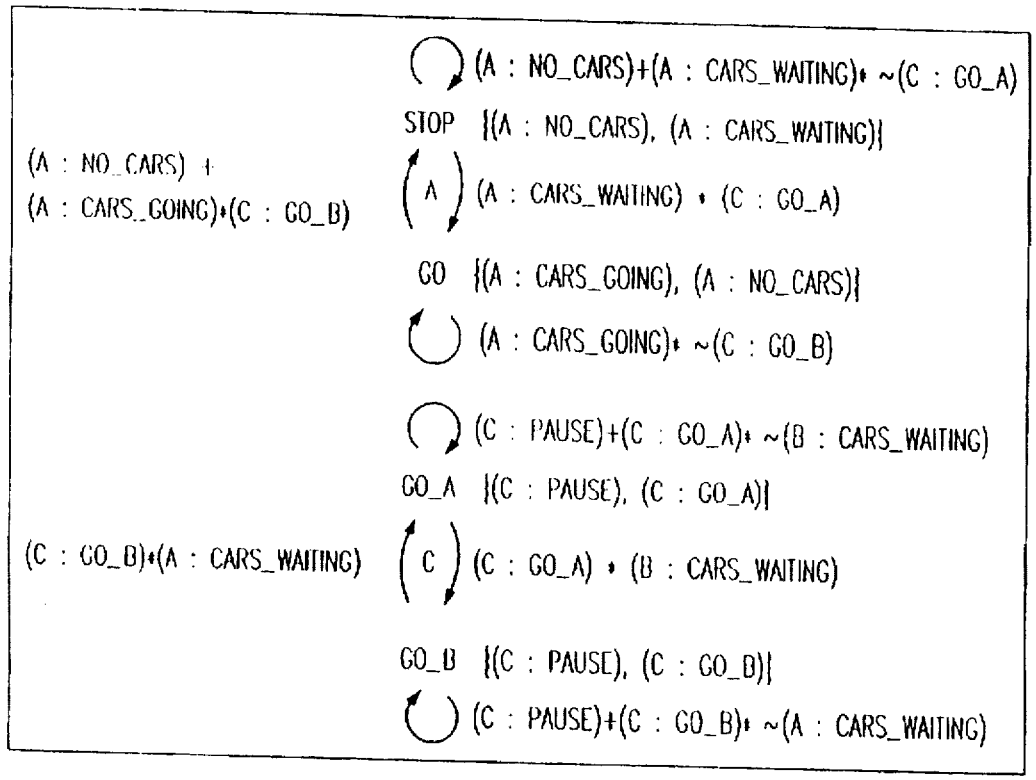
Figure 1D:
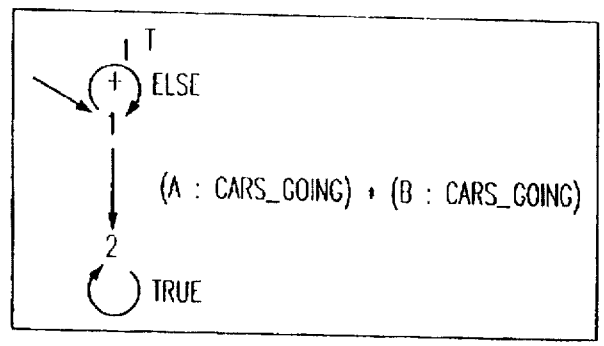
Figure 1E:
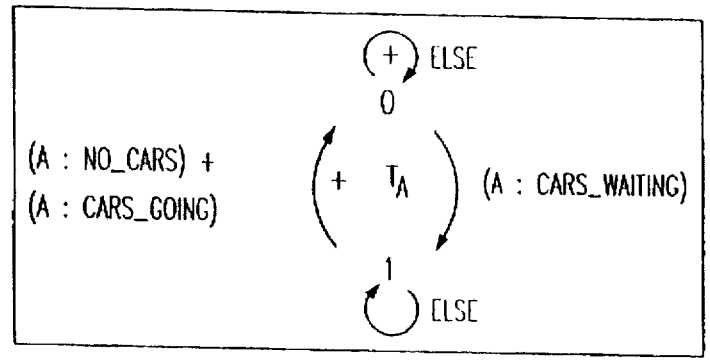
Figure 1F:
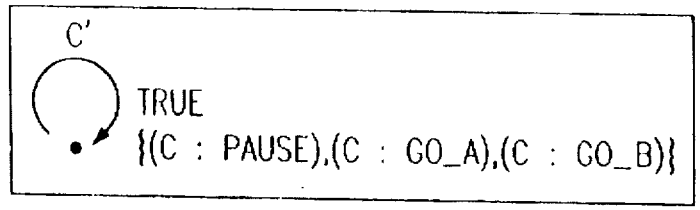
Figure 1G:
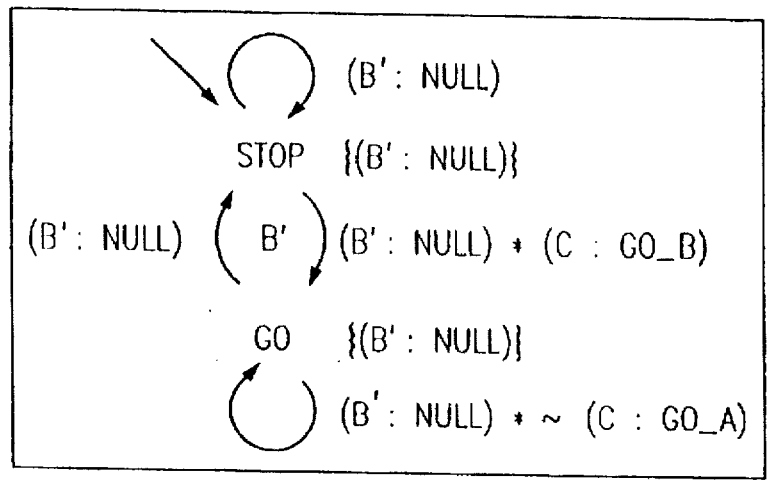
Figure 1H:
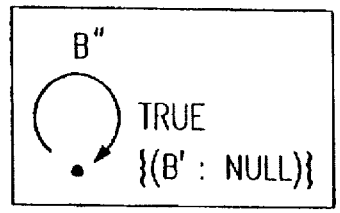
Figure 1I:
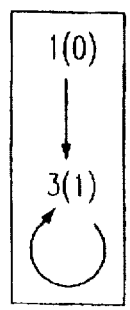
Figure 1J:
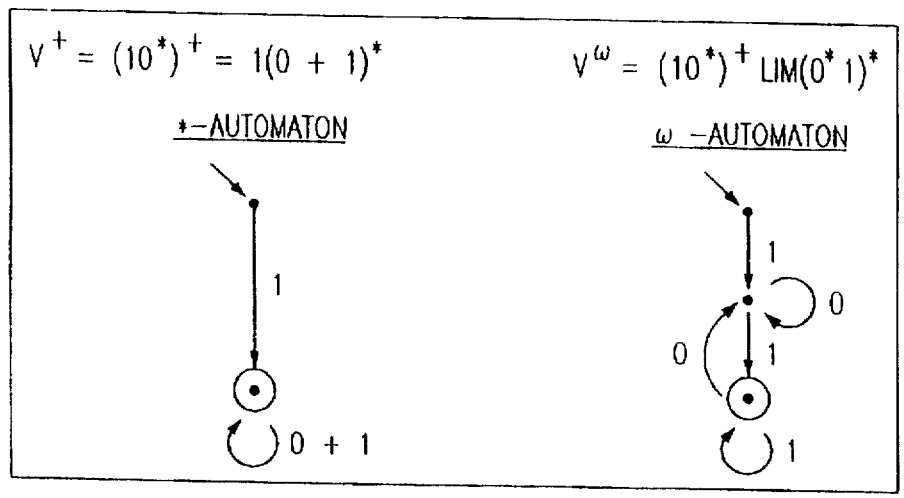

FOGS. 9 and 11 contain flow charts which illustrate logic implemented by one form of the invention.

FIG. 10 illustrates one form of the invention.

DETAILED DESCRIPTION OF THE INVENTION

Appendices A, B, C and D contain technical information sufficient to explain how to implement the invention using a programmable digital computer. Appendices A, B, C, and D are hereby incorporated by attachment.

A method of verifying whether a reduced model is homomorphic to a more complex model is given in Appendix A, section 8.10, entitled "Automatic Reduction of Symmetries." FIG. 8.7 illustrates the method in tabular form.

Appendices C and D provide C-code extracts which would assist a designer in writing a program which will run on a system known as COSPAN, and which is described in U.S. Pat. No. 5,163,016, issued to Alur et al. on Nov. 10, 1992. This patent is hereby incorporated by reference. Alternately, a system known as SMV, available as public domain software, developed at Carnegie-Mellon University, can be used.

Appendix B contains observations and suggestions which were developed based on the inventors' experience with application of the invention to the analysis of highly complex systems. These observations and suggestions will assist a designer in optimizing code which is written.

U.S. Pat. No. 5,163,016, issued to Har'El et al. on Nov. 10, 1992, describes a development apparatus suitable for use with the present invention. This patent is hereby incorporated by reference.

Numerous substitutions and modifications can be undertaken without departing from the true spirit and scope of the invention.

Contents

| | | |
|---|---|---:|
| Preface | | xi |
| 1 | Introduction | 3 |
| | 1.1 An Example | 12 |
| | 1.2 ∗-automata vs. ω-automata | 24 |
| | 1.3 Background of ω-automata | 26 |
| 2 | Boolean Algebra | 31 |
| | 2.1 Boolean Algebra $L$ | 34 |
| | 2.2 Lifting Lemma | 41 |
| 3 | $L$-matrix | 45 |
| | 3.1 Transition Structure | 46 |
| | 3.2 Paths | 47 |
| | 3.3 Projection | 48 |
| 4 | $L$-language | 51 |
| | 4.1 Model Behaviors | 51 |
| | 4.2 Duality of Homomorphisms | 52 |
| 5 | String Acceptors | 63 |
| | 5.1 $L$-∗-automaton/$L$-∗-process | 64 |
| | 5.2 Choueka "Flag" Construction | 70 |
| | 5.3 Closure Properties of $L$-∗-automata | 72 |
| | 5.4 Fundamental Theorem of Regular Sets | 74 |
| | 5.5 Equivalence | 74 | viii                                                                 Contents

6 ω-theory: L-automaton/L-process                                      77
  6.1   Regular Sets . . . . . . . . . . . . . . . . . . . . . . . . .    77
  6.2   ω-automata . . . . . . . . . . . . . . . . . . . . . . . . . .    81
  6.3   Images of Automata . . . . . . . . . . . . . . . . . . . . .     104

7 The Selection/Resolution Model                                      109
  7.1   Selection/Resolution . . . . . . . . . . . . . . . . . . . .     110
  7.2   Moore Process . . . . . . . . . . . . . . . . . . . . . . . .    114
  7.3   s/r as a Data-Flow Model . . . . . . . . . . . . . . . . .       120
  7.4   "Fairness" Constraints . . . . . . . . . . . . . . . . . . .     121
  7.5   System Verification . . . . . . . . . . . . . . . . . . . . .    121
  7.6   Modelling Asynchrony and Continuous Time . . . . . .             125
  7.7   Timing Verification . . . . . . . . . . . . . . . . . . . . .    149

8 Reduction of Verification                                           153
  8.1   Verification . . . . . . . . . . . . . . . . . . . . . . . . .   153
  8.2   Complexity Issues . . . . . . . . . . . . . . . . . . . . . .    155
  8.3   $P$-adic Processes . . . . . . . . . . . . . . . . . . . . . .   161
  8.4   Automatic Localization Reduction . . . . . . . . . . . .         170
  8.5   Homomorphic Reduction . . . . . . . . . . . . . . . . . .        172
  8.6   Homomorphic Refinement . . . . . . . . . . . . . . . . .         176
  8.7   Node-Recurring Transform . . . . . . . . . . . . . . . . .       181
  8.8   Simple Decomposition . . . . . . . . . . . . . . . . . . .       183
  8.9   State Homomorphism . . . . . . . . . . . . . . . . . . .         187
  8.10  Automorphic Reduction of Symmetries . . . . . . . . .            192
  8.11  Homomorphism Verification . . . . . . . . . . . . . . .          197
  8.12  Lifting Homomorphisms . . . . . . . . . . . . . . . . . .        198

9 Structural Induction                                                203
  9.1   The Structural Induction Theorem . . . . . . . . . . .           205
  9.2   Example: Dining Philosophers . . . . . . . . . . . . . .         207

10 Binary Decision Diagrams                                           215
  10.1  Terminology and Notation . . . . . . . . . . . . . . . .         217
  10.2  From Automata to BDD's . . . . . . . . . . . . . . . .           219
  10.3  Algorithm I: Transitive Closure . . . . . . . . . . . . .        221
  10.4  Algorithm II: The Emerson-Lei Formula . . . . . . . .            223
  10.5  Implementation Issues . . . . . . . . . . . . . . . . . . .      226
  10.6  Failure Reporting . . . . . . . . . . . . . . . . . . . . . .    229

| | |
|---|---|
| *Contents* | ix |
| Appendices | 231 |
| Bibliography | 241 |
| Glossary | 263 |
| Index | 264 |

Preface

The basic problem addressed by this book is a practical one, of primary concern to anyone involved in the actual verification of an industrial system: how to cope with the computational complexity associated with the formal verification of coordinating processes. For important reasons which are fully developed, we use automata as the underlying semantic model. Given a "system process" modelled by the automaton $P$ and a "task" which $P$ is intended to perform, modelled by the automaton $T$, verification of the "performance of $T$ by $P$" (or that "$P$ meets the specification $T$") is by definition testing the truth of the formal language containment $\mathcal{L}(P) \subset \mathcal{L}(T)$. Typically, $P$ is too complex to allow a direct language containment test by conventional means. This book describes a methodology which subsumes many compositional methods, for reducing this test to a set of associated tests $\mathcal{L}(P_i') \subset \mathcal{L}(T_i')$ for simpler $P_i'$ and $T_i'$, $i = 1, \ldots, n$, so $\mathcal{L}(P_i') \subset \mathcal{L}(T_i') \; \forall i \Rightarrow \mathcal{L}(P) \subset \mathcal{L}(T)$. This reduction of $P$ is *relative* to the task to be verified, and each task induces a different reduction. The relationship between each $P_i'$ and $P$, $T_i'$ and $T$ which guarantees this implication is given in terms of respective homomorphisms on an associated Boolean algebra. The Boolean algebra is defined by the instantaneous "events" possible in the system: conditions typically expressed in terms of respective values of system variables. The book relates this semantic basis, needed for the mathematical development of the theory, back to the structures used in actual verification in an industrial setting.

This same theory gives rise to a top-down developmental methodology for system design based upon successive refinement: each successive refinement model $P$ has a reduction $P'$ as its abstraction. This enables one to prove respective properties in a succession of increasingly more detailed models, with the result that all the properties hold in the lowest level (most detailed) model. The lowest level model could contain sufficient detail to admit of an implementation which may be synthesized or compiled automatically from the model description. In addition to producing reliable designs, this development methodology permits debugging a design very early in the design cycle, with the result that overall development time may be reduced substantially.

The entire foundation for this theory is given here, including the required treatment of regular and $\omega$-regular languages, and Boolean algebra homomorphisms. However, a basic knowledge of automata theory is presumed, such as may be found in [HU79]. The proofs of a number of lemmas and theorems are omitted, in order to provide exercises.

This book grew out of lecture notes, originally created for U. C. Berkeley E. E. course 290H given in the Fall 1991, and subsequently for a course *Formal Verification of Hardware* given at the Technion (Haifa, Israel) in December 1991. It is derived from [Cho74] and [Kur90] but includes a new treatment of homomorphic reduction, and much other new material, including a new formulation of the generic reduction and decomposition problems, drawn from [Kur94d], the development of $P$-adic processes, drawn from [Kur94c], and other material drawn from [KM89], [TBK91], [Kur94a], and [Kur94b].

I would like to thank all who made suggestions and pointed out mistakes in the various drafts of this book, especially the many students at Berkeley and the Technion, and my colleagues at Bell Labs. Special thanks are due to Vassilios Zoukos for his careful reading and large number of helpful comments. I thank my long-time collaborator, mentor and friend B. Gopinath for focusing my attention on the verification problem so many years ago. I thank Ken McMillan whose unique clarity of view in more discussions than I can count has been of central importance in shaping my views on verification. For helpful conversations and suggestions, I thank my colleagues Rajeev Alur, Ed Clarke, Costas Courcoubetis, Allen Emerson, Joan Feigenbaum, Orna Grumberg, Gerard Holzmann, Jacob Katzenelson, Leslie Lamport, David Long, Kostas Oikonomou, Doron Peled, Hervé Touati, and Mihalis Yannakakis. I thank Bob Brayton for fostering my long and fruitful collaborations at U. C. Berkeley, which led to this book in the first place. And finally, I extend my eternal gratitude to Sue Pope, who typeset this entire manuscript in LaTeX, composed all the figures and tables, figured out how to do all the typographical organization, carefully proof-read every line, and without whose help this book would not exist.

*R. P. Kurshan*
*Murray Hill, NJ*
*October, 1994*

**COMPUTER-AIDED VERIFICATION
OF COORDINATING PROCESSES**
The Automata-Theoretic Approach

Chapter 1

Introduction

This book addresses the problem: how to verify mathematically that a system model of coordinating components behaves as it should. In this context, the "system" typically is a hardware and/or software implementation of a control algorithm. Examples of systems subject to the type of formal verification addressed in this book include controllers which implement communication protocols, cache coherency protocols and telephone switches. However, for our purposes, a system may as well be a subcircuit which implements an adder, a state machine implementing a lexical parser, a game such as nim, or a discrete-event economic model. The real-time behavior of systems also may be analyzed in this context, as long as the tested attributes are discrete events.[1]

Given a mathematical model[2] of such a system, one seeks to verify that the model has a given attribute. The attribute could be that

---

[1] The best-known such examples are in the continuous-time verification of discrete-event systems, described in Section 7.7, where time bounds are placed upon nondeterministic (discrete) state transitions. However, see also [KM91].

[2] One can *prove* properties only of a mathematical *model* (whose semantics matches that of the proof-system). Thus, one formally verifies not the *system* itself but only a *model* of the system. This has led to some confusion when the model syntax serves as input to a computer which, in executing the input, implements the system. Nonetheless, it is only the *model* which is verified; how well this verification serves as a predictor for the behavior of the computer *system* depends upon the extent to which the model accounts for behaviors of the computer, including its interactions with all the software which it runs, as well as other parameters such as temperature and gamma rays. (The acid test of a "verified chip" is to hit it with a large hammer — or atom bomb — and then check that it still possesses its verified behavior.)

Chapter 1. Introduction all modelled behaviors are consistent with another model. The second model may represent a single aspect of the first model, such as "every message is eventually delivered", "all cache reads are consistent", "add$(a, b) = a + b$", "black wins in 3" and so on.

It is this process which we call formal verification. The expression "formal verification", as it appears in the literature, refers to a variety of (often quite different) methods used to prove that a model of a system has certain specified attributes. What distinguishes *formal* verification from other undertakings also called "verification", is that *formal* verification conveys a promise of mathematical certainty.[3] The certainty is that if a model is formally verified to have a given attribute, then no behavior or execution of the model ever can be found to contradict this. (This is assuming the formal verification itself is mathematically correct!). This is distinct from other types of "verification" which simply test the given model in a (possibly large but not exhaustive) set of cases, wherein the model is said to be "verified" if none of the tested cases contradict the asserted attribute. These types of "verification", more accurately called "testing" (or, in hardware circles, "simulation", with an added sense of sophisticated test generation and error capture capabilities), never can serve to prove that the model in all cases has the required attribute. (Typical circuit testing may run billions of tests, requiring more than a year to execute, and yet not cover even close to 1% of the possible circuit states. Moreover, many circuits implement nonterminating models, which cannot be tested exhaustively through circuit execution, in finite time.)

While simulation is the current norm for testing computer hardware (software testing typically is even more primitive), it has become increasingly recognized in industry that this is (even grossly) insufficient for many applications. This realization has given rise to a recent upsurge of interest in formal verification, at least in the hardware community. Although methods for testing hardware are applicable to testing much software as well, *e.g.*, the large control software found in communication protocols and telephone switches, the software community remains about 5 years behind the hardware community in the application of these techniques, early warnings notwithstanding [Yeh83] (*cf.* [Pet91]). Only recently — as the hardware community has begun to adopt formal verification — has the software community begun to adopt hardware simulation methods.

---

[3] Including "certainty in probability" as in [Var85], [CY88], [CY90], which is outside the scope of this book.

Today, there is a consensus among practitioners of formal verification that from a practical point of view, computer systems are too complex to be verified by hand [Bar89]. As a result, *formal verification* increasingly is becoming synonymous with *computer-aided verification* (*cf.* [CAV]). Computer-aided verification means using a computer, for increased speed and reliability, to carry out the steps of the verification. More than simply automating calculations, computer-aided verification has spawned techniques which would be entirely infeasible without a computer. These new techniques are based upon largely new mathematical and logical foundations. They have engendered new algorithms, as well as questions concerning computational complexity, expressive equivalence and heuristics.

Generally speaking, formal verification may be construed as theorem-proving in a given logic. However, in practice, research in formal verification falls within various subcategories (*cf.* Figure 1.1). The oldest and Figure 1.1: Formal Verification spans a spectrum in which expressive power trades off against automatability. The focus of this book lies at the automated end of the spectrum.

6                                                              Chapter 1. Introduction most general form of computer-aided formal verification is this: given two formulae $f$, $g$ in a reasonably expressive logic, each representing models or properties, prove $f \Rightarrow g$. This most general form has been studied and practiced since before 1960, under the name *automated theorem-proving*. Conceptually, any proof constructed by a computer could have been done by hand. However, on account of the general lack of peer review and the complexity of many proofs, hand proofs of the validity of computer algorithms have been largely discredited as intrinsically unreliable [Bar89]. The literature and variety of automated proof-checking/theorem-proving is extensive. For a sample, see [BM79], [BL84], [Gor88], [Joy88], [Hun89], [AVCM93], representative from the perspective of this book. While results in automated theorem-proving are the most general in scope, they are the most limited algorithmically: most often the question "$f \Rightarrow g$?" in such a general context is undecidable. Thus, in this context, computer-aided verification requires extensive user involvement.

Dissatisfaction with this largely nonalgorithmic form of verification and its effective inability to address many industrial problems gave rise to highly restricted forms of theorem-proving for which all theorems are decidable. For example, in restricted logics such as linear-time temporal logic (LTL — see the *linear-time* references in Section 1.3.e), proving the theorem $f \Rightarrow g$, is equivalent to testing the unsatisfiability of the formula $f \wedge \neg g$ which is decidable (although PSPACE-complete [SC85]). As the best known decision procedure has exponential time complexity, this continued to present a practical barrier, as did expressive limitations of LTL (it cannot adequately express unbounded sequentiality such as a requirement that a property holds at every 2nd clock tick [Wol83]), and thus it is not useful for verifying or even defining many system models.

Great inroads through these computational barriers were made in the context of another form of formal verification known as *model-checking*, which for the branching-time logic CTL[4], the well-known "computation tree logic" of Clarke and Emerson introduced in [CE82], admits of a linear-time decision procedure. In model-checking as discussed here, the theorems "$f \Rightarrow g$" are restricted to the case where $f$ is a state transition model of the system to be verified and $g$ is a logical formula stating a desired property or "specification" of $f$, which is "checked" on $f$. The relation generally is written $f \models g$ ("$f$ is a model of $g$"— the implication "$\Rightarrow$" being interpreted liberally). In the case of CTL, the check is in time linear in the size of $f$ and of $g$ (compared with the

---

[4] See also [QS82] for a closely related logic, as well as the *branching-time* references in Section 1.3.e.

PSPACE-complete check for LTL formula implication). Between automated proof-checking/theorem-proving and model-checking fall other types of formal verification such as the extensive study of the Petri nets[5] whose theorems in most cases are decidable and thus machine-checkable. Also in this span lie many other specialized theories (which often tend to be reducible to special cases of the ones already mentioned) [Gup92].

The setup of a sequential system model and linear-time decidability afforded by CTL model-checking represented a major practical advance in formal verification. Recently, its applicability has been broadened dramatically through the utilization of fixed-point procedures implemented with binary decision diagrams [BCM+90], [McM93a]. This has allowed large sets of states to be analyzed simultaneously, further offsetting the limitation imposed by computational complexity. However, system models typically are expressed in terms of coordinating components, in a fashion which is logarithmically succinct as compared with the size of the model state space (a situation often called "state-space explosion"). Thus even these major advances may be of little help in the *direct* model-checking of many problems, the computational complexity of which remain beyond any conceivable computational resources.

This remaining computational barrier is one reason for focusing on *automata-theoretic verification* (the subject of this book). Automata-theoretic verification is a type of model-checking which admits of powerful *reduction* algorithms which, although only heuristics, often can break through the computational complexity barrier. Automata (*i.e.*, ω-automata) as a class are more expressive than LTL and are capable of expressing eventuality (or "fairness") assumptions not expressible in CTL (or even the expressively richer — and computationally more complex — CTL*), whereas CTL can express branching-time properties not expressible by automata. It is possible to include automata as operators within CTL [CGK89], thereby achieving the combined expressive power of each. However, the existential path quantification of CTL, which gives it much of its expressive power (and can be very useful in checking the nondegeneracy of a design), precludes the general application of the automata-theoretic reduction algorithms to that logic. (A limited form of reduction possible in CTL is discussed in Section 8.9. A somewhat more general form of reduction is possible in ∀CTL, the logic CTL with existential path quantification removed (Sections 7.5, 8.9).)

---

[5] See [Pet81]. The listing [PR91] contains 4100 entries! Thus, Petri nets may be more extensively studied than automated theorem-proving, temporal logic and model-checking combined. Nonetheless, in spite of providing a very interesting and often valuable theoretical model (*cf.* [McM93b]), Petri nets have not succeeded to make a direct impact on the practice of computer-aided verification.

*Chapter 1. Introduction*

In automata-theoretic verification, "formulae" all are of the form $x \in \mathcal{L}(P)$ (read "x is a behavior of model $P$"). Thus, theorems all are of the form $x \in \mathcal{L}(P) \Rightarrow x \in \mathcal{L}(T)$, i.e., $\mathcal{L}(P) \subset \mathcal{L}(T)$. As a form of model-checking, the system is modelled by the automaton $P$, the "formula" or specification to be checked by the automaton $T$, and the "check" is whether the language of $P$ is contained in the language of $T$. Using an $\omega$-automaton $P$ to model the system directly supports eventuality ("fairness") assumptions which often are added (through the addition of $\omega$ automata) to the system model description in CTL model-checking (resulting in "fair" CTL). Thus, the $\omega$-automaton $P$ combines the state transition model and fairness into one structure. Using the automaton $T$ rather than a CTL formula to express the property to be checked sacrifices the expressiveness of branching-time properties and the syntactic flexibility[6] of logic. However, it benefits from the expressiveness of arbitrary $\omega$-regular sequential properties such as the "every 2nd clock tick" property mentioned above (with fairness), many of which are not expressible even in CTL*. Most significantly, using $\omega$-automata instead of branching-time logic affords a greater opportunity to apply the reduction algorithms and stepwise refinement techniques which are the subject of this book.

It should be said, however, that these are not strictly "either/or" choices: there is utility in combining CTL model-checking with automata-theoretic verification [CGK89], [HSBK93], [HBK93] and in combining automated theorem-proving with automata-theoretic verification [KL93]. Indeed, these all are combined to good effect in the COSPAN verification system [HK90], [HTKB93]. The HSIS verification system [HSIS94] combines CTL model-checking with automata-theoretic verification. The SMV verification system [McM93a] which implements CTL model-checking, also is capable of performing automata-theoretic verification [BCM+90].

Utilizing automata alone, however, as the semantic basis for verification, so that both the system model and its specification are defined in a syntactically uniform fashion, affords an opportunity to practice a verification-driven top-down design development methodology called *stepwise refinement*, described in Section 8.6. Under this methodology, a system design evolves as a succession of models, each model more detailed than the previous. Each model is taken as a "specification" of the succeeding model, and verification is used to check the consistency

---

[6] As a practical matter, the syntactic advantage of a logical notation may be offset through the use of a library of parameterized common properties. (Experience suggests that such a library is sufficient for many applications [MP90].)

of each specification with the preceding specification. Typically, earlier models in the design evolution are more abstract, expressing only high-level logical attributes of the system under development, while the later (more refined) models add low-level details needed for the ultimate physical implementation.

There are a number of advantages of such a development methodology. First, and probably foremost, is that the highest-level (most abstract) model in the refinement hierarchy, because it is abstract, may be defined much more rapidly than a full system design. It may be considered a "rapid prototype" of the ultimate design. This prototype may be logically debugged through verification (that is, in the course of attempting to verify its important attributes). In the process, one uncovers design errors at the earliest possible time in the design cycle. This permits fixing bugs at a stage when the design is relatively simple, and less additional code has been written around the faulty code, which possibly would need to be changed to accommodate the bug fixes. Early discovery of design errors long has been known to be an important accelerant of the design process [Gab94]. Experience bears out that when testing, debugging and code rewriting are taken into account, the extra time needed to develop a design through a succession of models can be more than offset by time saved in the course of correcting mistakes, and result in a dramatic net *decrease* in development time overall [HK90].

Another advantage of stepwise refinement as a design methodology is that high-level designs may be reused in a variety of applications. (Although code reusability, on account of incompatibility problems, has not born out its early promise of saving, design reusability is much less sensitive to such compatibility issues.) Moreover, a high-level design, because it is relatively simple, may be used as a (formal) design specification. In this way, top-down designs may be considered to be *self-documenting*.

Finally, stepwise refinement builds into the design a notion of "locality", which may greatly advance the effectiveness of reduction algorithms used to cope with the computational complexity of verification. "Global" properties may be verified in the highest level (most abstract) model, where computational complexity is less of an issue. Local properties (of more detailed structures), first addressed at lower design levels, are verified through algorithms which abstract away portions of the design irrelevant to the local properties being verified.

The stepwise refinement hierarchy, in verifying that each successive model is consistent with the preceding model, guarantees that every Chapter 1. Introduction property verified at one level of the hierarchy is inherited by all subsequent levels. This inheritance of verified properties from one level to the next is precluded in branching time logics such as CTL, by the existential path quantifier in these logics: an abstract model, since it is less constrained, has more behaviors than its refinement; hence a particular (path-dependent) behavior which is proved to exist in an abstract model may be absent from its refinement. (One way around this is to require refinement to be exact (Section 8.9); but this may be overly restrictive to be of great use. Another way is to restrict to $\forall$CTL where the existential path quantifier has been removed, as discussed in Section 7.5).

Refinement and reduction actually are dual. The essence of reduction is to replace a computationally expensive test $\mathcal{L}(P) \subset \mathcal{L}(T)$ with a set of collectively cheaper tests $\mathcal{L}(P_i') \subset \mathcal{L}(T_i')$, $i = 1, \ldots, n$, such that $\mathcal{L}(P_i') \subset \mathcal{L}(T_i') \; \forall i \Rightarrow \mathcal{L}(P) \subset \mathcal{L}(T)$. Typically, $P_i'$ is a "localization" of $P$ relative to $T$. For example, if $T$ refers only to a small part of the functionality of $P$, the extra functionality (extra with respect to $T$) may be abstracted. An instance of this is *data abstraction* [Wol86] in which one may abstract the values of data to just a few representative tokens. For example, if one wishes to verify that sent messages always are received, the set of all messages may be abstracted to just 2 tokens: one representing a canonical message being tracked, the other representing all other messages. (For this to work properly, the system must be symmetric with respect to permuting messages; the first token is generated precisely once, nondeterministically, somewhere within a stream of the second tokens.)

The advantage of such reduction is that, by construction, the size of $P$ is exponential in the size of the $P_i'$'s, while the complexity of language containment (for the automata of interest) is linear in the size of each automaton. Hence, the complexity of testing $\mathcal{L}(P) \subset \mathcal{L}(T)$ directly is exponential in the number of components of $P$, while the total cost of testing whether $\mathcal{L}(P_i') \subset \mathcal{L}(T_i') \; \forall i$, is roughly $n$ (the number of local tests) times the size of a component. Thus, if $n$ is sublinear in the size of $P$ (more precisely, in the number of transitions of $P$), this approach is a win over computing $\mathcal{L}(P) \subset \mathcal{L}(T)$ directly. Moreover, as space is the current verification bottleneck in most cases, this gives a way to reduce space requirements (at the expense of time). Therefore, even the means to find an $n$ which were polynomial in the size of the components could be welcome, as a way of trading off space for time. Although it is not known how to find a small $n$ in every problem, there are enough empirical examples to be convincing that this reduction technique is of considerable practical value in a large variety of problems arising in industrial settings, expanding the class of models, and properties of those models, which can be formally verified. It is of greatest interest, therefore, to determine when a small $n$ may be found, and how to find it (along with the $P'_i$ and $T'_i$).

Reduction consists of two steps: *task decomposition* and *task localization*. In the decomposition step, a global system "task" or property $T$ is decomposed into local properties $T_i$ such that $$\cap \mathcal{L}(T_i) \subset \mathcal{L}(T) \,, \tag{1.1}$$

i.e., the local properties taken together imply the global property. Thus, the sought-after conclusion $\mathcal{L}(P) \subset \mathcal{L}(T)$ will follow from $$\mathcal{L}(P) \subset \mathcal{L}(T_i), \ \forall i \,.$$

The localization step replaces each test $$\mathcal{L}(P) \subset \mathcal{L}(T_i) \tag{1.2}$$

with a computationally simpler test $$\mathcal{L}(P'_i) \subset \mathcal{L}(T'_i) \tag{1.3}$$

which implies the former. The automaton $P'_i$ is a reduction of $P$ *relative* to $T_i$. This reduction serves to abstract those portions of $P$ "irrelevant" to the "local" property $T_i$, as in the example described above; the automaton $T'_i$ is an abstraction of $T_i$ consistent with the abstraction of $P$ relative to $T_i$.

The localization reduction of (1.2) to (1.3) and the checking of (1.1) and (1.3) all may be done algorithmically (Chapter 8). Finding useful heuristics to determine a viable decomposition (1.1) is one of the foremost open problems in this field. Presently, one uses knowledge of $P$ and $T$ to guess a decomposition (1.1); a bad guess may fail to satisfy (1.1), or may not lead to tractable reduction checks (1.3), but otherwise cannot interfere with the validity of the verification process. Once (1.1) is verified, and (1.3) is verified for all $i$, (1.2) follows, and thus so does its consequence $\mathcal{L}(P) \subset \mathcal{L}(T)$.

This book develops the underlying theory pertaining to such reductions, abstraction and refinement. While the development is presented mainly in terms of two classes of $\omega$-automata (the *L-processes* and *L-automata*), many of the methods and theorems apply to arbitrary $\omega$-automata and in fact more generally to the $\mu$-calculus [EL86]. However, 12                                              *Chapter 1. Introduction* we have opted in favor of clarity and the proximity to implementational issues afforded by a fixed class of $\omega$-automata.

The following section presents an example which illustrates much of the subsequent theory. Chapters 2-4 develop the Boolean-algebraic basis of the theory. Chapter 5 gives a development of $*$-automata (string acceptors) in this context, following Choueka [Cho74], and Chapter 6 does the same for $\omega$-automata. The underlying automata-theoretic model of coordination adopted here, the $s/r$ model, is presented in Chapter 7. Finally, the theory of reduction is developed in Chapter 8. The structural induction theorem of [KM89], an application of reduction to parameterized system models, appears in Chapter 9. Although implementation issues generally are not addressed in this book, an exception is made for implementations using ordered binary decision diagrams, since for this data structure, the implementation has algorithmic ramifications. These issues are discussed in Chapter 10, which is taken from [TBK91].

1.1 An Example

System models arising in industrial settings often have state spaces of size $10^{100}$ or even $10^{10^6}$ states. We consider next (for illustrative purposes) a system model with 8 states.

Consider the example of a system comprising a "crossroad traffic controller", composed of 3 coordinating components: Avenue $A$, intersecting Boulevard $B$ and traffic Controller $C$. We model each of these components by a state machine (named $A$, $B$ and $C$, respectively), each with inputs and outputs. The outputs of $A$ are 3 tokens:

$$(A : no\_cars)$$
$$(A : cars\_waiting)$$
$$(A : cars\_going)$$

and likewise for $B$. The outputs of $C$ also are 3 tokens:

$$(C : go\_A)$$
$$(C : go\_B)$$
$$(C : pause) .$$

The outputs of the various machines form the inputs to the others. The data-flow (i.e., input/output token-flow) among the 3 component state machines is given by the diagram of Figure 1.2.

1.1. An Example                                                                                         13

Figure 1.2: Data-flow diagram for the Crossroad Traffic Controller, showing the flow of data (control tokens) among its three component processes.

Each of $A$, $B$ and $C$ have 2 states, as shown in Figure 1.3. At each state (e.g., STOP, GO, go_A, etc.) of each state machine there are 2 possible outputs, given inside the associated $\{\cdots\}$[7]; in any execution of the system, the choice of output from each respective state is nondeterministic. For example, in its state STOP, machine $A$ may output either the token (A : no_cars) or the token (A : cars_waiting), the choice of which being nondeterministic. The diagrams of Figure 1.3 define state transitions in terms of Boolean predicates of the output tokens, described along edges, with * denoting AND, + denoting OR and ~ denoting NOT. The transition structure for $B$ is the same as that for $A$, but with $A$ and $B$ interchanged throughout. (The thoughtful reader may have trouble interpreting aspects of this example, such as the possibility that (A : cars_waiting) may be followed immediately by (A : no_cars); while a little fanciful thought may help — say the car turned around and left the intersection! — the purpose of the example is to illustrate verification methodologies, not the proper modelling of a crossroad controller!)

The crossroads "system" is modelled by the coordination of the 3 concurrent component "processes" $A$, $B$ and $C$, which taken together comprise the system model $X$. The states of $X$ thus are 3-tuples of states of $A$, $B$ and $C$ respectively, for example (STOP, STOP, go_A), which signifies that $A$ and $B$ are in their respective STOP state, while $C$ is in its go_A state. The transition conditions for $X$ are given in terms of respective Boolean conjunctions of transition conditions for the components. Thus, for example, letting A(STOP, GO) denote the condition for $A$ to move from its state STOP to its state GO, which in the example is defined to be $$A(\text{STOP, GO}) = (\text{A : cars\_waiting}) * (\text{C : go\_A})$$

---

[7]The designation within braces of the outputs possible at a state is semantically redundant, in that the same information may be discerned from the sum of the labels on edges outgoing from the state, in this case (A : no_cars) + (A : cars_waiting).

Figure 1.3: State transition diagrams for processes $A$ and $C$.

and likewise for $B$, $C$ and $X$ (see Figure 1.3), we get

X((STOP, STOP, go_A), (GO, STOP, go_A))

= A(STOP, GO) * B(STOP, STOP) * C(go_A , go_A)

= (A : cars_waiting) * ((B : no_cars) + (B : cars_waiting)) * (C : go_A)

as is easily computed from the transition conditions defined in Figure 1.3. (It often is said that $X$ is the "synchronous" product of $A$, $B$ and $C$. While synchronous product often is thought to be a simple — even uninteresting! — type of coordination, we show in Section 7.6 how, through use of nondeterminism, this conceptually simple coordination serves to model the most general "asynchronous" coordination.)

We add to the definitions of $A$, $B$ and $C$ a designation of respective initial states, say:

$$I(A) = \{STOP\},$$
$$I(B) = \{STOP\},$$
$$I(C) = \{go\_A, go\_B\}.$$

1.1. An Example

This is inherited by $X$, giving the initial states of $X$:

$$I(X) = \{(\text{STOP, STOP, go\_A}), (\text{STOP, STOP, go\_B})\}.$$

We express the assumption that $X$ is defined by the coordination of its concurrent components $A$, $B$ and $C$, by writing $X = A \otimes B \otimes C$.

Figure 1.4: The $\omega$-automaton which defines the state-invariant task "no cars collide".

Having modelled the crossroad system process by $X$ (defined in terms of its coordinating component models $A$, $B$, $C$ as $X = A \otimes B \otimes C$), we are ready to "verify" $X$. What should we verify? While we could adopt an absolute notion of verification, such as freedom from deadlock, in practice we need a more flexible notion of verification, (as discussed in Section 7.5). Thus, we identify some specific properties we wish to verify in $X$. We may think of these properties as *tasks* which $X$ is required to perform. Thus, we seek to *verify* that $X$ performs each of these *tasks*. For this example, we define two such tasks. The first task is to ensure that *no cars collide* (an invariant property — it is enough to check that it holds at each state — often called a "safety" property, although the term "safety" is used somewhat more generally). The second task whose performance we wish to verify is that the system model $X$ ensures that *all the cars on each road eventually get through the intersection*. (This "eventuality" property is intrinsically more complicated than an invariant property, as it cannot directly be seen to be true or false at a given state — sometimes this type of property is called a "liveness" condition.) We may model each of these two tasks by automata. Since 16                                                    Chapter 1. Introduction we are interested in nonterminating behavior and eventuality, we will
use ω-automata, whose intrinsic notion of a "behavior" is an infinite
execution.

The invariant task may be modelled by a 2-state automaton $T_1$ as
shown in Figure 1.4. The way to read this is: $T_1$ has initial state 1,
designated by the short arrow entering 1; the "self-loop" transition $1 \to 1$
marked by a '+' is a "recur" edge, meaning that any infinite path
through the transition structure of $T_1$ which crosses the edge $1 \to 1$
infinitely often designates a behavior "accepted" by $T_1$. It is clear that
every behavior (of $X$) is accepted by $T_1$ unless it involves cars going
simultaneously on both roads (a collision), in which case $T_1$ moves to its
state 2, precluding an infinite number of recur-edge crossings, and thus
precluding the acceptance by $T_1$ of any behavior which includes that
collision event. *Every invariant task may be modelled by such a 2-state
automaton.* (When implemented in a verification computer program, it
is common simply to halt the program — returning an error — when
the condition which labels the state transition $1 \to 2$ is enabled.)

The eventuality task, which we already said is more complicated,
can be modelled by a 4-state automaton $T_2$ (see Appendix A). However,
let us instead decompose $T_2$ as in (1.1), into subtasks which are more
"local" in the sense of pertaining to a smaller portion of $X$ than $T_2$.
This will circumvent computations which involve $X$ and $T_2$, in favor of
less complex computations involving $X$ and simpler subtasks of $T_2$. It
moreover permits the "localization" of $X$ relative to each local subtask.
Localization replaces $X$ with a system which is simplified by collapsing
those portions of $X$ which are irrelevant to the performance of the sub-
task. This lessens the computational complexity of verification of each
subtask, and hence the verification of $T_2$ itself, since the complexity of
$X$ is multiplicative in terms of its components, whereas the complexity
of verifying the decomposed localized task is additive in the number of
subtasks.

We decompose the task $T_2$ into two local subtasks: *all cars on A
eventually get through* and *all cars on B eventually get through.* To do
this, we model the subtasks and then verify that all behaviors common
to each of the two subtasks are behaviors of $T_2$, as in (1.1). Notice that
this decomposition need be only approximate, in the sense that (1.1)
involves only language containment, not equality. Notice also that each
of these subtasks indeed is "local", referring to a smaller portion of $X$
than the more "global" task $T_2$.

*The general problem of how best to decompose a task into more local*

1.1. An Example

*subtasks is an important open problem.*

To model *all cars on A eventually get through*, we may use the 2-state automaton $T_A$ shown in Figure 1.5, and likewise for $T_B$, modelling *all*

Figure 1.5: The automaton $T_A$, modelling the requirement that all cars on Avenue $A$ eventually get through the intersection.

*cars on B eventually get through.* (Notice that a behavior is accepted by $T_A$ *unless* in $A$, at some point cars are waiting, and thereafter neither (A : no_cars) nor (A : cars_going) ever become true.)

We now describe the formal context in which we seek to verify that $X$ performs the tasks defined by $T_1$ and $T_2$. The "behavior" of $X$ is defined in terms of its (nonterminating) executions: (infinite) sequences, each of the form $x = (x_0, x_1, \ldots)$ where each $x_i = x_{A_i} * x_{B_i} * x_{C_i}$, for tokens $x_{A_i}, x_{B_i}, x_{C_i}$ output from $A$, $B$ and $C$ respectively. Thus, for example, we may have $$x_0 = (\text{A : cars\_waiting}) * (\text{B : cars\_waiting}) * (\text{C : go\_A})$$

where $x_{A0} = (\text{A : cars\_waiting})$, etc. In this case, a possible value for $x_1$ is $$x_1 = (\text{A : cars\_going}) * (\text{B : cars\_waiting}) * (\text{C : pause})$$

(the reader is invited to find the other seven possible values for $x_1$).

Let $\mathcal{L}(X)$ (the "language" of $X$) denote the set of all such behaviors x of $X$. Likewise, we define the language $\mathcal{L}(T)$ of an automaton $T$ to be the set of all sequences x accepted by $T$, where each $x_i$ is of the 18                                                              Chapter 1. Introduction form described above. Although each $x_A$, $x_B$, $x_C$, is required to be an output token of $A$, $B$ and $C$ respectively, there is no requirement that $\mathbf{x} \in \mathcal{L}(T)$ satisfy $\mathbf{x} \in \mathcal{L}(X)$.

For example, if for all $i \geq 0$, $$x_i = (\text{A : cars\_waiting}) * (\text{B : cars\_going}) * (\text{C : go\_B}) ,$$

then $\mathbf{x} \notin \mathcal{L}(T_3)$ (also $\mathbf{x} \notin \mathcal{L}(X)$ — why?). On the other hand, if for all $i \geq 0$ $$x_{2i} = (\text{A : cars\_waiting}) * (\text{B : cars\_going}) * (\text{C : pause}) ,$$
$$x_{2i+1} = (\text{A : cars\_going}) * (\text{B : cars\_waiting}) * (\text{C : pause})$$

then $\mathbf{x} \in \mathcal{L}(T_1) \cap \mathcal{L}(T_A) \cap \mathcal{L}(T_B)$ (but again, $\mathbf{x} \notin \mathcal{L}(X)$).

"Verification" of $X$ (in this context) consists of proving that $$\mathcal{L}(X) \subset \mathcal{L}(T_1) \cap \mathcal{L}(T_2) .$$

We do this by checking the following steps:

$$\mathcal{L}(X) \subset \mathcal{L}(T_1) ;$$
$$\mathcal{L}(X) \subset \mathcal{L}(T_A) ;$$
$$\mathcal{L}(X) \subset \mathcal{L}(T_B) ;$$
$$\mathcal{L}(T_A) \cap \mathcal{L}(T_B) \subset \mathcal{L}(T_2) .$$

Consider the first language containment check: although both $\mathcal{L}(X)$ and $\mathcal{L}(T_1)$ are infinite sets, it is possible to check $\mathcal{L}(X) \subset \mathcal{L}(T_1)$ in a finite number of steps. Basically, it works like this: construct the transition system $X \otimes T_1$ (analogous to the earlier definition $X = A \otimes B \otimes C$), and find the cycles in the finite directed graph underlying $X \otimes T_1$. Although there are an infinite number of cycles, they all are captured by the (finite) set of strongly connected components of this graph. (A strongly connected component of a directed graph is a nonempty set of vertices maximal with respect to the property that any ordered pair of vertices from the set are connected by a directed path from the first to the second.) Since $X \otimes T_1$ is a finite state system, any (infinite) behavior $\mathbf{x} \in \mathcal{L}(X \otimes T_1)$ must describe a trajectory which eventually cycles within some single strongly connected component of the graph. It is enough then to check that each strongly connected component is consistent with the acceptance structure (in this case, the *recur* edges) of $T_1$. One can write a decision procedure to perform this check. The details of this are described in Chapter 8.

1.1. An Example

To check $\mathcal{L}(X) \subset \mathcal{L}(T_1)$ as above requires searching a state space roughly of size $|X \otimes T_1| = |A| \cdot |B| \cdot |C| \cdot |T_1| = 2^4$, where $|Z|$ denotes the number of states in $Z$ ("roughly", because some of the states of $X \otimes T_1$ are unreachable from its initial states, and thus do not enter into the decision procedure). As we are interested to be able to perform the language containment check automatically on a computer, we are concerned about the computational complexity of this check: the complexity is (roughly[8]) related to the size $|X \otimes T_1|$ of the state space. We now describe a "reduction" of this language containment test to a search of a smaller state space.

First, we must discuss how we define the language of system components. For the component $A$ of $X$, we define $\mathcal{L}(A)$ as the set of behaviors $x$ *over the same output space as* $X$ consistent with the transition structure of $A$. This takes into account tokens from $B$, although $A$ "doesn't care" about $B$. (This output space is an underlying constant, forming the "alphabet" of all automata/state machines.) Thus, $x \in \mathcal{L}(A)$ has the form $x_i = x_{A_i} * x_{B_i} * x_{C_i}$ described earlier; for $x$ defined by $$x_0 = (A:\text{cars\_waiting}) * (B:\text{cars\_waiting}) * (C:\text{go\_A}),$$
$$x_i = (A:\text{cars\_going}) * (B:\text{cars\_going}) * (C:\text{go\_A})$$

for all $i > 0$, $x \in \mathcal{L}(A)$ while $x \notin \mathcal{L}(B)$, $x \notin \mathcal{L}(C)$ and $x \notin \mathcal{L}(X)$. A basic observation concerning $\otimes$ is that $\otimes$ supports the *language intersection property*:

$$\mathcal{L}(A \otimes B \otimes C) = \mathcal{L}(A) \cap \mathcal{L}(B) \cap \mathcal{L}(C).$$

(The intuition for this is that each component constrains behaviors, and these constraints taken together comprise the constraints of $X$.) Thus, in order to prove that $\mathcal{L}(X) \subset \mathcal{L}(T_1)$, if we can prove instead that $$\mathcal{L}(X') \subset \mathcal{L}(T_1)$$

for $X' = A \otimes B \otimes C'$ with $\mathcal{L}(C) \subset \mathcal{L}(C')$, then by the language intersection property, $\mathcal{L}(X) \subset \mathcal{L}(T_1)$ follows. (However, if $\mathcal{L}(X') \subset \mathcal{L}(T_1)$ fails, $\mathcal{L}(X) \subset \mathcal{L}(T_1)$ may or may not hold.) If $|C'| < |C|$, then $|X'| < |X|$

---

[8] The complexity is related both to the size of the reachable state space and to the algorithm used. If states are explicitly enumerated, then the computational complexity increases linearly with the number of reachable edges, as long as number and width of variables is held constant. Although the number of reachable states/edges is not so well correlated with the computational complexity of algorithms based upon implicit ("symbolic") enumeration of states such as the BDD-based algorithms described in Chapter 10, the decomposition and reduction heuristics described here have been found to be just as useful in conjunction with BDD-based algorithms as with explicit-enumeration algorithms.

20                                                            Chapter 1. Introduction and testing $\mathcal{L}(X') \subset \mathcal{L}(T_1)$ typically[9] involves a search of a smaller state space than does testing $\mathcal{L}(X) \subset \mathcal{L}(T_1)$. If in this context $\mathcal{L}(X) \subset \mathcal{L}(X')$, we say $X'$ is a *reduction* of $X$ (relative to $T_1$). Our candidate for $X'$ is obtained by reducing $C$ to a 1-state model $C'$, having (nondeterministic) outputs from that state consisting of all the 3 tokens of $C$:

(See Figure 1.5A.)

It should be clear upon a moment's reflection that $\mathcal{L}(C) \subset \mathcal{L}(C')$, as $C'$ provides none of the transition constraints that $C$ does. The resulting $X'$ is a particularly trivial form of reduction. In general, $C'$ may have fewer states than $C$, but more than 1 state; moreover, as we shall see shortly, we may get more powerful reductions by changing the underlying alphabet.

In fact it can be checked that $\mathcal{L}(X') \subset \mathcal{L}(T_1)$ and thus we can conclude indirectly that $\mathcal{L}(X) \subset \mathcal{L}(T_1)$, without ever building all of $X$. Furthermore, we could have derived $X'$ algorithmically, by testing $\mathcal{L}(X') \subset \mathcal{L}(T_1)$ successively for $X' = A$ (no), then $X' = A \otimes B$ (yes) which defines the same language as $X' = A \otimes B \otimes C'$ (see Section 8.4 for the general algorithm). This is the *task localization* step (1.3) above.

Next, let us consider the test $$\mathcal{L}(X) \subset \mathcal{L}(T_A) \ .$$

We could apply the same method as before, this time reducing $B$ to a single-state machine $B'$. However, we can do even better than this. From the perspective of analyzing $X$ for the performance of the task $T_A$, there is no need to distinguish among the output tokens of $B$. Thus, let us define an entirely new system $X' = A' \otimes B' \otimes C'$ with associated task $T'_A$, in which $B'$ has a single output token, say (B' : null), and $A'$, $B'$, $C'$ and $T'_A$ are derived from $A$, $B$, $C$ and $T_A$ respectively by replacing every appearance of (B : no_cars), (B : cars_waiting) or (B : cars_going) with the token (B : null). We require that $T_A$ be invariant[10] with respect to this transformation: that $T'_A = T_A$, as is obviously true, since $T_A$ does not involve $B$. After such a simplifying transformation, it may be possible ---
[9] "Typically", because $|C'| < |C|$ typically, although not necessarily, implies that the reachable state space of $X'$ will be smaller than that of $X$.
[10] In Chapter 8, this invariance requirement is relaxed.

*1.1. An Example* 21 to reduce the state spaces of a component, while retaining its respective language (in the transformed token space). For this example, this is the case for $B$: although this transformation gives $A' = A$, $B'$ looks like this (after simplification of expressions):

(See Figure 1.5B.)

Applying state minimization (Section 8.9) to $B'$ gives $B''$ with $\mathcal{L}(B'') = \mathcal{L}(B')$, where $B''$ looks like this[11]:

(See Figure 1.5C.)

(as is readily evident). Although the transition structure of $C'$ is simpler than $C$, for this transformation we cannot reduce the size of the state space of $C'$ and maintain the same language $\mathcal{L}(C')$. (While we could reduce $C$ to a single state as before, it can be checked that the resulting $X'$ would not perform the task — the reduction, while valid, is too great to support verification.)

Setting $X'' = A' \otimes B'' \otimes C'$, since $T'_A = T_A$, $$\mathcal{L}(X'') \subset \mathcal{L}(T'_A) \Rightarrow \mathcal{L}(X) \subset \mathcal{L}(T_A)$$

which is another instance of the *task localization* step (1.3) above. In fact, this task localization results in what is called a *strongly co-linear* reduction, which implies language containment for the reduction is both *necessary* as well as sufficient for containment in the unreduced problem.

---
[11] In this trivial example, minimization reduces $B'$ to a single state, although in general, $B''$ could have any size (up to the size of $B'$).

22                                                          Chapter 1. Introduction However, there is no reason to require $\mathcal{L}(B') = \mathcal{L}(B'')$; $\mathcal{L}(B') \subset \mathcal{L}(B'')$ is enough. Examples show that such a more general reduction can be very effective in reducing verification to computationally tractable checks. A more extensive example which illustrates this relationship is given in Appendix D.

Next, we observe an example of a fairly common method for exploiting symmetry in a model. It is common to find system models which contain a fair amount of symmetry such as the symmetry between $A$ and $B$ in $X$.

Let $\varphi$ be the map of system output tokens which interchanges the tokens of $A$ and $B$ (so $\varphi(\text{A : no\_cars}) = (\text{B : no\_cars})$, etc.), and $$\varphi(\text{C : go\_A}) = (\text{C : go\_B}),$$
$$\varphi(\text{C : go\_B}) = (\text{C : go\_A}),$$
$$\varphi(\text{C : pause}) = (\text{C : pause}).$$

Then $\varphi$ induces a map of the transition predicates, which may be extended to a map of the states and hence of the state machines and automata, themselves, giving $\varphi A = B$, $\varphi B = A$, $\varphi C = C$, $\mathcal{L}(\varphi X) = \mathcal{L}(X)$ and $\varphi T_A = T_B$. Once we have proved that $\mathcal{L}(X) \subset \mathcal{L}(T_A)$, it follows that $\mathcal{L}(X) = \mathcal{L}(\varphi X) \subset \mathcal{L}(\varphi T_A) = \mathcal{L}(T_B)$. Thus, it is unnecessary to perform the specific analysis to prove $\mathcal{L}(X) \subset \mathcal{L}(T_B)$; it is sufficient to prove $\varphi A = B$, $\varphi B = A$ and $\varphi C = C$ (from which it follows that $\mathcal{L}(\varphi X) = \mathcal{L}(X)$), and to prove that $\varphi T_A = T_B$. Each of these checks is computationally simple, being a check on a component rather than a check on the entire system model $X$. In fact, the symmetry of $X$ under $\varphi$ also gives rise to an explicit reduction of $X$, as described in Section 8.10.

Thus, we have reduced the check $$\mathcal{L}(X) \subset \mathcal{L}(T_2)$$

to the check $$\mathcal{L}(X') \subset \mathcal{L}(T_4).$$

In fact, this check fails! The trouble can be seen from the following error track[12] which shows a sequence of global states (i.e., states of

---

[12] This is output of the computer-aided verification tool COSPAN [HK90], [HTKB93], when applied to the system model $X''$ and the property $T_4$; the COSPAN input code for this example is given in Appendix B. COSPAN is an AT&T software tool for Coordination SPecification ANalysis (licensed to universities for noncom-

1.1. An Example $X$) starting from an initial state designated 1(0) and ending in a "Bad cycle", in this case from the state designated 3(1) back to itself. Here $X.A.\$$ is a variable which holds the state of the $A$-component of $X$, $X.B.\$$ holds the state of the *reduced $B''$*-component of $X$ and so on; the variables with suffix '#' store the values of the respective nondeterministically selected output tokens which determine the transitions from one state to the next.

```
1(0) .X.A.$=STOP .X.B.$=0 .X.C.$=go_B .TA.$=0
     .X.A.#=cars_waiting .X.B.#=null .X.C.#=go_B Bad cycle at 3(1) back to 3(1):

3(1) .X.A.$=STOP .X.B.$=0 .X.C.$=go_A .TA.$=1
     .X.A.#=cars_waiting .X.B.#=null .X.C.#=pause
```

The problem is seen to begin in global state designated 3(1), reachable from the initial state designated 1(0) in a single step. At global state 3(1), $A$ has selected cars_waiting and $C$ is in its state go_A, but $C$ has selected pause instead of go_A, so $A$ cannot move out of its state STOP. This error track (See Figure 1.5D.)

terminates in an unaccepted cycle (which may repeat forever), in violation of the task $T_A$. However, we may like to change the model so as to forbid or disregard the possibility that $C$ may "pause" forever. There are a number of ways to do this. For example, we could add it as a restriction to $C$, or as a relaxation of $T_A$. Let us relax $T_A$ so as to model the task: either *all cars on $A$ eventually get through* or $C$

--- mercial research and educational purposes: contact k@research.att.com). There are a number of other generally available software tools which can do this sort of decision-procedure-based analysis, in one form or another (although with widely varying degrees of functionality, expressiveness and efficiency): see Appendix E.

24                                    Chapter 1. Introduction

*eventually pauses forever*. The code[13] for this revised automaton $T_A$ may be found in Appendix C. (It is probably more natural to forbid $C$ to pause forever; also, syntactically this is simpler, and we will see in Chapter 6 how to do this.) To relax $T_A$ (or restrict $C$) we use a second acceptance structure called a "cycle set", a designated set of states of $T_A$. If a behavior of $X$ causes $T_A$ eventually to stay inside a cycle set then that behavior also is accepted by $T_A$.

With this redefinition of $T_A$ (and associated redefinitions of $T_B$ and $T_2$), it can be checked that $\mathcal{L}(X') \subset \mathcal{L}(T_A)$, from which it follows that $\mathcal{L}(X) \subset \mathcal{L}(T_A)$, $\mathcal{L}(X) \subset \mathcal{L}(T_B)$ and hence $\mathcal{L}(X) \subset \mathcal{L}(T_2)$. We also need to verify that the transformation $X \rightarrow X'$ (induced by $B \rightarrow B''$) leaves $T_A$ invariant: $T'_A = T_A$, and that $\mathcal{L}(T_A) \cap \mathcal{L}(T_B) \subset \mathcal{L}(T_2)$. The machinery for all of these checks is developed in the following chapters (and implemented in COSPAN).

1.2  ∗-automata[14] vs. ω-automata

Here is a very brief summary of the relationship between the two classes of automata studied in the literature, the more conventional ∗-automata and ω-automata. Basically, ω-automata are the same as conventional automata which accept strings, except that the final states of the latter (signalling the end of an accepted string) are replaced by an acceptance condition on the set of states visited infinitely often. Readers unfamiliar with these concepts could skip this section and await the formal definitions given in Chapters 5 and 6. Essentially, the difference between the two types is:

a) ∗-automata can express properties "at a state":

> *state invariants* — e.g. $Q.head \geq Q.tail$ (also known as "safety" properties, these may be a function of the sequential history)

b) ω-automata can express state invariants and also

> *eventualities* — e.g. "$x = 0 \Rightarrow$ eventually thereafter $x = 1$"

---

[13]In fact, experience suggests that a library of a dozen parameterized automata suffices to define most tasks used in practice. Thus, the verifier rarely needs to define a task automaton explicitly. (A similar observation has been made in connection with temporal logic [MP90].)

[14]Rabin-Scott automata [RS59], [HU79], accepting strings; term coined by John Thistle [Th91].

1.2. ∗-automata vs. ω-automata c) although eventuality, in looking to the future, in a sense is dual to safety which depends upon the past, in fact there is no natural way to express eventualities with ∗-automata:

*Eg.* Given regular $V$, perhaps $V^\omega = \lim V$? ($\lim V$ is the set of sequences with an infinite number of prefixes in $V$)

$NO$: for $V = 10^*$, $10^\omega \in \lim V$, $10^\omega \notin V^\omega$ perhaps $V^\omega = \lim V^*$?

$NO$: same reason $$V^+ = (10^*)^+ = 1(0+1)^* \qquad V^\omega = (10^*)^+ \lim(0^*1)^*$$

(See Figure 1.5F.)

In fact, the general relationship is given by the following lemma:

Lemma [Cho74, Lemma 5.2] *For any regular $V$, there exists a regular $\tilde{V}$ such that $V^\omega = V^+ \lim \tilde{V}$*

One may distinguish automata according to whether their transitions are deterministic or nondeterministic. While every nondeterministic ∗-automaton may be "determinized", yielding an equivalent deterministic automaton, the same is not true for ω-automata. There are advantages and disadvantages to each type, as the following table shows.

|  | projection | inversion |
|---|---|---|
| Deterministic theory (Muller) | hard | easy |
| Nondeterministic theory (Büchi) | easy | hard |

26                                                              Chapter 1. Introduction

1.3  Background of ω-automata

Although *-automata [RS59, HU79] are much more familiar objects, there is a respectable literature on ω-automata as well. The following is a chronological sample of this literature, skewed towards automata-theoretic verification. The listed citations are representative, but by no means exhaustive. On the other hand, some of the references in section e) are only peripherally related to automata-theoretic verification, employing automata-theoretic techniques only indirectly or inferentially.

*Prehistory*

The ω-automata are natural extensions of *-automata. The *-automata (called then simply "automata", "recognizers" or "acceptors"), developed (independently) from Turing's famous 1936 paper [Tur36] dealing with computability, and McCulloch and Pitts' 1943 paper [MP43] attempting to model neural networks. These two independent but parallel views of finite state transition systems mirror a dichotomy that persists until today: the automaton of Turing as a tool for analyzing computational complexity, and the state machine of McCulloch and Pitts as a generator of behaviors. The automaton view developed through Kleene [Kle56], Chomsky [CM58], Rabin and Scott [RS59] and Hartmanis and Stearns [HS65], while the state machine view developed through Shannon [Sha49], Mealy [Mea55], Moore [Moo56], von Neumann [von56] and Krohn and Rhodes [KR63].

a) *Logic*

The study of explicit ω-automata apparently began in 1960 with Büchi's search for decision procedures in restricted arithmetic: the monadic second-order theory of one successor [Büc60], [Büc62]; this direction was expanded in [BL69], [Lan69], [Rab69], [Sie70], [Büc73], [GH82].

b) *Switching circuits*

In 1963 Muller [Mul63], seeking to specify nonstabilizing switching circuits which can be described properly only in terms of their infinite behavior, proposed a different class of ω-automata. The relationship between Büchi's automata and Muller's — that deterministic Muller automata accept the same languages as nondeterministic Büchi automata — was presented by McNaughton [McN66] three years later. But small bugs remained, and the exposition was difficult to penetrate. These problems were cured and recast in the beautiful exposition of Choueka [Cho74], which relates all the ω-automata known to that time. Safra [Saf88], [Saf92] improved the complexity of translation among automata classes, as well as complementation and determinization, from commonly doubly exponential to singly exponential algorithms.

1.3. Background of $\omega$-automata c) Church's problem

In 1963, Church [Chu63] posed (essentially) the following problem. Given an $\omega$-regular language $\mathcal{L}$, when and how can one construct a finite state machine whose infinite input/output behavior is contained in $\mathcal{L}$. Solutions to Church's problem involve $\omega$-automata viewed as acceptors of infinite trees [BL69], [Lan69], [Rab72], [EC82], [MW84], [PR89a], [PR89b], [Thi91]. This also is related to the controller synthesis problem of discrete event supervisory control [RW87], [CDFV88], [Ram89], [Thi91].

d) Generalizations and abstractions

Excited by the power and potential of $\omega$-automata and their role in decision theories, many researchers began investigating $\omega$-regular languages in their own right [TB73], [Eil74], [Cho74], [CG77a], [CG77b], [Cho78], [Tho79], [Wag79], [Par81], [Str82], [Sta83], [MH84], [Per84], [Arn85], [Kam85], [NP85], [Sta85a], [Pec86], [SVW87], [Lin88], [EJ88], [Saf88], [SV89], [Eme90], [Tho90], [Saf92], [MS93], [PP93]. (See [PP93] for many more references.) It would turn out that all the linear-time logics being developed could be understood in terms of $\omega$-automata; likewise, an understanding of branching-time logics would be found in a generalization of $\omega$-automata, the *tree* automata [Rab69], [Rab72], [MS87], [Eme90], [Tho90], [BVW94] (see e), following).

e) Implicit $\omega$-automata for various logics

The year 1980 could be viewed as holding the roots of $\omega$-automata in formal verification. Several different temporal logics were being proposed for formal verification, and many of the decision procedures for these logics, at first implicitly (and unknowingly) but ultimately explicitly, devolved from the theory of $\omega$-automata. These logics were of two basic varieties: *linear-time*: [Kam68], [RU71], [Pnu77], [GPSS80], [MP81], [Pnu81], [OLS2], [Wol83], [MW84], [AS85], [LP85], [LPZ85], [SC85], [CVW86], [Wol86], [VW86a], [AS87], [AL91], [Coh91], [Lam91], [Kla91], plus very many others — see especially Wolper's clarification of linear-time temporal logic in terms of $\omega$-automata [Wol89], and Emerson's survey [Eme90] for an excellent overview; and *branching-time*: [EC80], [BAMP81], [CE82], [QS82], [CM84], [EL85], [CES86], [EL86], [VW86b], [CG87], [Tho87], [EJ88], [CGK89], [Wol89], [Eme90], [BVW94], and many others. Of special significance in branching-time was the introduction in 1981 of a computationally efficient method of automatic verification called *model-checking* by Clarke and Emerson [CE82], and elaborated in [CES86]. Independently Quielle and Sifakis [QS82] proposed much the same idea (although they did not analyze the complexity of their algorithm, whereas [CE82] makes a point of the importance of its polynomial efficiency). The idea itself had earlier roots, e.g. as early as 1977. Pnueli [Pnu77], [Pnu81] suggested using linear-time temporal logic for specifying and verifying concurrent programs (although efficient decision procedures came later). Also related in terms of its models is the widely-studied Hennessy-Milner logic [HM85] associated with Milner's CCS [Mil80], an implied branching-time logic. A succinct description of CCS, its branching-time structure and deciding equivalence is found in [KS90]; for a more elaborated description, see also [Hen88], [Wal88]. Emerson's survey [Eme90] also gives an excellent overview of branching-time logic. Just as linear-time logic may be understood in terms of $\omega$-automata, branching-time logic may be understood in terms of tree-automata, as clearly explained in Thomas' survey [Tho90]. For a unified treatment, see [BVW94]. Owing mainly to the work of Clarke and his students in developing the idea and convincingly showing its utility, computationally efficient model-checking, discussed further in Section 7.5, revolutionized formal verification. Model-checking turned verification from a largely intractable (or even undecidable) undertaking involving theorem-proving or at best exponentially complex satisfiability-testing, to a decision procedure with linear time complexity. This idea, more than any other single event, opened the way for practical formal verification.

f) *Explicit $\omega$-automata for formal verification*
The theoretical foundations for $\omega$-automata laid in d) first crossed over to formal verification via linear-time temporal logic, in the ground-breaking paper of Wolper [Wol83], presented at the FOCS symposium in 1981. In this paper, Wolper showed that linear-time temporal logic was insufficient to express certain simple sequential properties (such as, that a property is true at every 2nd event in an event sequence). He proposed an extension which gave the logic the expressiveness of $\omega$-automata. (The expressiveness of linear-time temporal logic alone was known earlier, however, to be that of the $*$-free $\omega$-regular languages [Lad77], [Tho79], [Tho81]). This marked the migration of the growing powerful body of theoretical work on $\omega$-automata over to the more practical side of formal verification. This migration was slower and more tenuous than one might have expected. Along the way was the prescient (but largely ignored, at first) [WVS83] as well as another complaint about the inadequacy of temporal logic compared to $\omega$-automata, for certain types of verification [LPZ85]. One reason for the slow migration to $\omega$-automata may have been due to a reluctance to take the idea of automata-theoretic verification seriously enough to think about it deeply and broadly, prior to the advent of widely available high-speed computing. Only with today's computational power, has automata-

1.3. Background of ω-automata theoretic verification become practical. Another reason seems to have been a myopia which focused mainly on logic. Moreover, not infrequently, especially in the earlier years, when an automata-theoretic result was needed, it was reinvented rather than drawn from the established literature. Nonetheless, since around 1987, stimulated to a large degree by the influence of Vardi in a sequence of papers beginning with [VW86a] and [SVW87], automata-theoretic verification has been gaining momentum: [AKS83a], [WVS83], [AS85], [Kur85a], [LPZ85], [CVW86], [VW86b], [AS87], [Kur87b], [MP87], [Var87], [CY88], [Saf88], [Dil89], [Ram89], [SV89], [Var89], [AD90], [Eme90], [Kur90], [Var91], [CVWY92], [DHWT92], [FMJJ92], [Saf92], [CDK93], [WL93], [AD94], [Kur94d] are representative.

30	Chapter 1. Introduction

Chapter 2

Boolean Algebra

Figure 2A:
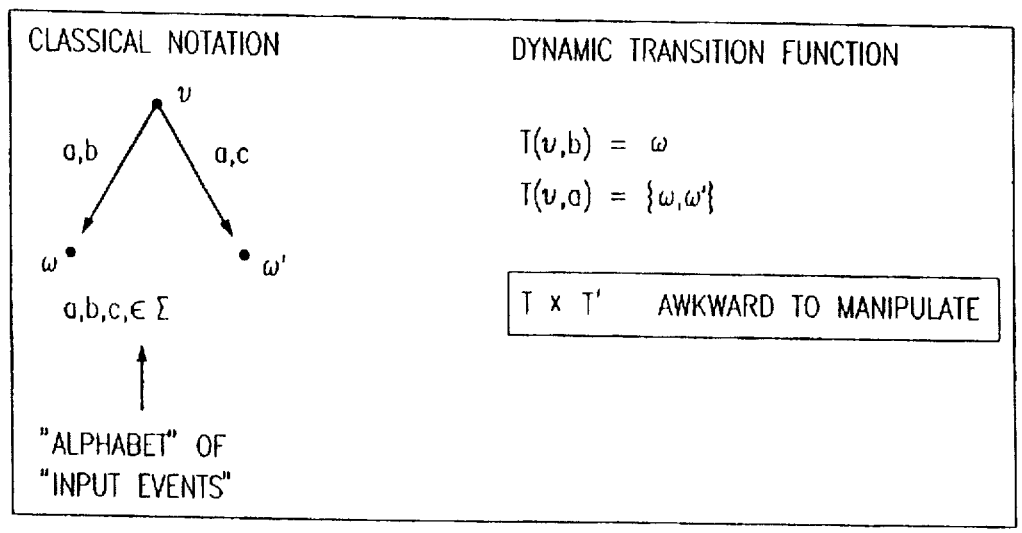
FIG. 2.1 illustrates classical dynamic representation of an automaton transition structure.
Figures 2B, 2C, 2D:
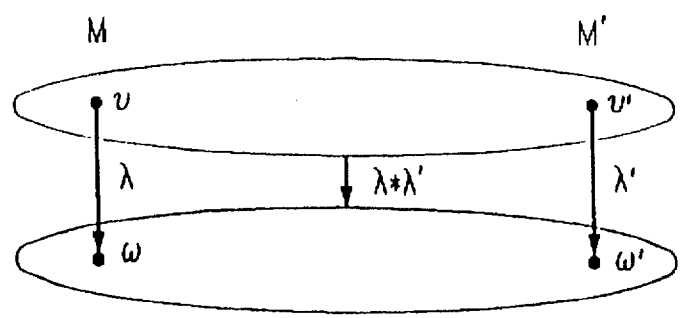

An *automaton*, defined precisely in Chapters 5 and 6, is a finite-state transition system used to define a set of strings or sequences of discrete-event behaviors. Classically, the transition structure of an automaton is Figure 2.1: Classical "dynamic" representation of an automaton transition structure, in terms of a transition function $T$ which gives "next" states as a function of a "current" state $v$ and input $a$.

represented "dynamically" in terms of a transition function which gives the "next" states as a function of each "current" state and input, as in Figure 2.1. When the "alphabet" of "inputs events" is represented by 32                    *Chapter 2. Boolean Algebra* the values of a vector x (as typically is the case in practice), this representation can be very cumbersome. For example, if $x = (x_1, \ldots, x_n)$, then the alphabet of inputs has the form:

$$a = (0, 0, \ldots, 0)$$
$$b = (0, 0, \ldots, 1)$$
$$c = (\qquad)$$
$$\vdots$$

However, transition conditions often may be encoded more concisely than by enumeration. For example, for $n = 3$, the condition for the left-hand transition is expressed more concisely than the equivalent condition for the right-hand transition:

(See Figure 2.1A.)

Such a coding gives rise to a Boolean algebra of transition predicates, and a "static" representation of the transition structure, as in Figure 2.2. In the static representation, each directed edge or transition $(v, w)$ is labelled by a Boolean predicate $M(v, w)$ which determines the values of x for which the transition is enabled. If $a = (a_1, \ldots, a_n)$ defines a value of the generic input vector $x = (x_1, \ldots, x_n)$, define the conjunction of static transition function $$M(v, w) = \text{Boolean transition condition}$$

Figure 2.2: Static representation of an automata transition structure, in terms of Boolean predicates of the generic input $x = (x_1, \ldots, x_n)$, where + denotes logical OR and * denotes logical AND.

Figure 2.3: The parallel composition of the transition structures $M$ and $M'$, when represented statically, has the following nice representation:
$$(M \times M')((v,v'), (w,w')) = M(v,w) * M'(v',w')$$
for all states $v, w$ of $M$ and $v', w'$ of $M'$.

Boolean predicates $\hat{a} = (x_1 = a_1) * (x_2 = a_2) * \cdots * (x_n = a_n)$. The relationship between the static transition function $M$ and the dynamic transition function $T$ is given by: $w \in T(v, a)$ if and only if the conjunction $\hat{a} * M(v,w) \neq 0$. A proposal to represent automata transition structures statically in terms of the Boolean algebra of input predicates appeared as early as 1959 [Tse59] but then apparently was largely forgotten. Another important advantage of the static representation is that, notationally, the parallel conjunction of the two transition structures taken together, $M \times M'$, is easy to represent, as shown in Figure 2.3. More specifically, $M$, $M'$ can be represented by matrices over the Boolean algebra of transition predicates, as shown in Figure 2.4. Then $M \times M'$ is the tensor product $M \otimes M'$ of these matrices.

Figure 2.4: Static representation of the transition structure is a matrix over the Boolean algebra of transition predicates.

2.1 Boolean Algebra $L$

A Boolean algebra [Hal74] is a set $L$ with distinguished elements $0, 1 \in L$, closed under the Boolean operations:

$$* \quad - \quad \text{AND}$$
$$+ \quad - \quad \text{OR}$$
$$\sim \quad - \quad \text{NOT}$$

with universal element 1, and its complement 0. The following axioms for a Boolean algebra are given in [Hal74]:

2.1.1 Definition A *Boolean algebra* is a set $L$ with two distinguished elements 0, 1, and admitting of two binary operations $+$, $*$ and a unary operation $\sim$, satisfying for all $x, y, z \in L$:

| | | | |
|---|---|---|---|
| 1 | $\sim 0 = 1$ | | $\sim 1 = 0$ |
| 2 | $x * 0 = 0$ | | $x + 1 = 1$ |
| 3 | $x * 1 = x$ | identity rules | $x + 0 = x$ |
| 4 | $x * \sim x = 0$ | | $x + \sim x = 1$ |
| 5 | $\sim(\sim x) = x$ | reflexivity | |
| 6 | $x * x = x$ | idempotency | $x + x = x$ |
| 7 | $\sim(x * y) = \sim x + \sim y$ | de Morgan | $\sim(x + y) = \sim x * \sim y$ |
| 8 | $x * y = y * x$ | commutativity | $x + y = y + x$ |
| 9 | $x * (y * z) = (x * y) * z$ | associativity | $x + (y + z) = (x + y) + z$ |
| 10 | $x * (y + z) = (x * y) + (x * z)$ | distributivity | $x + (y * z) = (x + y) * (x + z)$ |

From 3, 4, 8, and 10, all the others may be derived [Hal74].

2.1.2 Definition For $x, y \in L$, write $x \leq y$ if and only if $x * y = x$. If every set of elements of $L$ contains an infimum and supremum in $L$ relative to the partial order $\leq$, then $L$ is *complete*. (Obviously, every finite Boolean algebra is complete.)

2.1.3 Definition $S(L)$ — the *atoms* of $L$, are the nonzero elements of $L$ minimal with respect to $\leq$. A Boolean algebra is *atomic* if every non-zero element dominates an atom.

Clearly, every finite Boolean algebra is atomic. For the purpose of this book, we may assume every Boolean algebra is finite, although infinite $L$ arise in certain contexts, including modelling real-time systems. (However, all the results carry over to arbitrary atomic, complete Boolean algebras unless otherwise stated, and all proofs will be written so that they will be correct in this context.)

2.1. Boolean Algebra L   35

2.1.4 Notes

1. $s, t \in S(L)$, $s \neq t \Rightarrow s * t = 0$.

2. Every nonzero element of a finite Boolean algebra is a sum of a unique set of atoms.

3. The infimum (supremum) of a set of elements is their product (sum).

2.1.5 Example Let $L$ be the set of all subsets of an "alphabet" $S$ : $L = 2^S$. Every finite Boolean algebra may be represented in this form. For $L = 2^S$, $$\begin{aligned} * &= \cap \\ + &= \cup \\ \sim &= {}' \text{ (set complementation)} \\ 0 &= \varphi \text{ (empty set)} \\ 1 &= S \end{aligned}$$

and $S(L) = \{\{s\} \mid s \in S\}$.

2.1.6 Lemma Let $L$ be a Boolean algebra. Then for $x, y \in L$, the following are equivalent:

a) $x \leq y$, $y \leq x$;

b) $x * \sim y + y * \sim x = 0$;

c) $x = y$.

2.1.7 Definition For $L, L'$ Boolean algebras, a map $$\varphi : L \longrightarrow L'$$

is a *homomorphism* provided $$\begin{aligned} \varphi(x + y) &= \varphi(x) + \varphi(y) \\ \varphi(x * y) &= \varphi(x) * \varphi(y) \\ \sim\varphi(x) &= \varphi(\sim x) \,. \end{aligned}$$

A *monomorphism* is a homomorphism which is 1-1, while an *isomorphism* is a monomorphism which is onto. In case $\varphi$ is an isomorphism, we write $L \cong L'$. If $L' = L$, an isomorphism is said to be an *automorphism*.

36                                    Chapter 2. Boolean Algebra

2.1.8 Definition The *kernel* of a homomorphism $\varphi : L \to L'$ is $\ker \varphi = \{x \in L \mid \varphi(x) = 0\}$.

The kernel defines the part of $L$ which may be "disregarded" from the perspective of $L'$; cf. Theorem 4.2.7, for example.

2.1.9 Lemma *Let $\varphi$ be a Boolean algebra homomorphism. Then:* a) $\varphi(1) = 1$, $\varphi(0) = 0$;

b) $x \leq y \Rightarrow \varphi(x) \leq \varphi(y)$;

c) $\ker \varphi = 0 \Leftrightarrow \varphi$ is $1-1$.

Proof:
a)
$$\varphi(1) = \varphi(0 + 1) = \varphi(0) + \varphi(1) = \varphi(0) + \sim\varphi(0) = 1;$$
$$\varphi(0) = \varphi(\sim 1) = \sim\varphi(1) = \sim 1 = 0.$$

b) If $x \leq y$ then $y = x + y$ so $\varphi(y) = \varphi(x + y) = \varphi(x + y * \sim x) = \varphi(x) + \varphi(y * \sim x)$, so $\varphi(x) \leq \varphi(y)$.

c) If $\ker \varphi = 0$ and $\varphi(x) = \varphi(y)$ then
$$\varphi(x * \sim y + y * \sim x) = \varphi(x) * \sim\varphi(y) + \varphi(y) * \sim\varphi(x) = 0$$
so by Lemma 2.1.6.b, $x = y$. If $\varphi$ is $1-1$ and $\varphi(x) = 0$ then since $\varphi(0) = 0$ by a), $x = 0$.

2.1.10 Definition. A Boolean algebra $K$ is a *subalgebra* of a Boolean algebra $L$ if $K \subset L$ and they share the same operations and distinguished elements 0, 1.

2.1.11 Lemma *Let $\varphi : L \to L'$ and let $L'' \subset L$ be a subalgebra. Then $\varphi(L'')$ is a subalgebra of $L'$ and $S(\varphi L'') = (\varphi S(L'')) \setminus \{0\}$; if $\ker \varphi = 0$, $S(\varphi L'') = \varphi S(L'')$.*

Proof. That $\varphi(L'')$ is a subalgebra of $L'$ follows from the linearity of $\varphi$ and $\varphi(1) = 1$ (Lemma 2.1.9). If $y \in S(\varphi L'')$ then $y = \varphi(x)$ for some $x \in L''$. Let $x \in L''$ be minimal with respect to $y = \varphi(x)$. Since $y \in S(\varphi L'')$, $x > 0$. Let $z \in L''$ satisfy $z < x$. Then
$$y = \varphi(x * z + x * \sim z) = \varphi(z) + \varphi(x * \sim z)$$

2.1. Boolean Algebra L and $\varphi(z) * \varphi(x * \sim z) = 0$, so (since $y$ is an atom) either $\varphi(z) = 0$ or $\varphi(x * \sim z) = 0$. If $\varphi(x * \sim z) = 0$ then $y = \varphi(z)$ while $z < x$, contradicting the minimality of $x$. Thus, $\varphi(z) = 0$, so $y = \varphi(x * \sim z)$. But $x * \sim z \leq x$ so by minimality of $x$, $x * \sim z = x$ or $x \leq \sim z$. Then $z \leq \sim x$, $z < x$ so $z = 0$, proving that $x \in S(L'')$, so $S(\varphi L'') \subset \varphi S(L'')$. Now, let $x \in S(L'')$, $x \notin \ker \varphi$, and let $y \in \varphi(L'')$, $y < \varphi(x)$. Say $y = \varphi(z)$, $z \in L''$. Then $z * x = 0$ since otherwise $x \leq z$ in which case $y < \varphi(x) \leq \varphi(z) = y$. Thus, $y = \varphi(z * x) + \varphi(z * \sim x) = \varphi(z * \sim x)$ so $y = y * \varphi(x) = \varphi(z * \sim x) * \varphi(x) = 0$. Hence, $\varphi(x) \in S(\varphi L'')$ and so $\{\varphi S(L'')\} \setminus \{0\} \subset S(\varphi L'')$, while $0 \notin \varphi S(L'')$ if $\ker \varphi = 0$.

2.1.12 Notes In (2.1.11) each atom $x \in S(L'')$ is a sum of atoms in $S(L)$. Since $\varphi(1) = 1$ (Lemma 2.1.9), $\varphi(s) \neq 0$ for some $s \in S(L)$. (In particularly there is no identically 0 homomorphism.) If $\varphi : L \to L$, $L$ is finite and $\ker \varphi = 0$, then $\varphi$ is 1-1, hence onto and thus is an automorphism. In this case, the $n$-fold composition $\varphi^n$ must satisfy $\varphi^n = id$ for some $n > 0$ ($id$ is the identity map).

On account of its multiplicative linearity, any homomorphism must take distinct atoms to elements whose product is 0. The next result shows that this condition together with completeness is enough to give a homomorphism.

2.1.13 Corollary *Let $L$, $L'$ be Boolean algebras, let $S \subset S(L)$, $S \neq \phi$ and let $f$ be any map*

$$f : S \to L'$$

*which satisfies for all $s, s' \in S$:*

$$f(s) * f(s') \neq 0 \Rightarrow s = s' \; ;$$

$$\sum_{s \in S} f(s) = 1 \; .$$

*Then there is a unique homomorphism $\varphi : L \to L'$ which agrees with $f$ on $S$ and has $S(L) \setminus S \subset \ker \varphi$.*

Proof. Define $$\varphi(s) = \begin{cases} f(s) & \text{if } s \in S \\ 0 & \text{if } s \in S(L) \setminus S \text{ or } s = 0 \end{cases}$$

and extend $\varphi$ to $L$ by linearity: $\varphi(\sum s_i) = \sum \varphi(s_i)$ for $s_i \in S(L)$. Note that $\varphi$ is trivially linear with respect to $+$, and for some pairing of equal 38                                                    Chapter 2. Boolean Algebra atoms: $s_i = s'_{j_i}, i \in I$.

$$\begin{aligned}
\varphi(x * y) &= \varphi((\sum s_i) * (\sum s'_i)) \\
&= \varphi\left(\sum_{i \in I} s_i * s'_{j_i}\right) \\
&= \varphi\left(\sum_{i \in I} s_i\right) \\
&= \sum_{i \in I} \varphi(s_i) \\
&= \sum_{i \in I} f(s_i) * f(s'_{j_i}) \\
&= \left(\sum f(s_i)\right) * \left(\sum f(s'_i)\right) \\
&= \varphi(x) * \varphi(y) .
\end{aligned}$$

Finally, $\varphi(\sim 1) = 0$ while for $1 \neq x \in L$, if $\sum s_i = \sim x$ is the atomic decomposition of $\sim x$ and $\sum s'_j$ is the atomic decomposition of $x$ (vacuous if $x = 0$), then $\sum s_i + \sum s'_j = 1$ and $\varphi(\sim x) + \varphi(x) = \sum f(s_i) + \sum f(s'_j) = 1$ so $\sim \varphi(x) \leq \varphi(\sim x)$ since $\sim \varphi(x) * \varphi(\sim x) = \sim \varphi(x) * (\varphi(\sim x) + \varphi(x)) = \sim \varphi(x)$ while $\varphi(\sim x) * \varphi(x) = 0$ so $\varphi(\sim x) * \sim \varphi(x) = \varphi(\sim x) * (\varphi(x) + \sim \varphi(x)) = \varphi(\sim x)$ and $\varphi(\sim x) \leq \sim \varphi(x)$. Thus, $\varphi(\sim x) = \sim \varphi(x)$.

We need the analog of a Cartesian product for Boolean algebras. In case the algebras all are subalgebras of a given algebra, say $L_1, \ldots, L_k \subset L$, we would like to consider $k$-tuples of elements in $L_1 \times \cdots \times L_k$. It is more convenient to consider $k$-fold products $x_1 * \cdots * x_k \in L$, where $x_i \in L_i$ for $i = 1, \ldots, k$. However, these do not in general form a subalgebra of $L$. For that, we must take sums of products

2.1.14 Definition For $L_1, \ldots, L_k \subset L$ subalgebras, define their (interior) product $$\prod_{i=1}^{k} L_i = \left\{ \sum_{j \in J} x_{1j} * \cdots * x_{kj} \;\middle|\; x_{ij} \in L_i, \; J \text{ finite} \right\} .$$

2.1.15 Lemma $\pi L_i$ is a subalgebra of $L$.

2.1.16 Definition $L_1, \ldots, L_k$ are independent if $0 \neq x_i \in L_i, i = 1, \ldots, k \Rightarrow x_1 * \cdots * x_k \neq 0$.

2.1. Boolean Algebra L

2.1.17 Note Writing $$\prod_{i=1}^{k} S(L_i) \equiv \{s_1 * \cdots * s_k \mid s_i \in S(L_i),\ 1 \leq i \leq k\}\ .$$

$S(\Pi L_i) = \Pi S(L_i) \setminus \{0\}$.

2.1.18 Lemma *The following are equivalent:* a) $L_1, \ldots, L_k$ *independent;* b) $S(\Pi L_i) = \Pi S(L_i)$;

c) $0 \notin \Pi S(L_i)$.

2.1.19 Lemma *Let $L_1, \ldots, L_k$ be Boolean algebras. Then there exists a Boolean algebra $L$, unique up to isomorphism, such that:* a) *for each $i = 1, \ldots, k$ there exists a monomorphism*

$$\varphi_i : L_i \longrightarrow L\ ;$$

b) $\varphi_1(L_1), \ldots, \varphi_k(L_k)$ *are independent subalgebras of $L$;* c) $L = \prod_{i=1}^{k} \varphi_i(L_i)$.

Proof. [Sik69, §13]

2.1.20 Definition For Boolean algebras $L_1, \ldots, L_k$, define their (*exterior*) product to be a Boolean algebra $L$ given by Lemma 2.1.19 (unique up to isomorphism). We will identify $L_i$ with $\varphi_i(L_i)$.

2.1.21 Definition For any set $U \subset L$, $\mathbb{B}(U)$ is defined to be the smallest subalgebra of $L$ containing $U$. Let $\mathbb{B} \equiv \mathbb{B}(\{0,1\})$ be the trivial subalgebra (always) $\mathbb{B} \subset L$). For an arbitrary set $V$, define $\mathbb{B}[V]$ to be the Boolean algebra $2^V$ (with Boolean set operations as above). For notational simplicity, for $v \in V$, $\{v\} \in \mathbb{B}[V]$ may be denoted by $v$.

2.1.22 Lemma $\Pi L_i = \mathbb{B}(\cup L_i)$.

40                                       Chapter 2. Boolean Algebra

2.1.23 Lemma *If $0 \notin V \subset L$, $v * w \neq 0 \Rightarrow v = w$ for all $v, w \in V$, and $\sum_{v \in V} v = 1$, then $\mathbb{B}(V) \cong \mathbb{B}[V]$ and $S(\mathbb{B}(V)) = V$.*

2.1.24 Definition Let $x \notin \mathbb{B}$. Denote by $\mathbb{B}[x]$ the Boolean algebra $\mathbb{B}[\{x, \sim x\}]$ with elements $x, \sim x, 0, 1$. Let $\mathbb{B}[x_1, \ldots, x_k] \equiv \prod_{i=1}^{k} \mathbb{B}[x_i]$ (exterior product).

Figure 2.5: $\mathbb{B}[x_1, \ldots, x_N]$ may be visualized as an $N$-cube.

2.1.25 Example $\mathbb{B}[x_1, \ldots, x_N]$ corresponds to the Boolean algebra comprised of $N$ Boolean variables $X_1, \ldots, X_N$ under the correspondence $x_i \mapsto (X_i = 1)$, $\sim x_i \mapsto (X_i = 0)$, for $i = 1, \ldots, N$. One could make other such correspondences, for example, if $L$ is the Boolean algebra defined by the value assignments of a variable $Y$ taking values in the set $0, \ldots, 2^N - 1$, then $L \cong \mathbb{B}[x_1, \ldots, x_N]$ under the isomorphism induced by the association of atoms:

$$\left( Y = \sum_{i=0}^{N-1} a_i 2^i \right) \mapsto \prod_{i=1}^{N} x_i^{(a_i - 1)}$$

2.2. Lifting Lemma 41 where $a_i \in \{0,1\}$ and we denote $x_i^{(0)} \equiv \sim x_i$, $x_i^{(1)} \equiv x_i$ for $i = 1, \ldots, N$. This could be further generalized as follows: let $L_i$ be the Boolean algebra generated by the assignments of a variable $Y_i$ taking values in a finite $R_i$, for $i = 1, \ldots, k$. Then $S(L_i) = \{(Y_i = a) \mid a \in R_i\}$. For $L = \Pi L_i$ (exterior product), $S(L) = \{(Y_1 = a_1) * \cdots * (Y_k = a_k) \mid a_i \in R_i, 1 \leq i \leq k\}$. If $|R_i|$ is a power of 2 for each $i$, then $L \cong \mathbb{B}[x_1, \ldots, x_N]$ for $N = \sum_{i=1}^{k} \log_2 |R_i|$. This last example is especially important for our purposes here, as most of the systems models are defined in terms of system variables $Y_1, \ldots, Y_k$ as above. State transitions of the system model are defined in terms of this Boolean algebra, that is, in terms of assignments to the system variables. Note that predicates such as $Y_1 < Y_2$, $Y_1 = Y_2 + Y_3$, $Y_1 = (Y_2 \text{ if } Y_3 < Y_4 \text{ else } Y_5)$ all are simply abbreviations for elements in $L$:

$$(Y_1 < Y_2) = \sum_{a_1 < a_2} (Y_1 = a_1) * (Y_2 = a_2),$$

$$(Y_1 = Y_2 + Y_3) = \sum_{a_1 = a_2 + a_3} (Y_1 = a_1) * (Y_2 = a_2) * (Y_3 = a_3),$$

$$(Y_1 = (Y_2 \text{ if } Y_3 < Y_4 \text{ else } Y_5)) = \sum_\Gamma \prod_{i=1}^{5} (Y_i = a_i)$$

where $\Gamma$ is the condition $$(a_1 = a_2) * (a_3 < a_4) + (a_1 = a_5) * (a_3 \geq a_4).$$

2.2 Lifting Lemma

The next lemma shows that homomorphisms on independent components can be "lifted" to the product. It forms a cornerstone of the reduction methodology (see Section 8.12).

2.2.1 Lemma *Suppose $L$, $L'$ are Boolean algebras and $L'_1, \ldots, L'_k$ are independent subalgebras of $L' = \Pi L'_i$. If for $i = 1, \ldots, k$*

$$\varphi_i : L'_i \to L$$

*is a homomorphism, then the map*

$$\varphi : L' \to L$$

Chapter 2. Boolean Algebra

*defined by linear extensions of*

$$\varphi(x_1 * \cdots * x_k) = \varphi_1(x_1) * \cdots * \varphi_k(x_k)$$

*for $x_i \in L'_i$ ($1 \leq i \leq k$) is a homomorphism.*

Proof. Since the $L'_i$'s are independent, $$S(L') = \{x_1 * \cdots * x_k | x_i \in S(L'_i), 1 \leq i \leq k\}.$$

Since every element of $L'$ is (uniquely) expressible as a sum of its atoms, $\varphi$ by definition is additively linear. Let $x, y \in L'$, and write $x = \sum x_i$, $y = \sum y_j$, where $x_i, y_j \in S(L')$. Then $$\varphi(x * y) = \varphi\left(\left(\sum_i x_i\right) * \left(\sum_j y_j\right)\right) = \sum_{i,j} \varphi(x_i * y_j).$$

Since $x_i$ and $y_j$ are atoms, $x_i * y_j$ is either $0$ or $x_i$, depending upon whether $x_i \neq y_j$ or $x_i = y_j$, respectively. Likewise, $$\varphi(x) * \varphi(y) = \sum_{i,j} \varphi(x_i) * \varphi(y_j).$$

Write $x_i = x_{i1} * \cdots * x_{ik}$, $y_j = y_{j1} * \cdots * y_{jk}$ for $x_{in}, y_{jn} \in S(L'_n)$, $1 \leq n \leq k$. Then $$\begin{aligned}
\varphi(x_i) * \varphi(y_j) &= \varphi_1(x_{i1}) * \varphi_1(y_{j1}) * \cdots * \varphi_k(x_{ik}) * \varphi_k(y_{jk}) \\
&= \varphi_1(x_{i1} * y_{j1}) * \cdots * \varphi_k(x_{ik} * y_{jk}).
\end{aligned}$$

If $x_i \neq y_j$, then some $x_{in} \neq y_{jn}$ and $\varphi_n(x_{in} * y_{jn}) = \varphi_n(0) = 0$ so $\varphi(x_i) * \varphi(y_j) = 0$; if $x_i = y_j$, then each $x_{in} = y_{jn}$ for $1 \leq n \leq k$ and $\varphi(x_i) * \varphi(y_j) = \varphi_1(x_{i1}^2) * \cdots * \varphi_k(x_{ik}^2) = \varphi(x_i)$. Thus, $\varphi(x_i * y_j) = \varphi(x_i) * \varphi(y_j)$ and hence $\varphi(x * y) = \varphi(x) * \varphi(y)$. Finally, note that for $z_j \in L'_i$, by expanding $z_j$ into a sum of atoms of $L'$, one sees that $\varphi(z_j) = \varphi_i(z_j)$. Thus, $$\begin{aligned}
\varphi(\sim x) &= \varphi(\sim \sum_i x_i) = \varphi(\Pi_i \sim x_i) \\
&= \Pi_i \varphi(\sim x_i) \\
&= \Pi_i \varphi(\sim \Pi_{j=1}^k x_{ij}) \\
&= \Pi_i \varphi\left(\sum_j \sim x_{ij}\right)
\end{aligned}$$

2.2. Lifting Lemma $$\begin{aligned}
&= \Pi_i \sum_j \varphi(\sim x_{ij}) \\
&= \Pi_i \sum_j \varphi_i(\sim x_{ij}) \\
&= \Pi_i \sum_j \sim \varphi_j(x_{ij}) \\
&= \Pi_i(\sim \Pi_j \varphi_j(x_{ij})) = \Pi_i(\sim \varphi(x_i)) \\
&= \sim \sum_i \varphi(x_i) = \sim \varphi\left(\sum_i x_i\right) \\
&= \sim \varphi(x) .
\end{aligned}$$

2.2.2 Definition For homomorphisms $\varphi_1, \ldots, \varphi_k$ as in Lemma 2.2.1, define their product $\Pi \varphi_i = \varphi$ as defined there.

2.2.3 Example Let $L = \mathbb{B}[x, y]$, let $L' = \mathbb{B}[x] \cdot \mathbb{B}[y]$ (interior product of subalgebras $\mathbb{B}[x], \mathbb{B}[y] \subset L$). Then $L' = L$. Let $$\varphi_1 : \mathbb{B}[x] \to L$$
$$\varphi_2 : \mathbb{B}[y] \to L$$

be defined by $$\varphi_1(x) = x ,$$
$$\varphi_2(y) = x$$

and extended linearly. Then by lemma 2.2.1, the map $$\varphi : L' \to L$$

defined by linear extensions of $$\varphi(x * y) = \varphi_1(x) * \varphi_2(y)$$

is a homomorphism. In fact, $\ker \varphi = \{0, x* \sim y, \sim x * y\}$ and $\varphi(L') = \mathbb{B}[x] \subset L$.

Chapter 2 Boolean Algebra

Chapter 3

L-matrix

The automaton transition structure discussed in the previous chapters and illustrated in Figure 2.2 now is defined formally as a matrix over the Boolean algebra of atomic system events. The most common example of an "atomic system event" is a global assignment to system variables. If $Y_1, \ldots, Y_k$ are the variables comprising a system model, and for each $i$, $a_i$ is a possible value of $Y_i$, then the collection of local assignments $$Y_1 = a_1,$$
$$Y_2 = a_2,$$
$$\vdots$$
$$Y_k = a_k$$

one local assignment for each system variable, is such a global assignment. The conjunction over all system variables of these local assignments $$(Y_1 = a_1) * (Y_2 = a_2) * \cdots * (Y_k = a_k)$$

thus is an atomic system event. For $i = 1, \ldots, k$ let $G_i$ be the set of all local assignments of the form $Y_i = a_i$ (for every $a_i$ in the range of $Y_i$). Then, as in Example 2.1.25, $G_i$ is the set of atoms of the Boolean algebra $L_i = \mathbb{B}[G_i]$ which it generates: $G_i = S(L_i)$. The Boolean algebra formed by the exterior product: $L = \prod_{i=1}^{k} L_i$ has as its atoms the set of global assignments. This set of global assignments forms the alphabet for our automata. In the statically defined transition structure, each transition 46 — Chapter 3. L-matrix is labelled by an element of $L$, which thus may be interpreted as a set of letters from this alphabet of global assignments, $S(L)$.

3.1 Transition Structure

3.1.1 Definition Let $V$ be a nonempty set, and let $M$ be a map $$M: V^2 \to L \quad (V^2 = V \times V, \text{ the Cartesian product}).$$

Say $M$ is an *L-matrix* with *vertices* or *state-space* $V(M) = V$, and *edges* or *transitions* $E(M) = \{e \in V^2 | M(e) \neq 0\}$. $M$ provides the (static) transition function for automata. Note that $M(e) = \sum_{\substack{s \in S(L) \\ s \leq M(e)}} s$ (where each $s$ is an "input letter"). For all $v \in V(M)$, define $$s_M(v) = \sum_{w \in V(M)} M(v, w).$$

3.1.2 Definition $M$ is *deterministic* at state $v$ if for each "input letter" $s \in S(L)$, $s \leq M(v, w)$ for at most one state $w$, i.e., provided $$w \neq w' \Rightarrow M(v, w) * M(v, w') = 0.$$

Say $M$ is *deterministic* if $M$ is deterministic at each of its states. $M$ is *complete* if for each state $v$ and for each "input letter" $s$, $s \leq M(v, w)$ for some state $w$, i.e., provided for each $v \in V(M)$, $s_M(v) = 1$.

3.1.3 Definition Let $M, N$ be $L$-matrices with $$V(M) \cap V(N) = \emptyset.$$

Their *direct sum* $M \dotplus N$ is $L$-matrix with $$V(M \dotplus N) = V(M) \cup V(N),$$

defined by:

$$(M \dotplus N)(v, w) = \begin{cases} M(v, w) & \text{if } v, w \in V(M) \\ N(v, w) & \text{if } v, w \in V(N) \\ 0 & \text{otherwise} \end{cases}$$

3.2. Paths

Their *tensor product* $M \otimes N$ is $L$-matrix with $$V(M \otimes N) = V(M) \times V(N),$$

where $$(M \otimes N)((v,v'),(w,w')) = M(v,w) * N(v',w').$$

3.1.4 Note $\oplus$ and $\otimes$ are associative, $\oplus$ is commutative and $\otimes$ distributes over $\oplus$. Disjointness of state-spaces is necessary only for $\oplus$. However, for simplicity, it will be assumed everywhere that $L$-matrices have disjoint state spaces. Thus, in writing $M \oplus M$, it is inferred that the second $M$ is a copy of the first with an isomorphic (but disjoint) state-space. Likewise, in writing $V(M) = V(N)$, it is assumed that $V(N)$ is a distinct copy of $V(M)$. It is enough to assume that each state of an $L$-matrix implicitly is tagged with the name of the matrix.

3.1.5 Lemma *The direct sum and tensor product of deterministic (respectively, complete) $L$-matrices is deterministic (respectively, complete).*

3.1.6 Lemma *For $L$-processes $P$, $Q$ and $v \in V(P)$, $w \in V(Q)$,*

$$s_{P \otimes Q}(v,w) = s_P(v) * s_Q(w).$$

Proof.
$$\begin{aligned}
s_{P \otimes Q}(v,w) &= \sum_{v',w'} (P \otimes Q)((v,w),(v',w')) \\
&= \sum_{v',w'} P(v,v') * Q(w,w') \\
&= \left(\sum_{v'} P(v,v')\right) * \left(\sum_{w'} Q(w,w')\right) \\
&= s_P(v) * s_Q(w).
\end{aligned}$$

3.2 Paths

3.2.1 Definition A *path* in $M$ is a string $\mathbf{v} = (v_0, \ldots, v_n) \in V(M)^{n+1}$ for $n \geq 1$ such that $(v_i, v_{i+1}) \in E(M)$ for $i = 0, \ldots, n-1$. If $v_n = v_0$, $\mathbf{v}$ is a *cycle*. Say $w$ is *reachable* from $v \in V(M)$ or $I \subset V(M)$ if there is a path $\mathbf{v}$ with $v_0 = v$ (respectively, $v_0 \in I$) and $v_n = w$. Say $C \subset V(M)$ is *strongly connected* if for each $v, w \in C$, there is a path in $C$ from $v$ to $w$. (NB: By this definition, $\{v\}$ is strongly connected if and only if $(v,v) \in E(M)$.) A *directed graph* is a $\mathbb{B}$-matrix.

Chapter 3. L-matrix

3.2.2 Definition Given a string $(x_0,\ldots,x_{n-1}) \in L^*$ (respectively, a sequence $\mathbf{x} \in L^\omega$) and a string $(v_0,\ldots,v_n) \in V(M)^*$ (respectively, a sequence $\mathbf{v} \in V(M)^\omega$), say $\mathbf{v}$ is a *run* of $\mathbf{x}$ (in $M$, from $v_0$ to $v_n$ in the string case) provided $\forall i$, $$x_i * M(v_i, v_{i+1}) \neq 0.$$

If $I, F \subset V(M)$ and $\mathbf{v} = (v_0,\ldots,v_n)$ with $v_0 \in I$ and $v_n \in F$, say $\mathbf{v}$ is a run *from $I$ to $F$*.

3.2.3 Note If $L, \hat{L}$ are Boolean algebras, $L \subset \hat{L}$ is a subalgebra and $M$ is an $L$-matrix, then $M$ is also an $\hat{L}$-matrix.

3.2.4 Definition Let $M$ be an $L$-matrix, let $\hat{L} = L \cdot \mathbb{B}[V(M)]$, and define the $\hat{L}$-matrix $\widehat{M}$ by $$V(\widehat{M}) = V(M)$$
$$\widehat{M}(v, w) = M(v, w) * \{w\}$$

[Choueka "deterministic image" ([Cho74, 3.6])].

3.2.5 Lemma *The natural embedding $\varphi: L \hookrightarrow \hat{L}$ is a homomorphism, and $\widehat{M}$ is a deterministic $\hat{L}$-matrix.*

3.2.6 Lemma [Cho74, 13.6]: *If $\mathbf{x} \in L^\omega$, then the following are equivalent:*

1. $\mathbf{v}$ *is a run of* $\mathbf{x}$ *in* $M$;
2. $\mathbf{v}$ *is a run of* $\mathbf{x}$ *in* $\widehat{M}$;
3. $\mathbf{v}$ *is a run of* $(x_i * \{v_{i+1}\})_i$ *in* $\widehat{M}$.

3.3 Projection

Projection corresponds to what often is called *hiding*: it provides a mechanism to remove, for example, the values of certain variables from inclusion in the definition of "behavior". In logical terms, projection of a variable $x$ corresponds to existential quantification: $\exists x$. As Lemma 3.3.2 shows, projection is the "inverse" homomorphic image of the inclusion map.

3.3. Projection

3.3.1 Definition Let $L', L'' \subset L$, and suppose $L', L''$ are independent subalgebras of $L$, with $L = L' \cdot L''$. Let $\Pi_{L'} : L \to L'$ be the projection given by $\Pi_{L'}(s' * s'') = s'$ for atoms $s' \in S(L')$, $s'' \in S(L'')$ and extended linearly to $L$.

3.3.2 Lemma $h : L' \hookrightarrow L$ for $h(x) = \sum \{y | \Pi_{L'}(y) = x\}$ is the inclusion homomorphism.

3.3.3 Lemma

$$\begin{aligned}
\Pi_{L'}(0) &= 0 \\
\Pi_{L'}(1) &= 1 \\
\Pi_{L'}(x+y) &= \Pi_{L'}(x) + \Pi_{L'}(y) \\
\Pi_{L'}(x*y) &\leq \Pi_{L'}(x) * \Pi_{L'}(y) \\
\sim \Pi_{L'}(x) &\leq \Pi_{L'}(\sim x).
\end{aligned}$$

3.3.4 Corollary $\ker \Pi_{L'} = 0$.

Proof. Otherwise, since $S(L) = S(L') * S(L'')$, for some $x \in S(L')$ and $y \in S(L'')$, $0 = \Pi_{L'}(x*y) = x$, a contradiction.

3.3.5 Definition If $L' \subset L$ are as above and $M$ is an $L$-matrix, define $\Pi_{L'} M$ to be the $L'$-matrix given by $$\begin{aligned}
V(\Pi_{L'}M) &= V(M); \\
(\Pi_{L'}M)(v,w) &= \Pi_{L'}(M(v,w)).
\end{aligned}$$

If $f : L \to L'$ is an arbitrary map of Boolean algebras, $fM$ is defined analogously.

3.3.6 Lemma $M$ complete $\Rightarrow \Pi_{L'} M$ complete.

Proof. $\sum_w (\Pi_L M)(v,w) = \sum_w \Pi_L(M(v,w)) = \Pi_L \sum_w M(v,w) = \Pi_L(1) = 1$.

3.3.7 Lemma Let $M, N$ be $L$-matrices and $\varphi$ a homomorphism on $L$. Then Chapter 3. L-matrix a) $M$ complete $\Rightarrow \varphi M$ complete;
b) $M$ deterministic $\Rightarrow \varphi M$ deterministic;
c) $(\varphi M) \odot (\varphi N) = \varphi(M \odot N)$.

Proof.
a) $\sum_w (\varphi M)(v,w) = \varphi \sum_w M(v,w) = \varphi(1) = 1$;

b) $M(v,w) * M(v,w') = 0 \Rightarrow 0 = \varphi(0) = (\varphi M)(v,w) * (\varphi M)(v,w')$;

c) $((\varphi M) \odot (\varphi N))((v,w),(v',w')) = (\varphi M)(v,v') * (\varphi N)(w,w')$
$= \varphi(M(v,v') * N(w,w'))$
$= (\varphi(M \odot N))((v,w),(v',w'))$.

Chapter 4

L-language

We now introduce the vehicle used to define the "behavior" of a transition system. Conceptually, the *behavior* of a transition system is the set of sequentially evolving atomic events consistent with its transition structure. If the atomic events are comprised of global assignments to system variables, as described in the introduction to Chapter 3, then each behavior of the system consists of a sequence of such consecutive global assignments. Since each atomic event is modelled by an atom of the underlying Boolean algebra, each system behavior is a sequence of atoms consistent with the system model transitions structure. The set of behaviors of a system model is its *language*. It is a fundamental part of the theory that behavior is defined in terms of *language*, *not* in terms of the underlying transition structure itself. Several different transition structures may define the same language, and we do not distinguish among them when dealing with the behaviors of a system model. (This is the primary distinction between our theory and the branching-time theories.)

4.1 Model Behaviors

4.1.1 Definition A *string* is a finite-dimensional vector. Let $L$ be a Boolean algebra. An $L$-*-*language* is a subset of $S(L)^+$, the set of strings of atoms of $L$; an $L$-$\omega$-language is a subset of $S(L)^\omega$, the set of sequences of atoms of $L$. A string in $S(L)^+$ sometimes is called a *word*, while a sequence in $S(L)^\omega$ is called an $\omega$-*word*.

52                                                                Chapter 4. L-language

4.1.2 Note In the entire development there is no need to consider the empty string. Furthermore, replacing $+$ by $*$ has no effect on the results. We find it generally convenient to avoid discussion of the empty string, as including it sometimes complicates proofs while not advancing the theory. However, in the interest of convention, we retain the terminology "$L$-$*$-language" (and later, "$*$-regular") in favor of the better "$L$-$+$-language" ($+$-regular).

4.1.3 Definition Let $L, L'$ be arbitrary Boolean algebras, $$\sigma : S(L) \to S(L')$$

an arbitrary map and define $$\Phi : S(L)^+ \to S(L')^+$$

by $\Phi(\mathbf{x}) = (\sigma(x_i))_i$. Then $\Phi$ is said to be a *language homomorphism with support* $\sigma$. $\Phi$ extends naturally to $L$-$*$-*languages*: subsets of $S(L)^+$. We make the identical definition with $\omega$ in place of $+$. For a projection $\Pi_{L'}$ (as in (3.3.1)), the language homomorphism with support $\Pi_{L'}$ is denoted by $\Pi_{L'}$ as well.

4.2 Duality of Homomorphisms

We now establish a duality between language homomorphisms and Boolean algebra homomorphisms. This is a fairly technical section, and could be skimmed on a first reading, taking note of the following discussion, the Definition 4.2.1, the main result: Theorem 4.2.18, and the Examples 4.2.16, 4.2.20. It is needed for Section 6.3 and Chapter 8.

For each Boolean algebra homomorphism $\varphi : L' \to L$ we define its support $\hat\varphi : L \to L'$ with the property that $\hat\varphi : S(L) \to S(L')$. Thus $\varphi$ induces a unique language homomorphism $\Phi_\varphi$, namely, that language homomorphism with support $\hat\varphi|_{S(L)}$. Conversely, given a language homomorphism $\Phi$ with support $\sigma$, we establish the existence of a unique Boolean algebra homomorphism $\varphi_\Phi$ with support $\hat\varphi_\Phi$ satisfying $\hat\varphi_\Phi|_{S(L)} = \sigma$. Moreover, $$\varphi_{\Phi_\varphi} = \varphi$$
$$\Phi_{\varphi_\Phi} = \Phi$$

The map $$\Phi : S(L)^\sim \to S(L')^\sim$$

4.2. Duality of Homomorphisms is a map of *behaviors* induced by the support $$\sigma : S(L) \to S(L')$$

mapping *atomic events*. Theorem 4.2.18 shows that the *behavior* map $\Phi$, which may be visualized as mapping *detailed* behaviors into *abstract* behaviors, is fully characterized by a *structure* map $$\varphi : L' \to L$$

which may be visualized as mapping an *abstract* structure: an $L'$-matrix $M$, to a *detailed* structure: the $L$-matrix $\varphi M$. The connection between $\Phi$ and $\varphi$ is given by the relationship $$\widehat{\varphi}|_{S(L)} = \sigma \ .$$

If the abstract event $x \in S(L')$ is the abstraction of the detailed events in $\sigma^{-1}(x) = \{x_1, \ldots, x_N\} \subset S(L)$:

(See Figure 4.1A.)

$$\sigma : S(L) \to S(L')$$

then $$\varphi(x) = x_1 + \cdots + x_n \ .$$

If $\ker \varphi = 0$, then $\Phi$ is onto $S(L')^\omega$ and $$\widehat{\varphi}(\varphi M) = M \ .$$

The canonical example of a Boolean algebra homomorphism is the one in which $L'$ is defined by a partition of the elements of $L$, as in Example 4.2.20. Any association of atoms of $L'$ with partition elements of atoms of $L$ gives rise to such a homomorphism. An explanation of why we must deal with $\varphi$ — in addition to $\sigma$ and $\widehat{\varphi}$ — is given in Note 6.3.14.

4.2.1 Definition Let $\varphi : L' \to L$ be a Boolean algebra homomorphism. Define $$\widehat{\varphi} : L \to L' \quad (\text{the } support \text{ of } \varphi)$$

by $$\widehat{\varphi}(x) = \Pi\{y \in L' \mid x \leq \varphi(y)\} \ .$$

Chapter 4. L-language

Thus, $\hat{\varphi}(x)$ is the smallest element $y$ of $L'$ for which $\varphi(y)$ dominates $x$. The support $\hat{\varphi}$ is an approximate inverse to $\varphi$ on $\varphi(L')$, and $\hat{\varphi} = \varphi^{-1}$ when $\ker \varphi = 0$ (Theorem 4.2.7). Moreover, $\hat{\varphi}$ establishes the duality between a language homomorphism $$\Phi: S(L)^+ \to S(L')^+ \text{ or } \Phi: S(L)^- \to S(L')^-$$

and a Boolean algebra homomorphism $\varphi: L' \to L$ (Theorem 4.2.18). The support $\sigma$ of $\Phi$ maps atoms of $L$ to atoms of $L'$; the support $\hat{\varphi}_\Phi$ of $\varphi_\Phi$ agrees with $\sigma$ on $S(L)$ and $\varphi_\Phi$ maps an atom $x$ of $L'$ to the sum of atoms of $L'$ which $\sigma$ maps to $x$:

$$\varphi_\Phi(x) = \sum_{\sigma(y)=x} y \ .$$

For the rest of this section, assume $\varphi$, $L$ and $L'$ are as in (4.2.1).

4.2.2 Example Let $L$, $L'$ and $\varphi$ be as in Example 2.2.3. Then $$\hat{\varphi}: L \to L'$$

according to the values given in the following table:

| $a$ | $\hat{\varphi}(a)$ |
|---|---|
| 0 | 0 |
| 1 | $x * y + \sim x * \sim y$ |
| $x$ | $x * y$ |
| $y$ | $x * y + \sim x * \sim y$ |
| $x * y$ | $x * y$ |
| $x * \sim y$ | $x * y$ |
| $\sim x * y$ | $\sim x * \sim y$ |
| $\sim x * \sim y$ | $\sim x * \sim y$ |

4.2.3 Lemma *For all $x \in L$, $y \in L'$, $x \leq (\varphi \circ \hat{\varphi})(x)$, $(\hat{\varphi} \circ \varphi)(y) \leq y$.*

Proof. It follows from the Stone representation theorem [Hal74] that for $x \in L$, $\varphi(\hat{\varphi}(x)) = \Pi\{\varphi(y) | y \in L', x \leq \varphi(y)\} \geq x$. For $y \in L'$, $(\hat{\varphi} \circ \varphi)(y) = \Pi\{y' \in L' | \varphi(y) \leq \varphi(y')\} \leq y$.

4.2.4 Lemma $\hat{\varphi}(x) = 0 \Leftrightarrow x = 0$.

Proof. Since $0 \leq \varphi(0) (= 0)$, $\hat{\varphi}(0) = \Pi\{y \in L' | 0 \leq \varphi(y)\} \leq 0$. Conversely, if $\hat{\varphi}(x) = 0$ then by (4.2.3), $x \leq \varphi(\hat{\varphi}(x)) = \varphi(0) = 0$.

4.2. Duality of Homomorphisms

4.2.5 Lemma $\hat{\varphi}: S(L) \to S(L')$.

Proof. Say $x \in S(L)$ and $\hat{\varphi}(x) = y + z$. Then by (4.2.3), $x \leq \varphi(\hat{\varphi}(x)) = \varphi(y) + \varphi(z)$. Since $x \in S(L)$, we may suppose $x \leq \varphi(y)$; but then $y + z = \hat{\varphi}(x) \leq y$ from the definition of $\hat{\varphi}(x)$, so $z \leq y$. By (4.2.4), $\hat{\varphi}(x) \neq 0$, so it follows that $\hat{\varphi}(x) \in S(L')$.

4.2.6 Lemma For all $x, y \in L$, a) $\hat{\varphi}(x + y) = \hat{\varphi}(x) + \hat{\varphi}(y)$;

b) $\hat{\varphi}(x * y) \leq \hat{\varphi}(x) * \hat{\varphi}(y)$;

c) $x \leq y \Rightarrow \hat{\varphi}(x) \leq \hat{\varphi}(y)$.

Proof.
a) Since $x \leq \varphi(\hat{\varphi}(x))$ and $y \leq \varphi(\hat{\varphi}(y))$, $x + y \leq \varphi(\hat{\varphi}(x)) + \varphi(\hat{\varphi}(y)) = \varphi(\hat{\varphi}(x) + \hat{\varphi}(y))$ so by the definition of $\hat{\varphi}$, $\hat{\varphi}(x + y) \leq \hat{\varphi}(x) + \hat{\varphi}(y)$. Conversely, by (4.2.3), $x \leq x + y \leq \varphi(\hat{\varphi}(x+y))$ so again by the definition of $\hat{\varphi}$, $\hat{\varphi}(x) \leq \hat{\varphi}(x + y)$; similarly, $\hat{\varphi}(y) \leq \hat{\varphi}(x + y)$ so $\hat{\varphi}(x) + \hat{\varphi}(y) \leq \hat{\varphi}(x + y)$.
b) Since $x * y \leq x$ and $x * y \leq y$, by the additivity of $\varphi$, $\varphi$ is monotone and hence $\varphi(x * y) \leq \varphi(x)$, $\varphi(x * y) \leq \varphi(y)$ so $\varphi(x * y) \leq \varphi(x) * \varphi(y)$.
c) Set $z = y * \sim x$. Then, by a), $\hat{\varphi}(x) \leq \hat{\varphi}(x) + \hat{\varphi}(z) = \hat{\varphi}(x + z) = \hat{\varphi}(y)$.

4.2.7 Theorem The following are equivalent:

1. $\ker \varphi = 0$;

2. $\hat{\varphi}$ is onto $L'$;

3. $\hat{\varphi}|_{S(L)}$ is onto $S(L')$;

4. $\hat{\varphi}(1) = 1$;

5. $\hat{\varphi} \circ \varphi = id$;

6. $\Phi$ (the language hom with support $\hat{\varphi}|_{S(L)}$) is onto.

$1 \Rightarrow 5$: Let $z = \hat{\varphi}(\varphi(y))$, $z' = y * \sim z$. Then $z * z' = 0$ so $\varphi(z) * \varphi(z') = 0$. By (4.2.3), $\varphi(y) \leq \varphi(\hat{\varphi}(\varphi(y))) = \varphi(z)$ so $\varphi(z) + \varphi(z') = \varphi(z + z') = \varphi(y + z) = \varphi(y) + \varphi(z) = \varphi(z)$ and thus $\varphi(z') = 0$. Since $\ker \varphi = 0$, Chapter 4. L-language $z' = 0$ so $y \leq z = \hat{\varphi}(\varphi(y))$. But $\hat{\varphi}(\varphi(y)) \leq y$ by (4.2.3) so $\hat{\varphi}(\varphi(y)) = y$.
5 ⇒ 3: $\hat{\varphi}S(L) \subseteq S(L')$ by (4.2.5); 5 ⇒ $\hat{\varphi}$ is onto.
3 ⇒ 2: $L' = \mathbb{B}(S(L'))$.
2 ⇒ 1: If $\varphi(y) = 0$ then $\varphi(\hat{\varphi}(x)) = 0$ for some $x \in L$ (with $\hat{\varphi}(x) = y$) by 2, and $x \leq \varphi(\hat{\varphi}(x)) = 0$ so $x = 0$. Thus, by (4.2.4) $y = 0$.
4 ⇒ 3: If $\hat{\varphi}(1) = 1$ then by (4.2.5) and (4.2.6.a), $$\sum_{s' \in S(L')} s' = 1 = \hat{\varphi}(1) = \hat{\varphi}\left(\sum_{s \in S(L)} s\right) = \sum_{s \in S(L)} \hat{\varphi}(s)$$

and 3 follows.
3 ⇒ 4: $1 = \sum s' = \sum \hat{\varphi}(s) = \hat{\varphi} \sum s = \hat{\varphi}(1)$.
6 ⇔ 3: $\Phi$ is pointwise-induced by $\hat{\varphi}$ on $S(L)$.

4.2.8 Corollary *For all $y \in L'$,*

(*) $$\varphi(y) = \sum_{\hat{\varphi}(x) \leq y} x \geq \sum_{\hat{\varphi}(x) = y} x$$

*if* $\ker \hat{\varphi} = 0$ *then equality holds between the two sums.*

Proof. If $\hat{\varphi}(x) \leq y$ then $x \leq \varphi(\hat{\varphi}(x)) \leq \varphi(y)$ so $\sum_{\hat{\varphi}(x) \leq y} x \leq \varphi(y)$. On the other hand, $\hat{\varphi}(\varphi(y))$ by (4.2.3) so substituting $\varphi(y)$ for one of the summands $x$ gives $\sum_{\hat{\varphi}(x) \leq y} x \geq \varphi(y)$ and thus (*) holds. If $\ker \hat{\varphi} = 0$ then by (4.2.7) $\hat{\varphi}$ is onto. For each $x \in L$ such that $\hat{\varphi}(x) < y$, let $z = y \sim \hat{\varphi}(x)$. Since $\hat{\varphi}$ is onto there is some $x' \in L$ such that $\hat{\varphi}(x') = z$. Then, by (4.2.6.a), $\hat{\varphi}(x + x') = \hat{\varphi}(x) + \hat{\varphi}(x') = y$. It follows that (*) is an equality.

We now may form a clearer picture of the relationship between $\hat{\varphi}$ and $\varphi$. Is $\hat{\varphi} = \varphi^{-1}$? No, as $\varphi$ typically is not even onto $L$, whereas $\hat{\varphi}$ is defined on all of $L$. Is $\hat{\varphi} = \varphi^{-1}$ on $\varphi(L') \subseteq L$? No, as $\hat{\varphi}$ is a function, whereas $\varphi$ need not be $1 - 1$. What if $\varphi$ is $1 - 1$? Yes, in this case, by Theorem 4.2.7, $\hat{\varphi} \circ \varphi = id$ and thus $\hat{\varphi} = \varphi^{-1}$ on $\varphi(L')$. What about the other way: perhaps $\hat{\varphi}^{-1} = \varphi$? No, because $\varphi$ is a function and $\hat{\varphi}$ need not be $1 - 1$. If $\hat{\varphi}$ is $1 - 1$ and onto, then by Theorem 4.2.7, $\varphi$ is $1 - 1$ and thus onto if $L$ is finite, so $\varphi$ is an isomorphism with $\varphi^{-1} = \hat{\varphi}$. If $\hat{\varphi}$ is simply onto, then by Theorem 4.2.7 $\ker \hat{\varphi} = 0$ and thus by (4.2.8), $$\varphi(y) = \sum_{x \in \hat{\varphi}^{-1}(y)} x$$

4.2. Duality of Homomorphisms (Sikorski [Sik69] thus says that $\varphi$ is the homomorphism *induced* by the point map $\hat{\varphi} : S(L) \to S(L')$.)

In the main result of this section, it is shown that the conditions of (4.2.5), (4.2.6.a) and (4.2.8) characterize the homomorphism $\varphi$. This will enable us to define $\varphi$ from $\hat{\varphi}|_{S(L)}$.

Say that an arbitrary function $f : L \to L'$ is *additively linear* (respectively, *monotone*) if $f(x + y) = f(x) + f(y)$ (respectively, $x \leq y \Rightarrow f(x) \leq f(y)$) for all $x, y \in L$. If $f$ is additively linear, then, as in the proof of (4.2.6.c), $f$ is monotone. The following theorem, proved below, establishes the homomorphism duality described at the start of the section.

4.2.9 Theorem [Sik69] *If* $f : L \to L'$ *is additively linear and* $f : S(L) \to S(L')$ *then the map* $\varphi : L' \to L$ *defined by*

$$\varphi(y) = \sum_{f(x) \leq y} x$$

*is a homomorphism and for all* $0 \neq x \in L'$, $\hat{\varphi}(x) = f(x)$.

4.2.10 Notes

1. Without the requirement that $f : S(L) \to S(L')$, it may happen that $f$ is additively linear (even onto $L'$) and yet both the map $\varphi(y) = \sum_{f(x) \leq y} x$ and the map $\varphi(y) = \sum_{f(x) = y} x$ are each not even additively linear (and thus not a homomorphism). Indeed, let $L = \mathbb{B}[x, y]$, $L' = \mathbb{B}[z]$ and define $f : L \to L'$ by $f(x * y) = z$, $f(x * \sim y) = \sim z$, $f(\sim x * y) = f(\sim x * \sim y) = 1$ and extend this to $L$ by linearity, with $f(0) = 0$. Then $f$ is additively linear by construction, but $\varphi(1) = 1$ whereas $\varphi(z) + \varphi(\sim z) = x * y + x * \sim y = x < 1$.

2. In (4.2.9), if $|fS(L)| = 1$ (i.e., if $f$ maps $S(L)$ to a single atom of $L'$) then the homomorphism $\varphi$ satisfies $$\varphi(y) = \begin{cases} 1 & \text{if } f(1) \leq y \\ 0 & \text{otherwise} \end{cases}.$$

It also could happen that $f(0) = f(1) > 0$. On the other hand, if $|fS(L)| > 1$, say $s, t \in S(L)$ and $f(s) \neq f(t)$, then $f(0) + f(s) = f(0 + s) = f(s)$ so $f(0) \leq f(s)$ and likewise $f(0) \leq f(t)$. Thus, since $f(s) * f(t) = 0$, $f(0) = 0$.

58                                                    Chapter 4. L-language

3. Although $\hat{\varphi}$ is additively linear (Lemma 4.2.6), in general $\hat{\varphi}$ is not multiplicatively linear and does not carry subalgebras to subalgebras, even if ker $\varphi = 0$. However, if $\varphi$ is an isomorphism (1-1 and onto) then $\hat{\varphi} = \varphi^{-1}$ is the inverse isomorphism, by Corollary 2.1.13.

4.2.11 Lemma $x \leq \sum_{f(x) \leq f(x)} x$.

Proof. Since $f(x) \leq f(x)$, $x$ is a summand of the rhs.

4.2.12 Lemma $f\varphi(y) \leq y$, $\varphi f(x) \geq x$.

Proof. $f\varphi(y) = f \sum_{f(x) \leq y} x = \sum_{f(x) \leq y} f(x) \leq y$, $\varphi f(x) = \sum_{f(z) \leq f(x)} z \geq x$.

Proof of (4.2.9). Let $y_1, y_2 \in L'$. Then $f(\varphi(y_1) + \varphi(y_2)) = f\varphi(y_1) + f\varphi(y_2) \leq y_1 + y_2$ by (4.2.12), so by (4.2.11)

$$\varphi(y_1) + \varphi(y_2) \leq \sum_{f(x) \leq f(\varphi(y_1) + \varphi(y_2))} x$$
$$\leq \sum_{f(x) \leq y_1 + y_2} x$$
$$= \varphi(y_1 + y_2).$$

If $\varphi(y_1) + \varphi(y_2) < \varphi(y_1 + y_2)$ then there exists an atom $t \in S(L)$ with $t \leq \varphi(y_1 + y_2) * \sim (\varphi(y_1) + \varphi(y_2))$, and $f(t) \in S(L')$. But $f\varphi(y_1 + y_2) \leq y_1 + y_2$ by (4.2.12) so by monotonicity $f(t) \leq f\varphi(y_1 + y_2) \leq y_1 + y_2$; since $f(t)$ is an atom, we may as well assume $f(t) \leq y_1$. But then, by the definition of $\varphi(y_1)$, $t \leq \varphi(y_1)$, a contradiction. Hence $\varphi$ is additively linear. To show that $\varphi$ is multiplicatively linear, observe that as in (4.2.6.b), if $f(x) \leq y_1$ and $f(x') \leq y_2$ then $f(x * x') \leq f(x) * f(x') \leq y_1 * y_2$ while if $f(x) \leq y_1 * y_2$ then $f(x) \leq y_1$, $f(x) \leq y_2$. Hence $$\varphi(y_1 * y_2) = \sum_{f(x) \leq y_1 * y_2} x$$
$$= \sum_{\substack{f(x) \leq y_1 \\ f(x') \leq y_2}} x * x'$$
$$= \left(\sum_{f(x) \leq y_1} x\right) * \left(\sum_{f(x') \leq y_2} x'\right)$$
$$= \varphi(y_1) * \varphi(y_2).$$

4.2. Duality of Homomorphisms

Next, $1 = f(1) + \sim f(1)$ so by (4.2.12) $\varphi(1) = \varphi f(1) + \varphi(\sim f(1)) \geq 1 + \varphi(\sim f(1)) = 1$. Now, $f : S(L) \to S(L')$ so by linear additivity of $f$, $f(x) = 0 \Rightarrow x = 0$, so $\varphi(\sim y) * \varphi(y) = \varphi(\sim y * y) = \varphi(0) = \sum_{f(x) \leq 0} x = 0$, and thus $\varphi(\sim y) \leq \sim \varphi(y)$. Also, $1 = \varphi(1) = \varphi(\sim y + y) = \varphi(\sim y) + \varphi(y)$. Hence $\sim \varphi(y) = \sim \varphi(y) * \varphi(\sim y) = \varphi(\sim y)$. It follows that $\varphi$ is a homomorphism. Finally, for all $x \in L$, $$\begin{aligned}\hat{\varphi}(x) &= \Pi\{y \in L' \mid x \leq \varphi(y)\} \\ &= \Pi\left\{y \in L' \mid x \leq \sum_{f(z) \leq y} z\right\} \\ &\leq f(x) \text{ by (4.2.11)}.\end{aligned}$$

On the other hand, if $x > 0$, write $x = \sum s_i$ where $s_i \in S(L)$. Then $f(x) = \sum f(s_i)$ and $f(s_i) \in S(L')$ for all $i$. For any atom $t \leq f(x)$ there exists an atom $s$ such that $s \leq x$ and $f(s) = t$. To show that $f(x) = \hat{\varphi}(x)$ it suffices to show that for each such $t$, $t \leq \hat{\varphi}(x)$, which follows if we show $x \leq \varphi(y) \Rightarrow t \leq y$. Indeed, if $x \leq \sum_{f(z) \leq y} y$ then $t = f(s) \leq f(x) \leq \sum_{f(z) \leq y} f(z)$ so for some $z$, $t \leq f(z) \leq y$. Thus, $t \leq \hat{\varphi}(x)$ and it follows that $f(x) \leq \hat{\varphi}(x)$ so $f(x) = \hat{\varphi}(x)$.

4.2.13 Lemma $\hat{\varphi} \circ \varphi = \text{id}$ on $\hat{\varphi}L$ and $$\ker \varphi = \left\{\sum S \mid S \subset S(L') \setminus \hat{\varphi}S(L)\right\}.$$

Proof. Let $x \in L$. Then $\varphi(\hat{\varphi}(x)) \geq \sum_{\hat{\varphi}(z) = \hat{\varphi}(x)} z$ by (4.2.8). Thus $\hat{\varphi} \circ \varphi(\hat{\varphi}(x)) \geq \hat{\varphi}(\sum z) = \sum \hat{\varphi}(z) = \hat{\varphi}(x)$. But $\hat{\varphi} \circ \varphi(\hat{\varphi}(x)) \leq \hat{\varphi}(x)$ by (4.2.3). Therefore, $\hat{\varphi} \circ \varphi = \text{id}$ on $\hat{\varphi}L$, and thus as in (4.2.7), $\ker \varphi \cap \hat{\varphi}L = \{0\}$. On the other hand, if $s \in S(L') \setminus \hat{\varphi}S(L)$ and $\varphi(s) > 0$ then for some $t \in S(L)$, $t < \varphi(s)$, so $\hat{\varphi}(t) \leq \hat{\varphi}(\varphi(s)) \leq s$ by (4.2.3), a contradiction. Therefore, $\varphi(s) = 0$, and $\ker \varphi$ is as stated.

4.2.14 Lemma *Suppose $L'$ is finite, $\varphi, \psi : L' \to L$ are homomorphisms and $\hat{\varphi} = \hat{\psi}$ on $S(L)$. Then $\varphi = \psi$.*

Proof. If $\hat{\varphi} = \hat{\psi}$ on $S(L)$ then by (4.2.6) and (4.2.4), $\hat{\varphi} = \hat{\psi}$. To show $\varphi = \psi$, it is enough to that on $S(L')$. Let $t \in S(L')$. If $\varphi(t) > 0$ then $s \leq \varphi(t)$ for some $s \in S(L)$. In this case, $\hat{\varphi}(s) \leq \hat{\varphi}(\varphi(t)) \leq t$ by (4.2.3), Chapter 4. L-language so $\widehat{\varphi}(s) = t$ by (4.2.5). Thus, $t = \widehat{\varphi}(r) = \widehat{v}(s)$ so $v(t) = v(\widehat{v}(s)) \geq r$ by (4.2.3). It follows by symmetry of argument that for any $s \in S(L)$, $s \leq v(t) \Rightarrow s \leq v(t)$. Thus, $\varphi(t) = v(t)$, q.e.d.

4.2.15 Corollary Let $\sigma : S(L) \to S(L')$ be an arbitrary map, $L'$ finite. Then there exists a unique homomorphism $\varphi : L' \to L$ such that for all $s \in S(L)$, $\widehat{\varphi}(s) = \sigma(s)$.

Proof. Define $f : L \to L'$ by extending $\sigma$ linearly to $L$: set $f(0) = 0$ and for $0 \neq x \in L$, write $x = \sum s_i$ for $s_i \in S(L)$, and set $f(x) = \sum f(s_i)$. The result follows from (4.2.9) and (4.2.14).

4.2.16 Example Suppose $L_1, \ldots, L_k$ are independent subalgebras of $L$ with $L = \Pi L_i$ and $L'_1, \ldots, L'_k$ are independent subalgebras of $L'$ with $L' = \Pi L'_i$. If $\sigma : S(L_i) \to S(L'_i)$ are arbitrary maps for $1 \leq i \leq k$, we may define $\sigma : S(L) \to S(L')$ by $\sigma(s_1 * \cdots * s_k) = \sigma(s_1) * \cdots * \sigma(s_k)$, in which case by (4.2.15) there exists a unique homomorphism $\varphi : L' \to L$ with $\widehat{\varphi} = \sigma$ on $S(L)$. Conversely, if $\varphi_i : L'_i \to L_i$ are arbitrary homomorphisms then $\widehat{\varphi}_i : S(L_i) \to S(L'_i)$ and by (4.2.15) there is a unique homomorphism $\varphi : L' \to L$ with $$\widehat{\varphi}(s_1 * \cdots * s_k) = \widehat{\varphi}_1(s_1) * \cdots * \widehat{\varphi}_k(s_k).$$

Thus, $\varphi = \Pi \varphi_i$ as defined in (2.2.2).

4.2.17 Corollary Let $\varphi : L' \to L$ be a Boolean algebra homomorphism, $L'$ finite. Then there is a unique language homomorphism $\Phi : S(L)^- \to S(L')^-$ and a unique language homomorphism $\Phi : S(L)^+ \to S(L')^+$, with support $\widehat{\varphi}$.

Putting together (4.2.15) and (4.2.17) gives our duality theorem:

4.2.18 Theorem Over finite[1] Boolean algebras, there is a 1-1 relationship between language homomorphisms and Boolean algebra homomorphisms: for any language homomorphism $\Phi$ with support $\sigma$ there is a unique Boolean algebra homomorphism $\varphi$ with $\widehat{\varphi}|_{S(L)} = \sigma$; for any Boolean algebra homomorphism $\varphi$ there is a unique language homomorphism $\Phi$ with support $\widehat{\varphi}|_{S(L)}$.

---

[1] This theorem is not true for arbitrary Boolean algebras, but it almost is. What is true is that every homomorphism may be transformed to a canonical form (i.e., to a homomorphism of Boolean algebras of open-closed subsets of a totally disconnected space). After this transformation, Theorem 4.2.18 holds in general [Sik69, §41]. See also [Sik49].

4.2. Duality of Homomorphisms

4.2.19 Lemma *If $\varphi : L' \to L$ is a homomorphism with $\ker \varphi = 0$ and $M$ is a complete $L$-matrix, then $\hat{\varphi}M$ is a complete $L'$-matrix.*

Proof. If $x_i \in L$ and $\sum x_i = 1$ then by Lemma 4.2.6 and Theorem 4.2.7, $\sum \hat{\varphi}(x_i) = 1$.

4.2.20 Example Let $L$ be an arbitrary Boolean algebra and let $\pi$ be a partition of $S(L)$, i.e., $\pi$ is a set of pairwise disjoint subsets of $S(L)$ whose union is $S(L)$. Set $\overline{\pi} = \{\sum_{x \in s} x | s \in \pi\}$ and let $L' = \mathbb{B}[\overline{\pi}]$. By Lemma 2.1.23, $L' \cong \mathbb{B}(\overline{\pi}) \subset L$ is a subalgebra, and $\overline{\pi} = S(L')$. Let $\sigma : S(L) \to S(L')$ be defined by $x \leq \sigma(x)$ for all $x \in S(L)$. Then $\sigma$ is onto and hence by Theorem 4.2.7, the homomorphism $\varphi : L' \to L$ with $\hat{\varphi}|_{S(L)} = \sigma$ guaranteed by Theorem 4.2.18 satisfies $\ker \varphi = 0$. Thus, by Lemma 4.2.19, given any complete $L$-matrix $M$, $\hat{\varphi}M$ is a complete $L'$-matrix. Furthermore, for any $x \in S(L')$, writing $x = \sum x_i$ for $x_i \in S(L)$, by the definition of $\sigma$, $\hat{\varphi}(x_i) = x$ for all $i$. Thus, by Lemma 4.2.6, $\hat{\varphi}(x) = x$ for all $x \in L'$ and $\hat{\varphi}$ is the identity on $L'$. Consequently, for $x \in S(L')$, $x = \hat{\varphi}(x) = \Pi\{y \in L' | x \leq \varphi(y)\}$ and thus $x \leq \varphi(x)$. Therefore, $\sum x_i \leq \sum \varphi(x_i) = \varphi(\sum x_i)$ for $x_i \in S(L')$, and so $x \leq \varphi(x)$ for all $x \in L'$. In particular, $\sim x \leq \varphi(\sim x)$, so $\varphi(x) = \sim \varphi(\sim x) \leq x$ and it follows that $\varphi(x) = x$ for all $x \in L'$, i.e., $\varphi : L' \hookrightarrow L$ is the inclusion map. Thus, for any $L'$-matrix $M$, both $\hat{\varphi}$ and $\varphi$ leave $M$ invariant, i.e., $\varphi M = \hat{\varphi}M = M$. Alternatively, for $\varphi : L' \to L$ defined to be the inclusion map, $\varphi$ is a homomorphism, with $\ker \varphi = 0$. Hence $\hat{\varphi} : S(L) \to S(L')$ is onto by Theorem 4.2.7, and for all $x \in S(L)$, $\hat{\varphi}(x)$ is defined by $x \leq \hat{\varphi}(x)$.

4.2.21 Definition Say that the inclusion $\varphi$ of the example above is the homomorphism *induced* by the partition $\pi$.

62 *Chapter 4 L-language*

Chapter 5

String Acceptors

System behaviors are defined through finite-state generators and "acceptors" of behavior, known generally as "finite state machines" and "finite state automata", respectively. In case all behavior is eventually terminating (bounded in time), each behavior is captured by a *string* of events. (Nonterminating (unbounded) behavior, captured by sequences of events, is dealt with analogously in Chapter 6). There are reasons, discussed in Section 6.2, for wanting, in both the bounded and infinite cases, two distinct types of structures for defining behavior: the *process* in the role of behavior generator, and the *automaton* in the role of acceptor. The acceptor or automaton defines a language whose elements are strings each of which describes some path in a given complete transition matrix from an initial state to a "final" or "accepting" state. The automata turn out to be most useful for defining *properties* of a given system. The *system itself* is more conveniently given by a process: a finite state machine in the role of generator defined in terms of an incomplete transition matrix, whose language consists of those strings which describe some path from an initial state to a state which is *not* an "exception" state. As we will see, semantically "process" and "automaton" are dual, defining somewhat complementary languages (exactly complementary in the deterministic case). In fact, the "process" may be viewed as another type of automaton.

There are a number of different types of finite state automata on finite words: deterministic, nondeterministic, with or without $\epsilon$-moves, one-way or two-way. All of these define the same set of languages: the *regular* languages. All of these have a single notion of "acceptance", defined in 64                                                          Chapter 5. String Acceptors terms of a run reaching one of several designated *final* states. Although Mealy and Moore *machines* (*cf.* Section 7.2) could be interpreted as automata with more complex acceptance conditions (acceptance defined in terms of the associated output string), it is not common to do so. (It is possible to define an unlimited number of distinct types of acceptance conditions. For example, a word is accepted if it has a run through 3 red states and a blue state, or, if it has exactly 2 distinct runs; or, if *every* run ends in a final state; and so on. However, there has — thankfully — been no interest to do this. All of these definitions would give rise to regular sets of languages, incidentally.)

We focus on just one generic type of automaton: the nondeterministic Rabin-Scott acceptor [RS59] (which of course, as a special case, may be deterministic).

5.1  $L$-*-automaton/$L$-*-process

5.1.1 Definition Let $L$ be a Boolean algebra. An $L$-*-*automaton* is a 3-tuple
$$A = (M_A, I(A), F(A))$$
where $M_A$ is a complete $L$-matrix (the *transition* matrix), $I(A), F(A) \subset V(M_A)$ (*initial, final* states, respectively). The *language* of $A$ is the $L$-*-language
$$\mathcal{L}(A) = \{x \in S(L)^+ \mid x \text{ has a run in } M_A \text{ from } I(A) \text{ to } F(A)\}.$$

Such a run is called an *accepting* run for $x$.

5.1.2 Definition An $L$-*-*process* is a 4-tuple
$$P = (L_P, M_P, I(P), F(P))$$
where $L_P$ is a subalgebra of $L$ (*output* subalgebra of $P$), $M_P$ is an arbitrary $L$-matrix, (the *transition* matrix), $I(P), F(P) \subset V(M_P)$ (*initial, final* states, respectively). The *language* of $P$ is the $L$-*-language
$$\mathcal{L}(P) = \{x \in S(L)^+ \mid x \text{ has a run in } M_P \text{ from } I(P) \text{ to } V(P) \setminus F(P)\}.$$

5.1.3 Definition For a process or automaton $X$, write $V(X) \equiv V(M_X)$, $E(X) \equiv E(M_X)$, $X(v, w) \equiv M_X(v, w)$, $s_X(v) \equiv s_{M_X}(v)$.

5.1. L-*-automaton/L-*-process

5.1.4 Definition The *selections* of $P$ at $v \in V(P)$ are the elements of the set
$$S_P(v) = \{s \in S(L_P) \mid s * s_P(v) \neq 0\} \ .$$

5.1.5 Example Consider the crossroads example of Section 1.1. Let
$$S(A) = \{(A:\text{no\_cars}), (A:\text{cars\_waiting}), (A:\text{cars\_going})\} ,$$
$$S(C) = \{(C:\text{go\_A}), (C:\text{go\_B}), (C:\text{pause})\}$$

and let $S(B)$ be defined analogously to $S(A)$; set
$$L_A = \mathbb{B}[S(A)] ,$$
$$L_B = \mathbb{B}[S(B)] ,$$
$$L_C = \mathbb{B}[S(C)]$$

and define $L$ to be the exterior product
$$L = L_A \cdot L_B \cdot L_C \ .$$

For $M_A$ defined according to the transition diagram in Figure 1.3, for $I(A) = \{\text{STOP}\}$ and for
$$F(A) = \{\text{STOP}, \text{GO}\}, A = (L_A, M_A, I(A), F(A))$$

is an $L$-*-process; likewise for $B$ and $C$. Similarly, $T_1$, $T_A$ and $T_B$ are $L$-*-automata, with $F(T_1) = F(T_A) = F(T_B) = \{1\}$. Note that $S(L_A) = S(A)$, etc. and $S(L) = S(A) * S(B) * S(C)$ (product as in 2.1.8). Also
$$S_A(\text{STOP}) = \{(A:\text{no\_cars}), (A:\text{cars\_waiting})\} ,$$
$$S_A(\text{GO}) = \{(A:\text{cars\_going}), (A:\text{no\_cars})\}$$

and similarly for $B$ and $C$.

5.1.6 Definition Let $P$ be an $L$-*-process. Define the *dual* of $P$, $P^\#$ to be the $L$-*-automaton with (for some symbol $\# \notin V(P)$)

$$V(P^\#) = \begin{cases} V(P) \cup \{\#\} & \text{if } \prod_v s_P(v) < 1 , \\ V(P) & \text{otherwise} \end{cases}$$

$$I(P^\#) = I(P)$$

$$F(P^\#) = \begin{cases} F(P) \cup \{\#\} & \text{if } \# \in V(P^\#) \\ F(P) & \text{otherwise} \end{cases}$$

$$P^\#(v,w) = P(v,w) \text{ if } v,w \in V(P) ;$$

Chapter 5. String Acceptors if $\prod s_P(v) < 1$, then for all $v \in V(P)$, $$P^\#(v, \#) = \sim s_P(v) \quad \text{(makes } M_{P^\#} \text{ complete)}$$
$$P^\#(\#, v) = 0 ;$$
$$P^\#(\#, \#) = 1 .$$

5.1.7 Lemma $P^\#$ is an $L$-*-automaton.

5.1.8 Definition An $L$-*-automaton/process $X$ is *strongly deterministic* if $M_X$ is deterministic and $|I(X)| = 1$. An $L$-*-automaton $A$ is *deterministic* if $M_A$ is.

N.B. Generally, "deterministic" is used for what here is called "strongly deterministic". However, $|I(X)| = 1$ is not required for many algorithms such as homomorphism verification (e.g., Sections 8.5, 8.9 and state minimization). The distinction turns out to be convenient for complexity reduction results as well. For the $L$-*-process, the concept of "determinism" may be a bit misleading. The reason is that the selections of even a strongly deterministic process model nondeterministic choice. For this reason, we generally refer to the determinism of a process transition matrix, rather than determinism "of the process".

5.1.9 Definition Given an $L$-*-automaton $A$, define the *dual of* $A$, $A^\#$ to be the $L$-*-process $$A^\# = (L, M_A, I(A), F(A)) .$$

5.1.10 Lemma Let $P$ be a process, $A$ an automaton. Then $$\mathcal{L}(P^{\#\#}) = \mathcal{L}(P), \quad A^{\#\#} = A .$$

5.1.11 Lemma Let $X$ be an $L$-*-process or $L$-*-automaton. Then $\mathcal{L}(X^\#) \supset \mathcal{L}(X)'$ (where $'$ denotes set complementation: $\mathcal{L}(X)' = S(L)^* \setminus \mathcal{L}(X)$); if $X$ is strongly deterministic, $$\mathcal{L}(X^\#) = \mathcal{L}(X)' .$$

5.1.12 Lemma Let $A$ be an $L$-*-automaton and let $\bar{A}$ be the $L$-*-automaton $(M_A, I(A), F(A)')$. Then $$\mathcal{L}(\bar{A}) \supset \mathcal{L}(A)' ;$$

5.1. L-∗-automaton/L-∗-process

*if $A$ is strongly deterministic,*

$$\mathcal{L}(\tilde{A}) = \mathcal{L}(A)'.$$

5.1.13 Definition Let $X_1, \ldots, X_k$ be a family of $L$-∗-automata. Then $$\bigoplus_{i=1}^{k} X_i = \left( \bigoplus M_{X_i}, \bigcup_i I(X_i), \bigcup_i F(X_i) \right)$$

$$\bigotimes_{i=1}^{k} X_i = \left( \bigotimes M_{X_i}, \bigtimes I(X_i), \bigcup_{i=1}^{k} \Pi_i^{-1} F(X_i) \right)$$

$$\bigwedge_{i=1}^{k} X_i = \left( \bigotimes M_{X_i}, \bigtimes I(X_i), \bigtimes_{i=1}^{k} F(X_i) \right).$$

For $L$-∗-processes we make the analogous definitions, with respective output subalgebras $L_{\oplus X_i} = L_{X_1}$ (with $\oplus X_i$ undefined unless $L_{X_1} = \cdots = L_{X_k}$), $L_{\otimes X_i} = L_{\wedge X_i} = \Pi L_{X_i}$.

5.1.14 Lemma Let $A_1, \ldots, A_k$ be a family of $L$-∗-automata. Then $$\mathcal{L}(\bigoplus A_i) = \mathcal{L}(\bigotimes A_i) = \bigcup \mathcal{L}(A_i),$$

$$\mathcal{L}(\bigwedge A_i) = \bigcap \mathcal{L}(A_i).$$

5.1.15 Lemma Let $A$ be a deterministic $L$-∗-automaton and set $A_i = (M_A, \{i\}, F(A))$ $\forall i \in I(A)$. Then $\otimes A_i$ is strongly deterministic and $\mathcal{L}(\otimes A_i) = \mathcal{L}(A)$.

5.1.16 Lemma Let $P_1, \ldots, P_k$ be a family of $L$-∗-processes. Then $$\mathcal{L}\left(\bigoplus P_i\right) = \bigcup \mathcal{L}(P_i),$$

$$\mathcal{L}\left(\bigotimes P_i\right) = \bigcap \mathcal{L}(P_i),$$

$$\mathcal{L}\left(\bigwedge P_i\right) \supset \bigcap \mathcal{L}(P_i)$$

(= *if all the $P_i$'s are strongly deterministic*).

5.1.17 Lemma Let $X_1, \ldots, X_k$ be a family of $L$-∗-automata/processes. If all the $X_i$'s are deterministic, so are $\oplus X_i$, $\otimes X_i$, $\wedge X_i$. If all the $X_i$'s are strongly deterministic, so are $\otimes X_i$, $\wedge X_i$.

68                                    Chapter 5. String Acceptors

5.1.18 Example Let $A$ be an $L$-$*$-automaton. Define the $L$-$*$-automaton $\hat{A}$ by $$V(\hat{A}) = 2^{V(A)},$$
$$I(\hat{A}) = \{I(A)\},$$
$$F(\hat{A}) = \{V \subseteq V(A) \mid V \cap F \neq \emptyset\}$$

and $$\hat{A}(V, W) = \sum \{x \in S(L) \mid \forall v \in V \; \exists w \in W : x \leq A(v, w)\}$$

(where $\sum \emptyset = 0$). (Thus, if $x \in S(L)$ and $x \leq \hat{A}(V, W)$ then $W = \bigcup_{v \in V} \{w \in V(A) \mid x \leq A(v, w)\}$.) It is easily seen that $\hat{A}$ is strongly deterministic and $\mathcal{L}(\hat{A}) = \mathcal{L}(A)$. The above construction, called the "subset" construction, is due to Rabin and Scott [RS59]. Will this construction have the same effect for an $L$-$*$-process?

5.1.19 Example For some $N > 1$ let $\mathcal{L} = (0+1)^*1(0+1)^{N-1}$, i.e., $\mathcal{L}$ is the set of strings over $V = \{0,1\}$ whose $(N-1)$st-from-the-last element is a 1. An $(N+1)$-state $\mathbb{B}[V]$-$*$-automaton $A$ with $\mathcal{L}(A) = \mathcal{L}$ is formed as follows:

$$V(A) = \{s_0, \ldots, s_N\}$$
$$I(A) = \{s_0\}$$
$$F(A) = \{s_N\}$$
$$A(s_0, s_0) = V$$
$$A(s_0, s_1) = \{1\}$$
$$A(s_i, s_{i+1}) = V \text{ for } 1 \leq i < N$$
$$A(s_N, s_0) = V$$
$$A(s_i, s_j) = \emptyset \text{ otherwise}.$$

Thus, $A$ decides nondeterministically in state $s_0$ whether to start counting. Once it starts, then upon input of a 1 it counts to $N$, accepting the total input string to that point. The only nondeterminism in $A$ is at the single state $s_0$. Nonetheless, the smallest deterministic $\mathbb{B}[V]$-$*$-automaton whose language is $\mathcal{L}$, must have at least $2^N$ states. A simple way to see this is through an information-theoretic argument: in order for a deterministic automaton to remember if the $(N-1)$st-from-the-last input was a 1, it must remember the last $N$ inputs, of which there may be $2^N$ possibilities. Thus, for this $\mathcal{L}$, the construction of (5.1.18) is minimal-state (cf. Example 5.1.20).

5.1. L-\*-automaton/L-\*-process

5.1.20 Example For $V = \{0,1\}$, $0 \leq i \leq n$ let $L_i = \mathbb{B}[V]$, let $L = \prod_{i=0}^{n} L_i$ (exterior product) (so $L \cong \mathbb{B}[x_0, \ldots, x_n]$) and let $s_i(\delta) = \{\delta\} \in S(L_i)$ for $\delta \in V$. For $1 \leq i \leq n$ define the L-\*-process $P_i = (L_i, M_i, \{0\}, F_i)$ where $V(M_i) = V$ and $$M_i(v, w) = s_i(v) * s_{i-1}(w)$$

for $v, w \in V$; $F_i = \phi$ for $i < n$, $F_n = \{0\}$. Note that for $1 \leq i \leq N$, $s_i = s_{P_i}$. Moreover, $P = \bigotimes_{i=1}^{n} P_i$ models a binary shift-register (cf. Figure 5.1) which takes each input bit and shifts it $n$ stages to the output, accepting input strings which give output 1. Thus, for $n = N$, $\Pi_{L_0}\mathcal{L}(P) = \mathcal{L}(\Pi_{L_0}P) = \mathcal{L}$ as defined in (5.1.19). Note that each $P_i$ is strongly deterministic and thus by (5.1.17), so is $P$. As each $P_i$ has 2 states, $P$ has $2^N$ states. Since $P$ models a shift-register, all its $2^N$ states are reachable from its initial state.

Figure 5A:
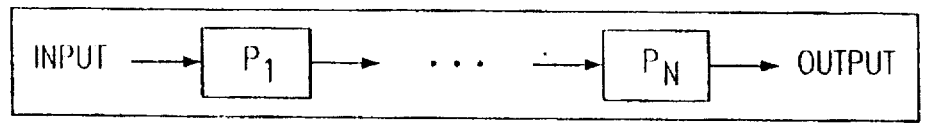
FIG. 5.1 illustrates a shift register.
Figure 5B:
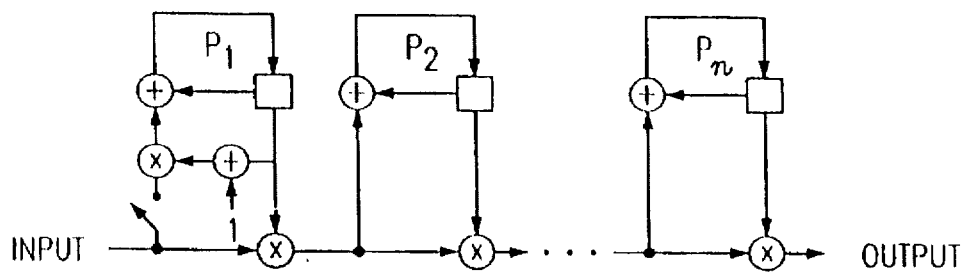
Figure 5C:
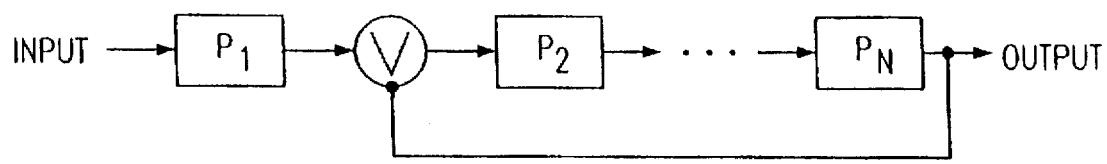

Figure 5.1: The shift-register of (5.1.20) modelled by $P$, with $N$ stages $P_1, \ldots, P_N$, input $\{0,1\} \subset S(L_0)$ and output $\{0,1\} \subset S(L_N)$; output 1 signals acceptance of the entire input string to that point.

5.1.21 Example Let $s_i$, $L_i$, $P_i$ and $P$ be as in Example 5.1.20, except that $$M_1 = \begin{pmatrix} s_1(0) & s_1(0) * s_0(1) \\ s_1(1) * s_n(1) & s_1(1) * s_n(0) \end{pmatrix}$$

while for $1 < i \leq n$ $$M_i = \begin{pmatrix} s_i(0) * s_{i-1}(0) & s_i(0) * s_{i-1}(1) \\ s_i(1) * s_{i-1}(1) & s_i(0) * s_{i-1}(0) \end{pmatrix}$$

and suppose $N = 2^{n-1} - 1$. Then for $\mathcal{L}$ as defined in (5.1.19), $\mathcal{L}(\Pi_{L_0}P) = \mathcal{L}$, as in (5.1.20). Notice that for $i > 1$, $P_i$ is strongly deterministic. However, $P$ has only $N + 2$ states and thus $P_1$ (with only 2 states) cannot be "determinized" in isolation: its nondeterminism "spreads" to all of $P$.

70  Chapter 5. String Acceptors

5.1.22 Example For some $N > 1$ let $$\hat{\mathcal{L}} = \bigcup_{i>0}(0+1)^* 1(0+1)^{i(N-1)}$$

(cf. [Kla93]). If $A$ is as in Example 5.1.19 except that $A(s_N, s_0) = \phi$ and $A(s_N, s_2) = V$, then $\mathcal{L}(A) = \hat{\mathcal{L}}$. If $s_i$, $L_i$, $P_i$ and $P$ are as in Example 5.1.20 except that for $x = s_1(0) * s_n(0) + s_1(1) * s_1(1)$, $M_1(0, w) = x * s_0(w)$ for $w \in \{0, 1\}$ (cf. Figure 5.3); or as in Example 5.1.21 except that $M_1(1, 0) = 0$ and $M_1(1, 1) = s_1(1)$ (cf. Figure 5.2 with the output feedback to $P_1$ removed), then $\mathcal{L}(\Pi_{L_0} P) = \hat{\mathcal{L}}$.

Figure 5.2: The deterministic binary counter of (5.1.21) modelled by $P_2 \otimes \cdots \otimes P_n$ with nondeterministic element $P_1$. Addition is modulo 2, the square signifies a bit memory location and the unattached arrow in $P_1$ denotes nondeterministic choice. Inputs, outputs and acceptance are as in Figure 5.1.

Figure 5.3: If Figure 5.1 is transformed by introducing between the first two stages a logical OR of the output, then the language accepted at the input changes from $\mathcal{L}$ to $\hat{\mathcal{L}}$, as explained in Example 5.1.22.

5.2 Choueka "Flag" Construction

The following general construction is quite useful, arising in a variety of applications. In particular, it is used [Cho74, 3.9] to show that *-regular languages coincide with automata languages (cf. the usual construction [HU79]).

5.2. Choueka "Flag" Construction

Let $A, B$ be $L$-*-automata. We will construct an $L$-*-automaton $C$ with $$\mathcal{L}(C) = \mathcal{L}(A) \cdot \mathcal{L}(B) \quad (\equiv \{xy \mid x \in \mathcal{L}(A),\ y \in \mathcal{L}(B)\}) .$$

We may assume $I(X) \cap F(X) = \phi$ for $X = A, B$ and $|I(B)| = 1$ (by using the previous construction: $\widehat{B} = \odot B_i \quad B_i = (M_B, \{i\}, F(B))$).

Let $L' = L \cdot \mathbb{B}[f] \cdot \mathbb{B}[V_1] \cdots \mathbb{B}[V_n]$ where $n = |V(B)|$ and $V_1, \ldots, V_n$ are distinct copies of $V(B)$, $f \notin L$ ($f$ is the "flag").

Define $L'$-*-process $\widehat{A}$ by $$L_{\widehat{A}} = \mathbb{B}[f],\ V(\widehat{A}) = V(A),\ I(\widehat{A}) = I(A),\ F(\widehat{A}) = \phi,$$

$$\widehat{A}(v, w) = \begin{cases} A(v, w) * f & \text{if } v \in F(A) \\ A(v, w) * \sim f & \text{else} .\end{cases}$$

5.2.1 Note $S_{\widehat{A}}(v) = \{f\}$ if $v \in F(A)$, $S_{\widehat{A}}(v) = \{\sim f\}$ if $v \notin F(A)$.

For $i = 1, \ldots, n = |V(B)|$ let $B_i$ be the $L'$-*-process defined by $L_{B_i} = \mathbb{B}[V_i]$, $V(B_i) = V(B)$, $I(B_i) = I(B)$, $F(B_i) = F(B)$, for $I(B) = \{\alpha\}$, $\beta \neq \alpha$; writing $(B_i : v) \equiv v \in S(L_{B_i})$:

$$B_i(\alpha, \beta) = B(\alpha, \beta) * f * \alpha * \prod_{j=1}^{i-1} \sim (B_j : \alpha) ,$$

$$B_i(\alpha, \alpha) = \left( \sum_{\beta \neq \alpha} \sim B_i(\alpha, \beta) \right) * \alpha ;$$

$\beta, \gamma \neq \alpha$:

$$\gamma \neq \alpha : \quad B_i(\beta, \gamma) = B(\beta, \gamma) * \beta * \prod_{j=1}^{i-1} \sim (B_j : \beta) ,$$

$$B_i(\beta, \alpha) = \left( \sum_{\gamma \neq \alpha} \sim B_i(\beta, \gamma) \right) * \beta .$$

5.2.2 Note $S_{B_i}(v) = \{v\}$.

Define $\widehat{C} = (\widehat{A} \odot B_1 \odot \cdots \odot B_n)^\#$, let $C'$ be the $L$-*-automaton defined as follows:

$$M_{C'} = \Pi_L M_{\widehat{C}},\ I(C') = I(\widehat{C}),\ F(C') = F(\widehat{C}) \setminus \{\#\} .$$

Chapter 5. String Acceptors

Let $C$ be $C'$ with edges to # deleted. Then $C$ is deterministic if $A$ and $B$ are, and $\mathcal{L}(C) = \mathcal{L}(C')$.

5.2.3 Theorem $\mathcal{L}(C') = \mathcal{L}(A) \cdot \mathcal{L}(B)$.

Proof. (sketch). $\hat{A}$ turns on an idle copy of $B$ each time $\hat{A}$ reaches a final state of $A$. Acceptance of the string is then determined by acceptance of the suffix by that copy. Each copy of $B$ turns itself off if some copy with lower index has the same state, ensuring that there is always at least one idle copy of $B$.

5.3 Closure Properties of $L$-∗-automata

5.3.1 Definition Let $A$ be an $L$-∗-automaton and let $\varphi : L \to L'$ be a homomorphism. Define $\varphi A \equiv (\varphi M_A, I(A), F(A))$. By Lemma 3.3.7, $\varphi A$ is an $L'$-automaton.

5.3.2 Theorem [Cho74, 4.2] *The set of languages defined by [strongly] deterministic $L$-∗-automata is closed under complementation, union, intersection, concatenation (juxtaposition of strings), ∗, and contains languages of homomorphic images of [strongly] deterministic $L'$-∗-automata for any homomorphism $\varphi : L' \to L$.*

Proof. $\mathcal{L}(A)' = \mathcal{L}(\tilde{B})$ where $B$ is strongly deterministic, $\mathcal{L}(B) = \mathcal{L}(A)$ ($B = \bigotimes_{i \in I(A)} B_i, B_i = (M_A, \{i\}, F(A))$).

$$\mathcal{L}(A) \cup \mathcal{L}(B) = \mathcal{L}(A \vee B).$$
$$\mathcal{L}(A) \cap \mathcal{L}(B) = \mathcal{L}(A \wedge B).$$

For concatenation, use "flag construction". For ∗, use a variant without $\hat{A}$ where the 1st idle $B_i$ becomes active whenever any $B_j$ is in its final state.

If $A$ is a [strongly] deterministic $L'$-automaton then $\varphi A$ is a [strongly] deterministic $L$-∗-automaton by Lemma 3.3.7.

5.3.3 Lemma *Let $\varphi : L' \to L$ be a Boolean algebra homomorphism, and let $\Phi : S(L)^* \to S(L')^*$ be the language homomorphism with support $\bar{\varphi}|_{S(L)}$. Then for any $L'$-∗-automaton $B$, $\mathcal{L}(\varphi B) = \Phi^{-1}\mathcal{L}(B)$.*

5.3. Closure Properties of L-*-automata

Proof. Let $\mathbf{x} \in \mathcal{L}(\varphi B)$. Find $\mathbf{y} \in \mathcal{L}(B)$ such that $x_i \leq \varphi(y_i)$ $\forall i$. Then $\forall i\ \tilde\varphi(x_i) \leq \tilde\varphi\varphi(y_i) \leq y_i$ (Lemma 4.2.3) so in fact $\Phi(\mathbf{x}) = \mathbf{y} \in \mathcal{L}(B)$ and thus $\mathbf{x} \in \Phi^{-1}\mathcal{L}(B)$, giving $\mathcal{L}(\varphi B) \subset \Phi^{-1}\mathcal{L}(B)$. Conversely, suppose $\mathbf{x} \in \Phi^{-1}\mathcal{L}(B)$. Then $(\tilde\varphi(x_i))_i = \Phi(\mathbf{x}) \in \mathcal{L}(B)$. Since $\forall i\ x_i \leq \varphi\tilde\varphi(x_i)$ (Lemma 4.2.3), it follows that $\mathbf{x} \in \mathcal{L}(\varphi B)$, giving $\Phi^{-1}\mathcal{L}(B) \subset \mathcal{L}(\varphi B)$.

5.3.4 Corollary *Let $A, B$ be $L$-*-automata and let $\varphi$ be a homomorphism on $L$. Then*

$$\mathcal{L}(A) \subset \mathcal{L}(B) \Leftrightarrow \mathcal{L}(\varphi A) \subset \mathcal{L}(\varphi B) .$$

Proof. Let $\Phi$ be the language homomorphism with support $\tilde\varphi|_{S(L)}$. By Lemma 5.3.3, $\mathcal{L}(\varphi A) = \Phi^{-1}\mathcal{L}(A)$, $\mathcal{L}(\varphi B) = \Phi^{-1}\mathcal{L}(B)$ and so the result follows by monotonicity of $\Phi^{-1}$ and $\Phi$.

5.3.5 Corollary *Let $\Phi : S(L)^+ \to S(L')^+$ be a *-language homomorphism, and let $A'$ be a [[strongly] deterministic] $L'$-*-automaton. Then there is a [[strongly] deterministic] $L$-*-automaton $A$ with*

$$\mathcal{L}(A) = \Phi^{-1}(\mathcal{L}(A')) .$$

Proof. Let $\varphi : L' \to L$ be the homomorphism defined by the support of $\Phi$. Set $A = \varphi A'$.

5.3.6 Definition For $L$-*-automaton $A$, let the $L'$-*-automaton $\Pi_{L'} A$ denote $(\Pi_{L'} M_A, I(A), F(A))$.

5.3.7 Lemma *Let $A$ be an $L$-*-automaton. Then $\exists$ language homomorphism $\Phi$ with*

$$\Phi(\mathcal{L}(A)) = \mathcal{L}(\Pi_{L'} A) .$$

Proof. The inclusion map $\varphi : L' \hookrightarrow L$ defined by $\varphi(x) = \sum\{y \mid \Pi_{L'}(y) = x\}$ is a homomorphism. Let $\Phi$ be the language homomorphism with support $\tilde\varphi|_{S(L)}$. For $s \in S(L)$, $\tilde\varphi(s) = \Pi\{y \in L' \mid s \leq \varphi(y)\} = \Pi\{y \in L' \mid s \leq y\} = \Pi_{L'}(s)$. Thus, $\mathbf{x} \in \mathcal{L}(A) \Rightarrow$ some $\mathbf{v}$ is an accepting run of $\mathbf{x} \Rightarrow \forall i\ x_i * A(v_i, v_{i+1}) \neq 0 \Rightarrow 0 < \Pi_{L'}(x_i * A(v_i, v_{i+1})) \leq \Pi_{L'}(x_i) * \Pi_{L'} A(v_i, v_{i+1}) \Rightarrow \tilde\varphi(x_i) * \Pi_{L'} A(v_i, v_{i+1}) \neq 0 \Rightarrow \Phi(\mathbf{x}) \in \mathcal{L}(\Pi_{L'} A)$. Conversely, if $\mathbf{y} \in \mathcal{L}(\Pi_{L'} A)$ then $\exists$ run $\mathbf{v}$ of $\mathbf{y}$: $0 < y_i * \Pi_{L'} A(v_i, v_{i+1})$ (and $y_i \in S(L')$). Thus, $\forall i\ \exists x_i \in S(L)$ with $x_i \leq y_i * A(v_i, v_{i+1})$. Then $x_i * A(v_i, v_{i+1}) \neq 0$, so $\mathbf{x} \in \mathcal{L}(A)$ and $\Phi(\mathbf{x}) = \mathbf{y}$ so $\mathbf{y} \in \Phi(\mathcal{L}(A))$.

5.4 Fundamental Theorem of Regular Sets

5.4.1 Definition Let $\mathcal{L} \subset S(L)^+$. Then $\mathcal{L}$ is *-regular provided $\mathcal{L}$ can be obtained from the sets $\{\sigma\}$, $\sigma \in S(L)$, by a finite number of union, concatenation and + operations.

5.4.2 Theorem [Cho74, 4.4]: *The *-regular L-languages coincide with the languages of [strongly] deterministic L-*-automata.*

Proof. Surely each $\{\sigma\}$ is the language of a strongly deterministic $L$-*-automaton. Since those are closed under union, concatenation and +, every *-regular language is the language of some strongly deterministic $L$-*-automaton. Also, strongly deterministic $\Rightarrow$ deterministic. Now, let $A$ be a (deterministic) $L$-*-automaton, $V(A) = \{v_1, \ldots, v_n\}$. For $1 \leq i, j \leq n$ and $0 \leq k < n$, define languages $\mathcal{L}_{i,j}^k$ as follows:

$$\mathcal{L}_{i,j}^0 = \{\mathbf{x} \mid \mathbf{x} \text{ has a run from } v_i \text{ to } v_j\}$$
$$\mathcal{L}_{i,j}^{k+1} = \mathcal{L}_{i,j}^k \cup \mathcal{L}_{i,k+1}^k (\mathcal{L}_{k+1,k+1}^k)^* \mathcal{L}_{k+1,j}^k$$

By induction on $k$, get $\mathcal{L}(A) = \bigcup_{v_i \in F(A)} \mathcal{L}_{1,i}^n$. Since each $\mathcal{L}_{i,j}^k$ is *-regular, so is $\mathcal{L}(A)$.

5.4.3 Corollary *If $\Phi : S(L)^+ \to S(L')^+$ is a language hom and $\mathcal{L}$ is $L$-*-regular, then $\Phi(\mathcal{L})$ is $L'$-*-regular.*

Proof. $\Phi(\mathcal{L}_1 \cup \mathcal{L}_2) = \Phi(\mathcal{L}_1) \cup \Phi(\mathcal{L}_2)$, $\Phi(\mathcal{L}_1 \cdot \mathcal{L}_2) = \Phi(\mathcal{L}_1) \cdot \Phi(\mathcal{L}_2)$, $\Phi(\mathcal{L}^+) = \Phi(\mathcal{L})^+$ and $\Phi(\{\sigma\}) \in S(L')$.

5.5 Equivalence of Deterministic and Nondeterministic Automata

Now we are ready to show the equivalence of deterministic and nondeterministic automata.

5.5.1 Theorem [Cho74, 4.6]: *Let $\mathcal{D}_L$ be the $L$-*-languages of strongly deterministic $L$-*-automata, and let $\mathcal{F}_L$ be the $L$-*-languages of arbitrary (nondeterministic) $L$-*-automata. Then*

$$\mathcal{D}_L = \mathcal{F}_L$$

5.5. Equivalence

Proof. $\mathcal{D}_L \subset \mathcal{F}_L$ by definition. Let $A$ be an arbitrary $L$-*-automaton. Let $P$ be the deterministic $L \cdot \mathbb{B}[V(A)]$-process defined by $$P = (\mathbb{B}[V(A)], \widehat{M}_A, I(A), F(A))$$

where, recall, $$\widehat{M}(v,w) = M(v,w) * \{w\} .$$

Let $\widehat{A}$ be the $L \cdot \mathbb{B}[V(A)]$-*-automaton $P^\#$, except with $F(\widehat{A}) = F(P)$. Then, with $\Phi$ as in Lemma 5.3.7, $$\Phi(\mathcal{L}(\widehat{A})) = \mathcal{L}(\Pi_L \widehat{A}) = \mathcal{L}(A) .$$

Since $\widehat{A}$ is deterministic, $\mathcal{L}(\widehat{A})$ is *-regular by Theorem 5.4.2. Thus, $\mathcal{L}(A)$ is *-regular by Corollary 5.4.3. Thus, by Theorem 5.4.2, there exists a strongly deterministic $L$-*-automaton $B$ with $\mathcal{L}(A) = \mathcal{L}(B)$.

[Look, ma, no subset construction!]

76 Chapter 5. String Acceptors

Chapter 6

ω-theory: L-automaton/L-process

6.1 *-Theory vs. ω-Theory for Regular Sets

The "automata" of *automata-theoretic verification* (the subject of this book) are ω-automata: acceptors of sequences, as apposed to the acceptors of strings discussed in the previous chapter. The reasons for this choice are presented in Section 6.2. First, some machinery is developed to help relate the languages of these two theories.

6.1.1 Definition An $L$-$\omega$-*language* is a subset $\mathcal{L} \subset S(L)^\omega$. $\mathcal{L}$ is $\omega$-*regular* if $$\mathcal{L} = \bigcup_{i=1}^{n} \mathcal{L}_{i1} \cdot \mathcal{L}_{i2}^\omega$$

where $\mathcal{L}_{ij}$ are *-regular.

6.1.2 Example $0^\omega + 1^\omega \neq \mathcal{L}_1 \mathcal{L}_2^\omega$ for any *-regular $\mathcal{L}_1, \mathcal{L}_2$.

6.1.3 Definition Let $\mathcal{L}$ be an $L$-*-language. Then $x \in \mathcal{L}$ is *minimal* if no prefix of x is in $\mathcal{L}$. Let $k(\mathcal{L})$ be the set of minimum elements of $\mathcal{L}$. If $\mathcal{L} = k(\mathcal{L})$, say $\mathcal{L}$ is *minimal*.

6.1.4 Notes    1. $k(k(\mathcal{L})) = k(\mathcal{L})$.

Chapter 6.  ω-theory: L-automaton/L-process

2. $\mathcal{L}$ *-regular $\Rightarrow k(\mathcal{L})$ *-regular.

Proof. $k(\mathcal{L}) = \mathcal{L} \setminus (\mathcal{L} \cdot S(L)^+)$.

6.1.5 Theorem [Cho74, 4.9]: $\mathcal{L}$ *-regular if and only if $\mathcal{L} = \bigcup_{i=1}^{n} \mathcal{L}_{1_i}\mathcal{L}_{2_i}^*$, for some regular minimal sets $\mathcal{L}_{1_i}, \mathcal{L}_{2_i}$.

Proof. Let $\mathcal{L} = \mathcal{L}(A)$ for some strongly deterministic $L$-*-automaton $A$, with $I(A) = \{\alpha\}$. For $v, w \in V(A)$, let $A_{vw} = (M_A, \{v\}, \{w\})$. Then $\mathcal{L} = \mathcal{L}(A) = \bigcup_{w \in F(A)} k(\mathcal{L}(A_{\alpha w})) \cdot k(\mathcal{L}(A_{ww}))^*$.

6.1.6 Note $\mathcal{L}$ is ω-regular if and only if $\mathcal{L} = \bigcup_{i=1}^{n} \mathcal{L}_{1_i}\mathcal{L}_{2_i}^\omega$, where $\mathcal{L}_{1_i}$ is regular and $\mathcal{L}_{2_i}$ is regular, minimal. If we restrict $\mathcal{L}_{1_i}$ to be minimal as well, we get a proper subset, those ω-languages accepted by deterministic Büchi automata (see Section 6.2). The sets $\mathcal{L}_{1_i}\mathcal{L}_{2_i}^\omega$ may be taken to be pairwise-disjoint [Cho74, 6.1.6].

6.1.7 Definition Given an $L$-*-language $\mathcal{L}$, define $$\lim \mathcal{L} = \{\mathbf{x} \in S(L)^\omega \mid x_0 \cdots x_{n_i} \in \mathcal{L} \text{ for } n_0 < n_1 < \cdots \},$$

the set of sequences in $S(L)^\omega$ with an infinite number of prefixes in $\mathcal{L}$.

Recall: $\mathcal{L}^\omega \neq \lim \mathcal{L}$, $\lim \mathcal{L}^*$ in general (see Example 6.1.9 below).

6.1.8 Lemma [Cho74, 5.2]: Let $\mathcal{L}$ be *-regular. Then $\exists$ *-regular $\widehat{\mathcal{L}}$ such that
$$\mathcal{L}^\omega = \mathcal{L}^*(\lim \widehat{\mathcal{L}}).$$

Proof (sketch). Let $A$ be strongly deterministic *-automaton with $\mathcal{L}(A) = \mathcal{L}^+$. Say $\mathbf{x} \sim \mathbf{y}$ if the run of $\mathbf{x}$ and $\mathbf{y}$ in $A$ which starts at $\alpha \in I(A)$ ends at the same state. Set $\widehat{\mathcal{L}} = \{\mathbf{x} \mid \mathbf{x} = \mathbf{y} \cdot \mathbf{z} \text{ with } \mathbf{y} \in \mathcal{L}^+, \mathbf{x} \sim \mathbf{z} \text{ and } \mathbf{y} \cdot \mathbf{z}' \nsim \mathbf{z}' \text{ for every prefix } \mathbf{z}' \text{ of } \mathbf{z}\}$.

6.1. Regular Sets

Figure 6D:
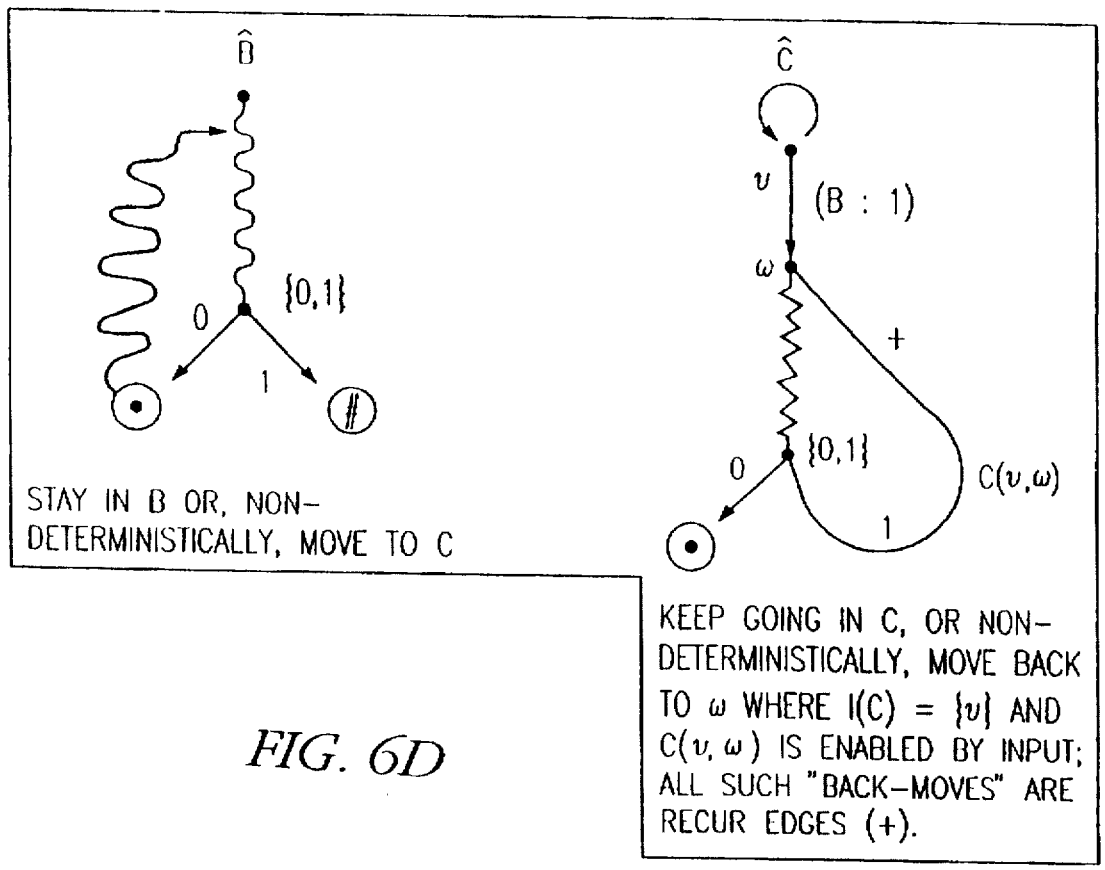
FIG. 6.1A illustrates a state diagram for use with Example 6.1.9
Figure 7A:
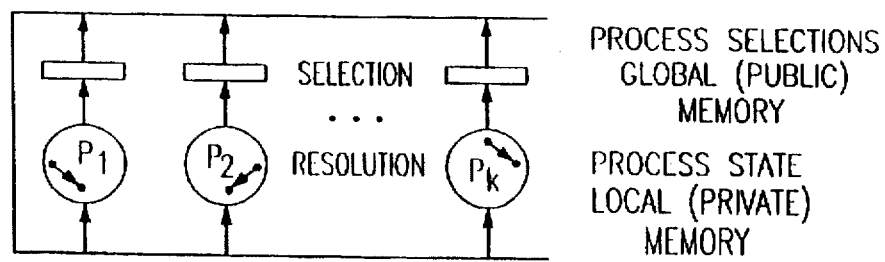
FIG. 7.1 illustrates an s/r model.
Figure 7B:
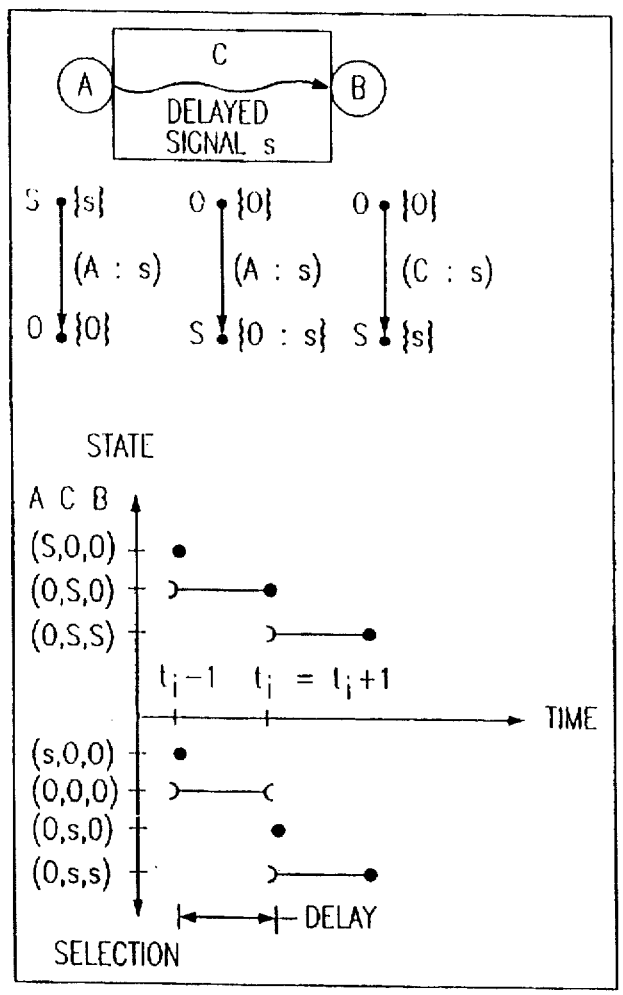
Figure 7C:
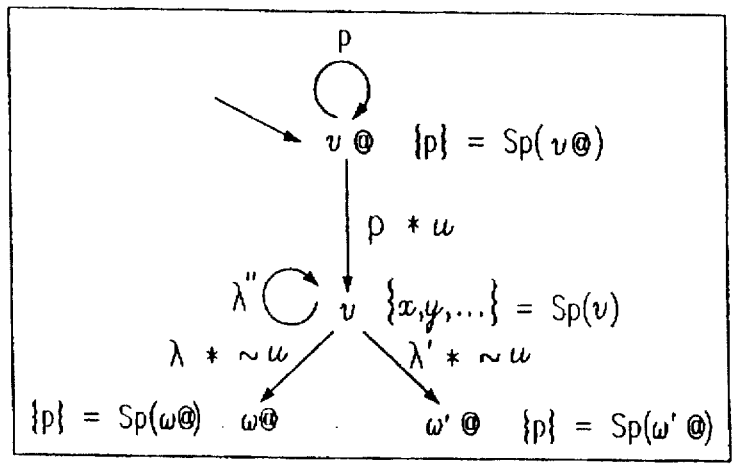
Figure 7D:
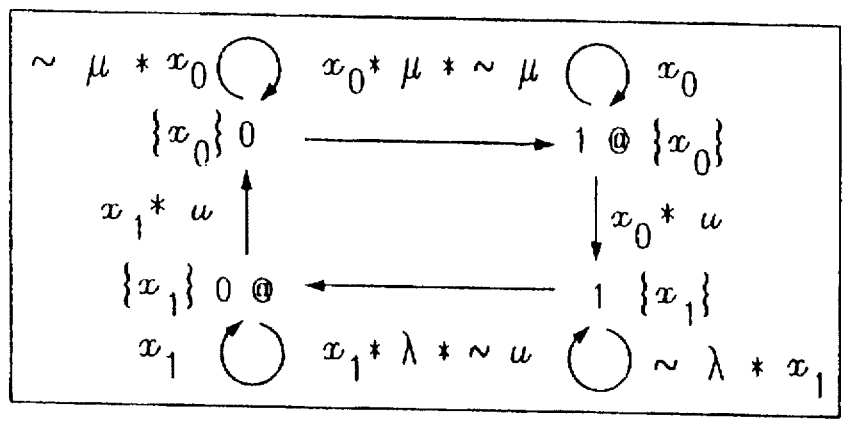
Figure 7E:
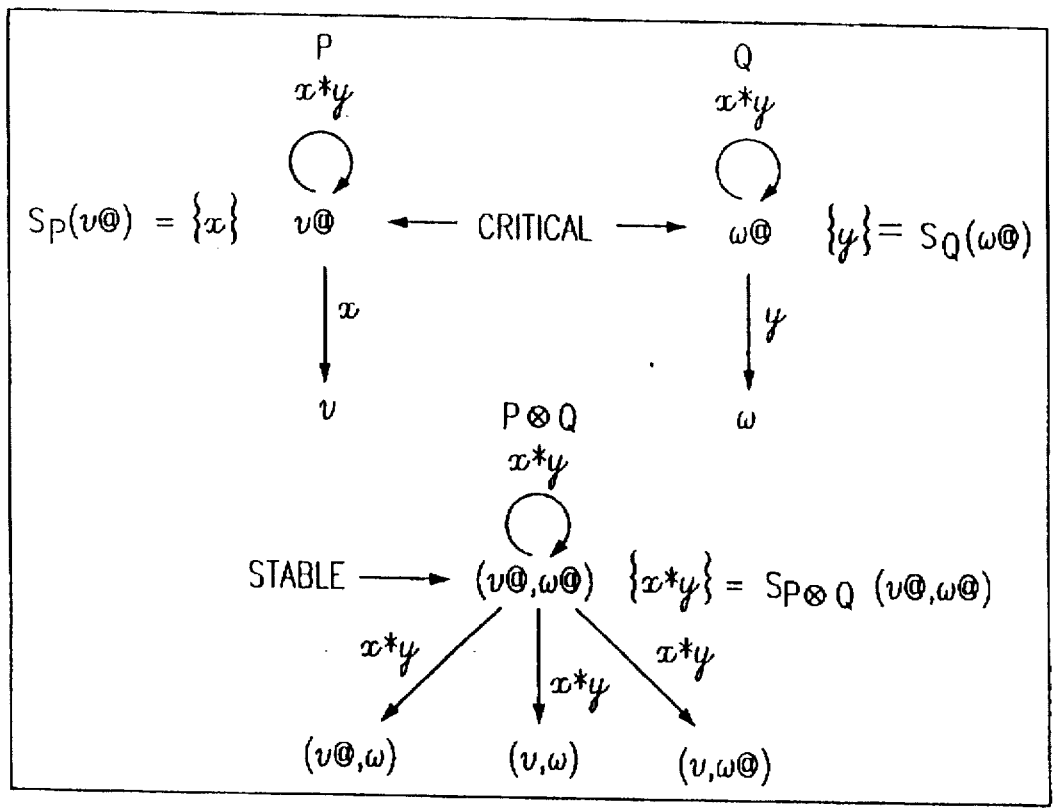
Figure 7F:
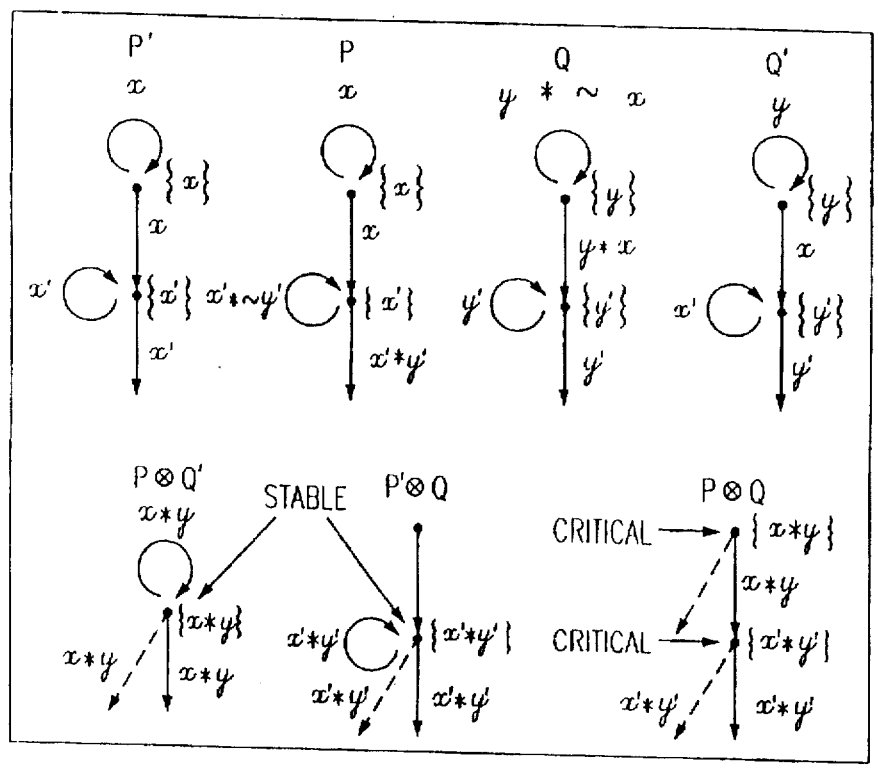
Figure 7G:
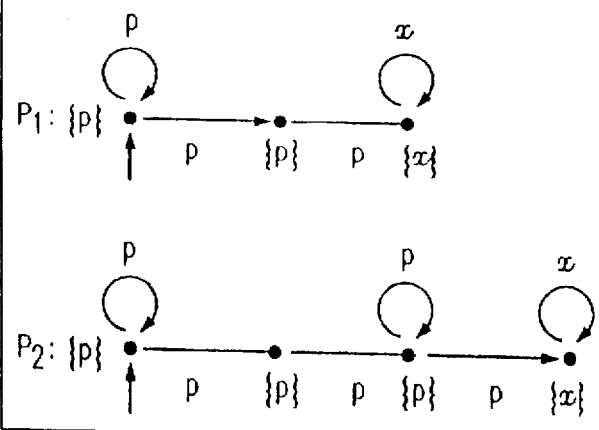
Figure 7H:
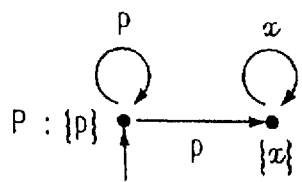
Figure 8A:
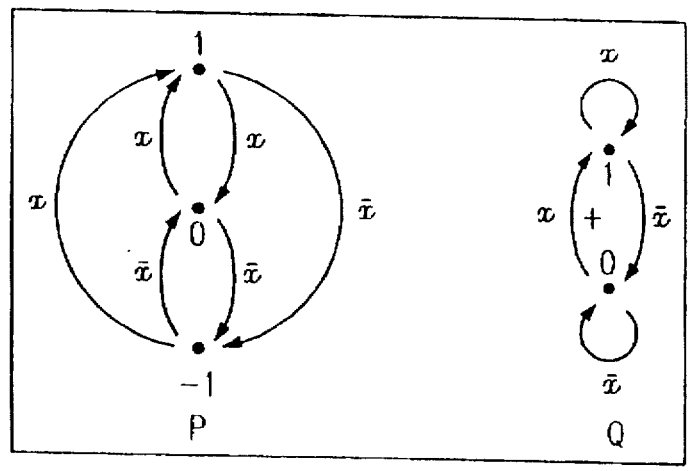
FIG. 8.1 illustrate two processes.
Figure 8B:
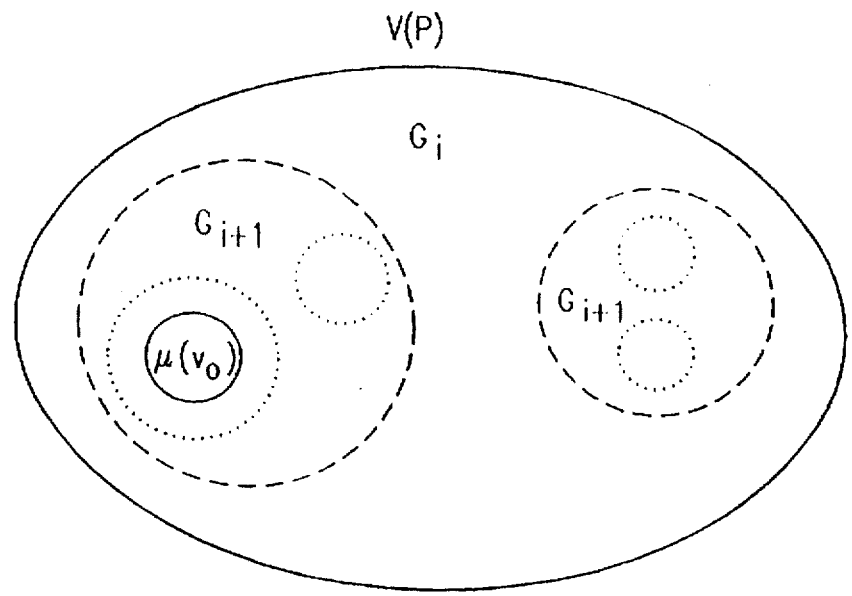
Figure 8C:
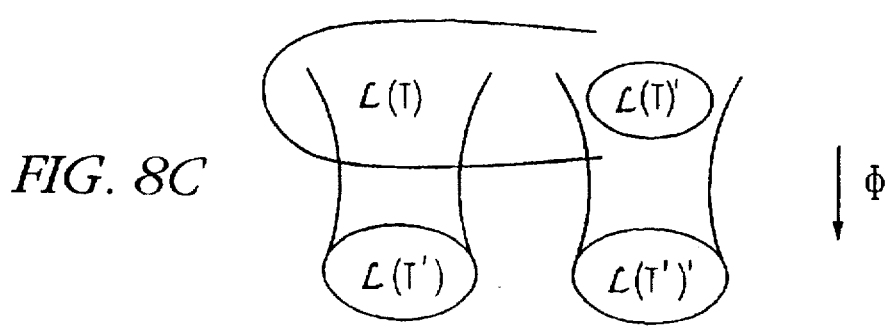
Figure 8D:
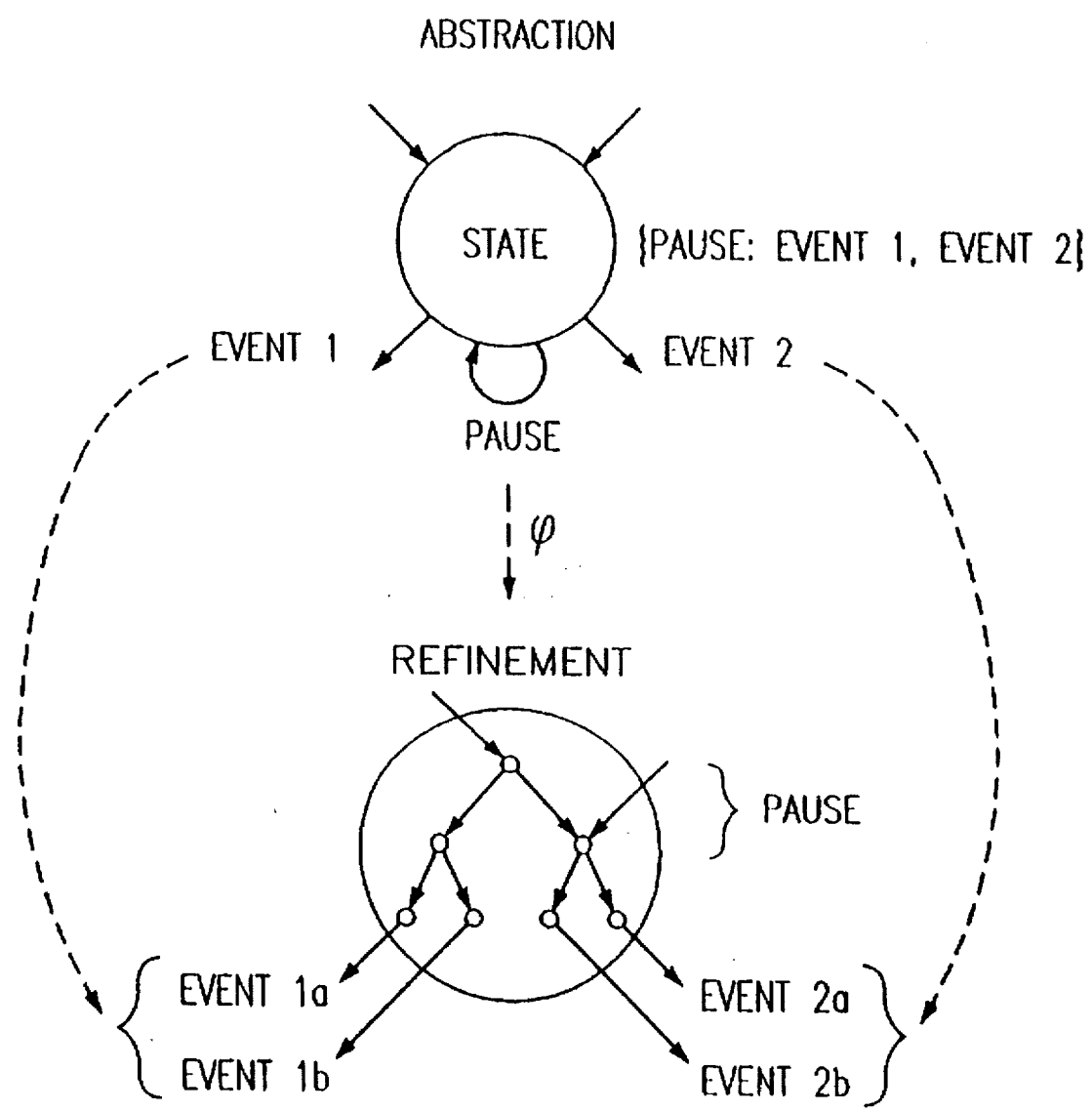
Figure 8E:
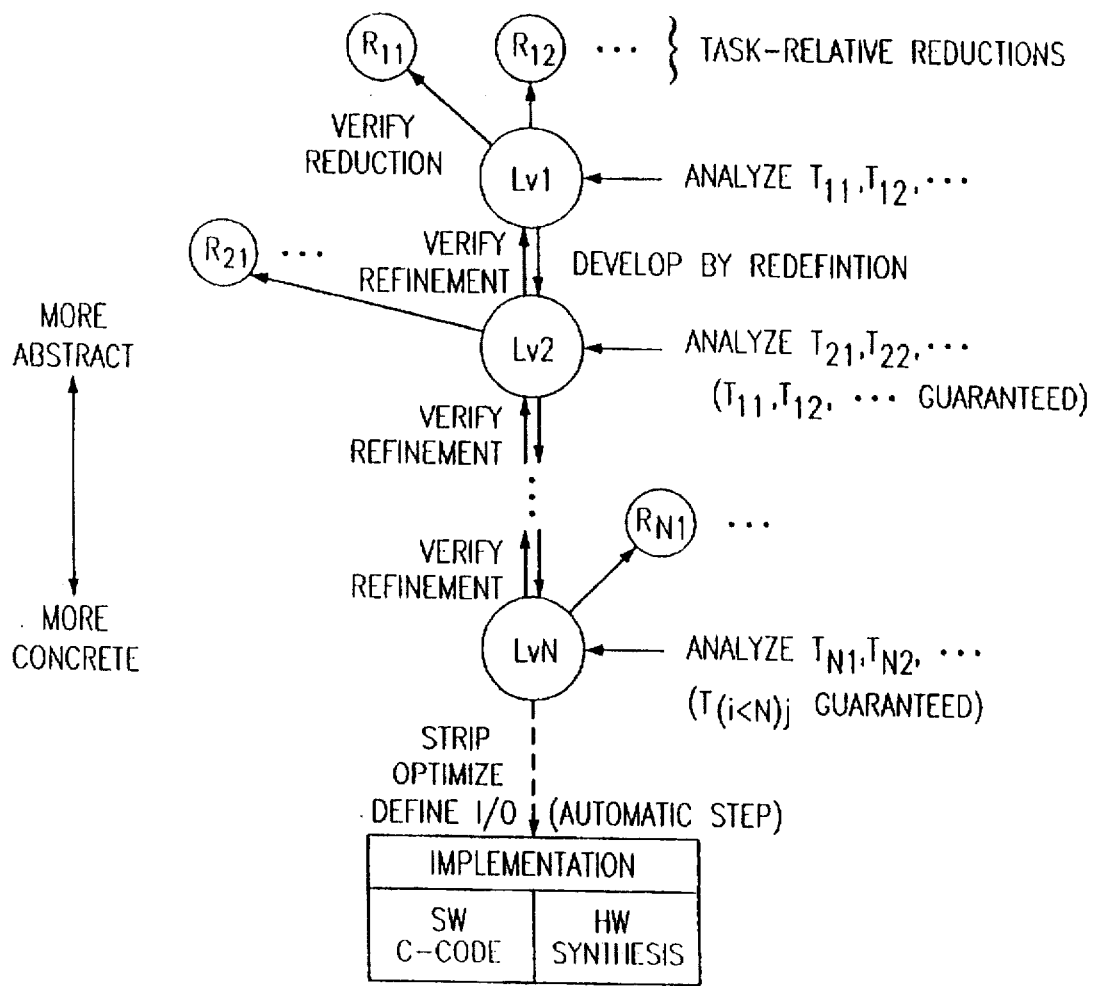
Figure 8F:
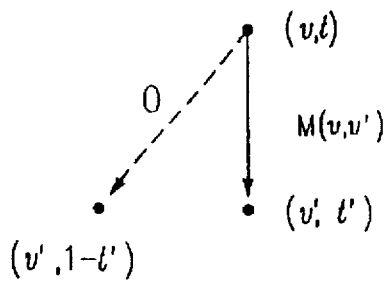
Figure 8G:
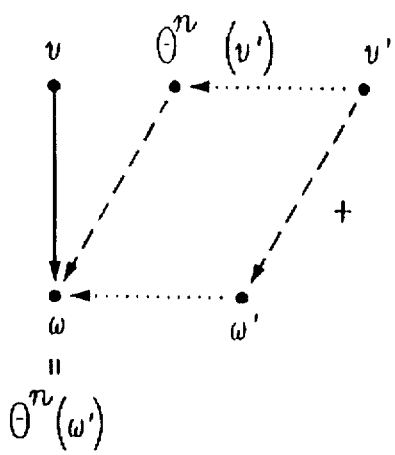
Figure 8H:
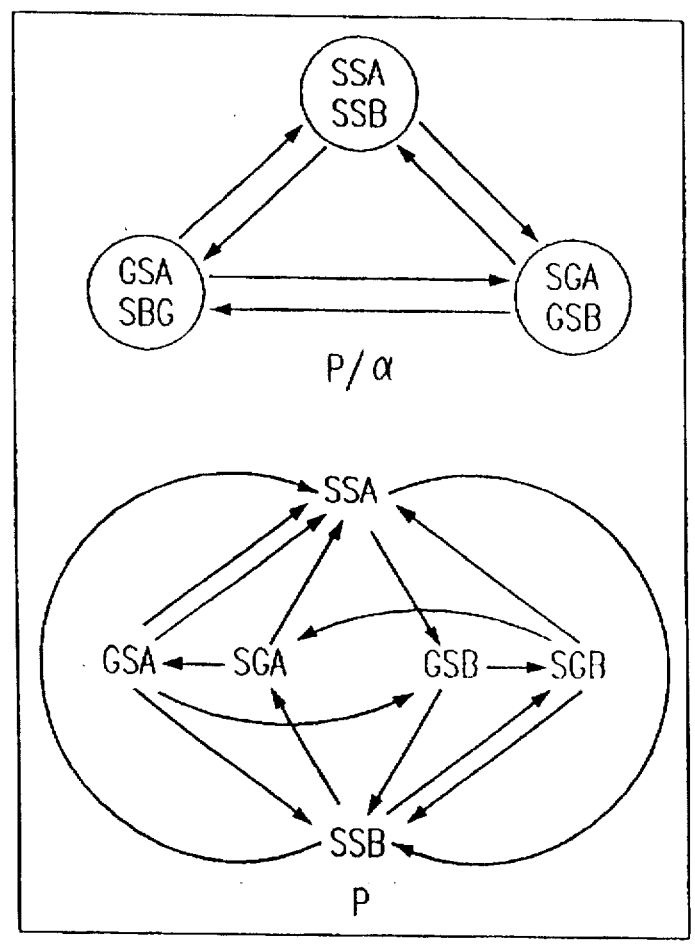
Figure 8I:
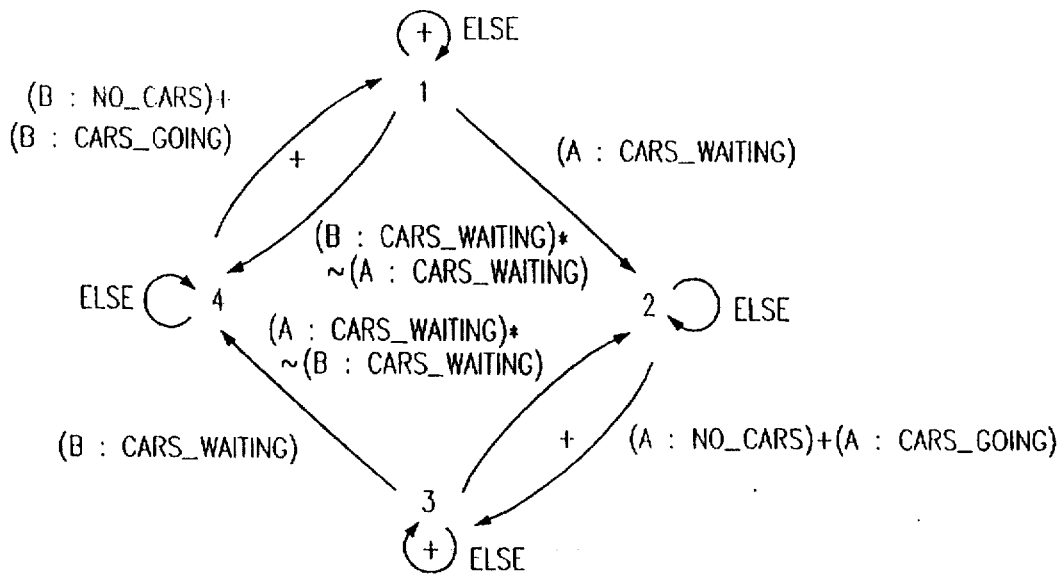
Figure 8J:
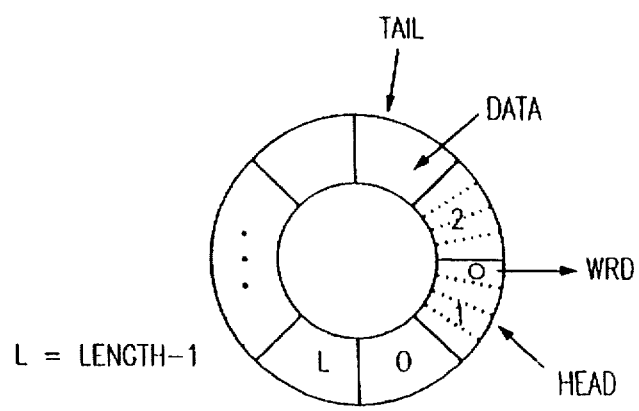

6.1.9 Example $\mathcal{L} = 10^*$ (See Figure 6.1A.)

The proof follows from the next three lemmas.

6.1.10 Lemma $\widehat{\mathcal{L}} = \bigcup_w (\mathcal{L}^* \cap \mathcal{L}((M_A, \{\alpha\}, \{w\}))) \cdot \left(\bigcup_v \widehat{W}_{wv}\right)$ where $$\widehat{W}_{wv} = W_{wv} \cap \bigcap_u (W_{wu} S(L)^+)$$

where $$W_{wv} = \mathcal{L}((M_A, \{w\}, \{v\})) \cap \mathcal{L}((M_A, \{\alpha\}, \{v\})),$$

and thus $\widehat{\mathcal{L}}$ is $*$-regular.

6.1.11 Lemma $\lim \widehat{\mathcal{L}} \subset \mathcal{L}^\omega$ $(\Rightarrow \mathcal{L}^*(\lim \widehat{\mathcal{L}}) \subset \mathcal{L}^* \mathcal{L}^\omega = \mathcal{L}^\omega)$.

Proof. $x \in \lim \widehat{\mathcal{L}}$. Then $x^{(j)} = (x_0, \ldots, x_{n_j}) \in \widehat{\mathcal{L}}$ for $j = 0, 1, \ldots$. Let $y^{(j)} \in \mathcal{L}^+$ be corresponding prefix of $x^{(j)}$ given by definition of $\widehat{\mathcal{L}}$. After possibly eliminating some $x^{(j)}$'s, can get $y^{(j)}$ is a prefix of $x^{(j)}$ is a prefix of $y^{(j+1)}$ for all $j$. Choose $z^{(j)}$ to satisfy $$x^{(j)} = y^{(j)} z^{(j)}$$

and choose $\widehat{z}^{(j)}$ to satisfy $$y^{(j+1)} = x^{(j)} \widehat{z}^{(j)}$$

80     Chapter 6. $\omega$-theory: L-automaton/L-process for all $j$. Get (*)     $\mathbf{x} = \mathbf{y}^{(1)}(\mathbf{z}^{(1)}\widehat{\mathbf{z}}^{(1)})(\mathbf{z}^{(2)}\widehat{\mathbf{z}}^{(2)})\cdots$ $$\underbrace{\phantom{y^{(1)}(z^{(1)}\widehat{z}^{(1)})}}_{\mathbf{x}^{(1)}}$$

$$\underbrace{\phantom{y^{(1)}(z^{(1)}\widehat{z}^{(1)})(z^{(2)})}}_{\mathbf{y}^{(2)}}$$

$$\underbrace{\phantom{y^{(1)}(z^{(1)}\widehat{z}^{(1)})(z^{(2)}\widehat{z}^{(2)})}}_{\mathbf{x}^{(2)}}$$

$$\underbrace{\phantom{y^{(1)}(z^{(1)}\widehat{z}^{(1)})(z^{(2)}\widehat{z}^{(2)})x}}_{\mathbf{y}^{(3)}}$$

By definition, $\mathbf{y}^{(1)} \in \mathcal{L}^+$. Also, $\mathbf{y}^{(j+1)} = \mathbf{x}^{(j)}\widehat{\mathbf{z}}^{(j)} \sim \mathbf{z}^{(j)}\widehat{\mathbf{z}}^{(j)}$ (since $\mathbf{x}^{(j)} \sim \mathbf{z}^{(j)}$) by the definition of $\widehat{\mathcal{L}}$. Since $\mathbf{y}^{(j+1)} \in \mathcal{L}^+$, then also $\mathbf{z}^{(j)}\widehat{\mathbf{z}}^{(j)} \in \mathcal{L}(A) = \mathcal{L}^+$. Thus, from (*), $\mathbf{x} \in (\mathcal{L}^+)^\omega = \mathcal{L}^\omega$.

6.1.12 Lemma     $\mathcal{L}^\omega \subset \mathcal{L}^+ \lim \widehat{\mathcal{L}}$.

Proof. Let $\mathbf{x} \in \mathcal{L}^\omega$. Write $\mathbf{x} = \mathbf{x}^{(0)}\mathbf{x}^{(1)}\cdots$ where each $\mathbf{x}^{(i)} \in \mathcal{L}$. Then $\mathbf{x}^{(i)}$ has a run in $A$ from $\alpha$ to a $v_i \in F(A)$. For each $v \in F(A)$ let $$Q(v) = \{(j,k) \mid j < k, \ \mathbf{x}^{(j)}\cdots\mathbf{x}^{(k)} \text{ runs from } \alpha \text{ to } v\}.$$

This partitions $E = \{(i,j) | i < j\}$ into $m = |F(A)|$ disjoint sets. Consider the complete graph on $\mathbb{N}$ where edge $\{i,j\}$ is colored "$Q(v)$" if $(i,j) \in Q(v)$. Then each edge has one of a finite number of colors. The (infinite version of) Ramsey's Theorem [GRS90, p. 16] guarantees the existence of an infinite, complete, monochromatic subgraph. Say that graph has vertices $N \subset \mathbb{N}$ and its edges have color "$Q(v)$". After (possibly) removing 0 from $N$, let $0 < j_0 < j_1 < \cdots$ be the elements of $N$, and let $\mathbf{y} = \mathbf{x}^{(0)}\cdots\mathbf{x}^{(j_0-1)}$, $\mathbf{z} = \mathbf{x}^{(j_0)}\mathbf{x}^{(j_0+1)}\cdots$. By definition, $\mathbf{y} \in \mathcal{L}^+$. Claim $\mathbf{z} \in \lim \widehat{\mathcal{L}}$. For each $k \geq 1$ let $\mathbf{z}^{(k)}$ be the shortest prefix of $\mathbf{x}^{(j_k)}$ which satisfies:

$$\mathbf{z}^{(k)} \sim \mathbf{x}^{(j_0)}\mathbf{x}^{(j_0+1)}\cdots\mathbf{x}^{(j_k-1)}\mathbf{z}^{(k)}$$

(at least $\mathbf{z}^{(k)} = \mathbf{x}^{(j_k)}$ satisfies this, by the Ramsey argument). Set $$\mathbf{y}^{(k)} = \mathbf{x}^{(j_0)}\cdots\mathbf{x}^{(j_k-1)}, \quad \widehat{\mathbf{x}}^{(k)} = \mathbf{y}^{(k)}\mathbf{z}^{(k)}.$$

Then $\mathbf{y}^{(k)} \in \mathcal{L}^+$, $\widehat{\mathbf{x}}^{(k)} \sim \mathbf{z}^{(k)}$ by definition and $\mathbf{y}^{(k)}\mathbf{z} \not\sim \mathbf{z}$ for any prefix $\mathbf{z}$ of $\mathbf{z}^{(k)}$, again by definition of $\mathbf{z}^{(k)}$. Thus, $\widehat{\mathbf{x}}^{(k)} \in \widehat{\mathcal{L}}$ for $k = 1, 2, \ldots$ so $\mathbf{z} \in \lim \widehat{\mathcal{L}}$.

6.2 ω-automata

Essentially, there is only one type of $L$-*-automaton acceptance structure used in practice: the designated set of *final* states. For ω-automata, the situation is quite different. There are a variety of (inequivalent) types of acceptance conditions commonly used with respect to ω-automata. Most of these may be defined as below, in terms of the *Muller* acceptance condition (6.2.4), which is expressed in terms of a designated set of subsets of states.

Say two types of acceptance conditions are *expressively equivalent* if they define the same class of ω-regular languages. Different types, even if expressively equivalent, may give rise to exponentially different computational complexities for various algorithms (such as testing language containment), and thus may have a nontrivial translation complexity (to express automata with one type in terms of automata with the other) [Saf88], [CDK93]. An automaton type, or acceptance condition will be said to be *fully* expressive if it can be used to express every ω-regular language.

6.2.1 Definition For an (arbitrary) sequence v, set $$\mu(\mathbf{v}) = \{v \mid v_i = v \text{ for infinitely many } v_i\text{'s}\} .$$

Although notions from logic and automata theory are fairly well integrated today, and in fact sprang from the same roots, the two often developed quite separately. The logical condition known as *strong-fairness*, although often conceived in purely logical terms, is strongly tied to ω-automata. Strong-fairness is related to all the ω-automata discussed here (*cf.* Figure 6.1).

6.2.2 Definition A *strong-fairness* constraint *on* the set $S$ with designated set of *initial* states $I(S)$ is a pair $(L, U)$ of subsets of $S$. Its *satisfaction* set is $$\mathbf{SF}(L, U) = \{\mathbf{v} \in S^\omega \mid v_0 \in I(S), \mu(\mathbf{v}) \cap L \neq \phi \Rightarrow \mu(\mathbf{v}) \cap U \neq \phi\} .$$

Sometimes $L$ is associated with an "enable" condition and $U$ is associated with a "performed" condition, in which strong fairness means "infinitely often enabled ⇒ infinitely often performed". For a strong-fairness constraint on the set of states of an automaton (or process) $A$, it is to be understood that the designated set of initial states $I(V(M_A))$ is $I(A)$.

82  Chapter 6. ω-theory: L-automaton/L-process

6.2.3 Note In the literature there also is a notion of "weak-fairness". Its satisfaction set is defined as $$\mathbf{WF}(L,U) = \{\mathbf{v} \in S^\omega \mid v_0 \in I(S), \ \mu(\mathbf{v}) \subset L \Rightarrow \mu(\mathbf{v}) \cap U \neq \phi\}.$$

Note that
$$\mathbf{SF}(L,U) \subset \mathbf{WF}(L,U)$$

and in fact
$$\mathbf{WF}(L,U) = \mathbf{SF}(S, L' \cup U)$$

so weak-fairness is just a special case of strong-fairness. Unlike strong-fairness, weak-fairness is not fully expressive for deterministic automata (although it is for nondeterministic automata). Indeed, there are many types of "fairness" defined in the literature, and even attempts to catalog these. In the context of ω-automata, each type of "fairness" may be expressed by an automaton acceptance condition, of which there are an infinite number of varieties.

6.2.4 Definition A *Muller L-ω-automaton* $A$ is a 3-tuple $$A = (M_A, I(A), \rho(A))$$

where
- $M_A$ is a complete $L$-matrix
- $I(A) \subset V(M_A)$  (*initial* states)
- $\rho(A) \subset 2^{V(M_A)}$  (*repetition* sets).

($2^V$ denotes the set of subsets of any set $V$.)

6.2.5 Definition Let $A$ be a Muller $L$-ω-automaton. The *language* $\mathcal{L}(A)$ of $A$ is the set of $\mathbf{x} \in S(L)^\omega$ for which there is a run $\mathbf{v}$ of $\mathbf{x}$ in $M_A$ with $v_0 \in I(A)$ and $\mu(\mathbf{v}) \in \rho(A)$. Such a run $\mathbf{v}$ is called an *accepting* run of $\mathbf{x}$ (*in* $A$).

Strongly deterministic[1] Muller automata are fully expressive [Cho74]. The best known other types of ω-automata: Büchi [Büc62], Rabin [Rab72] (see [Cho74]) and Streett [Str82], each can be defined as respective subclasses of Muller automata, obtained by restricting the allowable repetition sets [SV89]. Büchi automata are Muller automata whose repetition sets are restricted to those of the form $$\rho(A) = \{C \subset V(M_A) \mid C \cap R \neq \phi\}$$

---
[1] As defined in Definition 5.1.8.

6.2. ω-automata for some $R \subset V(M_A)$. Although nondeterministic Büchi automata are fully expressive, deterministic Büchi automata are not [Cho74] (cf. Note 6.1.6). Note that Büchi automata have the expressiveness of weak-fairness (6.2.3): a weak-fairness constraint $(L, U)$ defines the same language as a Büchi automaton with $R = L' \cup U$. Safra [Saf88], following Vardi [Var85], showed that an Büchi automaton of $n$ states may be "partially" determinized by an automaton with $O(3^n)$ states, in the sense that in the partially determinized automaton, any accepting run makes only a finite number of nondeterministic choices. *Streett* automata are Muller automata whose repetition sets are of the form $$\rho(A) = \{C \subset V(M_A) \mid C \cap L_i = \phi \text{ or } C \cap U_i \neq \phi\}$$

for *each* of some given set of pairs $(L_i, U_i)$ of subsets of $V(M_A)$. Note that each pair $(L_i, U_i)$ defines a strong-fairness constraint on $V(M_A)$ whose satisfaction set $\mathbf{SF}(L_i, U_i)$ is a set of runs of $V(M_A)$, and

6.2.6 $\mathcal{L}(A) = \{\mathbf{x} \in S(L)^\omega \mid \mathbf{x} \text{ has a run in } \cap_i \mathbf{SF}(L_i, U_i)\}$.

A dual class of automata are the *Rabin* automata, which are Muller automata whose repetition sets are of the form $$\rho(A) = \{C \subset V(M_A) \mid C \cap L_i \neq \phi \text{ and } C \cap U_i = \phi\}$$

for (at least) *one* of some given set of pairs $(L_i, U_i)$ of subsets of $V(M_A)$. Thus,

6.2.7 $\mathcal{L}(A) = \{\mathbf{x} \in S(L)^\omega \mid \mathbf{x} \text{ has a run in } \cup_i \mathbf{SF}(L_i, U_i)'\}$ and

6.2.8 $\mathbf{SF}(L_i, U_i)' = \mathbf{SF}(V(M_A), L_i) \cap \mathbf{SF}(U_i, \phi)$.

If $A$ is strongly deterministic, then each $\mathbf{x} \in \mathcal{L}(A)$ has a unique accepting run in $V(M_A)$. In this case, the duality of Streett and Rabin automata implies that for any given set of pairs $(L_i, U_i)$, the languages of the respective Streett and Rabin automata thus defined, are complementary. Moreover, strongly deterministic Rabin (and consequently, Streett) automata are fully expressive [Cho74]. One of Safra's main results [Saf88] is that any Büchi automaton of $n$ states accepts the same language as some strongly deterministic Rabin automaton with $2^{O(n \log n)}$ states. It follows that there exists a Büchi automaton accepting the complementary language, having $2^{O(n \log n)}$ states. Both of 84 Chapter 6. ω-theory: L-automaton/L-process these bounds are claimed to be essentially optimal [Saf88]. Klarlund [Kla91] and Safra [Saf92] each show that given a strongly deterministic Streett automaton with $n$ states and $k$ strong-fairness constraints, there exists a strongly deterministic Street automaton which accepts the complementary language, with $2^{O(nk \log nk)}$ states and $nk$ strong-fairness constraints.

Büchi automata may be considered a subclass either of Streett or Rabin automata, defined by restricting the acceptance condition to a single pair $(L, U)$ in which $L = V(M_A)$ for Streett automata, or $U = \phi$ for Rabin automata. Thus in particular, the Büchi acceptance condition may be viewed in terms of a (restricted) strong-fairness condition: for a Büchi $L$-ω-automaton $A$, $$\mathcal{L}(A) = \{x \in S(L)^\omega \mid x \text{ has a run in } \mathbf{SF}(V(M_A), U)\}$$

for some $U \subset V(M_A)$.

The acceptance condition for a Muller $L$-ω-automaton $A$ may be viewed in terms of strong-fairness, as well: for some sets $L_i \subset V(M_A)$, let $$\mathbf{FAIR} = \bigcup_i \left( \bigcap_{v \in L_i} (\mathbf{SF}(L_i, \{v\})) \right) \cap \mathbf{SF}(L'_i, \phi) .$$

Then $$\mathcal{L}(A) = \{x \in S(L)^\omega \mid x \text{ has a run in } \mathbf{FAIR}\} .$$

These definitions suggest that there may be other interesting types of $L$-ω-automata. Emerson and Lei [EL85] in essence proposed to specify the repetition sets of a Muller automaton in terms of a propositional formula in its states. While this does not give rise to a new class of automata, it gives an explicit formalism for defining the repetition sets, which can be incorporated in complexity measures. Manna and Pnueli [MP87] proposed a class of automata which are *not* naturally viewed as a subclass of Muller automata. For their automata, which they call ∀-*automata*, an ω-word $x$ is accepted if *every* run of $x$ is an accepting run (instead of the customary: *some* run). A run is accepting if it is in the satisfaction set of some (fixed) single strong-fairness condition on the states of the automaton. Thus, the languages of the ∀-automata are precisely the complementary languages $\mathcal{L}(R_{(L,U)})'$ where $R$ is a Rabin automaton with acceptance condition defined by a single pair $(L, U)$. As such Rabin automata generalize Büchi automata which are fully expressive when nondeterministic, it follows that non-deterministic ∀-automata are fully expressive. However, deterministic ∀-automata are not fully expressive.

6.2. ω-automata

Although all of the foregoing automata types are fully expressive and hence expressively equivalent if taken to be nondeterministic, deterministic automata are needed for most applications, from testing language containment and homomorphism validity, to state minimization. For some automata such as those of Büchi, it is not always possible to find a deterministic automaton, of the same type, with the same language as that of a given nondeterministic one. For others (those which are fully expressive in their deterministic form), it always is possible, but at a computational cost which is exponential in the number of states of the automaton. Moreover, mapping from one class to another (for example, to find a deterministic Rabin automaton with the same language as that of a given deterministic Streett automaton) often has exponential cost itself. Thus, the choice of automaton class has computational significance. Safra gives the mapping costs and determinization costs for a number of automata types in [Saf88], [Saf92], representing a watershed in the study of ω-automata: he improved existing doubly exponential procedures to singly exponential ones (which he showed are essentially optimal). Another view of such mappings in terms of logical operators is given in [CDK93].

The choice of automaton type for use in connection with formal verification is governed by two issues: syntactic suitability and computational complexity. Acceptance structures should have a natural match with constructs that arise in the course of verification. Given that, these acceptance structures should give rise to verification algorithms with computational complexity as low as possible. Checking emptiness, essential in verification, is NL-complete for Büchi automata [SV89], P-complete for Streett automata and NP-complete for the acceptance condition of Emerson and Lei described above [EL85]. Even a slight generalization of the Streett acceptance condition, to allow some of the strong fairness constraints to be replaced by $(V(M_A), U)$ OR $(V(M_A), W)$, i.e. giving rise to automata in which some of the $\mathbf{SF}(L_i, U_i)$ terms in (6.2.6) are replaced by $$\mathbf{SF}(V(M_A), U) \cup \mathbf{SF}(V(M_A), W)$$

terms, changes the complexity of emptiness-testing to NP-complete (from P-complete) [EL85], [HSB94]. However, the Emerson-Lei acceptance condition is exponentially more succinct than the Streett acceptance condition, and that in turn is exponentially more succinct than the Büchi acceptance condition [SV89]. Moreover, factors of no theoretical interest also can be significant in practice. A complexity factor of 2 (for otherwise comparable algorithms) is important in practical terms, and a factor of 10 (say, waiting 1 hour versus 10 hours) can make the difference between feasibility and infeasibility. Notwithstanding the recommenda- 86  Chapter 6.  ω-theory: L-automaton/L-process tion of Safra to use Streett automata on the grounds that complementation is asymptotically no more than for Büchi automata [Saf92] (cf. [SV89]), we come to a different conclusion here, based upon the degree of the polynomial complexity of emptiness-testing (quadratic vs. linear: see below).

An important aspect of syntactic suitability is expressiveness, which figures in a tradeoff with computational complexity: if expressiveness is sacrificed, then computational complexity may be reduced. However, as the expressiveness possible with automata is limited to ω-regular languages (thus barring unbounded recursive computations), one should seek not to further limit expressiveness, but to construct algorithms for fully expressive automata which can capitalize on simpler input instances. In fact, it is not uncommon to design algorithms which take into account the nature of the input problem, so as to apply computationally less complex algorithms to simpler problems. The potential to change the algorithm in response to the input therefore should be a factor in the choice of a suitable class of automata. Moreover, it is desirable to have a foundation for verification which supports extensions in expressiveness, beyond ω-regular languages. Examples of this are algorithms for parameterized automata as discussed in Chapter 9 and interfaces with automated theorem-provers, such as [KL93]. The full power of ω-regular languages is needed in formal verification to express notions of eventuality ("if the computation begins, then eventually it completes") in all conditional combinations; such "eventuality" is necessary to express specifications of cache controllers, communication protocols and the myriad of control-intensive designs for which formal verification is applicable.

The strong-fairness constraints in the Streett automaton acceptance condition provides a powerful and general construct. However, it gives rise to verification algorithms which are more complex than necessary in many special cases. Moreover, strong-fairness itself, while fully expressive, is not a natural paradigm for most or many verification applications. One often needs only weak-fairness, and most often, simple eventualities: "eventually the computation will terminate" and conditional eventualities: "if a message is sent, it is eventually received". While these can be expressed in terms of strong fairness, it is syntactically cumbersome to do so. More important is that verification algorithms (for verifying language containment, homomorphic reduction and the like) will have a larger run-time complexity than necessary if they are designed to manipulate general strong fairness in every instance (cf. Section 8.3). Although this complexity is inevitable in the worst case, it

6.2. ω-automata can be avoided in the less complex typical cases just cited. Thus, we seek a paradigm at once capable of expressing the strong fairness of Streett automata, but based upon a computationally simpler acceptance condition which affords a less complex decision procedure for many typical cases which arise in practice.

The same concerns apply to Rabin automata. Büchi automata are syntactically convenient (the designated set of states $R$ may be associated with "progress milestones"). Unfortunately, they are not adequately expressive in their deterministic form ("0 or 1, but ultimately 1" cannot be expressed), while in nondeterministic form, they give rise to algorithms which are exponentially more complex than the corresponding algorithms for other automata which are fully expressive in deterministic form. With Muller automata it is often quite difficult or even infeasible (in the context of designs built from components) to relate a logical property to a precise definition of repetition sets: one typically does not know the set of reachable states until the verification algorithms have been applied. Moreover, when a design is expressed as a Cartesian product of component spaces (as is typically the case), it is syntactically infeasible to define the repetition sets. There is a similar problem with ∀-automata: it may be difficult or impossible to infer directly from the specification of a ∀-automaton whether or not it accepts a given behavior, and thus its logical meaning may be in doubt. Moreover, deterministic ∀-automata are not fully expressive, while nondeterminism gives rise to the same computational problems as for Büchi automata.

In what follows, another pair of dual ω-automata types are developed: *L-processes* and *L-automata*. These are fully expressive, have a simple and natural syntax tailored to formal verification, and give rise to algorithms with complexity sensitive to the complexity of the input (*cf.* Section 8.3). Their acceptance condition, although not directly definable in terms of the Muller acceptance condition, is definable in terms of strong-fairness (and hence the Muller condition) after a transformation which splits each state into two states (Section 8.7). This transformation, which doubles the size of the automaton state space, also may render the automaton syntactically less intuitive. Thus, it is desirable for syntactic reasons no less than reducing computational complexity, to maintain the structural compression.

For the purpose of relating these two automaton types to the others, let us assume this transformation has been done, however. Since the sequel focuses upon these two types of *L*-ω-automata alone, they are referenced simply as *L-process* and *L-automaton* respectively. After the 88    Chapter 6.  ω-theory: L-automaton/L-process above-mentioned transformation on states (and completing the transition matrix, in the case of an $L$-process) an $L$-process (respectively, $L$-automaton) $A$ is a Streett automaton (respectively, Rabin automaton) defined in terms of pairs $(L_i, U_i)$ which, for each $i$, satisfy either $L_i = V(M_A)$ or $U_i = \phi$. Thus, for the $L$-process $A$, acceptance may be defined in terms of strong-fairness constraints of the form (a)  $(V(M_A), U_i)$, (b)  $(L_i, \phi)$.

The first constraint (a) may be interpreted as: runs do not "get stuck" (forever) inside a designated set of transient states $U_i'$. The second constraint (b) may be interpreted as: runs eventually stay away from a designated set of "interrupt" states $L_i$. These constraints should be visualized as *exception* conditions: condition (a) excepts runs which "get stuck"; condition (b) excepts runs which repeatedly (without end) hit "interrupt" states.

Thus, an $L$-process accepts all behavior consistent with its transition structure which is not explicitly *excepted*. This notion of acceptance is well-suited to define a "system" model. Such a model may be considered as a design prototype, represented at some level of abstraction. In such a prototype, nondeterminism is the primary mechanism for abstraction (cf. Sections 7.6, 8.6). It is used to abstract both duration (delay) and computation. A "pause" event held arbitrarily long relative to other concurrent events and then terminated nondeterministically abstracts duration. A nondeterministic choice among the possible outcomes of a computation abstracts the computation. Thus, a routine which computes a value in a range $S$ may be abstracted by a nondeterministic pause, followed by a nondeterministic choice from the range $S$. However, the system model may fail to perform its intended function if certain delays are unbounded or certain nondeterministic choices such as choices which model interrupts, repeat without end. This unbounded behavior simply may be an artifact of the nondeterminism introduced to achieve abstraction, and is precluded by characteristics of the detailed design. The *exception* character of $L$-process acceptance offers a convenient mechanism to eliminate such spurious behaviors from the abstract model.

The conditions (a) and (b) suffice to render deterministic (although not strongly deterministic) $L$-processes fully expressive (Theorem 6.2.55), which from the perspective of complexity considerations, is sufficient (Section 8.11). Streett automata may in certain cases be exponentially more succinct than $L$-processes [HSB94]. However, it is shown in 6.2. ω-automata Section 8.3 how the effect on computational complexity of this potential blow-up is circumvented algorithmically. (A general strong-fairness constraint may be expressed by a deterministic 4-state $L$-process with one acceptance condition of type (a) and one of type (b). Thus, $k$ strong-fairness constraints are expressed by an $L$-process with $4^k$ states. Nonetheless, the complexity of language containment is $O(k)$ rather than $O(4^k)$ when the $k$ $L$-processes are retained in factored form.)

On the other hand, testing language emptiness (the basic step in checking language containment) is $O(k^2 e)$ for Streett automata with $e$ transitions and $k$ acceptance pairs [EL85], whereas it is only $O(ke)$ for $L$-processes (Corollary 8.1.7). (This advantage also has been obtained in [HSB94] by combining the Streett and $L$-process acceptance structures.)

As a special type of Rabin automaton, the $L$-automaton has its acceptance conditions defined in terms of complementary satisfaction sets $SF(V(M_A), U_i)'$ and $SF(L_i, \phi)'$ (cf. (6.2.7)). However, it is easily seen (cf. (6.2.8)) that (a') $\quad SF(V(M_A), U_i)' \;=\; SF(U_i, \phi)$,
(b') $\quad\quad SF(L_i, \phi)' \;=\; SF(V(M_A), L_i)$.

Hence, while $L$-processes and $L$-automata are syntactically dual (defining complementary languages when strongly deterministic), both their acceptance conditions are expressible in terms of the acceptance sets of strong-fairness constraints. However, the union in (6.2.7) dictates a positive interpretation of acceptance, in place of the negative "exception" interpretation adhering to $L$-processes. For $L$-processes, to be accepted, a run must be in the satisfaction set of *each* strong-fairness condition (hence the interpretation of these as *exception* conditions). For $L$-automata, a run need be in only one satisfaction set to be accepted. Therefore, it is natural to interpret these satisfaction sets positively, as accepting a run, thereby defining what *is* in the language, rather than what is not.

Beyond its natural duality with $L$-processes, this positive interpretation for $L$-automata affords a natural mechanism to specify *property requirements* for a system model (that is, the properties to be verified in the system model). Indeed, the first condition (a') may be interpreted as: runs eventually remain in their objective set $U_i'$. The second condition (b') may be interpreted as: runs continually pass "progress" states or milestones defined by $L_i$. In the formal definition of an $L$-automaton (and $L$-process), such progress will be given in terms of transitions rather than states — which is both more convenient syntactically for modelling purposes, and more succinct.

Chapter 6. $\omega$-theory: L-automaton/L-process

For reasons dual to those pertaining to $L$-processes and Streett automata, $L$-automata may be more suitable than Rabin automata for defining system requirements. Although less general than Rabin automata in terms of expressing complementary strong fairness, nondeterministic $L$-automata are fully expressive. The same is not true for deterministic $L$-automata. However, this is not a limitation for verification purposes, as intersections of the languages of strongly deterministic $L$-automata are fully expressive (Theorem 6.2.54). Moreover, such a "task decomposition" is required for the application of reduction algorithms to reduce the computational complexity of the verification algorithms, as described in Chapter 1. Although Rabin automata may in certain cases be exponentially more succinct than $L$-automata, as with $L$-processes this does not affect the computational complexity of the associated formal verification (compact product representations need not be expanded).

Thus, we will use $L$-processes to model a system, and $L$-automata to model its "specification" or the "tasks" whose performance is to be verified. Conventionally, if $S$ and $T$ are automata, $S$ modelling a system and $T$ a task for $S$, then the performance of $T$ by $S$, which is the language containment $$\mathcal{L}(S) \subset \mathcal{L}(T) \tag{6.1}$$

is tested as follows. Construct an automaton $\tilde{T}$ which accepts the complementary language:

$$\mathcal{L}(\tilde{T}) = \mathcal{L}(T)' \tag{6.2}$$

and test $$\mathcal{L}(S) \cap \mathcal{L}(\tilde{T}) = \phi. \tag{6.3}$$

Of course, (6.1) is equivalent to (6.3), and testing (6.3) for typical types of automata is easy when $S$ and $\tilde{T}$ are small, having computational complexity which is linear in the product of the sizes of $S$ and $\tilde{T}$. Typically, the bottleneck here is the size of $\tilde{T}$ which can be exponentially larger than $T$. However, utilizing an $L$-process for $S$ and $L$-automaton for $T$ avoids this, on account of their duality: the language inversion (6.2) can be accomplished in constant time, simply by considering $T$ as an $L$-process instead of an $L$-automaton, and moving it together with $S$. Thus, the computational complexity of the test (6.1), rather than being exponential in the size of $T$, is only linear in the size of $T$. This will become clear in Chapter 8.

Now, formal definitions of $L$-automaton and $L$-process are given in different terms, which emphasize the intended interpretation of their acceptance structures.

6.2. ω-automata

| AUTOMATON TYPE | ACCEPTED RUNS | FULLY EXPRESSIVE IF: |
|---|---|---|
| Muller | $\bigcup_i \bigcap_{v \in L_i} (\mathbf{SF}(L_i, \{v\}) \cap \mathbf{SF}(L'_i, \phi))$ | strongly deterministic |
| Büchi | $\mathbf{SF}(V(M_A), U_0)$ | nondeterministic |
| Streett | $\bigcap_i \mathbf{SF}(L_i, U_i)$ | strongly deterministic |
| Rabin | $\bigcup_i \mathbf{SF}(L_i, U_i)'$ | strongly deterministic |
| ∀- | $\mathcal{L}(R_{(L_0, U_0)})'$ | nondeterministic |
| L-process | $\bigcap_i \mathbf{SF}(L_i, \phi) \cap \mathbf{SF}(V(M_A), U_i)$ | deterministic |
| L-automaton | $\bigcup_i \mathbf{SF}(L_i, \phi)' \cup \mathbf{SF}(V(M_A), U_i)'$ | nondeterministic |

Figure 6.1: The acceptance conditions of various ω-automata $A$, viewed in terms of strong-fairness constraints $(L_i, U_i)$. Only the ∀-automaton, with language defined in terms of a Rabin automaton $R_{(L_0, U_0)}$ with single acceptance pair $(L_0, U_0)$, fails to fit within this paradigm.

6.2.9 Definition An *L-automaton* $A$ is a 4-tuple $$A = (M_A, I(A), R(A), Z(A))$$

where $M_A$ is a complete $L$-matrix    (*transition* matrix)
$I(A) \subset V(M_A)$    (*initial* states)
$R(A) \subset E(M_A)$    (*recur* edges)
$Z(A) \subset 2^{V(M_A)}$    (*cycle* sets).

6.2.10 Definition Let $M$ be an $L$-matrix and let $\mathbf{v} \in V(M)^\omega$. Set $$\beta(\mathbf{v}) = \{e \in E(M) \mid (v_i, v_{i+1}) = e \text{ infinitely often}\}.$$

Chapter 6. $\omega$-theory: L-automaton/L-process

6.2.11 Definition Let $A$ be an $L$-automaton. The $$\text{language} \quad \mathcal{L}(A),$$

$$\text{(resp.)} \quad B\ddot{u}chi\text{-}language \quad \mathcal{L}_\beta(A),$$

$$\text{(resp.)} \quad Muller\text{-}language \quad \mathcal{L}_\mu(A)$$

is the set of $\mathbf{x} \in S(L)^\omega$ such that for some run $\mathbf{v}$ of $\mathbf{x}$ in $A$ with $v_0 \in I(A)$, $$\beta(\mathbf{v}) \cap R(A) \neq \phi \quad \text{or} \quad \mu(\mathbf{v}) \subset C \in Z(A),$$

$$\text{(resp.)} \quad \beta(\mathbf{v}) \cap R(A) \neq \phi,$$

$$\text{(resp.)} \quad \mu(\mathbf{v}) \in Z(A).$$

Such a run $\mathbf{v}$ is called an *accepting* (resp., $\beta$-*accepting*, $\mu$-*accepting*) run of $\mathbf{x}$.

6.2.12 Note $\mathcal{L}_\beta(A), \mathcal{L}_\mu(A) \subset \mathcal{L}(A)$.

6.2.13 Note $\mathcal{L}_\beta$ is equivalent to the usual definition of a Büchi automaton, which has $R(A) \subset V(A)$ and tests $\mu(\mathbf{v}) \cap R(A) \neq \phi$; our definition (cf. Section 8.7) is up to two times more efficient in the size of $A$ for defining a given Büchi-language [Kur87a].

6.2.14 Definition An $L$-process $P$ is a 5-tuple $$P = (L_P, M_P, I(P), R(P), Z(P))$$

where $L_P$ is a subalgebra of $L$ (the *output* subalgebra), $M_P$ is an arbitrary $L$-matrix, (the *transition* matrix), and $I(P), R(P), Z(P)$ are as in Definition 6.2.9.

6.2.15 Definition For a process or automaton $X$, write $$V(X) \equiv V(M_X), \quad |X| \equiv |V(X)|, \quad E(X) \equiv E(M_X),$$

$$X(v, w) \equiv M_X(v, w), \quad s_X(v) \equiv s_{M_X}(v).$$

6.2. ω-automata

6.2.16 Definition The *selections* of an $L$-process $P$ at $v \in V(P)$ are the elements of the set $$S_P(v) = \{s \in S(L_P) \mid s * s_P(v) \neq 0\}.$$

The intended interpretation of "selection" is a set of (nondeterministic) outputs as a function of state. (These may be considered to be outputs either of the associated process or of a hidden internal process.) The nondeterministic nature of selection is an important facility for modelling abstraction: abstraction of function, achieved through modelling an algorithm by a nondeterministic choice of its possible outcomes, and abstraction of duration, achieved through modelling a specific sequence of actions by a delay of nondeterministic duration (see Sections 7.5, 8.6).

6.2.17 Example It is customary to implement an $L$-process in terms of a *state variable* and a *selection variable*. The Boolean algebra $L$ then is defined in terms of the selection variables of all the processes in the environment (including its own selection variable). Suppose $x_1, \ldots, x_k$ with respective finite ranges $R_1, \ldots, R_k$ are the selection variables in question. Then $L$ is the set of all Boolean sums of *global* assignments $$(x_1 = a_1) * \cdots * (x_k = a_k)$$

where $a_i \in R_i$ for $i = 1, \ldots, k$. If $L$-process $P_i$ has selection variable $x_i$, then its output subalgebra $L_{P_i}$ is the subalgebra of $L$ consisting of all Boolean sums of *local* assignments $$(x_i = a_i)$$

while the *selections* of $P_i$ at a state $v$ of $P_i$ are the local assignments which enable some transition from $v$. (It is common to say the selection of $P_i$ at $v$ is "$a_i$" rather than the formally correct $(x_i = a_i) \in L_{P_i}$). Notice that $$\sim(x_i = a_i) = \sum_{\substack{b \in R_i \\ b \neq a_i}} (x_i = b)$$

is the complement of $(x_i = a_i)$ in both $L_{P_i}$ and $L$ (as it must be, in order for $L_{P_i}$ to be a subalgebra of $L$). It is common to write $(x_i \neq a_i)$ to denote $\sim(x_i = a_i)$. The transition matrix of $P_i$ naturally defines transitions in terms of $L$:

$$P_1(v,w) = (x_1 = a) * (x_2 = b) + (x_1 = b) * \sim(x_3 = c)$$

for example. (*Cf.* Example 2.1.25.)

94  Chapter 6. ω-theory: L-automaton/L-process

6.2.18 Definition Let $P$ be an $L$-process. The *language* of $P$ is the set $\mathcal{L}(P)$ of $\mathbf{x} \in S(L)^\omega$ such that for some run $\mathbf{v}$ of $\mathbf{x}$ in $P$ with $v_0 \in I(P)$, $$\beta(\mathbf{v}) \cap R(P) = \phi \quad \text{and} \quad \mu(\mathbf{v}) \cap (V(P) \setminus C) \neq \phi \quad \forall C \in Z(P).$$

Such a run $\mathbf{v}$ is called an *accepting* run of $\mathbf{x}$.

6.2.19 Definition Let $P$ be an $L$-process. Define the *dual* of $P$, $P^\#$ to be the $L$-automaton with (for some symbol $\# \notin V(P)$)

$$V(P^\#) = \begin{cases} V(P) \cup \{\#\} & \text{if } \prod_v s_P(v) < 1, \\ V(P) & \text{otherwise} \end{cases}$$

$$P^\#(v,w) = P(v,w) \quad \text{if } v,w \in V(P)$$

if $\prod_v s_P(v) < 1$, then for all $v \in V(P)$, $$P^\#(v,\#) = \sim s_P(v) \quad \text{(makes } M_{P^\#} \text{ complete)}$$
$$P^\#(\#,v) = 0 ;$$
$$P^\#(\#,\#) = 1 ;$$
$$I(P^\#) = I(P)$$
$$R(P^\#) = \begin{cases} R(P) \cup (E(P^\#) \cap (V(P^\#) \times \{\#\})) & \text{if } \# \in V(P^\#) \\ R(P) & \text{otherwise} \end{cases}$$
$$Z(P^\#) = Z(P).$$

6.2.20 Lemma $P^\#$ is an $L$-automaton.

6.2.21 Definition If $P$ is an $L$-process and $W \subset V(P)$, define the *restriction* of $P$ to $W$ to be the $L$-process $P|_W$ with $L_{P|_W} = L_P$, $V(P|_W) = W$, $M_{P|_W}(e) = P(e)$ for all $e \in W^2$, $I(P|_W) = I(P) \cap W$, $R(P|_W) = R(P) \cap W^2$ and $Z(P|_W) = \{C \cap W \mid C \in Z(P)\}$.

6.2.22 Definition For an $L$-process $P$, let $W \subset V(P)$ be the states reachable from $I(P)$ through a path which may be extended to an accepting run of $P$, and set $P^* = P|_W$.

6.2.23 Lemma $P^*$ is an $L$-process and $\mathcal{L}(P^*) = \mathcal{L}(P)$.

6.2.24 Definition A regular $L$-*-language $\mathcal{L}$ is *prefix-closed* if for all $x, y \in S(L)^+$, $xy \in \mathcal{L} \Rightarrow x \in \mathcal{L}$.

6.2. ω-automata

6.2.25 Theorem Let $\mathcal{L}$ be an $L$-ω-language. The following are equivalent:

1. $\mathcal{L} = \lim \widehat{\mathcal{L}}$ for some prefix-closed regular $L$-*-language $\widehat{\mathcal{L}}$;
2. $\mathcal{L} = \mathcal{L}(P)$ for some $L$-process $P$ with $R(P) = Z(P) = \phi$.

Proof.

1. $\Rightarrow$ 2. Let $A$ be a strongly deterministic $L$-*-automaton with $\widehat{\mathcal{L}} = \mathcal{L}(A)$. Since $\widehat{\mathcal{L}}$ is prefix-closed, there can be no transition from a state of $V(A) \setminus F(A)$ reachable from $I(A)$, to a state of $F(A)$. Thus, $P = (L, M_A, I(A), \phi, \phi) |_{I(A) \cup F(A)}$ satisfies 2.

2. $\Rightarrow$ 1. If $R(P) = Z(P) = \phi$ then $\mathcal{L}(P) = \lim \mathcal{L}(A)$ for the $L$-*-automaton $A = (M_{P^\#}, I(P), V(P))$, which (by construction) has prefix-closed language.

6.2.26 Definition Given $L$-automaton $A$, define the *dual* of $A$, $A^\#$ to be the $L$-process $$A^\# = (\mathbb{B}, M_A, I(A), R(A), Z(A)) .$$

6.2.27 Lemma Let $P$ be a process, $A$ an automaton. Then $$\mathcal{L}(P^{\#\#}) = \mathcal{L}(P), \quad A^{\#\#} = A .$$

6.2.28 Definition An $L$-automaton/process $X$ is *deterministic* if $M_X$ is deterministic and is *strongly deterministic* if also $|I(X)| = 1$. A strongly deterministic $L$-process $P$ is *totally deterministic* if for all $v \in V(P)$, $x * s_P(v) \neq 0$ for exactly one element $x \in S(L_P)$ (i.e., $P$ has only one selection per state: cf. (6.2.16)).

6.2.29 Proposition Let $A$ be an $L$-automaton and $P$ an $L$-process. Then $A$ is strongly deterministic if and only if $A^\#$ is totally deterministic; if $P$ is strongly deterministic, then so is $P^\#$.

6.2.30 Lemma Let $X$ be an $L$-process or $L$-automaton. Then $\mathcal{L}(X^\#) \supset \mathcal{L}(X)'$; if $X$ is strongly deterministic, $$\mathcal{L}(X^\#) = \mathcal{L}(X)' .$$

96     Chapter 6. ω-theory: L-automaton/L-process

6.2.31 Definition Let $X_1, \ldots, X_k$ be a family of $L$-automata. Then $$\bigoplus_{i=1}^{k} X_i = \left( \bigoplus_i M_{X_i}, \bigcup_i I(X_i), \bigcup_i R(X_i), \bigcup_i Z(X_i) \right)$$

$$\bigotimes_{i=1}^{k} X_i = \left( \bigotimes_i M_{X_i}, \mathbf{X} I(X_i), \bigcup_i \Pi_i^{-1} R(X_i), \bigcup_i \Pi_i^{-1} Z(X_i) \right)$$

where $\Pi_i^{-1} Z(X_i) \equiv \{\Pi_i^{-1} C | C \in Z(X_i)\}$. For $L$-processes we make the analogous definitions, with respective output subalgebras $L_{\oplus X_i} = L_{X_i}$ (with $\oplus X_i$ undefined unless $L_{X_1} = \cdots = L_{X_k}$) and $L_{\otimes X_i} = \Pi L_{X_i}$.

6.2.32 Lemma Let $A_1, \ldots, A_k$ be a family of $L$-automata. Then $$\mathcal{L}(\bigoplus A_i) = \mathcal{L}(\bigotimes A_i) = \bigcup \mathcal{L}(A_i)$$

$$\mathcal{L}_\beta(\bigoplus A_i) = \bigcup \mathcal{L}_\beta(A_i)$$

$$\mathcal{L}_\mu(\bigoplus A_i) = \bigcup \mathcal{L}_\mu(A_i)$$

$$\mathcal{L}_\mu(\bigotimes A_i) \subset \bigcup \mathcal{L}_\mu(A_i)$$

6.2.33 Corollary *The set of [Büchi (resp. Muller)] languages defined by $L$-automata is closed under union and contains all [Büchi (resp. Muller)] languages of homomorphic images.*

Proof. By Lemma 6.2.32, Lemma 3.3.7.

6.2.34 Definition Let $A$ be a deterministic $L$-automaton and set $A_i = (M_A, \{i\}, R(A), Z(A))$ $\forall i \in I(A)$. Then the *strong determinization* of $A$ is the $L$-automaton $[A] = \odot A_i$.

6.2.35 Lemma *Let $A$ be a deterministic $L$-automaton. Then $[A]$ is strongly deterministic, and $\mathcal{L}([A]) = \mathcal{L}(A)$.*

6.2.36 Note If $P$ is an $L$-process with $M_P$ deterministic, then $P_i = (L_P, M_P, \{i\}, R(P), Z(P))$ is strongly deterministic for each $i \in I(P)$, and $\mathcal{L}(\oplus P_i) = \mathcal{L}(P)$.

6.2.37 Lemma *Let $A$ be a deterministic $L$-automaton and let $A'$ be $[A]$ except with*

$$Z(A') = \bigcup_i \left\{ C \subset V(\bigotimes A_j) \mid \Pi_i C \in Z(A_i) \right\}.$$

6.2. ω-automata

Then $A'$ is strongly deterministic and $\mathcal{L}_\mu(A') = \mathcal{L}_\mu(A)$.

6.2.38 Corollary *The set of Muller languages defined by deterministic L-automata is closed under complementation and intersection.*

Proof. Let $A$ be a deterministic $L$-automaton. By Lemma 6.2.37 we may find a strongly deterministic $L$-automaton $B$ with $\mathcal{L}_\mu(B) = \mathcal{L}_\mu(A)$. Then $\mathcal{L}_\mu(A)' = \mathcal{L}_\mu(M_B, I(B), \phi, 2^{V(B)} \setminus Z(B))$. Given $L$-automata $A_1, \ldots, A_k$, let $$A = (\otimes M_{A_i}, \mathsf{X}I(A_i),\ \phi,\ \mathsf{X}Z(A_i))$$

where $\mathsf{X}Z(A_i) = \{\mathsf{X}C_i | C_i \in Z(A_i)\}$. Then $\mathcal{L}_\mu(A) = \cap \mathcal{L}_\mu(A_i)$.

6.2.39 Lemma *Let $P_1, \ldots, P_k$ be a family of L-processes. Then*

$$\mathcal{L}\left(\bigoplus P_i\right) = \bigcup \mathcal{L}(P_i)$$
$$\mathcal{L}\left(\bigotimes P_i\right) = \bigcap \mathcal{L}(P_i).$$

This second property is called the *language intersection property* and is a fundamental ingredient in our model of coordination. It supports the interpretation of $P = \otimes P_i$ as a model of the behaviors common to all the $P_i$'s. In logical terms, it casts coordination and composition in terms of *conjunctions*.

6.2.40 Corollary *Let $X, Y$ be L-automata or L-processes. Then*

$$\mathcal{L}(X \oplus Y) = \mathcal{L}(Y \oplus X),$$
$$\mathcal{L}(X \otimes Y) = \mathcal{L}(Y \otimes X).$$

6.2.41 Lemma *Let $A, B$ be L-automata. Then*

$$(A \oplus B)^\# = A^\# \oplus B^\#,$$
$$(A \otimes B)^\# = A^\# \otimes B^\#.$$

Proof. By the definition of $\oplus$, $\otimes$ and duality.

6.2.42 Corollary *Let $A, B$ be L-automata. Then*

$$\mathcal{L}((A \otimes B)^\#) = \mathcal{L}(A^\# \otimes B^\#) \subset \mathcal{L}(A^\# \oplus B^\#) = \mathcal{L}((A \oplus B)^\#).$$

98              Chapter 6. ω-theory: L-automaton/L-process

Proof. 
$$\mathcal{L}(A^\# \otimes B^\#) = \mathcal{L}(A^\#) \cap \mathcal{L}(B^\#)$$
$$\subset \mathcal{L}(A^\#) \cup \mathcal{L}(B^\#)$$
$$= \mathcal{L}(A^\# \oplus B^\#),$$

so the result follows from Lemma 6.2.41.

6.2.43 Theorem *Let $P,Q$ be L-processes. Then*

$$\mathcal{L}((P \otimes Q)^\#) = \mathcal{L}(P^\# \otimes Q^\#) = \mathcal{L}(P^\# \oplus Q^\#) = \mathcal{L}((P \oplus Q)^\#) \ .$$

Proof. By Lemma 3.1.6, $(P \otimes Q)^\#((v,w), \#) = P^\#(v, \#) + Q^\#(w, \#)$. Thus, the first and last equalities follow from the definition of $\otimes$, $\oplus$ and duality, while the middle equality follows from Lemma 6.2.32.

6.2.44 Lemma *Let $A_1, \ldots, A_k$ be a family of L-automata. If all the $A_i$'s are deterministic, so are $\oplus A_i$, $\otimes A_i$. If all the $A_i$'s are strongly deterministic, so is $\otimes A_i$. Let $P_1, \ldots, P_k$ be a family of L-processes. If $M_{P_i}$ is deterministic for all $i$, then so is $M_{\otimes P}$ and $M_{\oplus P}$. If all the $P_i$'s are strongly (respectively, totally) deterministic, then so is $\otimes P_i$.*

6.2.45 Lemma *If $\mathcal{L}$ is L-∗-regular then for some strongly deterministic L-automata $A, \widehat{A}$,*

$$\lim \mathcal{L} = \mathcal{L}_\beta(A) = \mathcal{L}_\mu(A) = \mathcal{L}(\widehat{A}) \ .$$

Proof. Find a strongly deterministic L-∗-automaton $B$ with $\mathcal{L}(B) = \mathcal{L}$. Set $R(A) = (F(B) \times V(B)) \cap E(B)$, $Z(A) = \{C \subset V(B) \mid C \cap F(B) \neq \phi\}$ $$A = (M_B, I(B), R(A), Z(A)) \ .$$
$$\widehat{A} = (M_B, I(B), R(A), \phi) \ .$$

6.2.46 Lemma *If $\mathcal{L}$ is L-∗-regular and $A$ is a [[strongly] deterministic] L-automaton, then there is a [strongly deterministic] L-automaton $B$ with $\mathcal{L} \cdot \mathcal{L}_\mu(A) = \mathcal{L}_\mu(B)$.*

Proof. Flag construction, with observation (for $Z(B_1 \otimes \cdots \otimes B_n)$ use all subsets of cycle sets in product which project to given component cycle set, as in Lemma 6.2.37) that if $\mathbf{v}$ is a run in $B_1 \otimes \cdots \otimes B_n$ then $\Pi_i \mu(\mathbf{v}) \subset \mu(\Pi_i \mathbf{v})$, while if $w \in \mu(\Pi_i \mathbf{v})$, since $V(B)$ is finite, there can only be a finite number of $\mathbf{u} \in V(B_1) \times \cdots \times V(B_n)$ with $u_i = w$ so one of them must be in $\mu(\mathbf{v})$, showing $w \in \Pi_i \mu(\mathbf{v})$ (and $\Pi_i \mu(\mathbf{v}) = \mu(\Pi_i \mathbf{v})$).

6.2. ω-automata

6.2.47 Example Fails for $\mathcal{L}_\beta$ (and, in fact, $\mathcal{L}$) in place of $\mathcal{L}_\mu$: $\mathcal{L} = (0+1)^*$, $\mathcal{L}_\beta(A) = 1^\omega$ (See Figure 6.1B.)

6.2.48 Theorem [Ch. 6.6]: $\mathcal{L}_1, \mathcal{L}_2$ $L$-∗-regular $\Rightarrow \mathcal{L}_1 \cdot \mathcal{L}_2^\omega = \mathcal{L}_\mu(A)$ for some strongly deterministic $L$-automaton $A$.

Proof. By Lemma 6.1.8 find $L$-∗-regular $\widehat{\mathcal{L}}_2$ with $$\mathcal{L}_2^\omega = \mathcal{L}_2^*(\lim \widehat{\mathcal{L}}_2).$$

By Lemma 6.2.45, find strongly deterministic $L$-automaton $A$ with $\mathcal{L}_\mu(A) = \lim \widehat{\mathcal{L}}_2$. Then $$\mathcal{L}_1 \cdot \mathcal{L}_2^\omega = \mathcal{L}_1 \cdot (\mathcal{L}_2^*(\lim \widehat{\mathcal{L}}_2)) = (\mathcal{L}_1 \cdot \mathcal{L}_2^*) \lim \widehat{\mathcal{L}}_2 = \underbrace{(\mathcal{L}_1 \cdot \mathcal{L}_2^*)}_{\text{∗-regular}} \cdot \mathcal{L}_\mu(A) = \mathcal{L}_\mu(B)$$

for some strongly deterministic $L$-automaton $B$, by Lemma 6.2.46.

This significantly simplifies the corresponding proof in [McN66].

6.2.49 Theorem [Cho74, 6.7]: $\mathcal{L} \subset S(L)^\omega$ is $\omega$-regular if and only if $\mathcal{L} = \mathcal{L}_\mu(A)$ for some strongly deterministic $L$-automaton $A$.

Chapter 6. $\omega$-theory: L-automaton/L-process

Proof.

$\Rightarrow$. Follows from Theorem 6.2.48, Lemma 6.2.37 and closure of Muller languages under union (Corollary 6.2.33).

$\Leftarrow$. Let $A$ be strongly deterministic $L$-automaton. Since $\omega$-regular languages are closed under union, suffices to consider $Z(A) = \{C\}$ (a single set). Will define $*$-regular language's $\mathcal{L}_1$ and $\mathcal{L}_2$ where $\mathcal{L}_1$ is the set of all strings which "gain entry" to $C$ and $\mathcal{L}_2$ are those which "circulate" in $C$: for any (fixed) $v_0 \in C = \{v_0, \ldots, v_k\}$, let $$\mathcal{L}_1 = \mathcal{L}(M_A, I(A), \{v_0\}),$$

let $M$ be an $L$-matrix defined by $V(M) = C \cup \{\#\}$, $M(v, w) = M_A(v, w)$ if $v, w \in C$, else if $$v \in C, \ M(v, \#) = \sum w \in V(A) \setminus C M_A(v, w)$$

and $$M(\#, w) = \begin{cases} 1 & \text{if } w = \# \\ 0 & \text{else} \end{cases}$$

$$\mathcal{L}_{vw} = \mathcal{L}(M, \{v\}, \{w\})$$
$$\mathcal{L}_2 = \mathcal{L}_{v_0 v_1} \mathcal{L}_{v_1 v_2} \cdots \mathcal{L}_{v_{k-1} v_k} \mathcal{L}_{v_k v_0}$$

Then $\mathcal{L}_1, \mathcal{L}_2$ are $*$-regular and $\mathcal{L}_1 \cdot \mathcal{L}_2^\omega = \mathcal{L}_\mu(A)$.

6.2.50 Corollary *Given any language homomorphism* $\Phi : S(L)^\omega \to S(L')^\omega$, $\mathcal{L}$ $\omega$-regular $\Rightarrow \Phi(\mathcal{L})$ $\omega$-regular.

Proof. From Definition 6.1.1, by Corollary 5.4.3.

6.2.51 Corollary

$$\{\mathcal{L}_\mu(\text{strongly deterministic } L\text{-automaton})\} = \{\mathcal{L}_\mu(L\text{-automaton})\}.$$

Proof. Same as Theorem 5.5.1 (using projection of deterministic image).

6.2.52 Theorem [Ch. 6.16]: $\mathcal{L} \subset S(L)^\omega$ *is $\omega$-regular if and only if* $\mathcal{L} = \mathcal{L}_\beta(A)$ *for some $L$-automaton $A$.*

6.2. ω-automata

Proof.

$\Leftarrow$. $\mathcal{L}_\beta(A) = \bigcup_{(v,w) \in R(A)} \mathcal{L}_v \cdot (\mathcal{L}^1_{(v,w)} \cdot \mathcal{L}^2_{(v,w)})^\omega$ where $\mathcal{L}_v = \mathcal{L}(A_0)$ for the $L$-*-automaton $A_0 = (M_A, I(A), \{v\})$, $\mathcal{L}^1_{(v,w)} = \{s \in S(L) \mid s \leq A(v,w)\}$ and $\mathcal{L}^2_{(v,w)} = \mathcal{L}(A_2)$ for the $L$-*-automaton $A_2 = (M_A, \{w\}, \{v\})$.

(See Figure 6.1C.)

$\Rightarrow$. By Theorem 6.1.5, $\mathcal{L} = \cup \mathcal{L}(B_i) \cdot \mathcal{L}(C_i)^\omega$ for some finite number of strongly deterministic $L$-*-automata $B_i, C_i$. We will find $L$-automata $A_i$ such that
$$\mathcal{L}_\beta(A_i) = \mathcal{L}(B_i) \cdot \mathcal{L}(C_i)^\omega$$
whence $\mathcal{L} = \cup \mathcal{L}_\beta(A_i) = \mathcal{L}_\beta(\oplus A_i)$ by Lemma 6.2.32. Thus, let $B, C$ be strongly deterministic $L$-*-automata. For $L$-processes $\widehat{B}, \widehat{C}$, we will show that the $L$-automaton $A = (\widehat{B} \otimes \widehat{C})^\#$ satisfies $\mathcal{L}(A) = \mathcal{L}(B) \cdot \mathcal{L}(C)^\omega$, (See Figure 6.1D.)

Chapter 6. ω-theory: L-automaton/L-process completing the proof. We use the flag construction: $\hat{B}$, derived from $B$, has a flag ($\hat{B}$ : 1) to signal $\hat{C}$, which moves from its initial state when flagged by $\hat{B}$. Every time $B$ reaches a final state, $\hat{B}$ nondeterministically sets its flag. When $\hat{C}$ (derived from $C$) is flagged and moves from its initial state. Each time $C$ reaches a final state, $\hat{C}$ crosses a recur edge to return $C$ to its initial state.

6.2.53 Corollary $\mathcal{L}$ is ω-regular if and only if $\mathcal{L} = \mathcal{L}(A)$ for some L-automaton $A$.

Proof. Take $A$ with $Z(A) = \varphi$, $\mathcal{L} = \mathcal{L}_\beta(A) = \mathcal{L}(A)$.

6.2.54 Theorem $\mathcal{L} \subset S(L)^\omega$ is ω-regular if and only if $$\mathcal{L} = \bigcap_{i=1}^n \mathcal{L}(A_i)$$

for some strongly deterministic L-automata $A_1, \ldots, A_n$.

Proof.

⇐. For each $i$, let $Z_i = \{D \subset V(A_i) \mid D \subset C \in Z(A_i)\}$. Then $\mathcal{L}(A_i) = \mathcal{L}_\beta(A_i) \cup \mathcal{L}_\mu((M_{A_i}, I(A_i), \phi, Z_i))$, so $\mathcal{L}$ is ω-regular.

⇒. Find a strongly deterministic L-automaton $A$ such that $$\mathcal{L}_\mu(A) = \mathcal{L}'$$

For each $C \in Z(A)$, set $A_C = (M_A, I(A), \phi, \{C\})$, let $$R_C = \{(v, w) \in E(A) \mid \text{not both } v, w \in C\},$$
$$Z_C = \{D \subset V(A) \mid D \subsetneq C\}$$

and define the L-automaton $$B_C = (M_A, I(A), R_C, Z_C).$$

Then $\mathcal{L}(B_C) = \mathcal{L}_\mu(A_C)'$ (the set of runs which either repeatedly leave $C$ [accepted by $R_C$] or eventually stay inside a proper subset of $C$ [accepted by $Z_C$]). Then $$\mathcal{L} = \mathcal{L}_\mu(A)' = \left(\bigcup_{C \in Z(A)} \mathcal{L}_\mu(A_C)\right)' = \bigcap_C \mathcal{L}_\mu(A_C)' = \bigcap_C \mathcal{L}(B_C).$$

6.2. ω-automata

6.2.55 Theorem $\mathcal{L} \subset S(L)^\omega$ is ω-regular if and only if $\mathcal{L} = \mathcal{L}(P)$ for some L-process P with $M_P$ deterministic and complete.

Proof.

⇒. Find strongly deterministic L-automata $A_1, \ldots, A_n$ with $\mathcal{L}' = \cap \mathcal{L}(A_i)$ (by Theorem 6.2.54). Then $\mathcal{L}(A_i^\#) = \mathcal{L}(A_i)'$, so $$\mathcal{L} = (\cap \mathcal{L}(A_i))' = \cup \mathcal{L}(A_i)' = \cup \mathcal{L}(A_i^\#) = \mathcal{L}(\oplus A_i^\#).$$

⇐. For each $i \in I(P)$, $P_i = (L_P, M_P, \{i\}, R(P), Z(P))$ is strongly deterministic so $\mathcal{L}(P_i^\#) = \mathcal{L}(P_i)'$, and $\mathcal{L}(P) = \mathcal{L}(\oplus P_i) = \cup \mathcal{L}(P_i) = \cup \mathcal{L}(P_i^\#)'$ and each $\mathcal{L}(P_i^\#)'$ is ω-regular.

6.2.56 Corollary $\mathcal{L} \subset S(L)^\omega$ is ω-regular if and only if $$\mathcal{L} = \mathcal{L}(\oplus P_i)$$

for totally deterministic $P_i$.

6.2.57 Theorem Given any strongly deterministic L-process P, there exists a strongly deterministic L-process Q with $\mathcal{L}(Q) = \mathcal{L}(P)$ and $|Z(Q)| = 1$.

Proof. Using the flag construction, construct a cyclic L-process C with $2|Z(P)|$ states which makes the 2 state transitions $2i \to 2i+1 \to 2(i+1)$ each time P is not in its i-th cycle set and C is in state i; let $Z(C)$ consist of the single set $\{2i \mid i \leq |Z(P)|\}$. Set $Q = \widehat{P} \otimes C$, where $\widehat{P}$ is P except that $Z(\widehat{P}) = \phi$. Since a run of P which never stays in any cycle set of P corresponds to a run of Q which periodically exists it single cycle set, $\mathcal{L}(Q) = \mathcal{L}(P)$.

6.2.58 Corollary The languages defined by strongly deterministic L-processes coincide with the languages defined by strongly deterministic Rabin automata with a single acceptance pair.

6.2.59 Corollary The deterministic Rabin automata (with an arbitrary number of initial states) which have a single acceptance pair, define all ω-regular languages.

104                    Chapter 6. ω-theory: L-automaton/L-process

6.2.60 Corollary *The above 3 results hold with "L-process" replaced by "L-automaton" and "Rabin" replaced by "Streett".*

6.2.61 Note Notwithstanding these results, the $L$-process is a natural analog of the Streett automaton, in that both satisfy the language intersection property: the language of a product is the intersection of the component languages. Likewise, the $L$-automaton is a natural analog of the Rabin automaton in that for both the language of a sum is the union of the component languages.

6.3  Images of Automata

6.3.1 Definition For an $L$-automaton $A$ and an homomorphism $\varphi : L \to L'$, let $\varphi A = (\varphi M_A, I(A), R(A), Z(A))$. By Lemma 3.3.7, $\varphi A$ is an $L'$-automaton. If $L', L'' \subset L$ are independent subalgebras with $L = L' \cdot L''$, let $\Pi_{L'} A$ denote $(\Pi_{L'} M_A, I(A), R(A), Z(A))$. By Lemma 3.3.6, $\Pi_{L'} A$ is an $L'$- automaton. For an $L'$-automaton $B$, if $\ker \varphi = 0$, let $\hat\varphi B = (\hat\varphi M_B, I(B), R(B), Z(B))$. By Lemma 4.2.19, $\hat\varphi B$ is an $L$-automaton.

6.3.2 Definition For an $L$-process $P$ and a homomorphism $\varphi : L \to L'$, let $\varphi P = (\varphi L_P, \varphi M_P, I(P), R(P), Z(P))$. By Lemma 2.1.11, $\varphi P$ is an $L'$-process. If $L', L'' \subset L$ are independent subalgebras with $L = L' \cdot L''$ and if $\Pi_{L'}(L_P)$ is a subalgebra of $L'$, let $\Pi_{L'} P$ denote the $L'$-process $(\Pi_{L'}(L_P), \Pi_{L'} M_P, I(P), R(P), Z(P))$. For an $L'$-process $Q$, let $\hat\varphi Q$ denote the $L$-process $(\mathbb{B}(\hat\varphi L_Q), \hat\varphi M_Q, I(Q), R(Q), Z(Q))$.

6.3.3 Lemma *Let $\varphi : L' \to L$ be a homomorphism and let $X$ be an $L'$-automaton or an $L'$-process. Then*

$$\mathcal{L}(\varphi X)' \subset \mathcal{L}(\varphi X^\#) .$$

Proof. If $X$ is an $L'$-automaton, then $M_{X^\#} = M_X$ so $\varphi X^\# = (\varphi X)^\#$ and the result follows from Lemma 6.2.30. Moreover if $\# \in V(X^\#)$, then for any $v \in V(X)$, $(\varphi X)^\#(v, \#) = \sim s_{\varphi X}(v) = \sim \varphi(s_X(v)) = \varphi(\sim s_X(v)) = \varphi(X^\#(v, \#))$, so if $X$ is an $L'$-process, then the result obtains.

6.3.4 Lemma *Let $\varphi : L' \to L$ be a homomorphism with $\ker \varphi = 0$ and let $X$ be an $L$-automaton or $L$-process. Then*

$$\mathcal{L}(\hat\varphi X)' \subset \mathcal{L}(\hat\varphi X^\#) .$$

6.3. Images of Automata

Proof. If $X$ is an $L$-automaton, then $M_{X^\#} = M_X$ so $\widehat{\varphi}X^\# = (\widehat{\varphi}X)^\#$ and the result follows from Lemma 6.2.30. Moreover if $\# \in V(X^\#)$, then for any $v \in V(X)$, by Lemma 4.2.6.a, $$\begin{aligned}(\widehat{\varphi}X)^\#(v, \#) &= \sim s_{\widehat{\varphi}X}(v) \\ &= \sim \widehat{\varphi}(s_X(v)) \\ &\leq \widehat{\varphi}(\sim s_X(v)) \\ &= \widehat{\varphi}(X^\#(v, \#)) ,\end{aligned}$$

the inequality following from the fact that $$\widehat{\varphi}(\sim s_X(v)) + \widehat{\varphi}(s_X(v)) = \widehat{\varphi}(1) = 1$$

by Theorem 4.2.7 (and $\sim \widehat{\varphi}(s_X(v)) * \widehat{\varphi}(s_X(v)) = 0$). It follows that if $X$ is an $L$-process, then the result obtains.

6.3.5 Note In general there need be no relationship between $\mathcal{L}(\widehat{\varphi}X^\#)$ and $\mathcal{L}((\widehat{\varphi}X)^\#)$.

6.3.6 Lemma *Let* $\varphi : L' \to L$ *be a Boolean algebra homomorphism, and let* $\Phi : S(L)^\omega \to S(L')^\omega$ *be the language homomorphism with support* $\widehat{\varphi}|_{S(L)}$. *Then for any $L'$-automaton or $L'$-process $X$,*

$$\mathcal{L}(\varphi X) = \Phi^{-1}\mathcal{L}(X) .$$

*For any $L$-process $Y$, and if $\ker \varphi = 0$, for any $L$-automaton $Y$,*

$$\mathcal{L}(\widehat{\varphi}Y) = \Phi \mathcal{L}(Y) .$$

Proof. Identical to the proof of Lemma 5.3.3, for the first equation. If $\ker \varphi = 0$ then $\widehat{\varphi}M_Y$ is complete if $M_Y$ is, by Lemma 4.2.19. In any case, $$x \in \mathcal{L}(\widehat{\varphi}Y) \Leftrightarrow \forall i\ x_i \leq \widehat{\varphi}(y_i) \text{ for some } y \in \mathcal{L}(Y)$$
$$\Leftrightarrow \forall i\ x_i = \widehat{\varphi}(y_i)$$

by Lemma 4.2.5

$$\Leftrightarrow x = \Phi(y) \text{ for some } y \in \mathcal{L}(Y) .$$

6.3.7 Corollary *Let $X, Y$ be $L$-automata or $L$-processes and let $\varphi$ be a homomorphism on $L$. Then* a) $\mathcal{L}(X) \subset \mathcal{L}(Y) \Leftrightarrow \mathcal{L}(\varphi X) \subset \mathcal{L}(\varphi Y)$ ;

b) $\mathcal{L}(\varphi(X \otimes Y)) = \mathcal{L}((\varphi X) \otimes (\varphi Y))$ .

106  Chapter 6. ω-theory: L-automaton/L-process

Proof. Let $\Phi$ be the language homomorphism with support $\widehat{\varphi}|_{S(L)}$. By Lemma 6.3.6, $\mathcal{L}(\widehat{\varphi}X) = \Phi^{-1}\mathcal{L}(X)$, $\mathcal{L}(\widehat{\varphi}Y) = \Phi^{-1}\mathcal{L}(Y)$ and so a) follows by monotonicity of $\Phi^{-1}$ and $\Phi$. Assertion b) follows from Lemma 3.3.7.c.

6.3.8 Corollary Let $\varphi : L' \to L$ be a homomorphism and let $\Phi$ be the language homomorphism with support $\widehat{\varphi}|_{S(L)}$. Let $X, Y$ be L-processes or suppose $\ker \varphi = 0$ and let $X, Y$ be L-automata. Then a) $\mathcal{L}(X) \subset \mathcal{L}(Y) \Rightarrow \mathcal{L}(\widehat{\varphi}X) \subset \mathcal{L}(\widehat{\varphi}Y)$ ;

b) $\mathcal{L}(\widehat{\varphi}(X \otimes Y)) \subset \mathcal{L}((\widehat{\varphi}X) \otimes (\widehat{\varphi}Y))$ .

Proof. By Lemma 6.3.6, $\mathcal{L}(\widehat{\varphi}X) = \Phi\mathcal{L}(X)$ and $\mathcal{L}(\widehat{\varphi}Y) = \Phi\mathcal{L}(Y)$, so a) follows by monotonicity of $\Phi$. Lemma 4.2.6 b) implies b).

6.3.9 Corollary Let $\Phi : S(L)^\omega \to S(L')^\omega$ be a language hom, and let $A'$ be a [[strongly] deterministic] $L'$-automaton. Then there is a [[strongly] deterministic] L-automaton $A$ with $\mathcal{L}(A) = \Phi^{-1}(\mathcal{L}(A'))$.

6.3.10 Proposition Suppose $P$ is a totally deterministic L-process, $L_0, L_1, L_2$ are independent subalgebras with $L_1 \cdot L_2 = L_P$ and $L = L_0 \cdot L_1 \cdot L_2$. Then, for $L' = L_0 \cdot L_1$, $\Pi_{L'}P$ is a totally deterministic $L'$-process.

Proof. Let $P' = \Pi_{L'}P$. Then $L_1 = L_{P'}$. By Lemma (3.3.3), for all $v \in V(P)$, $s_{P'}(v) = \Pi_L s_P(v)$ and thus $x * s_P(v) \neq 0$ for exactly one element $x \in S(L_P)$ implies the same for $P'$. Suppose that for some $v, w, w' \in V(P)$ and some $x \in S(L')$, $x \leq P'(v,w) * P'(v,w')$. Then, since $P$ is a totally deterministic L-process, $x * y \leq P(v,w)$ and $x * y' \in P(v,w')$ for some $y, y' \in S(L_2)$. However, $x * y, x * y' \in S(L)$ and both $(x * y) * s_P(v) \neq 0$ and $(x * y') * s_P(v) \neq 0$. Thus, by the total determinism of $P$, $y = y'$. But then $(x * y) \leq P(v,w) * P(v,w')$, so by the determinism of $M_P$, $w' = w$. It follows that $M_{P'}$ is deterministic, and thus $P'$ is totally deterministic.

6.3.11 Example A particular instance of (6.3.10) is with $L_1 = \mathbb{B}$ and $L_2 = L_P$, in which case $\Pi_{L'}P$ has $\mathbb{B}$ as its output subalgebra.

6.3.12 Note An automorphism $\varphi$ permutes model tokens, and is useful for exploiting symmetry (cf. the crossroads example, Section 1.1,

6.3. Images of Automata

Section 8.10). If $\varphi$ leaves the set of output subalgebras invariant — for example, if $P = \otimes P_i$ and $\varphi P = \otimes P_{\sigma(i)}$ for some permutation of indices $\sigma$, then by Lemma 3.3.7, Corollary 6.2.40 and Corollary 6.3.7, $\mathcal{L}(P) \subset \mathcal{L}(T) \Rightarrow \mathcal{L}(P) \subset \mathcal{L}(\varphi T)$.

6.3.13 Lemma *Let $X$ be an $L$-automaton or an $L$-process, $X'$ be an $L'$-automaton or, respectively, an $L'$-process, $\varphi: L' \to L$ a Boolean algebra homomorphism and $\Phi: S(L)^\omega \to S(L')^\omega$ the language homomorphism whose support is $\widehat{\varphi}|_{S(L)}$. Then*

$$\Phi\mathcal{L}(X) \subset \mathcal{L}(X') \iff \mathcal{L}(X) \subset \mathcal{L}(\varphi X').$$

Proof. $\Phi\mathcal{L}(X) \subset \mathcal{L}(X') \Rightarrow \mathcal{L}(X) \subset \Phi^{-1}\Phi\mathcal{L}(X) \subset \Phi^{-1}\mathcal{L}(X') = \mathcal{L}(\varphi X')$ by Lemma 6.3.6 so $\mathcal{L}(X) \subset \mathcal{L}(\varphi X')$, while $\mathcal{L}(X) \subset \mathcal{L}(\varphi X')$ $\Rightarrow \mathcal{L}(X) \subset \mathcal{L}(\varphi X') = \Phi^{-1}\mathcal{L}(X') \Rightarrow \Phi\mathcal{L}(X) \subset \mathcal{L}(X')$.

6.3.14 Note The basic role of homomorphism in the theory of reduction is captured by the partition function of Example 4.2.20. As this is completely represented by the support map $\sigma$ and its extension $\widehat{\varphi}$, the observant reader may wonder why we need to introduce $\varphi$ at all. Indeed, as we will see in Chapter 8, the basic check we seek to make is $$\Phi\mathcal{L}(X) \subset \mathcal{L}(X'),$$

while the basic check we know how to make is $$\mathcal{L}(X) \subset \mathcal{L}(Y)$$

for $X, Y$ over the same Boolean algebra. By Lemmas 6.3.6 and 6.3.13, $$\Phi\mathcal{L}(X) \subset \mathcal{L}(X') \iff \mathcal{L}(\widehat{\varphi}X) \subset \mathcal{L}(X')$$
$$\iff \mathcal{L}(X) \subset \mathcal{L}(\varphi X'),$$

and given the choice, $\mathcal{L}(\widehat{\varphi}X) \subset \mathcal{L}(X')$ would seem to be the preferred check, as it is over the simpler Boolean algebra. Therefore, why introduce $\varphi$ at all? The answer lies in Section 8.12: we wish to be able to check $\Phi\mathcal{L}(X) \subset \mathcal{L}(X')$ when $X = \otimes X_i$, $X' = \otimes X'_i$ and $\Phi\mathcal{L}(X) \subset \mathcal{L}(X')$ is too complex to check directly. Theorem 8.12.1 shows that since $\varphi X' = \otimes \varphi X'_i$ (Corollary 6.3.7.b), $$\Phi\mathcal{L}(X) \subset \mathcal{L}(X') \iff \mathcal{L}(X_{j,1} \otimes \cdots \otimes X_{j,m_i}) \subset \mathcal{L}(\varphi X'_i)$$

(for all indices over a suitable range). Unfortunately, generally $\widehat{\varphi}X \neq \otimes\widehat{\varphi}X_i$, so the analogous decomposition on $X$ does not work. Furthermore, although $$\mathcal{L}(\otimes Y_i) \subset \mathcal{L}(\varphi Y') \iff \mathcal{L}(\widehat{\varphi}(\otimes Y_i)) \subset \mathcal{L}(Y'),$$

108                    Chapter 6. ω-theory: L-automaton/L-process in general $\mathcal{L}(\hat{\varphi}(\odot Y_i)) \neq \mathcal{L}(\odot\hat{\varphi}Y_i)$, so $\odot Y_i$ would need to be expanded before application of $\hat{\varphi}$, defeating the objective of component-wise reduction.

6.3.15 Lemma *Let $X$ be an $L$-automaton or an $L$-process with $\Pi_{L'}(L_X)$ a subalgebra of $L$. Then $\exists$ language hom $\Phi$ with*

$$\Phi(\mathcal{L}(X)) = \mathcal{L}(\Pi_{L'}X) \ .$$

Proof. Identical to the proof of Lemma 5.3.7.

Chapter 7

The Selection/Resolution Model of Coordinating Processes

We now explain how the machinery thus far established, can be used to model and analyze systems of coordinating processors. Here, the sense of *coordination* is that of interconnected state machines whose respective outputs are functions of inputs, and the inputs are comprised of the outputs of the various machines.

The same underlying semantic model is used throughout, to model both synchronous or asynchronous systems, as well as to model *constraints* on systems. In all cases, the modelling semantics is founded on $L$-processes, $L$-automata and their tensor product, which forms a "synchronous" composition. (Synchronous composition of components corresponds to *logical conjunction* of the predicates which describe those components.) Such an intrinsically synchronous basis nonetheless is used in a natural fashion to model asynchrony, through nondeterminism. Respective $L$-process selections which represent "delay" may be interpreted as "held" by the respective $L$-processes for durations whose relative lengths are chosen nondeterministically. In this way, described in detail in Section 7.6, the $L$-processes may be used to model asynchronous coordination. In fact, in Section 7.7, real-time bounds are attached to these "delay" selections, thereby supporting continuous real-time analysis of asynchronous discrete-event systems.

110  Chapter 7. The Selection/Resolution Model

7.1 Selection/Resolution

7.1.1 Definition $L$-processes $P_1, \ldots, P_k$ are *independent* if $L_{P_1}, \ldots, L_{P_k}$ are.

Coordination in a "system" of independent $L$-processes $P_1, \ldots, P_k$ is modelled by the behavior of the product $L$-process $$P = P_1 \otimes \cdots \otimes P_k$$

(cf. the crossroads example of Section 1.1 and Example 5.1.5). Interpreting this system dynamically, at each time, in each process $P_i$, a selection $x_i$ possible at its "current" state $v_i$ (i.e., some $x_i \in S_{P_i}(v_i)$) is chosen non-deterministically. The selection $x_i$ may be considered an *output* of $P_i$, and an *input* to each $P_j$ with transitions which depend upon its value. The product $x = x_1 * \cdots * x_k$ defines a "current global selection", i.e., a selection $x \in S_P(v)$ of the product $P$ at the state $v = (v_1, \ldots, v_k)$. At each time, in each process, the current global selection determines a set of possible "next" states of that process, namely those states to which the transition from the current state is enabled by the current global selection. (The existence of at least one such state in each process $P_i$ is guaranteed if the $P_i$'s are independent lockup-free Moore processes — see Definitions 7.2.2, 7.2.3 and Theorem 7.2.7 below.) In $P_i$ the transition from state $v_i$ to state $w_i$ is enabled by $x$ if and only if $x * P_i(v_i, w_i) \neq 0$. This is necessarily true for some state $w_i$ if and only if $x * s_{P_i}(v_i) \neq 0$. Each process separately may be considered to *resolve* the current global selection, by choosing (nondeterministically) one of its possible next states. Each process of such a system progresses in time by repeatedly "selecting" and "resolving" (cf. Figure 7.1).[1] This interpretation correctly describes the behavior of the product if $P_1, \ldots, P_k$ are independent and $\Pi L_{P_i} = L$, since then $\Pi S(L_{P_i}) = S(L)$ (Lemma 2.1.18) and thus it follows that for $v = (v_1, \ldots, v_k)$, $x \in S_P(v)$ and $w = (w_1, \ldots, w_k)$, $$x * P_i(v_i, w_i) \neq 0 \; \forall \; i \Leftrightarrow x * P(v, w) \neq 0 \, .$$

In this setup, the "environment" (providing "inputs" to the rest of the system) also is part of the system model, comprising certain of

---

[1] This "selection/resolution" paradigm for modelling coordinating processes was conceived in 1979 by the author in collaboration with B. Gopinath. It predates and strongly influenced the algebraic foundation presented here and was used, prior to the 1986 introduction of COSPAN, as a semi-formal specification paradigm within Bell Labs; see (mainly as a matter of historical interest) [AKS83a], [AKS83b], [Kur85b], [Kur85a].

7.1. Selection/Resolution

Figure 7.1: The s/r Model. Each process $P_1, \ldots, P_k$ updates its state by instantaneously resolving the current global selection and then (instantaneously) making a new selection from the new state.

the $P_i$'s, and thus $P$ represents what is called a "closed system", taking no input from outside of itself. This paradigm turns out to be very convenient: it takes into account all requirements on the environment, and circumvents a vexing problem of circularity which arises in "assume/guarantee" styles of proofs ("assuming the environment does this, the system does that") [MC81], [Sta85b]. Moreover, it is quite natural and convenient to have the environment and system requirements represented in a uniform fashion: it makes analysis uniform, and permits refinement of the environment model through the same top-down methodology as the system model, when that is required.

In fact, the closed system paradigm does support reasoning about systems with external inputs, as long as the inputs are taken as unconstrained. Such reasoning commonly arises in the context of a subsystem. For example, suppose $Q$ is a component of $P$, say $P = E \otimes Q$ where $E$, the product of the remaining components of $P$, represents the "environment" of $Q$. It may be required to check that $Q$ performs some task modelled by an $L$-automaton $T$, meaning to check that $\mathcal{L}(Q) \subset \mathcal{L}(T)$, as explained in Section 8.1. (Such a check on components of $P$ is at the heart of the reduction methodology presented in Chapter 8, and therefore is central to the focus of this book.) However, since the inputs to $Q$ are unconstrained, the fact that $Q$ takes inputs from outside itself is more syntactical than semantical, as follows.

Indeed, let us define an operation on processes called *freeing* wherein the transition matrix is replaced by the 1-state $L$-matrix (*true*) with that state as its initial state, the sets of recur edges and cycle sets are replaced by the empty set and the output subalgebra remains unchanged. For any $L$-process $R$, if $R'$ is the $L$-process obtained by freeing $R$, then 112  Chapter 7. The Selection/Resolution Model $\mathcal{L}(R') = S(L)^\omega$, and so (trivially) $\mathcal{L}(R) \subset \mathcal{L}(R')$. Mechanistically, $R'$ may be inferred as the result of relaxing $R$ by allowing all selections of $R$, namely the elements of $S(L_R)$, to be generated nondeterministically (without regard to the state of $R$ or its "inputs").

If $E'$ is the $L$-process obtained by freeing $E$, then $E' \otimes Q$ takes no inputs from outside itself and $\mathcal{L}(E' \otimes Q) = \mathcal{L}(E') \cap \mathcal{L}(Q) = \mathcal{L}(Q)$. Thus, generally, there is no reason to distinguish between $Q$ and $E' \otimes Q$, and we regard both as "closed systems".

The distinction between the closed system paradigm and its alternative, the "open system" paradigm, arises when $\mathcal{L}(Q) \subset \mathcal{L}(T)$ fails, but would succeed if certain restrictions were placed on the inputs to $Q$. Within the closed system paradigm, this situation is handled as follows. Let $E'$ be a (new, no longer free) $L$-process model of the environment of $Q$, representing certain constraints on the inputs to $Q$ (possibly as a function of previous outputs from $Q$). The assertion that $Q$ performs the task $T$ in the presence of the restriction defined by $E'$, merely is $$\mathcal{L}(E' \otimes Q) \subset \mathcal{L}(T).$$

If we wish to relate this back to $P$, we require also that $E'$ abstracts the actual environment $E$ of $Q$ in $P$, namely that $$\mathcal{L}(E) \subset \mathcal{L}(E').$$

from which it then follows as a simple matter of set theory, that $$\mathcal{L}(P) \subset \mathcal{L}(T)$$

since $$\mathcal{L}(P) = \mathcal{L}(E \otimes Q) = \mathcal{L}(E) \cap \mathcal{L}(Q) \subset \mathcal{L}(E') \cap \mathcal{L}(Q) = \mathcal{L}(E' \otimes Q) \subset \mathcal{L}(T).$$

Within the open system paradigm, one reasons differently, using an "assume/guarantee" style of deductive reasoning about $Q$, viewed as a "reactive system" (reacting with its environment). Restrictions to the environment commonly are represented by temporal logic formulae through an assertion style which is open to circular reasoning. For example, suppose $e$ is a temporal logic formula which asserts that the output of $E$ always is 0, and $q$ is the same for $Q$. Suppose the task $T$ requires that the outputs of $E$ and $Q$ always are 0, and suppose that each of $E$ and $Q$ has the property that its initial output is 0 and if it receives an input 0 then its next output is 0. Then it is possible to

7.1. Selection/Resolution reason correctly as follows ('∧' denotes logical AND):

$$E \wedge q \Rightarrow e \quad (7.1)$$
$$e \wedge Q \Rightarrow q \quad (7.2)$$
$$\underline{e \wedge q \Rightarrow T} \quad (7.3)$$
$$\text{therefore } E \wedge Q \Rightarrow T \quad (7.4)$$

that is, $\mathcal{L}(E \otimes Q) \subset \mathcal{L}(T)$. (The general form of this inference rule and the conditions under which it is true are a bit more complicated [AL93].)

Now, for any linear temporal logic formula $f$, it is possible to find an $L$-process $F$ such that the set of sequences on which $f$ is true is exactly $\mathcal{L}(F)$ (Section 7.5). Letting $E'$ and $Q'$ be the corresponding $L$-processes for $e$ and $q$ respectively, it also is true that $$\mathcal{L}(E \otimes Q') \subset \mathcal{L}(E') \quad (7.1')$$
$$\mathcal{L}(E' \otimes Q) \subset \mathcal{L}(Q') \quad (7.2')$$
$$\mathcal{L}(E' \otimes Q') \subset \mathcal{L}(T) \quad (7.3')$$

although it does *not* follow by general set reasoning that $\mathcal{L}(E \otimes Q) \subset \mathcal{L}(T)$. In fact, the ability to deduce the conclusion (7.4) comes from the nature of $e$ and $q$ as invariants ("safety" properties), and their specific temporal behavior with respect to $E$ and $Q$.

Let us suppose instead that $e$ asserts that $E$ eventually will produce a 1 and $q$ does the same for $Q$. Suppose the task $T$ requires that the outputs of $E$ and $Q$ eventually each will produce a 1, and suppose that each of $E$ and $Q$ has the property that its initial output is 0 and its next output is a 1 if and only if its current input is a 1. It is evident that under these new definitions (7.1), (7.2) and (7.3) still hold, although (7.4) is false.

Moreover, it is not simply the "eventualities" in the new definitions which invalidated (7.4). For example, if we took $e$ and $q$ to be identically *false*, then (7.1), (7.2) and (7.3) again hold for any $E$ and $Q$, whereas (7.4) in general fails. Therefore, the "proof rule" represented by (7.1)–(7.4) is very sensitive to the particulars of its arguments.

Nonetheless, when it works, such a proof rule can be of significant value, as it permits reducing the computationally complex test $$\mathcal{L}(E \otimes Q) \subset \mathcal{L}(T) \quad (7.4')$$

to the computationally simpler tests (7.1')–(7.3'). Notice, however, that this reduction in no way is dependent upon the view of $Q$ as a reactive 114                    Chapter 7. The Selection/Resolution Model (open) system; it can be recast as a reduction principle which, when $E'$ and $Q'$ define invariants under the right conditions, supports the conclusion (7.4') from positive tests (7.1')–(7.3').

Sometimes it is argued that the open system paradigm supports a more general definition of a system $Q$, as it does not require the definition of an environment model $E'$ which embodies a particular (somewhat arbitrary) structure, in order to define the required constraints $e$, needed for $Q$ to function properly. However, as we have seen, this argument is specious, as any constraint $e$ also is to a certain extent arbitrary in its structure and extent, and every $e$ gives rise to a semantically equivalent environmental model (or constraint on the interaction of $E$ and $M$) $E'$.

In conclusion, the open/reactive system paradigm is semantically equivalent to the closed system paradigm, which may be preferable for reasons of clarity, uniformity and syntactic simplicity.

7.2 Moore Process

As classically understood, a "Moore machine" ([HU79]; [Moo56], [Moo64]) is a deterministic transition structure (state transitions a function of inputs) with initial state and "output" which is a function of state; a "Mealy machine" ([HU79]; [Mea55]) is the same, except the output is a function of the transition, i.e. the output is a function of the state and the input. An $L$-process generalizes these notions, allowing multiple outputs (selections) per state or per transition, and a nondeterministic transition structure. (Furthermore, it follows from Theorem 6.2.55 that the transition matrix of an $L$-process may be determinized, while that is not generally true for a Moore machine allowed to have nondeterministic transitions, but required to have outputs which are a deterministic function of state.) A Mealy machine may be considered to be a generalization of a Moore machine, if the Moore machine output at a state is associated with $each$ transition outgoing from that state. Likewise, an arbitrary $L$-process corresponds to a Mealy machine, while a "Moore" process is an $L$-process for which selections and inputs are independent, i.e., for every selection and input, some resolution is enabled, so the selections of a Moore process may be considered to be a function of the process state alone (with multiple selections per state).

7.2.1 Lemma $sp(v) \leq \sum_{s \in S_P(v)} s$

7.2. Moore Process

Proof.

$$s_P(v) \leq 1 = \sum S(L_P) = \sum S_P(v) + \sum (S(L_P) \setminus S_P(v))$$

so $$s_P(v) = s_P(v)^2 \leq s_P(v) * \sum S_P(v) + 0 \leq \sum S_P(v) \ .$$

If $s_P(v) < \sum S_P(v)$ then there is at least one ("global") selection at $v$ for which there is no resolution. Such a situation is not necessarily a defect, as it matches the (input/output pair) interpretation of an $L$-process interpreted as a Mealy machine (outputs on transitions). In this interpretation, the set of selections $S_P(v)$ at the state $v$ defines the set of all outputs possible on transitions from that state. For example, if $$S_P(v) = \{x, \sim x\}$$

and there are just 2 transitions from $v$: to $w$ and $w'$, with $P(v, w) = x * \lambda$, $P(v, w') = \sim x * \sim \lambda$, then there is no resolution of the global selection (input/output pair) $x * \sim \lambda$. However, we may interpret $P$ as producing output $x$ for input $\lambda$ and output $\sim x$ for input $\sim \lambda$. The "interconnection" of "Mealy machines" $P_1, \ldots, P_k$ is the "Mealy machine" defined by their tensor product $P_1 \otimes \cdots \otimes P_k$. Since $$\mathcal{L}(P_1 \otimes \cdots \otimes P_k) = \cap \mathcal{L}(P_i) \ ,$$

the "system" $[P_1, \ldots, P_k]$ may be understood by analogy with (say) differential equations: $\mathcal{L}(P_i)$ gives the "solutions" for the behavior of the "equation" $P_i$; $\mathcal{L}(P_1 \otimes \cdots \otimes P_k)$ gives the set of simultaneous solutions. This illustrates the utility of defining $\mathcal{L}(P_i)$ in terms of $S(L)$ ("input-output pairs") rather than the selections (outputs) of $P_i$ alone, as is done conventionally. For Mealy machines, it is natural to require *completeness*: that for every input there is an output. An independent set of such processes preserves this property if there are no cycles in the graph of output dependencies (Theorem 7.2.14), a fact well-known to hardware designers.

On the other hand, one may want to interpret a process as a Moore machine (outputs at state). In this case, one requires that for every global selection (input/output pair), the process admits of some resolution. Given this, one can "assemble" autonomous coordinating components as in Figure 7.1 and be assured that the system will in all cases run indefinitely (i.e., there will never be a global selection for which there is no resolution — a condition sometimes called "unspecified reception"). In circuit models, a Moore machine plays the role of a generalized latch: output is a function of state alone, independent of input.

116    Chapter 7. The Selection/Resolution Model

7.2.2 Definition An $L$-process $P$ is a *Moore* process if for all $v \in V(P)$, $s_P(v) = \sum S_P(v)$.

If $s_P(v) = 0$ then $S_P(v) = \phi$ and there can be no "next" state following $v$, for any selection whatsoever. This may properly be considered a "flaw" in the definition of $P$, as it can be rectified by recursively removing $v$ from $P$, together with its incoming edges, resulting in a process $\widehat{P}$ with the same language, but without this flaw (Lemma 7.2.4).

7.2.3 Definition A state $v \in V(P)$ for which $s_P(v) = 0$ is called a *lockup*. If $P$ has no lockups, say $P$ is *lockup-free*.

7.2.4 Lemma *For any $L$-process $P$ there exists a lockup-free $L$-process $\widehat{P}$ with $\mathcal{L}(\widehat{P}) = \mathcal{L}(P)$.*

Note that a lockup is distinct from a *deadlock*, which is a state $v$ for which $P(v, w) \neq 0$ if and only if $v = w$. Contrary to popular opinion, there is nothing intrinsically wrong with a deadlock; it simply connotes "completion". In nonterminating systems, it often indicates something is awry, but deadlock detection by itself typically is a poor indicator of trouble: most often, failure to progress manifests itself as a "livelock" in which a component thrashes, making movement, but not advancing its goal. Moreover, true deadlocks in components can be masked during analysis by activity in other components: the system progresses, although an individual component may be frozen.

7.2.5 Example All the processes of Example 5.1.5 are lockup-free Moore processes. For example, $$s_A(\text{STOP}) = (A : \text{no\_cars}) + (A : \text{cars\_waiting})$$

while $$S_A(\text{STOP}) = \{(A : \text{no\_cars}), (A : \text{cars\_waiting})\}$$

7.2.6 Lemma *For arbitrary $L$-processes $P$, $Q$, and $(v, w) \in V(P \otimes Q)$,*

$$S_{P \otimes Q}(v, w) \subset S_P(v) * S_Q(w) .$$

*If $P, Q$ are Moore, then*

$$\sum S_{P \otimes Q}(v, w) = \left(\sum S_P(v)\right) * \left(\sum S_Q(w)\right) .$$

7.2. Moore Process

Proof.

$S_{P \otimes Q}(v, w)$
$= \{z \in S(L_P \cdot L_Q) \mid z * s_{P \otimes Q}(v, w) \neq 0\}$
$= \{x * y \mid x \in S(L_P),\ y \in S(L_Q),\ x * y * s_{P \otimes Q}(v, w) \neq 0\}$
$= \{x * y \mid x \in S(L_P),\ y \in S(L_Q),\ (x * s_P(v)) * (y * s_Q(w)) \neq 0\}$
   (by Lemma 3.1.6)
$\subset S_P(v) * S_Q(w)$.

Thus, $\sum S_{P \otimes Q}(v, w) \leq \sum (S_P(v) * S_Q(w)) = (\sum S_P(v)) * (\sum S_Q(w))$.
If $P, Q$ are Moore then (again by Lemma 3.1.6), $$\left(\sum S_P(v)\right) * \left(\sum S_Q(w)\right) = s_P(v) * s_Q(w)$$
$$= s_{P \otimes Q}(v, w)$$
$$\leq \sum S_{P \otimes Q}(v, w)$$

by Lemma 7.2.1, and thus the desired equality holds.

7.2.7 Theorem *If $P_1, \ldots, P_k$ are [independent lockup-free] Moore processes, then $P = \otimes P_i$ is a [lockup-free] Moore process [and $S_P(\mathbf{v}) = \Pi S_{P_i}(v_i)$ for all $\mathbf{v} \in V(P)$].*

Proof. By Lemmas 3.1.6 and 7.2.6, $s_P(\mathbf{v}) = \sum S_P(\mathbf{v})$ for all $\mathbf{v} \in V(P)$. If the $P_i$'s are lockup-free, then $\sum S_P(\mathbf{v}) \neq 0$, and thus if the $P_i$'s are also independent, the desired result holds by Lemmas 2.1.18 and 7.2.6.

7.2.8 Lemma *Let $P$ be an $L$-process and let $\varphi$ be a homomorphism on $L$. Then for every $v \in V(P)\ (= V(\varphi P))$,*

*a)* $s_{\varphi P}(v) = \varphi s_P(v);$

*b)* $\ker \varphi = 0 \Rightarrow S_{\varphi P}(v) = \varphi S_P(v).$

Proof.

a) $s_{\varphi P}(v) = \sum_w \varphi P(v, w) = \varphi s_P(v)$.

b) By Lemma 2.1.11, $S(L_{\varphi P}) = \varphi S(L_P)$. Thus $y \in S_{\varphi P}(v) \Leftrightarrow y \in S(L_{\varphi P})$ and $y * s_{\varphi P}(v) \neq 0$
$\Leftrightarrow \exists x \in S(L_P)$ with $\varphi(x) = y$, and $\varphi(x * s_P(v)) \neq 0$
$\Leftrightarrow \exists x \in S_P(v)$ with $\varphi(x) = y$
$\Leftrightarrow y \in \varphi S_P(v)$.

118                    Chapter 7. The Selection/Resolution Model

7.2.9 Corollary *If* $\ker \varphi = 0$ *then* $P$ *[lockup-free] Moore* $\Rightarrow \varphi P$ *[lockup-free] Moore.*

Proof. For any $v \in V(P)$, $s_P(v) = \sum S_P(v) \Rightarrow s_{\varphi P}(v) = \varphi s_P(v) = \sum \varphi S_P(v) = \sum S_{\varphi P}(v)$. Since $\ker \varphi = 0$, if $P$ is lockup-free then $s_P(v) \neq 0$ and so $s_{\varphi P}(v) = \varphi s_P(v) \neq 0$.

Mealy machines frequently are used to model computer integrated circuits. Of concern in such representations is that the model is "complete" in the sense that for every input to the model, some transition and output of the model is enabled. Completeness in this sense is not necessarily preserved under taking products. Therefore, conditions under which completeness is preserved are of interest. A sufficient condition, well-known to hardware designers, is to break dependency cycles with a delay element ("latch"). The theoretical basis for this is developed next.

7.2.10 Definition Let $P$ be an $L$-process with $L = L_P \cdot L'$ for some subalgebra $L'$ with $L'$, $L_P$ independent. Say $P$ is *Mealy-complete* (relative to $L'$) if $\Pi_{L'} M_P$ is complete.

7.2.11 Note The intended interpretation is that $P$ is Mealy-complete if for every "input" $x \in S(L')$ there is a transition and "output" enabled in $P$, i.e., for each $v \in V(P)$, there is a $w$ such that $x * P(v,w) \neq 0$; the "output" is any selection $y \in S_P(v)$ such that $y * x * P(v,w) \neq 0$, i.e. any atom $y \in S(L_P)$ with $y \leq \Pi_{L_P}(x * P(v,w)) \neq 0$.

7.2.12 Lemma *If $P$ is a lockup-free Moore process and $L = L_P \cdot L'$ for independent subalgebras $L_P$, $L'$, then $P$ is Mealy-complete.*

Proof. For each $v \in V(P)$, $0 \neq s_P(v) \in L_P$ so $\Pi_{L'} s_P(v) = 1$.

7.2.13 Definition Let $P_1, \ldots, P_k$ be independent $L$-processes with $\Pi L_{P_i} = L$. Let $L_i = \Pi_{j \neq i} L_{P_j}$. The *dependency matrix* of $P_1, \ldots, P_k$ is the $\mathbb{B}$-matrix $D = D(P_1, \ldots, P_k)$ with $V(D) = \{1, \ldots, k\}$ and $D(i,j) = 1$ if and only if $\Pi_{L_i} M_{P_j} \neq M_{P_j}$. The *circuit matrix* of $P_1, \ldots, P_k$ is the $\mathbb{B}$-matrix $\widehat{D} = \widehat{D}(P_1, \ldots, P_k)$ derived from $D(P_1, \ldots, P_k)$ by setting $\widehat{D}(i,j) = 0$ if $P_j$ is a Moore process.

The dependency matrix is a directed graph with an edge $(i,j)$ if and only if $P_j$ depends upon $P_i$ and $P_j$ is not a Moore process. (A Moore

7.2. Moore Process process plays the role of a (possibly nondeterministic) latch or an input, in circuit models.)

7.2.14 Theorem Let $P_1, \ldots, P_k$ be independent $L$-processes with $\Pi L_{P_i} = L$. If each $P_i$ is Mealy-complete (relative to $L_i$) and $\widehat{D}(P_1, \ldots, P_k)$ is acyclic then for any $i_1, \ldots, i_n$, $P_{i_1} \otimes \cdots \otimes P_{i_n}$ is Mealy-complete (and in particular, $\otimes P_i$ is lockup-free).

7.2.15 Theorem $P$ Mealy-complete, $\ker \varphi = 0 \Rightarrow \varphi P$ Mealy-complete.

Proof. Let $L = L_P \cdot L'$ with $L_P, L'$ independent subalgebras of $L$, and let $\varphi$ be a homomorphism on $L$ with $\ker \varphi = 0$. Then $\varphi P$ is a $\varphi(L)$-process and $\varphi(L_P)$, $\varphi(L')$ are independent subalgebras of $\varphi(L)$ (since $\ker \varphi = 0$), with $\varphi(L) = \varphi(L_P) \cdot \varphi(L')$ and $L_{\varphi P} = \varphi(L_P)$. Every $y \in \varphi(L)$ has the form $y = \varphi(x)$ with $x = \sum a_i * b_i$, for $a_i \in L_P$, $b_i \in L'$. If $\Pi_{L'}(x) = 1$ then $\sum b_i = 1$ so $\Pi_{\varphi(L')} y = \sum \varphi(b_i) = \varphi(\sum b_i) = 1$. It follows that if $P$ is Mealy-complete, then so is $\varphi(P)$.

7.2.16 Theorem Let $P$ be an $L$-process and suppose $L_P$, $L''$, $L''' \subset L$ are independent subalgebras with $L = L_P \cdot L'' \cdot L'''$. Setting $L' = L_P \cdot L''$, $\Pi_{L'}(L_P) = L_P$ and a) $P$ [lockup-free] Moore $\Rightarrow \Pi_{L'} P$ [lockup-free] Moore;

b) $P$ Mealy-complete $\Rightarrow \Pi_{L'} P$ Mealy-complete.

Proof.
a) For $x \in S_P(v)$, $x * s_P(v) \neq 0$, so $x * s_{\Pi_{L'} P}(v) = \Pi_{L'}(x) * \Pi_{L'} s_P(v) \geq \Pi_{L'}(x * s_P(v)) > 0$ by Lemma 3.3.3, so $S_P(v) \subset S_{\Pi_{L'} P}(v)$. On the other hand, if $x \in S_{\Pi_{L'} P}(v)$ then $x \in S_P(v)$ by the independence of $L'$, $L''$ and so $S_P(v) = S_{\Pi_{L'} P}(v)$. Hence, $s_P(v) = \sum S_P(v) \Rightarrow s_{\Pi_{L'} P}(v) = \Pi_{L'} s_P(v) = \sum \Pi_{L'} S_P(v) = \sum S_{\Pi_{L'} P}(v)$ and if $s_P(v) \neq 0$, $0 \neq \Pi_{L'} s_P(v) = s_{\Pi_{L'} P}(v)$.

b) $\Pi_{L''} \Pi_{L'} M_P = \Pi_{L''} \Pi_{L'' \cdot L'''} M_P$ so if $P$ is Mealy-complete then $\Pi_{L'' \cdot L'''} M_P$ is complete and by Lemma 3.3.6, the rhs and thus lhs is complete, proving that $\Pi_{L'} P$ is Mealy-complete.

7.2.17 Example Let $L_i$, $L$, $P_i$ and $P$ be as in Example 5.1.20, except that $P_i$ and $P$ are turned into totally deterministic Moore $L$-processes by replacing $F_i$ with the pair $R_i$, $Z_i$ where $R_i = \phi$ and $Z_i = \phi$ for $i < n$, 120      Chapter 7. The Selection/Resolution Model $Z_n = \{\{0\}\}$. For some $N > 1$ let $\mathcal{L}$ be the $\omega$-language over $\{a,b,c,d\}$ defined by $$\mathcal{L} = ((a+b)^*b(a+b)^{N-1}(c+d))^\omega .$$

Thus, $\mathcal{L}$ is the language comprised of sequences with infinitely many elements from $\{c,d\}$, each of which is preceded $N$ elements earlier by a $b$. For $n = N$ and $L' = L_0 \cdot L_N \subset L$, define $a,b,c,d \in S(L')$ by $a = \{0\} * \{0\}$, $b = \{1\} * \{0\}$, $c = \{0\} * \{1\}$, $d = \{1\} * \{1\}$. Then 7.2.18      $\mathcal{L}(\Pi_{L'}P) = \mathcal{L} .$ By (6.2.44), $P$ is totally deterministic, so by Proposition (6.3.10), $\Pi_{L'}P$ is totally deterministic as well, and by an argument similar to the one in Example 5.1.19, with $2^N$ states, if $\Pi_{L'}P$ is a minimal state totally deterministic $L'$-process satisfying (7.2.18). Nonetheless, by making the substitution analogous with Example 5.1.21, at the sacrifice of determinism, (7.2.18) is obtained by an $(N+1)$-state process $P$. Note that while not Moore processes, the $P_i$'s thus obtained are Mealy-complete, and satisfy the conditions of Theorem 7.2.14. The analogy extends accordingly to Example 5.1.22. In this case, in the example derived from Example 5.1.21 by removing the output feedback to $P_1$, the resulting processes $P_1,\ldots,P_n$ are Moore processes, all totally deterministic except for $P_1$, giving an $(N+2)$-state $P$ satisfying $$\mathcal{L}(\Pi_{L'}P) = (a+b)^*b((a+b)^{N-1}(c+d))^\omega .$$

7.3    s/r as a Data-Flow Model

Generally, as with $L$-automata, $\omega$-automata are defined in terms of complete transition structures. The utility of allowing the transition matrix of an $L$-process to be incomplete is illustrated by the interpretation afforded in Figure 7.1, where the incomplete representation is used to emphasize the role of certain events (selections) as "outputs". When the processes are Moore processes or are Mealy-complete with acyclic circuit matrix, the system can be developed in a modular fashion and interpreted as a data-flow network whose nodes are the component processes and whose interconnections are defined by their dependency matrix. Component selections comprise the network data tokens. Such an interpretation as a data-flow network accommodates modelling different parts of the system at different levels of abstraction, according to design and modelling requirements. Likewise, $L$-processes can provide the semantic basis for a data-flow language such as S/R [KK86] (cf. LUCID [WA85]), illustrated in the examples of Appendix B, C and D.

7.4 "Fairness" Constraints

In the course of modelling a data-flow network as a system of coordinating $L$-processes, it often is required (for the correct behavior of the system) to impose various "fairness" constraints on the processes — requirements that certain actions (or inactions) are not sustained forever, or that certain sequential combinations of actions are disallowed, for example. As such constraints appear naturally as *exceptions* to the otherwise-defined selection/resolution (input/output) behavior of the model, the "negative" nature of the $L$-process acceptance structure, as discussed in Section 6.2, is appropriate. (While the literature is replete with proposals for particular context-dependent structures for "fairness" conditions, that afforded by the acceptance structure of the $L$-process is not tied to any specific context, and furthermore, is expressively as general as the $\omega$-regular languages.)

7.5 System Verification

Although the notion of system "verification" often is presented in *absolute* terms (as a function of the system only), such terms only can limit the scope of verification to a fixed schedule of items. In this direction, testing that a system model is free from "deadlocks" (states with no exit), commonly is called "verification" (although deadlocks are not the only or even predominant cause of system failure, as already discussed in Section 7.2). Likewise, the term "verification" is applied to checks for syntactic failures such as "unspecified receptions" (run-time type mismatches).

Here instead, "verification" is used only in a *relative* sense: a system of coordinating processes modelled by $L$-processes $P_1, \ldots, P_k$ is verified to perform each item on a specified list of "tasks". The system is modelled by the product process $P = \otimes P_i$, while each task is modelled by an $L$-automaton $T$. The $L$-process $P$ defines the set of all "behaviors" $\mathcal{L}(P)$ of the modelled system, while the $L$-automaton $T$ defines the set of all behaviors $\mathcal{L}(T)$ consistent with the performance of the modelled task. "Verification" in this sense thus consists of testing the language containment $$\mathcal{L}(P) \subset \mathcal{L}(T) .$$

The choice of $L$-automaton (rather than the expressively equivalent $L$-process) to model tasks, is based on the "positive" acceptance structure of $L$-automata, better suited to express system properties such as 122  Chapter 7. The Selection/Resolution Model performance of "eventualities" than the negative acceptance structure of $L$-processes (cf. the discussion in Section 6.2). This choice is consistent with the common use in the literature of Büchi automata to model and define system properties. It is common to call $T$ a "specification" and $P$ a "refinement" (or "implementation", but cf. Section 8.6, footnote 5), suggesting that $T$ is a complete abstract model of $P$. That perspective could be taken for stepwise refinement (see Section 8.6), in which case both $P$ and $T$, representing system models at different levels of abstraction, would be $L$-processes. However, in the case of what we here call "verification", $T$ is a single attribute of $P$ and is modelled by an $L$-automaton. Thus, for our purposes here, it is more suggestive to call $P$ a "specification" (of the system model — at some level of abstraction) and to call $T$ a property or "task" that $P$ is meant to perform. In this sense, this setup resembles model-checking, where the system is modelled by a transition system and the property to be verified is represented by a logic formula. Model-checking, as discussed in the Introduction, commonly is applied with respect to the two logics LTL and CTL.

The models of LTL formulae are sequences over a fixed propositional calculus. The propositional calculus has the form of a Boolean algebra $L = \mathbb{B}[a_1, \ldots, a_n]$ for "elementary propositions" $a_1, \ldots, a_n$. Each LTL formula $f$ defines the set of models $\mathbf{m} \in L^\omega$ on which it is true; if $\mathbf{m}$ is a model for $f$, one writes $\mathbf{m} \models f$. As $\mathbf{m} \models f$ if and only if $\mathbf{x} \models f$ for all $\mathbf{x} \in S(L)^\omega$ which satisfy $x_i \leq m_i$ $\forall i$, one may characterize the set of models $\mathbf{m} \in L^\omega$ such that $\mathbf{m} \models f$, in terms of the set of models $\mathbf{x} \in S(L)^\omega$ such that $\mathbf{x} \models f$. Denote this latter set of models by $\mathcal{L}(f)$, the *language* of $f$. The class of $\omega$-languages defined by LTL formulae measures the expressiveness of LTL; this class is strictly dominated by the class of $\omega$-languages defined by $L$-automata [Tho79], so for any LTL formula $f$ involving elementary propositions $a_1, \ldots, a_n$, there exist both an $L$-process and an $L$-automaton $F$, for $L$ as above, with $\mathcal{L}(f) = \mathcal{L}(F)$. Thus $L$-automata are strictly more expressive[2] than LTL formulae. Furthermore, testing equivalence of two LTL formulae or the dominance of one over another ($\mathbf{m} \models f \Rightarrow \mathbf{m} \models g$) is PSPACE-complete; the customary algorithm for such tests involves conversion of the LTL formulae to Büchi automata, requiring one exponent in the size of the formula $g$ and then a test for language containment [SVW87]. (The "specification" automaton need not be inverted if it is constructed from the negation of

---

[2] Although nondeterministic $L$-automata are fully expressive, we require strongly deterministic $L$-automata for tasks, and these are not fully expressive; nonetheless, intersections of languages of strongly deterministic $L$-automata are fully expressive (as proved in Chapter 6) and this in fact is what is needed for verification, as discussed in Chapter 8.

7.5. System Verification g.) Nonetheless, the syntax of LTL is held to be much more natural for defining temporal properties than that of automata. Certainly very simple LTL formulae very clearly express simple temporal properties such as "always $p$", "eventually $p$" and "$p$ until $q$", although these properties can be expressed just as clearly by automata through the use of specific notation or aliases for specific classes of formulae. While the latter approach does not generalize to nesting of formulae, it is also true that more complex LTL formulae are easily misinterpreted, and thus the ultimate justification for LTL in the context of formal verification may be rather tenuous. Sequential properties, which may be defined directly through the transition structure of automata, often are problematic to express in LTL; in fact, even very simple sequential properties are simply not expressible in LTL [Wol83]. Finally, we observe that although it is feasible to do model-checking with LTL [LP85], the branching-time logic CTL* subsumes LTL in expressiveness and moreover, each LTL formula may be model-checked with the same order of complexity when viewed as a CTL* formula [EL85].

Branching-time temporal logics in the CTL-family have state transition structures as models and their expressiveness cannot in general be related directly to that of $\omega$-automata, although ECTL [CGK89] is a logic whose expressiveness strictly dominates that of both of the branching time logics CTL and CTL*, and of $\omega$-automata. The CTL logics are distinguished by the presence of an operator which quantifies existentially over paths. There are simple and useful properties easily expressible in the simpler branching time logic CTL having no $\omega$-automaton analog, for example AGEF$p$ which says "no matter where you are, it is possible eventually to get to an occurrence of event $p$". If the underlying transition structure is deterministic in the sense that next-states are distinguishable in the logic,[3] this CTL formula says of its language $\mathcal{L}$ that $x \in \mathcal{L} \Rightarrow \exists y$ such that $xyp \in \mathcal{L}$.

There is a technique akin to skolemization in logic, whereby existential path quantification is replaced by an instance for which the quantification holds, resulting in an expression containing only universal path quantification. For example, AGEF$p$ may be in this sense skolemized, producing a formula which, for example, in essence says "eventually you'll reach a state where $p'$ is true, and if the event $p''$ occurs (a possibility with $p'$), then eventually there will be an occurrence of $p''$. (Although the possibility of a $p''$ with $p'$ also is an existential property, it is

---

[3] For nondeterministic transition structures, even the subset of CTL expressible without use of existential path quantification contains formulae whose models do not generate $\omega$-regular languages. An example is AFAG$p$, which may be interpreted as "eventually you'll be in a 'safe' state", where "safe" means "$\sim p$ never can happen".

Chapter 7. The Selection/Resolution Model expressed without a nesting of quantifiers, and thus may be negated and tested as a universal property.) In principle, any (arbitrarily nested) set of existential quantifiers may be replaced by such a skolem function. However, skolemization is driven by a basic understanding of the underlying model and often may be infeasible to automate.

Although the expressive power of ECTL strictly dominates that of $\omega$-automata, its decision algorithm for model-checking has complexity commensurate with that of testing language containment for $\omega$-automata (for each level of formula nesting). Unfortunately, on account of the existential path quantification of the branching-time logics, their formulae are not in general preserved by homomorphic reduction (Chapter 8), the basis of the theory presented here. An exception to this is exact homomorphic reduction (Section 8.9), which affords some abstraction, and preserves all ECTL, CTL* (and CTL) formulae.[4] However, exactness is a very restrictive requirement which excludes, for example, the very useful (non-exact) homomorphic reduction in which a specific succession of differentiated actions is reduced to a nondeterministic delay (Figure 8.3). Clarke, et al. have a weaker version of exact reduction (the presence of a "simulation" map) equivalent to the state homomorphism of Section 8.9, which preserves formulae in the subset ∀CTL consisting of CTL without existential path quantification [CGL92]. For other relationships between CTL* and $\omega$-regular languages, see [GK94].

The process model CCS (cf. Chapter 1) has a branching-time logic implied by its adopted notion of equivalence (bi-simulation equivalence). If one-way simulation is construed as a formula acting on a model, then this implied logic has the same expressiveness as CTL. On the other hand, a CCS process may be inferred as having considerably more expressive power through its "external variables" — part of the process definition — which may be used to define arbitrary $\omega$-automaton acceptance conditions. However, this inference is inconsistent with the definition of bi-simulation equivalence, and the external variables generally are ignored. While they could be incorporated in the equivalence by requiring an association of variables, this would be unnaturally restrictive, differentiating, for example, language-equivalent processes with identical branching structure but unidentical acceptance structure, a distinction for which there is no apparent justification. An attempt to resolve this issue appears in [GL91]. At any rate, as a branching-time logic, from our

---

[4] For details of property-preservation by exact homomorphisms in branching-time temporal logic, see the earlier (independent) treatment in [SiI83]. Undifferentiated sequential actions can, with certain restrictions, be abstracted by an atomic action if the "next-time" operator is taken out of the logic. For an early treatment of this type of reduction (focused upon deadlock detection) see [Lip75]. See also [BBLS93].

7.6. *Modelling Asynchrony and Continuous Time*                                    125 perspective this one shares the drawback of those above: its branching-time properties are not preserved under general homomorphic reduction, and thus it is not amenable to the theory of homomorphic reduction and stepwise refinement presented here.

Generally, formulae of branching-time logics admitting finite-state models can be modelled by "tree automata"[5] These are $\omega$-automata adapted as acceptors of infinite trees (rather than sequences), and serve as a basis for analysis of the expressiveness and model-checking complexity of CTL* [Tho90, pp. 181–2].

There is an important overall difference in the semantical views supported by branching-time versus linear-time and automata. In the semantics of automata, the state transition structure is merely a *generator* (or *acceptor*) of a language. It is the *language* which is primary, and structural distinctions between automata with the same language are of little or only secondary interest (mainly pertaining to interpretation rather than semantics). Conversely, in the semantics of branching-time, it is the *transition structure* which is primary, and the fact that two structures define the same language is of little or only secondary interest. When thinking about comparisons of linear- *vs.* branching-time, it is important to keep in mind that underlying all other differences is this difference in the primary importance of language *vs.* structure. Nonetheless, structure does enter into the automaton world as a secondary *interpreted* feature, when automata are used to represent structural components or "state machines" with input and output, as discussed in Section 7.1. (In the literature on the subject, it is common to find structure as a primary semantic feature even in linear-time models. By down-grading structure to a secondary *interpreted* feature here, we at once simplify the semantics and its decision procedures, and retain the modelling utility.)

7.6 Modelling Asynchrony and Continuous Time

The $s/r$ model, semantically based on $L$-processes, may be used to model asynchrony and other structural aspects of the continuous-time evolution of a discrete-event system based upon coordinating components. However, unlike inherently asynchronous "interleaving" mod-

---

[5] Although beyond the scope of these notes, an accessible introduction and overview to tree-automata and their relationship to branching-time logic is available in an excellent survey by Thomas [Tho90]. See also Emerson's excellent chapter [Eme90] in the same book, §6.1.4, 6.5. An interesting unification of these ideas is given in [BVW94].

126    *Chapter 7. The Selection/Resolution Model* els of concurrency in which component processes advance one at time [Mil80], [Hoa85], [HM85], [LT87], [Hol91], the s/r model is inherently synchronous, and asynchrony is an interpreted rather than inherent attribute, which applies to a subclass of models.

Indeed, the tensor product of $L$-processes constitutes what is commonly known as a "synchronous" composition: for $L$-processes $P_1, \ldots, P_k$, their product $P = \otimes P_i$ has the property that each transition of the product $(v, w) \in E(P)$ corresponds to "simultaneous" (or "synchronous") transitions of the components, namely $(v_i, w_i) \in E(P_i)$ for $i = 1, \ldots, k$. Moreover, on account of the language intersection property (6.2.39), synchronous composition corresponds to logical conjunction.

It is shown in this section how this synchronous composition may be interpreted, by exploiting nondeterminism in certain special cases, for modelling asynchronous composition, *i.e.*, where processes progress at arbitrary rates relative to one another. In fact, the "interleaving" model, the most common model for asynchrony in the software community, can be viewed as a *special case* of this *synchronous* product (see the discussion of *fundamental mode* at the end of this section). This simple observation comes as a shock to many. Indeed, it has not generally been understood that modelling asynchronous composition through a synchronous product even is feasible. Perhaps as a result of this, there has been a proliferation of various intrinsically asynchronous models of coordination. Ironically, an intrinsically asynchronous model may be more complicated to deal with algorithmically, unless it is transformed first into a synchronous model. For example, in order to model variable execution rates, it is common to introduce generalized notions of equivalence, such as "stuttering" equivalence, often with a tricky semantics and burdened syntax. In the s/r model, variable execution rates are modelled instead by *interpreting* a particular nondeterministic choice as a nondeterministic "pause", as explained in this section. Thus, instead of allowing the execution of one process to progress ahead of another, asynchronously, we instead allow one process to "pause" nondeterministically (but synchronously) while the others progress. Conceptually, it amounts to the same thing, but semantically, the synchronous product is simpler for this purpose. In particular, there is no need to identify specific "internal actions" which require special treatment under composition; here, "internal actions" are modelled through the interpreted pauses.

Instead of having to deal with equivalence classes under stuttering, with a synchronous product one need deal only with the "asynchronous closure" (Definition 7.6.29), a transition structure which arises naturally 7.6. Modelling Asynchrony and Continuous Time through the nondeterministic "pause", and can be computationally simpler to manage that stuttering equivalence (which requires computing a transitive closure). In fact, if the canonical pausing structure of Figure 7.3 is adopted, the asynchronous closure is implicit, and no additional calculation is needed, in order to compare the behavior of two structures.

When used to model asynchrony, the "realizability" of a product of $L$-processes becomes an issue: since the tensor product is not inherently asynchronous, there may in fact be no continuous-time interpretation of a given product. For example, state transitions are interpreted as occurring instantaneously (in order to disambiguate concurrency), so there can be no continuous-time interpretation of a process having two adjacent states without self-loops (a *self-loop* is a transition of a state to itself), as that would require successive instantaneous state changes, an impossibility. In fact, in order that a model be consistent with continuous time, for any state transition $v \to w$ enabled by a selection which disables the self-loop $v \to v$, the state $w$ must have the property that for *every* selection at that state, the self-loop at that state is enabled. Thus, a system model with more than 2 reachable states which is consistent with continuous time *must* have nondeterministic transitions (providing another example of the importance of nondeterminism). It is important, therefore, to identify a broadly applicable condition which guarantees that an $L$-process is realizable in the above sense.

Realizability

7.6.1 Definition Let $P$ be an $L$-process. The *chains* of $P$, $$C(P) = \{(\mathbf{v}, \mathbf{x}) \in V(P)^\omega \times S(L)^\omega \mid \mathbf{v} \text{ is an accepting run of } \mathbf{x}\} .$$

7.6.2 Definition A *realization* of $(\mathbf{v}, \mathbf{x}) \in C(P)$ is a nondecreasing sequence $t_0, t_1, \ldots$ of nonnegative real numbers with the property that for all $i$, $t_i < t_{i+1} \Rightarrow x_i * P(v_i, v_i) \neq 0$, and $t_i < t_{i+2}$.

The $t_i$'s suggest a progression of time instants: $t_i$ may be understood to be the "onset time" of the "event" $(v_i, x_i)$ (except for the case when $v_i = v_{i-1}$ and $x_i = x_{i-1}$: the number of repetitions of the same value $(v.x)$ has no significance, and two chains with differing numbers of repetitions are treated as equivalent, as made precise in 128  Chapter 7. The Selection/Resolution Model the definition of asynchronous equivalence, below). If $x_i * P(v_i, v_i) \neq 0$ then $x_i$ enables the self-loop at $v_i$, and the intended interpretation is that the event $(v_i, x_i)$ continues until $t_{i+1}$. Since $t_i < t_{i+2}$, either $x_i$ enables the self-loop at $v_i$ or $x_{i+1}$ enables the self-loop at $v_{i+1}$, and thus there are no required successive instantaneous state changes. If $x_i * P(v_i, v_i) = 0$ then $t_{i+1} = t_i < t_{i+2}$, $v_{i+1} \neq v_i$ and the interpretation is that the process $P$ is in state $v_i$ at time $t_i$ and in state $v_{i+1}$ in the interval $]t_{i+1}, t_{i+2}[$. Thus, $P$ "pauses" in state $v_{i-1}$ in the interval $]t_{i-1}, t_i[$ with $x_{i-1} * P(v_{i-1}, v_{i-1}) \neq 0$, $P$ is in state $v_i$ at $t_i$ with $x_i * P(v_i, v_{i+1}) \neq 0$ and $P$ again "pauses", in state $v_{i+1}$ in the interval $]t_{i+1}, t_{i+2}[$, with $t_{i+1} = t_i$ and $x_{i+1} * P(v_{i+1}, v_{i+1}) \neq 0$. Note that $v_{i-1}$ and $v_i$ are related by the fact that $x_{i-1} * P(v_{i-1}, v_{i-1}) \neq 0$ and $x_{i-1} * P(v_{i-1}, v_i) \neq 0$ (so $P$ is nondeterministic at $v_{i-1}$). On account of this relationship it is convenient to associate $v_{i-1}$ with $v_i$ and to consider them as a single state for illustrative purposes, as in Figure 7.2. On the other hand, if $v_{i-2} \neq v_{i-1} = v_i \neq v_{i+1}$ then $\ldots, (v_{i-2}, x_{i-2}), (v_{i-1}, x_i), (v_{i+1}, x_{i+1}), \ldots \in \mathcal{C}(P)$ has no realization. Thus, $v_{i-1}$ and $v_i$ cannot be associated as a single state; a syntactically convenient compromise is to associate both $v_{i-1}$ and $v_i$ with the same "nominal" state, say $v$, but add one bit of information to indicate whether $v$ was just entered $(v_{i-2} \neq v_{i-1} = v)$, in which case it must be held for one cycle $(v_i = v)$. This bit in fact splits $v$ into 2 states (which are designated $v@, v$ below, giving $v_{i-1} = v@, v_i = v$). In Figure 7.2, this gives rise to the state succession:

$$(S, 0, 0), (0@, S@, 0), (0@, S, 0), (0@, S, S@),$$

matching the time durations of the four selections, respectively and, when paired with those selections, forms a segment of a chain of $A \otimes B \otimes C$.

7.6.3 Note If $(\mathbf{v}, \mathbf{x}) \in \mathcal{C}(P)$ has a realization $\mathbf{t}$, and $t_{i-1} < t_i = t_{i+1} < t_{i+2} = t_{i+3}$, then $(v_i, x_i)$ and $(v_{i+2}, x_{i+2})$ mark instantaneous transitions at respective times $t_i$ and $t_{i+2}$, while $(v_{i+1}, x_{i+1})$ is a self-loop, connoting a "delay" event of duration $t_{i-2} - t_i$. As $t_j < t_{j+2}$ for all $j$, we may associate with $(\mathbf{v}, \mathbf{x})$ a strictly increasing sequence $\mathbf{t}'$ such that $t'_j = t_j$, unless $t_j = t_{j-1}$, in which case $t'_j = (t_j + t_{j+1})/2$. The sequence $\mathbf{t}'$ retains all the information in $\mathbf{t}$ pertaining to the beginning and ending of delays.

7.6.4 Definition An $L$-process $P$ is *realizable* if every chain of $P$ admits of a realization.

7.6. Modelling Asynchrony and Continuous Time

A realizable process may be understood to evolve in time as in Figure 7.2. One physical interpretation of the instantaneous state transition is that the signal $x_{i+1}$ actually is asserted somewhere in the interval Figure 7.2: Using nondeterminism to model *delay* within a purely synchronous semantics: delay is an event of nondeterministic duration (relative to other events),during which the delaying process is static. For simplicity, only the nominal state of each process is illustrated.

$]t_{i-1}, t_{i+1}]$ but through synchronization, effectively is asserted at the instant $t_{i+1}$. However, as electronic synchronizers have theoretical limits 130            Chapter 7. The Selection/Resolution Model on their certainty of operation, it often is important to model the synchronization process itself in the theoretical model [KM91]. Thus, it is better to associate the instantaneous state change with the instant that a signal crosses a boundary — for example, the boundary between $A$ and $C$, or $C$ and $B$ in Figure 7.2. Realizability does not guarantee implementability, however, as in general, in an implementation of a realizable system of processes, a process may need to respond to a signal of arbitrarily short — even instantaneous — duration. Therefore, realizability is a necessary but not sufficient condition for implementability. Nonetheless, a realizable model which is not implementable on account of a modelled response to arbitrarily short signals, also will exhibit behavior in which the short signals are "missed" (i.e., the responding process is "pausing", which it does nondeterministically, and therefore does not respond to the signal). Thus, although the modelled response may not be implementable, the physical response failure does appear in the model, as well. Hence, if a task depends upon the proper response, a test of its performance will fail. Thus, while *realizable* $\not\Rightarrow$ *implementable*, *realizable* + *task performance* (in some sense) does. A common means to ensure physical implementability is to specify an "interlock" which prevents signals from changing faster relative to one another than the implementation can accommodate. An interlock usually is implemented by an exchange of signals, or "handshake". With such an interlock, the nondeterministic possibility of response failure disappears along with nonimplementability.

7.6.5 Lemma *The following are equivalent for an L-process $P$:*

1. $P$ is realizable;

2. for each $(\mathbf{v},\mathbf{x}) \in \mathcal{C}(P)$ and each $i \geq 0$, $x_i * P(v_i, v_i) = 0 \Rightarrow x_{i+1} * P(v_{i+1}, v_{i+1}) \neq 0$;

3. for each $(v,w) \in E(P^*)$, if $0 < x \leq x' \in S_P(v)$, $x * P(v,v) = 0$ and $x * P(v,w) \neq 0$ then $y * P(w,w) \neq 0$ for all $y, 0 < y \leq y' \in S_{P^*}(w)$.

Proof.

1. $\Rightarrow$ 2. Let $\mathbf{t}$ be a realization of $(\mathbf{v},\mathbf{x})$. If $x_i * P(v_i, v_i) = 0$ then $t_i = t_{i+1} < t_{i+2}$ so $x_{i+1} * P(v_{i+1}, v_{i+1}) \neq 0$.

2. $\Rightarrow$ 3. Let $(v,w) \in E(P^*)$ and suppose $0 < x \leq x' \in S_P(v)$ with $x * P(v,v) = 0$, $x * P(v,w) \neq 0$. We may as well suppose that $x \in S(L)$, in which case there is a chain $(\mathbf{v},\mathbf{x}) \in \mathcal{C}(P)$ with $v_i = v$, $x_i = x$ and

7.6. Modelling Asynchrony and Continuous Time $v_{i+1} = w$. Then $x_{i+1} * P(w, w) = x_{i+1} * P(v_{i+1}, v_{i+1}) \neq 0$. Likewise, for any $y \in S(L)$, $0 < y \leq y' \in S_{P^*}(w)$, there is a chain as before but with $x_{i+1} = y$.

$3. \Rightarrow 1$. Let $(\mathbf{v}, \mathbf{x}) \in \mathcal{C}(P)$, and assume $(\mathbf{v}, \mathbf{x})$ has no realization. Then there is a largest $n$ such that $(t_0, \ldots, t_n)$ satisfies the defining property of realization. Thus, $x_n * P(v_n, v_n) = 0$, $x_n * P(v_n, v_{n+1}) \neq 0$ and $x_{n+1} * P(v_{n+1}, v_{n+1}) = 0$, in contradiction to 3.

Stability

7.6.6 Definition Let $P$ be an $L$-process. A state $v \in V(P^*)$ is *stable* if $s_{P^*}(v) = P(v, v)$. An edge $(v, w)$ is *critical* if $P(v, w) * \sim P(v, v) > 0$. A state $v$ is *critical* if $(v, w)$ is critical for some $(v, w) \in E(P^*)$. A set of stable states $W \subset V(P)$ is said to be *stabilizing* if for each critical $(v, w) \in E(P^*)$, $w \in W$. If $P$ contains a stabilizing set it is said to be *stable*.

Thus, an edge $(v, w)$ is critical if it is enabled by some selection which disables the self-loop $(v, v)$. Clearly, a reachable state is stable if and only if none of its outgoing edges to a state of the reachable subprocess $P^*$ is critical, and the edge $(v, w)$ is noncritical if and only if $P(v, w) \leq P(v, v)$.

7.6.7 Theorem *An $L$-process $P$ is realizable if and only if stable.*

Proof.

$\Rightarrow$. Let $W$ be a maximal set of stable states, and suppose $W$ is not stabilizing. Then for some critical edge $(v, w) \in E(P^*)$, $w \notin W$, so $w$ is not stable. Since $(v, w)$ is critical, for some $x \in S(L)$, $x * P(v, w) \neq 0$ while $x * P(v, v) = 0$. Since $w$ is not stable, $P(w, w) < s_{P^*}(w)$ so for some $y \in S(L)$, $y * P(w, w) = 0$ while $0 < y \leq y' \in S_{P^*}(w)$. Thus, by Lemma 7.6.5, $P$ is not realizable, a contradiction.

$\Leftarrow$. Let $W$ be stabilizing. Suppose $(v, w) \in E(P^*)$, $0 < x \leq x' \in S_P(v)$, $x * P(v, v) = 0$, $x * P(v, w) \neq 0$ and $0 < y \leq y' \in S_{P^*}(w)$. Then $(v, w)$ is critical, so $w \in W$. Therefore $s_{P^*}(w) = P(w, w)$ so $y * P(w, w) \neq 0$. By Lemma 7.6.5, $P$ is realizable.

While the following result shows that the homomorphic image of a stable process is stable, it is important to note that this does *not* imply (and in fact it is false in general) that if $P$ is stable and $\mathcal{L}(Q) = \Phi \mathcal{L}(P)$, 132            *Chapter 7. The Selection/Resolution Model* then $Q$ is stable: stability is very much related to the branching structure of the process $P$ (i.e., to $M_P$) and is not captured by $\mathcal{L}(P)$.

7.6.8 Theorem *Let $P$ be an $L$-process and let $\varphi$ be a homomorphism on $L$. Then*

1. *$P$ stable $\Rightarrow \varphi P$ stable;*

2. *$\varphi P$ stable, $\ker \varphi = 0 \Rightarrow P$ stable.*

Proof. If $W$ is stabilizing for $P$ then $s_{P^*}(v) = P(v,v) \; \forall v \in W$. By Lemma 7.2.8, $s_{\varphi P}(v) = \varphi s_P(v) = \varphi P(v,v)$ and thus $W$ is stabilizing for $\varphi P$. If $W$ is stabilizing for $\varphi P$, then $\varphi s_{P^*}(v) = s_{\varphi P^*}(v) = \varphi P(v,v)$ $\forall v \in W$; if $\ker \varphi = 0$ then $s_{P^*}(v) = P(v,v)$.

One would like a good way to build system models which are guaranteed by construction to be realizable. For example, it would be nice if a product of realizable processes were realizable. There can be no real hope for that, however, as the "pauses" of different component processes may fail to "align": the pause of one component may be effective in $]t,t'[$ while that of another component is effective in $]t,t']$. Thus, the first component may assume a new state at $t'$, while the other assumes a new state in $]t',t'']$, implying two successive zero-time state changes, which is unrealizable. An actual condition for closure of realizability under product, given in Theorem 7.6.12 below, is more complex (although not difficult to implement or check). It involves interpretation of realizability as a local stability condition.

In order to give a general means for constructing realizable "systems" (processes whose product is realizable by construction), the underlying Boolean algebra is assumed to contain a designated element $u$, the effect of which is to enforce the normalizing assumption discussed above. It is used to guarantee that realizations of respective processes will "align", avoiding the case where $t_{i-1} = t_i$ for one process and $t_i = t_{i+1}$ for the other. In physical terms, this may be understood as an assumption that all processes assume a new state in an open interval $]t_i,t_{i+1}[$ rather than some in the open interval and some in the half-open interval $[t_i,t_{i+1}[$. Since there is no physical distinction between an event which occurs *at $t_i$* and an event which occurs (immediately) *after $t_i$*, this is a normalization rather than a restriction, in physical terms.

7.6.9 Definition An $L$-process $P$ is *semi-deterministic* if $M_P$ is deterministic at every nonstable state. A state $v \in V(P)$ is *transient* if

7.6. Modelling Asynchrony and Continuous Time $P(v, v) = 0$. A nonstable, nontransient state $v \in V(P)$ is a *wait* state if $|S_P(v)| = 1$.

A wait state is a state $v$ in which the process $P$ "waits" for "input": a global selection which enables an exiting transition; while $P$ "waits" $P$ selects the single selection in $s_P(v)$. (The determinism afforded by the single selection in $s_P(v)$ is a crucial aspect of "waiting", in order to preserve stability.) Semi-determinism is as deterministic as a process can get and still preserve stability (which, as already discussed, requires nondeterministic "pauses").

7.6.10 Definition Let $w$ be a stable state of a process $P$. A selection $x \in S_P(w)$ is *locally active* if for some critical transition $(v, w)$, $x \in S_P(v)$ and $x * P(v, w) > 0$. Let $S_P^0(w)$ denote the set of locally active selections in $S_P(w)$ (empty if $w$ is not stable). The *active* selections of $P$ are the selections in $$\widehat{S}_P = S(L_P) \setminus \bigcup_{\text{stable } w} (S_P(w) \setminus S_P^0(w)).$$

The active selections are those selections which are not "pause" selections at any stable state $w$, unless they also enable the transition into $w$. The next definition gives a condition under which stability is preserved by the tensor product.

7.6.11 Definition Stable, semi-deterministic $L$-processes $P_1, \ldots, P_k$ form an *asynchronous family* provided for some $u \in L$, $\mathbb{B}[u], L_{P_1}, \ldots, L_{P_k}$ are independent, $L = \mathbb{B}[u] \cdot \prod_{i=1}^{k} L_{P_i}$ and for all $i$:

1. for each noncritical $(v, w) \in E(P_i)$, if $v \neq w$ then $P_i(v, w) \leq u$;

2. for each critical $(v, w) \in E(P_i)$, $P_i(v, w)$ is a sum of elements of the form $\sim u * \prod_{i=1}^{k} y_i$ where $y_i \in \widehat{S}_{P_i} \cup \{1\}$ for $i = 1, \ldots, k$.

3. every state of $P_i$ is either stable, transient or wait.

Conditions 1. and 2. normalize global transitions into the three classes: critical, noncritical or self-looping. From the perspective of modelling, this normalization costs no generality, as a 0-delay critical 134                     Chapter 7. The Selection/Resolution Model transition always may be constrained (without loss of generality), to follow a 0-delay noncritical transition (as shown in Figure 7.2). Condition 2. further stipulates that the selections at stable states are "internal delay events" which cannot force another process to move. This is natural if one uses the stable states to model those periods of inter-event delay, when the physical system state is indeterminate (undefined). Condition 3. stipulates that the physical system component state either be indeterminate (in the above sense), changing unconditionally, or changing conditionally as a function of externally defined conditions; as the "external" distinction is purely syntactic, this is not an operational restriction.

The purpose of the stable states, then, is to implement the delays of Figure 7.2. Given a realization t for a chain $(v, x)$, a state $v_{i-1}$ identified with the interval $]t_{i-1}, t_i[$ is such a stable or "pause" state $v_{i-1} = v@ \in W$. We may identify a unique "pause" selection $p \in S(L_P)$ and define $P(v@, v@) = p$, $P(v@, v) = p * u$ for any noncritical $(v@, v) \in E(P)$. If $t_{i-1} < t_i < t_{i+1} < \cdots$, there is a corresponding succession of stable or "pause" states. However, if $v_i = v$ is a critical state then $t_{i+1} = t_i$ and the transition structure of $P$ looks (locally) as in Figure 7.3. It is convenient to build up products guaranteed realizable by Theorem 7.6.12, from components having such isolated stable states and a unique "pause" selection, as shown, providing the prototypical example of an asynchronous family.

Figure 7.3: The canonical pair of states: $v@$, $v$, where $v@$ is a stable "pause" state, and edges out of $v$ may be critical. The nondeterministic exit from $v@$ models "delay".

7.6. Modelling Asynchrony and Continuous Time

In Figure 7.3, either $|S_P(v)| = 1$ or $\lambda'' = 0$. Especially with "2-state" devices, it is convenient to associate the value of the "pause" selection at a state with the value of the "nonpause" selection which enabled the transition to that state, as shown in Figure 7.4. This provides another prototypical example of a member of an asynchronous family.

Figure 7.4: The output of this process is a two-level signal alternating between $x_0$ and $x_1$, with intervening pauses of nondeterministic duration. Note that the selection at each stable state is locally active and thus remains constant across each critical transition.

7.6.12 Theorem *For an asynchronous family $P_1, \ldots, P_k$ of L-processes, $P = \otimes P_i$ is stable.*

7.6.13 Lemma *If $P_1, \ldots, P_k$ form an asynchronous family of L-processes, $I, J \subset \{1, \ldots, k\}$ with $I \cap J = \phi$, $P_I = \bigotimes_{i \in I} P_i$, $P_J = \bigotimes_{i \in J} P_i$, $(v, w) \in E(P_I)$, $(v', w') \in E(P_J)$ and*

$$(P_I \otimes P_J)((v, v'), (w, w')) \neq 0 ,$$

*then*

$(v, w), (v', w')$ *noncritical* $\Leftrightarrow ((v, v'), (w, w')) \in E(P_I \otimes P_J)$ *noncritical*.

Proof. The proof is by induction on $\max\{|I|, |J|\}$. Add to the induction hypothesis that if $(v, w)$ is critical then $P_I(v, w) \leq \sim u$ while if $(v, w)$ is noncritical and $v \neq w$, then $P_I(v, w) \leq u$; same for $P_J$.

$$\begin{aligned}
\Rightarrow. \quad (P_I \otimes P_J)((v, v'), (w, w')) &= P_I(v, w) * P_J(v', w') \\
&\leq P_I(v, v) * P_J(v', v') \\
&= (P_I \otimes P_J)((v, v'), (v, v'))
\end{aligned}$$

136  Chapter 7. The Selection/Resolution Model so $((v,v'),(w,w'))$ is noncritical. If $(v,v') \neq (w,w')$ then either $v \neq w$ or $v' \neq w'$ so $$(P_I \otimes P_J)((v,v'),(w,w')) \leq u.$$

$\Leftarrow$. If $(v,w)$ is critical and $(v',w')$ is noncritical with $v' \neq w'$, then $(P_I \otimes P_J)((v,v'),(w,w')) = P_I(v,w) * P_J(v',w') \leq \sim u * u = 0$, while $(P_I \otimes P_J)((v,v'),(v,w')) \leq \sim u$ and if it is nonzero, $$\begin{aligned}
(P_I \otimes P_J)((v,v'),(w,v')) &* \sim (P_I \otimes P_J)((v,v'),(v,v')) \\
&= P_I(v,w) * P_J(v',v') * (\sim P_I(v,v) + \sim P_J(v',v')) \\
&= (P_I(v,w) * \sim P_I(v,v)) * P_J(v',v') \\
&= P_I(v,w) * P_J(v',v') \\
&= (P_I \otimes P_J)((v,v'),(w,v')) \\
&> 0
\end{aligned}$$

(the next-to-last equality following from the semi-determinism of $P_I$), so $((v,v'),(w,v'))$ is critical, a contradiction. If both $(v,w)$ and $(v',w')$ are critical, then $(P_I \otimes P_J)((v,v'),(w,w')) \leq \sim u$, and if it is nonzero, $$\begin{aligned}
(P_I \otimes P_J)((v,v'),(w,w')) &* \sim (P_I \otimes P_J)((v,v'),(v,v')) \\
&= P_I(v,w) * P_J(v',w') * (\sim P_I(v,v) + \sim P_J(v',v')) \\
&= (P_I \otimes P_J)((v,v'),(w,w')) \\
&> 0
\end{aligned}$$

as before, so $((v,v'),(w,w'))$ is critical, again a contradiction.

7.6.14 Lemma *For arbitrary L-processes $P_1, \ldots, P_k$, if $v_i \in V(P_i)$ is stable $\forall i$, $P = \otimes P_i$ and $v = (v_1, \ldots, v_k) \in V(P^*)$, then $v$ is stable.*

For the next two lemmas, assume $P_1, \ldots, P_k$ is an asynchronous family of L-processes, and $P = \otimes P_i$

7.6.15 Lemma *If $v = (v_1, \ldots, v_k) \in V(P)$ and some $v_i$ is transient, so is $v$.*

7.6.16 Lemma *Each $v \in V(P^*)$ is either stable or transient.*

Proof. Write $v = (v_1, \ldots, v_k)$. If all the $v_i$'s are stable, then by Lemma 7.6.14, so is $v$. If some $v_i$ is transient, then by Lemma 7.6.15, so is $v$. Thus, suppose each $v_i$ is either stable or a wait state, say

7.6. Modelling Asynchrony and Continuous Time $\{1,\ldots,k\} = I \cup J$, $I \cap J = \phi$, $i \in I \Rightarrow v_i$ is stable, $i \in J \Rightarrow v_i$ is a wait state, and $J \neq \phi$. If $v$ is not transient, then $0 \neq P(v,v) + \Pi P_i(v_i, v_i)$. By Lemma 3.1.6, letting $$s = \prod_{i \in J} s_{P_i}(v_i),$$

$$s_P(v) = \prod_i s_{P_i}(v_i)$$

$$= \left(\prod_{i \in I} s_{P_i}(v_i)\right) * s$$

$$\geq \left(\prod_{i \in I} s_{P_i^*}(v_i)\right) * s$$

$$= \left(\prod_{i \in I} P_i(v_i, v_i)\right) * s.$$

Thus, if $s = \prod_{i \in J} P_i(v_i, v_i)$ then $$s_P(v) \geq \prod_{i=1}^{k} P_i(v_i, v_i) = P(v, v),$$

so $s_{P^*}(v) = P(v, v)$ and $v$ is stable. To this end, certainly $$\prod_{i \in J} P_i(v_i, v_i) \leq s.$$

Suppose $x \in S(L)$, $$x * \prod_{i \in J} P_i(v_i, v_i) = 0$$

and $x * s \neq 0$. Write $x = a * x_1 * \cdots * x_k$ where $a \in \{u, \sim u\}$ and $x_i \in S(L_{P_i})$. Then $x_i * s_{P_i}(v_i) \neq 0\ \forall i \in J$, so for $i \in J$, $x_i = s_{P_i}(v_i)$ since $v_i$ is a wait state. Since $$x * \prod_{i \in J} P_i(v_i, v_i) = 0,$$

for some $i_0 \in J$, $x * P_{i_0}(v_{i_0}, v_{i_0}) = 0$. By the independence assumption it follows that $s_{P_{i_0}}(v_{i_0}) * P_{i_0}(v_{i_0}, v_{i_0}) = 0$, so $P_{i_0}(v_{i_0}, v_{i_0}) = 0$ and $v_{i_0}$ is transient. But this contradicts the assumption that $i \in J \Rightarrow v_i$ is a wait state. Thus $x * s = 0$ and so $\prod_{i \in J} P_i(v_i, v_i) = s$, q.e.d.

Chapter 7. The Selection/Resolution Model

Proof of (7.6.12). To show that $P$ is stable, we must show that if $(v, w) \in E(P^*)$ is critical, then $w$ is stable. If $(v, w)$ is critical then by Lemma 7.6.13, for some $i$, $(v_i, w_i)$ is critical, and by the asynchronous family assumption 2., $P_i(v_i, w_i) \leq \sim u$. Hence, for each $i$, either $(v_i, w_i)$ is critical, in which case $w_i$ is stable since $P_i$ is stable, or $w_i = v_i$, in which case (by asynchronous family assumption 3.) either $w_i (= v_i)$ is stable, or $v_i$ is a wait state and $|S_{P_i}(v_i)| = 1$. Let $v_i$ be a wait state, with $S_{P_i}(v_i) = \{x_i\}$, and let $u_i \in V(P_i^*)$. Since $P_i$ is deterministic at $v_i$, for all $x \in S_{P^*}(v)$, $x * P_i(v_i, u_i) = 0$. For all $y \in S_{P^*}(w)$, $y \leq x_i$ and thus by assumption 2. of the definition of asynchronous family, it follows that $y * P_i(v_i, u_i) = 0$. Thus, since $w \in V(P^*)$, $y * P_i(v_i, v_i) \neq 0$, and thus $y * P(w, w) \neq 0$. Hence, by Lemma 7.6.16, $w$ is stable.

The following shows that the $u$ of Theorem 7.6.12 has only a "local", noncumulative effect upon the coordination of the $P_i$'s. The proof follows from the fact that any global transition of $Q$ which is disabled in $P$ by $u$ (i.e., concurrent critical and noncritical state changes in two components) can be "caught up" in two transitions of $P$, on account of the nature of stable states.

7.6.17 Theorem *Suppose $P_1, \ldots, P_k$ form an asynchronous family of $L$-processes, $P = \otimes P_i$ and $Q = \otimes \Pi_{L_P} P_i$. Then $V(Q^*) = V(P^*)$, $E(P) \subset E(Q)$ and if $(v, w) \in E(Q) \setminus E(P)$ then there is a $v' \in V(P)$ such that $(v, v'), (v', w) \in E(P)$.*

The following examples show that various forms of the converse to Theorem 7.6.12 fail. This is a pity, as in the course of verifying properties in a reduced model (see Chapter 8), one can at the same time (with nominal additional computation) test for stability. If one then knew that reduced models $P \otimes Q'$ and $P' \otimes Q$ were stable ($Q'$ a reduction of $Q$, $P'$ a reduction of $P$), it would be very convenient to be able then to infer that the unreduced system model $P \otimes Q$ were stable, either by concluding that $P$, $Q$ were stable and applying Theorem 7.6.12, or inferring it somehow directly. However, Examples 7.6.18, 7.6.19 show that neither need be the case. This leaves the alternative to conclude $P \otimes Q$ is stable by testing $P$ and $Q$ separately for stability and then applying Theorem 7.6.12.

7.6.18 Example Even if $P, Q$ are independent, lockup-free Moore processes, it is possible that $P \otimes Q$ is stable while neither $P$ nor $Q$ is, as shown in Figure 7.5.

7.6. Modelling Asynchrony and Continuous Time

Figure 7.5: $P$ and $Q$ are independent, lockup-free Moore processes with stable product $P \otimes Q$, although neither $P$ nor $Q$ is stable (Example 7.6.18).

7.6.19 Example Even if $P$ and $Q$, $P'$ and $Q'$ are independent, lockup-free Moore processes, $L_{P'} = L_P$, $L_{Q'} = L_Q$, $\mathcal{L}(P) \subset \mathcal{L}(P')$, $\mathcal{L}(Q) \subset \mathcal{L}(Q')$ and both $P \otimes Q'$ and $P' \otimes Q$ are stable, still $P \otimes Q$ may fail to be stable, as shown in Figure 7.6.

7.6.20 Note One may start with a family of stable, semi-deterministic Moore processes and convert them into an asynchronous family by multiplying every noncritical nonself-loop edge by $u$ and every critical edge by $\sim u$ (provided the result then satisfies the definition of an asynchronous family). However, in so doing, the resulting processes may not remain Moore: cf. Figure 7.4.

Asynchronous Equivalence

As already noted, with regard to a realization $t$ of a chain $(\mathbf{v}, \mathbf{x}) \in C(P)$, $t_i$ may be understood as the onset time of the "event" $(v_i, x_i)$ except when $t_{i-1} < t_i$, $v_i = v_{i-1}$ and $x_i = x_{i-1}$, i.e. when $(v_i, x_i)$ is Figure 7.6: $P$, $Q$ and $P'$, $Q'$ are respectively independent, lockup-free Moore processes, both $P \otimes Q'$ and $P' \otimes Q$ are stable and yet $P \otimes Q$ is not stable (Example 7.6.19).

the "continuation" of the "pause event" $(v_{i-1}, x_{i-1})$. In this case, $P$ "pauses" in the interval $]t_{i-1}, t_i[$ and then "continues to pause" in the interval $[t_i, t_{i+1}[$. Although from a language-theoretic point-of-view, the chain $(v, x)$ and the chain $(v_0, x_0), \ldots, (v_{i-1}, x_{i-1}), (v_{i+1}, x_{i+1}), \ldots$ are distinct, from the point-of-view of a process $P$ in an asynchronous environment, it often is required to identify these two chains, as lacking time bounds on events, there is no empirical way to physically distinguish between $(v_{i-1}, x_{i-1})$ effective within $]t_{i-1}, t_{i+1}[$ or within $]t_{i-1}, t_i[$ and then $[t_i, t_{i+1}[$. In intrinsically asynchronous models (cited above), this view has led to a notion called "stuttering equivalence" relative to a specifically identified "internal event" modelled as an $\epsilon$-transition (a "$\tau$-action" in CCS terminology, referring to an unlabelled state transition in a component, which may be taken while the rest of the component states are frozen); sequences are associated if they differ only in the number of repetitions of consecutive internal events. This introduces complications, especially with respect to the interleaved composition of processes. However, by using the asynchronous interpretation of a synchronous semantics, as just described, this complication is circumvented by identifying "internal events" with *pauses* as above and requiring sta-

7.6. Modelling Asynchrony and Continuous Time bility: between every 2 "external events" is a *pause*. In a composition, "internalized events" simply extend the embedded pauses, and thus may be directly identified with them. This has a simple language-theoretic interpretation: associate those sequences in the language of a realizable process which differ only in the number of consecutive repetitions of selections. If $P_1, \ldots, P_k$ are as in Theorem 7.6.12, then the only selections which may be repeated are the selections sustained across noncritical transitions, namely the "pause" selections. A string of several identical pause selections thus may be identified with a single pause (but never eliminated entirely, as stability must be maintained). As any pause may be repeated an arbitrary number of times, the only possible difference between two otherwise equivalent stable processes is the lower bound on the number of possible repetitions of a given pause (which may be greater than 1 if there is a succession of stable states with the same selection). This motivates the next definition. Moreover, this notion of equivalence is similar — but not identical to (and is simpler than) the usual notion of "stuttering equivalence", which must deal with arbitrary *insertions* as well as deletions of $\epsilon$-transitions. Furthermore, the dilemma, requiring semantic identification of "the internal event", of whether for internal event $\tau$ and external action $a$, $a\tau\tau a$ is stuttering equivalent to $aa$ and hence to $a$ does not arise here. (In particular, for realizability, there *must* be a "pause event" between the two $a$'s.) Finally, whereas dealing with stuttering equivalence requires precomputation of a transitive closure (an $O(n^2)$ algorithm for $n$ states), the asynchronous equivalence defined next does not require the computation of a closure at all, if processes are taken to be irredundant (Definition 7.6.23), a natural normalization.

7.6.21 Definition For any $L$-process $P$, let $$\mathcal{L}^+(P) = \{\mathbf{x} \in S(L)^\omega \mid (x_i^{n_i})_i \in \mathcal{L}(P) \text{ for some } \mathbf{n}, n_i > 0 \;\forall_i\}.$$

(The sequence $(x_i^{n_i})_i$ is the sequence formed by $n_0$ repetitions of $x_0$, followed by $n_1$ repetitions of $x_1$, and so on.) Say $L$-processes $P$, $Q$ are *asynchronously equivalent* if $\mathcal{L}^+(P) = \mathcal{L}^+(Q)$.

Thus, without identifying "internal events" or directly defining an equivalence relation on elements of the language, we can say that two processes are asynchronously equivalent if their languages differ only in repetitions of consecutive selections, as with $P_1$ and $P_2$ in Example 7.6.22.

142                         Chapter 7. The Selection/Resolution Model

7.6.22 Example $P_1$ and $P_2$ are asynchronously equivalent, as $\mathcal{L}(P_1)$ and $\mathcal{L}(P_2)$ differ only by elements which differ in the number of repetitions of consecutive selections.

(See Figure 7.6A.)

Both $P_1$ and $P_2$ are stable; if each has a cycle set which contains all but the last state, then $\mathcal{L}(P_1) = pp^+x^\omega$ while $\mathcal{L}(P_2) = p^2p^+x^\omega$ so $\mathcal{L}(P_1)$ and $\mathcal{L}(P_2)$ are incommensurate. However, they are asynchronously equivalent as $\mathcal{L}^+(P_1) = \mathcal{L}^+(P_2) = p^+x^\omega$, and furthermore there is a stable generator $P$ for this language:

(See Figure 7.6B.)

i.e., $\mathcal{L}(P) = \mathcal{L}^+(P_1)$. In fact, as is shown below, such a $P$ always may be found.

7.6.23 Definition Let $P$ be an arbitrary $L$-process, and let $(v,w) \in E(P)$. The *redundancy* of $(v,w)$ is $s_P(v) * s_P(w)$. $P$ is *irredundant* if every nonself-loop edge has redundancy 0.

7.6.24 Note If $S_P(v) \cap S_P(w) \neq \phi \Rightarrow v = w \; \forall (v,w) \in E(P)$, then $P$ is irredundant.

7.6. Modelling Asynchrony and Continuous Time

7.6.25 Lemma $P_1, \ldots, P_k$ irredundant $\Rightarrow \otimes P_i$ irredundant.

Proof. By Lemma 3.1.6.

7.6.26 Lemma $P$ irredundant $\Rightarrow \mathcal{L}^+(P) = \mathcal{L}(P)$.

7.6.27 Corollary $P_1, \ldots, P_k$ irredundant $\Rightarrow \mathcal{L}^+(\otimes P_i) = \mathcal{L}(\otimes P_i)$.

7.6.28 Definition Let $P$ be an $L$-process, $v, w \in V(P)$ and $x \in S(L)$. A path $v = v_0, \ldots, v_n = w$ in $P$ from $v$ to $w \neq v$ is said to be an $x$-path if $x * P(v_i, v_{i+1}) \neq 0$ for all $0 \leq i < n$. If every $x$-path from $v$ to $w$ crosses a recur edge, say $(v, w)$ is $x$-recurring.

7.6.29 Definition Given an arbitrary $L$-process $P$, define its *asynchronous closure* to be the $L$-process $P^+$ defined as follows:

$$\begin{aligned}
L_{P^+} &= L_P \; ; \\
V(P^+) &= (V(P) \times S(L))^2 \; ; \\
I(P^+) &= \{(v, x, v, x) \in V(P^+) \mid v \in I(P), x \in S(L)\} \; ;
\end{aligned}$$

$$P^+((v, x, v', x'), (w, y, w', y'))$$
$$= \begin{cases} x * P(v, w) & \text{if } w' = w, y' = y \\ x & \text{if } \exists \; x\text{-path from } v \text{ to } w \\ & \text{and } w' = v, y' = x \\ 0 & \text{otherwise} \; ; \end{cases}$$

$R(P^+) =$
$\{((v, x, v', x'), (w, y, w', y')) \in E(P^+) \mid (v, w) \in R(P), w' = w, y' = y\}$
$\cup \{((v, x, v, x), (w, y, v, x)) \in E(P^+) \mid (v, w) \text{ is } x\text{-recurring}\}$ for $C \in Z(P)$, letting $$\begin{aligned}
C^+ &= \{(v, x, v, x) \mid v \in C, \; x \in S(L)\} \cup \\
& \quad \{(w, y, v, x) \mid w \neq v \text{ and } \exists \; x\text{-path in } C \text{ from } v \text{ to } w\} \; ,
\end{aligned}$$

define
$$Z(P^+) = \{C^+ \mid C \in Z(P)\} \; .$$

144    Chapter 7. The Selection/Resolution Model

The intuition behind the construction of $P^+$ is this: the states $$(v, x, v, x)$$

correspond to an "atomic splitting" of $M_P$ into its *chain* matrix $C_P$ defined by $V(C_P) = V(P) \times S(L)$ and $C_P((v,x),(w,y)) = x * P(v,w)$. We would like to add an edge $((v,x),(w,y))$ to $E(C_P)$ whenever there is an $x$-path from $v$ to $w$; however, treatment of cycle sets then would become problematic, as $v$ and $w$ may belong to some cycle set $C$, while every $x$-path from $v$ to $w$ exits $C$. The solution taken here is to split off a copy of $(w,y)$; namely $(w,y,v,x)$, excluded from $C^+$.

7.6.30 Theorem $\mathcal{L}(P^+) = \mathcal{L}^+(P)$.

7.6.31 Lemma Let $P$, $Q$ be $L$-processes with $\mathcal{L}(P) \subset \mathcal{L}(Q)$ and suppose that for each $\mathbf{x} \in \mathcal{L}(Q)$ $\exists$ n such that $(x_i^{n_i})_i \in \mathcal{L}(P)$. Then $\mathcal{L}^+(P) = \mathcal{L}^+(Q)$.

Proof. Certainly $\mathcal{L}(P) \subset \mathcal{L}(Q) \Rightarrow \mathcal{L}^+(P) \subset \mathcal{L}^+(Q)$. Let $\mathbf{x} \in \mathcal{L}^+(Q)$ and let m be such that $(x_i^{m_i})_i \in \mathcal{L}(Q)$. Then, by assumption, there exists an n with $n_i \geq m_i$ such that $(x_i^{n_i})_i \in \mathcal{L}(P)$, so $\mathbf{x} \in \mathcal{L}^+(P)$.

Theorem 7.6.30 gives a test for asynchronous equivalence of $P$ and $Q$: $\mathcal{L}^+(P) = \mathcal{L}^+(Q) \Leftrightarrow \mathcal{L}(P^+) = \mathcal{L}(Q^+)$. However, constructing $P^+$ and $Q^+$ is computationally expensive, as $|V(P^+)| = (|V(P)| \cdot |S(L)|)^2$. Fortunately, it is often the case that asynchronous equivalence can be tested without this expense. For example, if $\mathcal{L}(P) = \mathcal{L}(Q)$, then naturally, $\mathcal{L}^+(P) = \mathcal{L}^+(Q)$. However, even if $\mathcal{L}(P)$ and $\mathcal{L}(Q)$ are incommensurate, there may be a cheap test of asynchronous equivalence. For example, if $P$ and $Q$ differ only in that $P$ has n consecutive states with the same pause selection $p$ and m consecutive states with some other pause selection $q$, where $Q$ has $n' > n$ such states with $p$ and $m' < m$ such states with $q$, then $\mathcal{L}(P) \subset \mathcal{L}(R)$ and $\mathcal{L}(Q) \subset \mathcal{L}(R)$ where $R$ differs from $P$ and $Q$ only in that it has n $p$'s and $m'$ $q$'s. Furthermore, for each selection at a state of $R$, there is corresponding state of $P$ with that selection, and the same applies to $Q$. It follows that $\mathcal{L}^+(P) = \mathcal{L}^+(R)$ and $\mathcal{L}^+(Q) = \mathcal{L}^+(R)$, so $\mathcal{L}^+(P) = \mathcal{L}^+(Q)$. Such an $R$ always may be found when $P$ and $Q$ are asynchronously equivalent, but perhaps $R = P^+$. However, when an $R$ may be found which is significantly simpler than $P^+$, there is a corresponding saving in computational cost.

Probably the best way to avoid the computational cost of the asynchronous closure is restrict oneself to irredundant components, on account of Corollary 7.6.27. This actually is a very natural restriction,

7.6. Modelling Asynchrony and Continuous Time which gives rise to a modelling style in the form of Figure 7.3, a style which has been used extensively in the design and verification of asynchronous protocols [HK90].

Fundamental Mode

There is another model of asynchrony: the *fundamental mode* model, formulated by hardware designers several decades ago for circuit models defined in terms of gates and latches. The fundamental mode model carries the assumptions that there are no simultaneous inputs, all transitions are instantaneous, and operation is in "steps" as follows. Each step begins with the application of an input, and the input value is held constant throughout the step. Throughout a step, the state may change several times, but if the model is "valid", the state is assumed to "stabilize" after a finite number of changes, changing no more. That is the conclusion of the step, and the conclusion may include the generation of an output.

Two such models are considered equivalent if they have the same input/output behavior, that is, if they are language-equivalent once steps are atomized. The basic problem with this paradigm is that it may be difficult or impossible to find an implementation which conforms to it: for example, outputs of digital electronic circuits typically are a function of state, and may change as a circuit moves through several transient states to a stable state, in the course of a step. As the input to one circuit typically is the output from another circuit, it thus often is difficult or inefficient to enforce the assumption that an input is held constant throughout each step. In fact many, if not most errors in digital circuits can be traced to transitory behaviors known as "races" and "hazards" (which are assumed not to exist, and therefore are undetectable, in the fundamental mode model).

For these reasons, the fundamental mode model largely was abandoned by the hardware community over 2 decades ago. Shortly after it was abandoned by the hardware community, it was rediscovered by theorists in the software community, who have embraced it ever since under the appellation "interleaving model", as already described above. In terms of software, the stabilization phase of the fundamental mode corresponds to local calculations at a state: an "event" occurs (read "input changes"), exactly one (or occasionally, several synchronized [LT87]) process(es) change state, local variables are recomputed and assigned the new state (read "change local state until stable"), and then the succession repeats.

Chapter 7. The Selection/Resolution Model

The model is represented as an abstraction of concurrent programs, justified by the assumption that program synchronization and interrupt-handling are low-level issues which can be dealt with appropriately in any implementation. In fact, the model is beset with the same problem of implementability for software applications as for hardware applications. Many concurrent program applications must deal ultimately with the issues of synchronization and interrupt-handling at process interfaces and (just as with hardware) the fundamental mode (interleaving) model may not be implementable.

Furthermore, (just as with hardware), many if not most software errors in concurrent programs can be traced to faulty synchronization and interrupt-handling (which, just as with hardware, are assumed not to exist and therefore are undetectable, in the fundamental mode/interleaving model).

One group of applications which may be exempt from this difficulty are distributed network protocols, whose implemented processes indeed often are physically isolated from one another, and thus may not be subject to the common problems surrounding synchronization and interrupts.

It sometimes is argued that the reality *is* in fact interleaving, as the probability that two independent events occur at precisely the same instant, is 0. While this may be so, it neglects an important application of asynchrony, namely *abstraction*. It is very useful to model as asynchronous, abstractions of processes whose ultimate implementation will be synchronous. This permits one to defer the details of synchronization (for example, how many cycles are required for each step) to a lower-level (more detailed) model. Moreover, if the ultimate implementation will be synchronous (as is virtually always the case in current technology), it is essential to allow for the possibility that the actions of several processes occur simultaneously.

Furthermore, although it is not generally recognized, the interleaving (*i.e.*, fundamental mode) model in fact corresponds to a special (restricted) case of the *synchronous* model of parallel composition. The translation is very simple: given a fundamental mode/interleaving model of concurrent processes $p_1,\ldots,p_k$, their parallel composition $p = p_1|\cdots|p_k$ (*i.e.*, the generator of their concurrent fundamental mode evolution) translates to a (synchronous) product of $L$-processes $\hat{p} = \hat{p}_1 \odot \cdots \odot \hat{p}_k$ where the transition structure of $\hat{p}_i$ is identical to that of $p_i$, and the internal and output actions $S_i$ of each $p_i$ translate to corresponding selections of $\hat{p}_i$, except as follows. For some symbols %, not in

7.6. Modelling Asynchrony and Continuous Time 147 the alphabet of actions of the $p_i$'s, $S(L_{\hat{p}_i}) = S_i \cup \{\%_i\}$, and $\%_i$ is added to the set of selections possible from each state of $\hat{p}_i$, enabling the respective self-loops. Thus, if $x, y, \ldots$ are the internal and output actions possible at (or leaving) a state $v$ of $p_i$, then $S_{\hat{p}_i}(v) = \{\%_i, x, y, \ldots\}$. If $p_i(v, w)$ is the transition predicate which enables the state transition $v \to w$ in $p_i$, then $$\hat{p}_i(v, w) = \begin{cases} p_i(v, w) & \text{if } v \neq w \\ p_i(v, w) + \%_i & \text{if } v = w \end{cases}.$$

Finally, we include exception conditions in the $\hat{p}_i$'s which except all those sequences $x \in \mathcal{L}(\otimes \hat{p}_i)$ but for those in which every term $x_j$ has the form $$\%_1 * \cdots * \%_{i-1} * x * \%_{i+1} * \cdots * \%_k ,$$

that is, in which all but exactly one component of each $x_j$ is from the set $\{\%_1, \ldots, \%_k\}$. If the definitions of the $p_i$'s include "fairness" conditions (which are $\omega$-regular properties), these can be included in the definition of $R(\hat{p}_i)$ and $Z(\hat{p}_i)$ when these conditions are defined locally, or else in the definition of $P$, as appropriate. Then, there is a 1-1 correspondence between the infinite[6] executions of $p$ and elements of $\mathcal{L}(\hat{p})$ by which each event $x$ of $p_i$ corresponds to $$\%_1 * \cdots * \%_{i-1} * x * \%_{i+1} * \cdots * \%_k \in S(L_{\hat{p}}) .$$

Analysis tools which support interleaving models frequently are implemented with a "scheduler" which chooses the next process to take an action. As this choice must be done in every possible order, it is necessary to maintain a stack of pending actions, and execute them accordingly. The data structures involved in this can be cumbersome, leading to slow and inefficient implementations. However, there are some exceptions, for example, Holzmann's SPIN makes good use of interleaving and obtains a very efficient implementation [Hol88], [Hol91]. Moreover, the interleaving semantics supports certain types of reductions based upon partial orders which generally are not applicable to synchronous models [CF69], [Maz84], [Zi87], [AR88], [GW91], [Val91], [McM93b], [Pel94]. Partial order reductions can in some cases be significant, although in the worst case cannot help [FKL93].

A synchronous model can be implemented as a "vector" system, with all processes updated "simultaneously" in a uniform (synchronous) step. This is quite simple to implement efficiently (for example, COSPAN is implemented this way).

---

[6] (Finite) strings of executions of $p$ always can be extended to (infinite) sequences by appending an infinite suffix of "null" actions.

148     Chapter 7. The Selection/Resolution Model

Testing "stuttering equivalence" in $p$ via this translation could be simple (it depends upon the particular semantics of the interleaving model). It corresponds to testing a "local" form of asynchronous equivalence in $\hat{p}$, as follows. Let $\mathcal{L}(p)$ be the set of fair traces of $p$ (however "fairness" may be defined within the interleaving semantics). That is, $\mathcal{L}(p) = \{x \mid \text{each } x_i \text{ is an internal or output event of some } p_j \text{ and } x \text{ is "fair"}\}$. The above map of events of $p$ (i.e., the union over $i$ of the events of $p_i$) to the atoms of $L_{\hat{p}}$:

$$x \to \%_1 * \cdots * x * \cdots * \%_k$$

corresponds to the support of a language homomorphism and defines a bijection $\mathcal{L}(p) \leftrightarrow \mathcal{L}(\hat{p})$. In particular, $$\mathcal{L}(p) \subset \mathcal{L}(q) \Leftrightarrow \mathcal{L}(\hat{p}) \subset \mathcal{L}(\hat{q}) .$$

For each $i$ let $\pi_i \subset S_i$ be a set of designated "internal" events of $p_i$, and let $\pi = \bigcup_{i=1}^{k} \pi_i$. Let $\mathcal{L}^{\pi}(p)$ be the set of elements $x \in \mathcal{L}(p)$, each altered by arbitrarily many insertions or deletions of strings from $\pi^*$. (That is, $y \in \mathcal{L}^{\pi}(p)$ if $y$ is obtained from some $x \in \mathcal{L}(p)$ through arbitrarily many deletions in $x$ of noncontiguous strings from $\pi^+$, followed by arbitrarily many insertions of strings from $\pi^*$, following each letter remaining after the deletions in $x$.)

The sequences $x, y \in \mathcal{L}(p)$ are said to be *stuttering equivalent* if one is obtained from the other by such insertions and deletions. Two such interleaved compositions $p, q$ are *stuttering equivalent* if each $x \in \mathcal{L}(p)$ is stuttering equivalent to some $y \in \mathcal{L}(q)$, and vice versa, that is, if $\mathcal{L}^{\pi}(p) = \mathcal{L}^{\pi}(q)$.

Let $\pi \subset S(L)$ and let $x, y \in S(L)^\omega$. Say $y$ is a $\pi$-*shift* of $x$ provided for some sequence $n$ with $n_i > 0$ for all $i$, $y = (x_i^{n_i})_i$ and $n_i > 1 \Rightarrow x_i \in \pi$. For any $L$-process $P$ and $\pi \subset S(L)$, let $$\mathcal{L}^{\pi}(P) = \{y \in S(L)^\omega \mid y \text{ is a } \pi\text{-shift of } x\} .$$

Thus, $\mathcal{L}^+(P) = \mathcal{L}^{S(L)}(P)$ and $\mathcal{L}^\phi(P) = \mathcal{L}(P)$. It is straightforward to mimic the construction of $P^+$, and construct an $L$-process $P^\pi$ such that $\mathcal{L}^{\pi}(P) = \mathcal{L}(P^\pi)$.

Let $\sigma : S(L_{\hat{p}_i}) \to S_i \setminus \pi_i$ by $$\sigma(x) = \begin{cases} x & \text{if } x \notin \pi_i \\ \%_i & \text{otherwise} . \end{cases}$$

7.7. Timing Verification

Letting $L' = \mathbb{B}[S_i \setminus \pi_i]$ (cf. Definition 2.1.14), $S(L') = S_i \setminus \pi_i$. Let $\varphi : L' \to L$ be the homomorphism with $\widehat{\varphi}|_{S(L)} = \sigma$, and let $\Phi$ be the language homomorphism with support $\sigma$. Note that $\sigma(\pi_i) = \{\%_i\}$.

Let $\overline{p}$ differ from $\widehat{p}$ only in that $\overline{p}$ allows all occurrences of $\% \equiv \%_1 * \cdots * \%_k$. Then $\widehat{\varphi}(\overline{p})$ (cf. Definition 6.3.2) is an $L'$-process and $\Phi \mathcal{L}(\overline{p}) = \mathcal{L}(\widehat{\varphi}(\overline{p}))$. The following is properly a "Schema" rather than a theorem, as the parallel compositions $p, q$ have not been defined (except in an intuitive sense).

7.6.32 Schema $\mathcal{L}^\pi(p) \subset \mathcal{L}^\pi(q) \Leftrightarrow \mathcal{L}^{\{\%\}}(\widehat{\varphi}(\overline{p})) \subset \mathcal{L}^{\{\%\}}(\widehat{\varphi}(\overline{q}))$.

Proof sketch.

$\Rightarrow$. Let $x \in \mathcal{L}^{\{\%\}}(\widehat{\varphi}(\overline{p}))$. Then $x = (\%^{n_i} y_i)_i$ for some $n$ with $n_i \geq 0$ $\forall i$ and some $y$ with $y_i \neq \%$ $\forall i$. Thus, for some $m$ with $m_i \geq n_i$ $\forall i$, $(\%^{m_i} y_i)_i \in \mathcal{L}(\widehat{\varphi}(\overline{p}))$. Hence, for some $r$ with $0 \leq r_i \leq m_i$, $\exists\, z \in (\pi^{r_i} y_i)_i$ with $z \in \mathcal{L}(p) \subset \mathcal{L}^\pi(p) \subset \mathcal{L}^\pi(q)$, so for some $s$, $\exists\, z' \in (\pi^{s_i} y_i)_i$ with $z' \in \mathcal{L}(q)$. Thus, for every $h$ which satisfies $h_i \geq s_i$ $\forall i$, $(\%^{h_i} y_i)_i \in \mathcal{L}(\widehat{\varphi}(\overline{q}))$; in particular, this is true for $h_i = \max\{s_i, n_i\}$, showing $x \in \mathcal{L}^{\{\%\}}(\widehat{\varphi}(\overline{q}))$.

$\Leftarrow$. Let $x \in \mathcal{L}^\pi(p)$ and let $y$ be the subsequence of $x$ comprised of those components of $x$ not in $\pi$. Then for some $n$ with $n_i \geq 0$ $\forall i$, $\exists\, z \in (\pi^{n_i} y_i)_i$ with $z \in \mathcal{L}(p)$. Thus $(\%^{n_i} y_i)_i \in \mathcal{L}(\widehat{\varphi}(\overline{p})) \subset \mathcal{L}^{\{\%\}}(\widehat{\varphi}(\overline{p})) \subset \mathcal{L}^{\{\%\}}(\widehat{\varphi}(\overline{q}))$, so $(\%^{m_i} y_i)_i \in \mathcal{L}(\widehat{\varphi}(\overline{q}))$ for some $m$ with $m_i \geq n_i$ $\forall i$. Thus, for some $r$ with $r_i \leq m_i$ $\forall i$, $\exists\, z' \in (\pi^{r_i} y_i)_i$ with $z' \in \mathcal{L}(q)$, so $x \in \mathcal{L}^\pi(q)$.

7.7 Timing Verification

Section 7.6 showed how to use the semantically synchronous parallel composition of $L$-processes to model asynchrony and continuous-time evolution of a discrete-event system. The key was the nondeterministic "pause" selections (i.e., selections at stable states) used to model delays. In this section we explain how one can analyze the continuous time process consisting of a realizable $L$-process (Definition 7.6.4) together with bounds on these delays. Restricting each such delay by lower and upper rational bounds, results in a model which retains decidability for language containment. Although the time bounds are required to be rationally commensurate (and thus may as well be taken as integers), the resulting model nonetheless is (uncountably) infinite state, as one process may change its state at any real value of time between the bounds of another pausing process. For this reason, this model often is 150   Chapter 7. The Selection/Resolution Model called a *dense-time* model. For example, given a system model which includes 2 $L$-processes of the type shown in Figure 7.4, one could place lower and upper bounds on the amount of time each $L$-process spends in its respective "pause" states 0@ and 1@. If the first process cycles through its state space, pausing for $\Delta t_i$ units of time in each of 0@ and 1@ in each cycle respectively, then after $n$ such cycles, $\sum_{i=1}^{2n} \Delta t_i$ units of time has elapsed. Suppose during these $n$ cycles, the second process remains in its state 0@, for which there is attached an upper bound of $U$. That means that the second process must make its nondeterministic choice to move 0@ $\to$ 0 no later than $U$ units of time after it entered the state 0@. Thus, in particular, in order for the joint behavior of the two processes to be consistent with their time bounds, it must be that $$\sum_{i=1}^{2n} \Delta t_i \leq U .$$

If $L$ is the minimum of the lower bounds attached to the pauses of the first process in its states 0@ and 1@, then also $$L \leq \Delta t_i$$

for each $i$. Although $L$ and $U$ are integers, the $\Delta t_i$ can be arbitrary real numbers. If in the limit $\Delta t_i \to 0$, the number of cycles $n$ can become arbitrarily large. The reason that this nominally uncountable state space for the resulting system does not intrinsically render verification undecidable, has to do with the fact that except for the time component, the system has a finite state space, from the perspective of which time naturally is partitioned into a finite number of equivalence classes; within each equivalence class, time differences play no role in state transitions. Thus, no matter how small the $\Delta t_i$'s, there are only a finite number of equivalence classes of time that govern the transitions of the system. This is not obvious, but can be shown through analysis [AD94]. It follows that verification of such a model is decidable, if the property to be verified is defined only in terms of the finite (non-time) parameters of the model.

Note that the timing bounds constrain the model behaviors. With no timing bounds (or, equivalently, lower bounds 0 and upper bounds $\infty$), this model reduces to the asynchronous model of the previous section. A given property may fail in the unconstrained model and hold in the constrained model. If such time bounds constrain the task (Section 7.5) as well, verification in general is undecidable [AD94].

7.7. Timing Verification

Verification in fact is applied to a homomorphic reduction of the uncountable state model to a finite state model. If time is considered to be a selection of a component of an infinite Boolean algebra $L$, then the reduction is obtained through a partition of $L$ into sets of selections which are equivalent relative to the non-time component of the state space, as in Example 4.2.20.

Exactly how to construct such a reduction was described first in the seminal work of Alur and Dill [AD90], [AD94], and resulted in much activity in the area, such as [BFH91], [ACH+92], [NSY92], [AHV93], [AIKY93] and [HNSY94]. The timed process model formed by placing lower and upper bounds on stable state sojourn times, for realizable processes which form an asynchronous family, has the same language expressiveness as the Alur/Dill timer model [AD90], [AD94].

Suppose we are given an asynchronous family $P_1, \ldots, P_k$ of $L$-processes and for $P = \otimes P_i$ and some $L$-automaton $T$, we wish to verify that 7.7.1 $\quad \mathcal{L}(P) \subset \mathcal{L}(T)$ .

It may be that (7.7.1) fails, but succeeds if some constraints are placed on the relative durations of various components $P_i$ at stable states. We associate with various of the stable states of various of the $P_i$'s, respective integers $0 \leq L \leq U \leq \infty$, construed as time bounds on the "pause delay" associated with the respective stable state. A *delay constraint* $D$ for the asynchronous family $P_1, \ldots, P_k$ consists of a set of stable states of various components $P_i$, together with such lower and upper bounds. A chain of $P$ is said to be *timing-consistent* with $D$ provided it admits of an unbounded realization (Definition 7.6.2) which at each step is within the allowed bounds. That is, the chain $(\mathbf{v}, \mathbf{x}) \in \mathcal{C}(P)$ is timing-consistent with $D$ provided that for some unbounded realization $\mathbf{t}$, if $v_i = (v_i^{(1)}, \ldots, v_i^{(k)})$ for all $i \geq 0$ and $v_i^{(j)} \in V(P_j)$ is stable with timing bounds $L, U$ in $D$ and $$v_{i-1}^{(j)} \neq v_i^{(j)} = v_{i+1}^{(j)} = \cdots = v_{i+m}^{(j)} \neq v_{i+m+1}^{(j)}$$

then
$$L \leq t_{i+m+1} - t_i \leq U .$$

In this case we say $\mathbf{x}$ is *timing-consistent* with $D$ or *$D$-consistent* (which is well-defined since the $P_i$'s are by definition semi-deterministic).

Given a timing constraint $D$, we wish to characterize the language $$\mathcal{L}_D(P) = \{\mathbf{x} \in \mathcal{L}(P) \mid \mathbf{x} \text{ is } D\text{-consistent}\}$$

152  Chapter 7. The Selection/Resolution Model in terms of the language of a related $L$-process.

7.7.2 Theorem Let $P_1, \ldots, P_k$ be an asynchronous family of $L$-processes with delay constraint $D$, $P = \otimes P_i$. Then there exists an $L$-process $R$ such that
$$\mathcal{L}_D(P) = \mathcal{L}(P \otimes R) .$$

Proof. [AD94].

Unfortunately, the size of $R$, the so-called *region automaton*, is exponential in $k$. (It also is proportional to the magnitudes of the timing bounds.) This may be ameliorated through a heuristic which computes $R$ incrementally [AIKY93].

Chapter 8

Reduction of Verification

8.1 Verification

Let $P_1, \ldots, P_k$ be $L$-processes modelling components of a system model, $P = \otimes P_i$ and let $T$ be an $L$-automaton which defines a requirement of $P$ we would like to verify. We verify that $P$ performs the "task" $T$ (cf. Section 7.5) by checking

8.1.1 $\qquad \mathcal{L}(P) \subset \mathcal{L}(T)$ .

There is no loss of generality in taking $T$ to be strongly deterministic, as for any $\omega$-regular language $\mathcal{L}$, we can write $\mathcal{L} = \cap \mathcal{L}(T_i)$ where $T_1, \ldots, T_n$ are strongly deterministic $L$-automata, by Theorem 6.2.54; verifying

8.1.2 $\qquad \mathcal{L}(P) \subset \mathcal{L}(T_i) \ \forall i$ , gives $\mathcal{L}(P) \subset \cap \mathcal{L}(T_i) = \mathcal{L}$. Moreover, as will be seen, expressing a "global" property $\mathcal{L}$ in terms of "local" properties $\mathcal{L}(T_i)$ such that $\cap \mathcal{L}(T_i) \subset \mathcal{L}$ is a direction we will take in any case, in order to afford an opportunity to reduce $P$ relative to each respective $T_i$: thus, even if $\mathcal{L} = \mathcal{L}(T)$, checking (8.1.2) is simpler computationally than checking (8.1.1) directly.

Now we address the prototypical check (8.1.1).

154                           Chapter 8. Reduction of Verification

8.1.3 Lemma *Given an L-process P and a strongly deterministic L-automaton T,*

$$\mathcal{L}(P) \subset \mathcal{L}(T) \text{ if and only if } \mathcal{L}(P \otimes T^\#) = \phi.$$

Proof. $\mathcal{L}(P) \subset \mathcal{L}(T)$ if and only if $\phi = \mathcal{L}(P) \cap \mathcal{L}(T)' = \mathcal{L}(P) \cap \mathcal{L}(T^\#) = \mathcal{L}(P \otimes T^\#)$.

8.1.4 Definition For an $L$-process $P$ and $I \subset I(P)$, define the $L$-process $P_I = (L_P, M_P, I, R(P), Z(P))$.

8.1.5 Corollary *Given an L-process P, a deterministic L-automaton T and $I \subset I(P \otimes T^\#)$ with $\Pi_P I = I(P)$,*

$$\mathcal{L}((P \otimes T^\#)_I) = \phi \Rightarrow \mathcal{L}(P) \subset \mathcal{L}(T).$$

Proof. We may find $f \subset I$ such that $(v,w), (v,w') \in f \Rightarrow w = w'$. Then $f$ is a function $f : I(P) \to I(T)$. For each $i \in I(P)$ set $P_i = (L_P, M_P, \{i\}, R(P), Z(P))$, $T_i = (M_T, \{f(i)\}, R(T), Z(T))$. Then $\bigcup_{i \in I(P)} \mathcal{L}(P_i) = \mathcal{L}(P)$ and for each $i \in I(P)$, $$\mathcal{L}(P_i \otimes T_i^\#) \subset \mathcal{L}((P \otimes T^\#)_I) = \phi$$

so, since $T_i$ is strongly deterministic, $\mathcal{L}(P_i) \subset \mathcal{L}(T_i) \subset \mathcal{L}(T)$ and thus $\mathcal{L}(P) \subset \mathcal{L}(T)$.

8.1.6 Definition For any $L$-process $P$, define $P^\circ$ to be the directed graph with edges $E(P^*) \setminus R(P^*)$. Let $\mathcal{B}(P)$, the *bad-cycle* set of $P$, be the set of strongly connected components of $P^\circ$ contained in no element of $Z(P)$.

"Bad-cycle" is something of a misnomer, inasmuch as a run $\mathbf{v}$ of $P$ is accepting if and only if $\mu(\mathbf{v})$ is contained in some element of $\mathcal{B}(P)$. The name comes from the following.

8.1.7 Corollary *Let P be an L-process and T a strongly deterministic L-automaton. Then $\mathcal{L}(P) \subset \mathcal{L}(T)$ if and only if $\mathcal{B}(P \otimes T^\#) = \phi$.*

The complexity of testing $\mathcal{B}(P \otimes T^\#) = \phi$ is linear in $|E(P \otimes T^\#)|$, as the set of strongly connected components of a directed graph may

*8.2. Complexity Issues* be found by traversing every edge of the graph once, in the course of a depth-first search [Tar72]. (Only the vertices of the graph — *not* its edges — need be saved in the course of the depth-first search.) Taking into account the check of the bad-cycle set, this gives an overall complexity of $O(|E(P \otimes T^\#)||Z(P \otimes T^\#)|)$ to test (8.1.1). There are algorithms to test $\mathcal{L}(P) \subset \mathcal{L}(T)$ which do not involve explicit computation of the strongly connected components of $(P \otimes T^\#)^\circ$, presented in Chapter 10.

8.2 Complexity Issues

Automata-theoretic verification is expressed by (8.1.1), which may be rewritten as the check

8.2.1 $\qquad \mathcal{L}(P_1 \otimes \cdots \otimes P_k) \subset \mathcal{L}(T)$ for $L$-processes $P_i$ and an $L$-automaton $T$. We are concerned with how to perform the test (8.2.1) when the number of system components $k$ becomes large. Although there are a variety of algorithms to test (8.2.1) such as the explicit state enumeration check Corollary 8.1.7, based upon Tarjan's algorithm, and the implicit state enumeration (bdd-based) algorithms described in Chapter 10 (which out-perform one another on various verification problems), all require an exhaustive search of the reachable state space of $P = P_1 \otimes \cdots \otimes P_k$ in one form or another.

If we wish to consider the asymptotic complexity of the problem (8.2.1) for large $k$, we must assume an unbounded nesting of Boolean subalgebras: the respective $L$ for each respective $k$. Since each $P_i$ is expressed in terms of a finite Boolean algebra and a finite state space, testing (8.2.1) depends upon only a finite number of entities. We may assume that each $P_i$ is of some small size which is independent of $k$, so that the memory required to store enough information to generate $P$ is $O(k)$.

Testing emptiness of language intersection

8.2.2 $\qquad \cap_{i=1}^{k} \mathcal{L}(P_i) = \phi$ for $*$-automata $P_i$, is PSPACE-complete [Koz77], [GJ79], and thus the test (8.2.1) is at least (in fact, exactly) this hard. Typical problems are not immune to this. Algorithms for (8.2.1) commonly exhibit intractable computational complexity. This has been a major impedi- 156                                             Chapter 8. Reduction of Verification ment to computer-aided verification. Many heuristics which are successful in special cases have been developed to combat it, including especially, compositional (divide and conquer) techniques such as [Kur87b], [Kur90], [GL91], [Lon93]. Some of these techniques apply generally, (albeit, with varying degrees of success), leading to checks of (8.2.1) for which, although no meaningful theoretical bounds are known, in many cases the empirical complexity seems to grow linearly with $k$. In given problems, such compositional techniques thus often make the difference between computational tractability and intractability.

In fact, it is commonly observed that, while in theory intractability obtains from a problem's time complexity, in practice it is space which runs out first.

For $\omega$-automata, testing (8.2.2) amounts to checking the directed graph induced by the transition relation of $P$ for the existence of an infinite walk which satisfies the automaton acceptance condition. Since the state space is finite, an infinite walk corresponds to a cycle, and hence analysis of emptiness boils down to a decidable analysis of cycles in that directed graph.

One way to test (8.2.2) therefore is to solve a family of directed $s$-$t$ connectivity problems [Wig92] related to the acceptance structure of $P$. If $|P|$ is the size of the state-space of $P$, then Savitch's theorem [Sav70] provides a space complexity of only $O((\log |P|)^2)$, which looks attractive indeed! Unfortunately, the recursive doubling algorithm with this space complexity given by Savitch's theorem is of little practical use, requiring time $2^{\Omega((\log |P|)^2)}$, which is exponential in its space bound.

More commonly, a decision procedure based upon Tarjan's algorithm is used to find the strongly connected components of the directed transition graph of $P$ (cf. Section 8.1). The time complexity for Tarjan's algorithm is $O(|E(P)|)$. In this case, the state space of $P$ is explored through a depth-first search, and states are stored explicitly in the order reached. Since the size of $P_i$ is small relative to $k$, this algorithm requires space $O(|P| \log |P|)$. On modern high-speed computers, this algorithm can exceed available space in as little as an hour or two of computation time, without terminating. This is not surprising, inasmuch as $|P| = 2^{O(k)}$ and $k$ may be in the range 20 to 200 for typical industrial problems we encounter in this context. Alternatively, instead of searching and storing the states of $P$ explicitly, a Boolean predicate can be used to represent the transition relation (in terms of *current state/next state*). This relation can be iterated to a fixed point, implicitly conducting a breadth-first search of the state space of $P$ as described

8.2. Complexity Issues in Chapter 10. The advantage of this is that while the depth-first search approach is strictly limited by the number of reached states which can be searched, the implicit breadth-first search has no such limitation: all iterates are represented by Boolean predicates which can define an arbitrarily large set of states. This approach has extended dramatically the size of models which can be verified. However, the worst-case complexity of this implicit breadth-first search is no better than that of explicit depth-first search, and moreover can suffer from a blowup in the size of the predicates required to define the intermediate iterates [McM93a]. The search for heuristics to impede this blowup is a very active area of research, having produced a number of techniques which appear quite promising in special cases, such as [TSL+90], [JPHS91], [HD93], [Rud93], [McM94].

With any of these decision procedures, if (8.2.1) is false and the algorithm completes before running out of memory, a counter-example to (8.2.1) is returned. There always is a chance that a counter-example will be found after an arbitrarily small amount of computation. However, to verify a positive answer requires searching the entire state space of $P^*$.

In view of the current space bottleneck, it would be of considerable interest to find a practical algorithm with somewhat better space complexity (even at some increased expense in time). In the other direction is [BBRS92] which gives for directed $s$-$t$ connectivity, a very slightly sublinear space bound for a high-degree polynomial time bound, but this still is not practical. Moreover, there is a long-standing conjecture that no deterministic algorithm for directed $s$-$t$ connectivity can run in simultaneous polylogarithmic space and polynomial time [BBRS92]. Although these results do not take into account the given decomposition of $P$ in terms of its components $P_i$, there is no way known to exploit this decomposition in general. However, finding a way to exploit the decomposition for (say) $s$-$t$ connectivity probably has not been seriously studied, and thus should not be dismissed out of hand.

Be that as it may, this leads us to search for heuristics which may work well on a reasonable subclass of problems. In fact, as long as we intend to limit the class of tractable problems, we may as well strive for dramatic improvements which circumvent the PSPACE-completeness altogether. An example of such a subclass is the $P$-adic processes described in the next section.

Heuristics such as state-caching (utilizing secondary memory), or deallocating memory used to store reached states which are no longer in the search path, permit a continuation of a state-space search past 158                                       Chapter 8. Reduction of Verification the point where main memory becomes filled [FMJJ92]. However, these generally seem to result in small improvements in space at a considerable cost in time. Caching states in secondary memory at best is a stop-gap measure, and very time-inefficient. Deallocating states out of the search path is somewhat more efficient, but only at the margin of the memory requirement, as the deallocation results in revisiting the same states many times, corresponding to various search orders. Since search orders then may grow like the number of permutations of the states searched, in the worst case, deallocating states out of the search path causes time to increase exponentially in the size of the entire reachable state space.

Another frequently suggested heuristic is to build $P$ incrementally from its components, computing and then reducing each of the successive terms $$P_1 \otimes P_2 \otimes \cdots \otimes P_i$$

for $i = 1, \ldots, k$, with the hope that internal cancellations will keep these successive terms small [GS91]. However, a commonly observed problem with this approach is that computing the middle terms (for $i \approx k/2$) very often involves an excessively large amount of computation – larger even than required to compute the final term $P_1 \otimes P_2 \otimes \cdots \otimes P_k$ directly (without benefit of successive reductions). The reason for this is that the middle terms model large and highly unconstrained systems which thus generate many states; many of these states, however, are unreachable in the complete, more constrained model.

Finally, we come to the reduction heuristic, for which we do observe a fair degree of success on common types of problems.

Reduction consists of two steps: *task decomposition* and *task localization*. In the decomposition step, a global system "task" or property $T$ is decomposed into local properties $T_i$ such that

8.2.3    $\cap \mathcal{L}(T_i) \subset \mathcal{L}(T)$ , i.e., the local properties taken together imply the global property. Thus, the sought-after conclusion $\mathcal{L}(P) \subset \mathcal{L}(T)$ will follow from $$\mathcal{L}(P) \subset \mathcal{L}(T_i), \quad \forall i .$$

The localization step replaces each test

8.2.4    $\mathcal{L}(P) \subset \mathcal{L}(T_i)$

8.2. Complexity Issues with a computationally simpler test

8.2.5 $\quad \mathcal{L}(P_i') \subset \mathcal{L}(T_i')$ which implies the former. The automaton $P_i'$ is a reduction of $P$ *relative to* $T_i$. This reduction serves to abstract those portions of $P$ "irrelevant" to the "local" property $T_i$; the automaton $T_i'$ is an abstraction of $T_i$ consistent with the abstraction of $P$ relative to $T_i$.

The localization reduction of (8.2.4) to (8.2.5) (Section 8.4) and the checking of (8.2.3) and (8.2.5) (Section 8.11) all may be done algorithmically. However, as optimal localization reduction is NP-complete [Kur87b], we relax optimality in favor of feasibility, and the algorithm given in Section 8.4 is efficient, but sub-optimal. Often, using knowledge of the system modelled by $P$, one can guess a better localization reduction and verify its validity through a homomorphic check as described in Section 8.5. Likewise, one uses knowledge of $P$ and $T$ to guess a decomposition (8.2.3); a bad guess may fail to satisfy (8.2.3), or may not lead to tractable reduction checks (8.2.5), but otherwise cannot interfere with the validity of the verification. Once (8.2.3) is verified, and (8.2.5) is verified for all $i$, (8.2.4) follows, and thus so does its consequence $\mathcal{L}(P) \subset \mathcal{L}(T)$.

The goal driving the search for a task decomposition (8.2.3) is to derive localizations and reduction checks (8.2.5) which are as large in their space requirements as the computational memory available (but no larger!), to the end of limiting the number of checks (8.2.5) to as few as possible. The more severe the limitation on available space, the finer the required granularity of task decomposition, and hence the longer the time required for the verification process. If the number of $T_i$'s in the task decomposition (8.2.3) is large, checking (8.2.3) itself may become intractable. (In the extreme, we may set $T_i = P_i^\#$ and the check (8.2.3) reduces to (8.2.1), the starting point.) Therefore, we impose a structure on the decomposition (8.2.3) which ensures that we may perform that check incrementally, so that each incremental check is assured to be tractable. Since the size of the localization reduction checks (8.2.5) by design fit into the available space, space complexity is removed as an issue, and what remains is finding a task decomposition which can be verified in this (to be explained) incremental fashion, in as few steps as possible. For simplicity, we confine ourselves to the case in which $\{P_1^\#, \cdots\} \subset \{T_1, \cdots\}$ and for all $i$, $j$, $P_i' = P_i$ and $T_j' = T_j$. (There is no loss of generality in terms of computing the asymptotic time complexity, with this simplification.) The following definition gives 160                                        Chapter 8. Reduction of Verification a hierarchy which permits us to perform the check (8.2.3) incrementally. As we will discuss, it is an open problem how to find such a hierarchy in every case that it exists.

8.2.6 Definition The task decomposition (8.2.3) forms a $f(k)$ *reduction hierarchy* for (8.2.1), if there are $f(k)$ $T_i$'s, all of some given size, and the $T_i$'s comprise the vertices of a directed acyclic graph rooted at $T = T_0$, with leaves $P_1, \cdots$ and regular out-degree 2 except at the leaves, such that the presence of the directed edges $T_i \rightarrow T_{j_1}$, $T_i \rightarrow T_{j_2}$ implies $$\mathcal{L}(T_{j_1}) \cap \mathcal{L}(T_{j_2}) \subset \mathcal{L}(T_i).$$

Task decomposition and localization reduction perhaps is the most promising heuristic available today for circumventing the computational intractability of (8.2.1) for large $k$. Thus, finding an efficient way to derive a small as possible reduction hierarchy is of paramount importance — arguably the foremost important open issue in computer-aided verification. Currently, reduction hierarchies are discovered in an ad hoc fashion, using knowledge of the system to guide its construction.

One envisions an algorithm which attempts to compute a reduction hierarchy for (8.2.1) recursively, bottom-up, one level at a time, starting from the leaves $P_i$. If this algorithm could compute each node of the hierarchy in time linear in the size of the automaton at that node, then since this size is bounded for the given problem, the resulting time complexity for (8.2.1) would be $O(f(k))$. Let us call such an algorithm *efficient*.

We seek an efficient decision procedure for finding a polynomial reduction hierarchy for (8.2.1) if there is one (returning a counter-example to (8.2.1) if the language containment fails, and terminating if there is no reduction hierarchy), for a reasonable class of problems. Although the PSPACE-completeness of (8.2.1) precludes the possibility of finding a polynomial reduction hierarchy in every case, it nonetheless is quite common to find a linear reduction hierarchy, in the class of problems that arise naturally in industrial contexts. It is not known whether some problem (8.2.1) for which the language containment obtains, admits of no reduction hierarchy.

Ideally, one would like an efficient decision procedure to find an $f(k)$ reduction hierarchy with $f(k)$ "close" to optimal, if one exists, or to terminate in time $2^{O(k)}$ with a counter-example to (8.2.1) or the determination that no reduction hierarchy exists. Even an efficient semi-decision

8.3. P-adic Processes procedure, which would find a tractable reduction hierarchy whenever one exists (but may not terminate if none exists), would be welcome; as mentioned above, we have other procedures that find counter-examples, and these could be run in parallel with a semi-decision procedure for reduction hierarchies.

One would like a characterization of those (8.2.1) which admit of a polynomial reduction hierarchy. For those problems (8.2.1) which *do* admit of an reduction hierarchy, it is not known whether there is an efficient algorithm to find one. Nor is it known whether there is a bound $F(k)$ such that any problem (8.2.1) which admits of a reduction hierarchy, admits of an $F(k)$ reduction hierarchy.

8.3 P-adic Processes

We now examine a special class of $L$-processes for which the language containment test (8.2.1) can be done in constant space. This class generalizes Streett automata (Section 6.2). For Streett automata (*i.e.*, with strong fairness as the acceptance condition), the test also can be done in time linear in the number of strong fairness constraints.

Suppose it is required to verify that an $L$-process $P$ performs a task $T$. It may be that this test fails, unless $P$ is subject to a number of strong-fairness constraints $(L_i, U_i)$ on $V(P)$. (This arises naturally if the system model represented here by $P$ is presented as a Streett automaton, as defined in Section 6.2.) The strong-fairness constraint $(L_i, U_i)$ may be represented by a 4-state $L$-process, provided $P$ "outputs its state": *i.e.*, provided the output subalgebra $L_P$ of $P$ contains enough information to determine the state of $P$ from its selections. This always can be accomplished by augmenting the output subalgebra $L_P$ so as to contain the state of $P$ as a component, as in Example 8.3.1.

8.3.1 Example Suppose $P$ is an $L$-process whose output subalgebra $L_P$ is an exterior product of the form $L_P = L' \cdot \mathbb{B}[V(P)]$ and $s_P(v) \leq v$ for all $v \in V(P)$. As in (2.1.21), for $v \in V(P)$, $\{v\} \in \mathbb{B}[V(P)]$ will be denoted by $v$. Then the state of $P$ is a component of its selection: every selection of $P$ is of the form $x * v$ where $x \in S(L')$ and $v \in V(P)$. In this case, a strong-fairness constraint $(L_i, U_i)$ on $V(P)$ may be represented by the 4-state $L$-process $Q_i = Q_i^L \oplus Q_i^U$ where $Q_i^L$ and $Q_i^U$ each are strongly deterministic, and defined as follows: for $X = L_i$ or $U_i$ the 162  Chapter 8. Reduction of Verification respective transition matrix of $Q_i^L$ or $Q_i^U$ is $$\begin{array}{c c}  & \begin{array}{cc} 0 & 1 \end{array} \\ \begin{array}{c} 0 \\ 1 \end{array} & \begin{pmatrix} X' & X \\ X' & X \end{pmatrix} \end{array}$$

where $X' = V(P) \setminus X$, $I(Q_i^L) = I(Q_i^U) = \{0\}$, $R(Q_i^L) = \{(0,1),(1,1)\}$, $Z(Q_i^L) = \emptyset$, $R(Q_i^U) = \emptyset$, $Z(Q_i^U) = \{\{0\}\}$ and each has the trivial output subalgebra $\mathbb{B}$. Then $Q_i$ is a $\mathbb{B}[V(P)]$-process and as such, for each run $v$ of $P$, $$v \in \mathcal{L}(Q_i^L) \Leftrightarrow \mu(v) \cap L_i = \emptyset,$$
$$v \in \mathcal{L}(Q_i^U) \Leftrightarrow \mu(v) \cap U_i \neq \emptyset$$

and $$\mathcal{L}(Q_i) = \mathcal{L}(Q_i^L) \cup \mathcal{L}(Q_i^U).$$

Thus, $$v \in \mathbf{SF}(L_i, U_i) \Leftrightarrow v \in \mathcal{L}(Q_i).$$

Consequently, for several strong-fairness constraints $(L_i, U_i)$, the subset of $\mathcal{L}(P)$ whose runs all satisfy $\cap \mathbf{SF}(L_i, U_i)$ is precisely $\mathcal{L}(P \odot Q)$ where $Q = \odot Q_i$. Hence, for a strongly deterministic $L$-automaton $T$, to show that $P$, subject to the strong-fairness constraints $(L_i, U_i)$, performs the task $T$, corresponds to showing 8.3.2 $\qquad \mathcal{L}(P \odot Q) \subset \mathcal{L}(T).$ The size of $P \odot Q$ grows geometrically with the number of strong-fairness constraints. In fact, it can be shown that in the worst case, if $\mathcal{L}(P') = \mathcal{L}(P \odot Q)$, then $2^k \leq |V(P')|$ [HSB94]. Thus, it may seem that the space required to test (8.3.2) also should grow thus. However, in what follows, it is shown that this is not the case. In fact, for a class of $L$-processes $Q_i$ which contains as a proper subset those $L$-processes derived from strong-fairness constraints (as above), the space required to test 8.3.3 $\qquad \mathcal{L}(P \odot Q_1 \odot \cdots \odot Q_k) \subset \mathcal{L}(T)$ is of constant size $|E(P)|$ for any $k$, just as it would be for a Streett automaton in place of $P$ with strong-fairness constraints on $P$ in place of the $Q_i$'s. If the $Q_i$'s in fact define strong fairness constraints, then the time complexity of this test is linear in $k$, as it would be for Streett

8.3. P-adic Processes automata. Moreover, we will see that it is not even necessary to test the $Q_i$'s for membership in this special class: the algorithm to test (8.3.3) will have the promised complexity when the $Q_i$'s are of this class, but will test (8.3.3) for any $L$-processes $Q_i$ whatsoever. (This is an example of the class of algorithms discussed in Sections 6.2 and 8.2 whose computational complexity adapt to the complexity of the input.)

The algorithm given below is based upon computations involving the successive terms $P \otimes Q_1 \otimes \cdots \otimes Q_i$ (cf. Section 8.2). However, each successive step involves computations in a model no larger than $P \otimes Q$, where $Q$ is the largest $Q_i$. The next definition generalizes the context of Example 8.3.1.

8.3.4 Definition Let $P, Q$ be $L$-processes. Say $Q$ is *P-faithful* provided for all $v \in V(P)$, and $w, w' \in V(Q)$, $$s_P(v) * Q(w, w') \neq 0 \Rightarrow s_P(v) \leq Q(w, w') .$$

Thus, $Q$ is $P$-faithful if whenever some selection of $P$ at $v$ enables a given transition of $Q$, then *every* selection at $v$ enables that transition. In other words, $Q$ cannot distinguish among the different selections of $P$ at a given state, and the behavior of $Q$ is a function of the state transitions of $P$.

8.3.5 Lemma *If $Q$ is $P$-faithful and $x, y \in \mathcal{L}(P)$ share the same run of $P$, then $x \in \mathcal{L}(Q) \Leftrightarrow y \in \mathcal{L}(Q)$.*

8.3.6 Definition Let $P$ be an $L$-process and let $L' \subset L$ be a subalgebra. Say $L'$ is *P-faithful* provided that for any $x, y \in S(L')$, if $v \in V(P)$, $x * s_P(v) \neq 0$ and $y * s_P(v) \neq 0$, then $x = y$.

The prototype $P$-faithful subalgebra is the subalgebra $\mathbb{B}[V(P)]$ of Example 8.3.1. A $P$-faithful subalgebra $L'$ is "faithful" to the state of $P$, inasmuch as distinct atoms $x, y \in S(L')$ correspond to distinct states of $P$. The atom $x \in S(L')$ "corresponds" to the state $v \in V(P)$ if $x * s_P(v) \neq 0$, and for each state $v$, this is true of exactly one element of $S(L')$, as the next lemma states.

8.3.7 Lemma *Suppose $L'$ is a factor of $L_P$. Then $L'$ is $P$-faithful if and only if*
$$\Pi_{L'} s_P : V(P) \to S(L')$$

$((\Pi_{L'} s_P)(v) = \Pi_{L'} s_P(v)).$

164  Chapter 8. Reduction of Verification

8.3.8 Proposition *Let $P$ be an $L$-process, $L' \subset L$ a $P$-faithful subalgebra and let $Q$ be an $L'$-process. Then $Q$ is $P$-faithful.*

Proof. Let $v \in V(P)$ and $w, w' \in V(Q)$. Suppose $\hat{x} \equiv s_P(v) * Q(w, w') \neq 0$, and let $\hat{y} = s_P(v) * \sim Q(w, w')$. By assumption, $\hat{x} > 0$, so for some $x \in S(L')$, $x*\hat{x} > 0$. If $\hat{y} > 0$, then likewise for some $y \in S(L')$, $y * \hat{y} > 0$. Thus, $x * s_P(v) \neq 0$ and $y * s_P(v) \neq 0$, so $x = y$. However, $x \leq Q(w, w')$ while $y \leq \sim Q(w, w')$, so $x = y = 0$, a contradiction. It follows that $\hat{y} = 0$, so $s_P(v) \leq Q(w, w')$, that is, $Q$ is $P$-faithful.

$P$-faithfulness is one half of a generalization of strong-fairness. If $Q_i$ is the $L$-process constructed in Example 8.3.1 to implement the strong-fairness constraint $(L_i, U_i)$, then by Proposition 8.3.8, $Q_i$ is $P$-faithful. The other half of the generalization relates to the acceptance condition, as follows.

8.3.9 Definition An $L$-$\omega$-language $\mathcal{L}$ is said to be *infinitary* if whenever $a, a' \in S(L)^*$ and $b \in S(L)^\omega$, then $$ab \in \mathcal{L} \Rightarrow a'b \in \mathcal{L} \ .$$

An $L$-process $P$ is *infinitary* if $\mathcal{L}(P)$ is.

Thus, a language $\mathcal{L}$ is infinitary if membership in $\mathcal{L}$ depends only upon eventualities. It is easily seen that each $Q_i$ of Example 8.3.1 is infinitary. Thus, infinitary and $P$-faithful together generalize strong-fairness, allowing more general acceptance conditions and sequentiality (defined by the transition structure).

8.3.10 Definition Let $P$ be an $L$-process. An $L$-process $Q$ is said to be *$P$-adic* if $Q$ is infinitary and $P$-faithful. The *$P$-adic languages* are $$\mathcal{L}_P = \{\mathcal{L}(P \otimes Q) \mid Q \text{ is } P\text{-adic}\} \ .$$

8.3.11 Lemma *If $Q_1$, $Q_2$ are $P$-faithful (respectively, infinitary), then the same is true for $Q_1 \otimes Q_2$ and $Q_1 \oplus Q_2$. If $\mathcal{L}$ is infinitary, so is the complementary language $\mathcal{L}'$.*

Proof. Suppose $Q_1$, $Q_2$ is $P$-faithful. Obviously, $Q_1 \oplus Q_2$ is $P$-faithful. Let $(w_1, w_2), (w_1', w_2') \in V(Q_1 \otimes Q_2)$ and suppose $$s_P(v) * (Q_1 \otimes Q_2)((w_1, w_2), (w_1', w_2')) \neq 0 \ .$$

8.3. P-adic Processes

Then $s_P(v) * Q_1(w_1, w_1') * Q_2(w_2, w_2') \neq 0$ so $$s_P(v) \leq Q_1(w_1, w_1') * Q_2(w_2, w_2') = (Q_1 \otimes Q_2)((w_1, w_2), (w_1', w_2')) \;.$$

Suppose $Q_1$, $Q_2$ are infinitary and $ab \in \mathcal{L}(Q_1 \oplus Q_2)$. Then $ab \in \mathcal{L}(Q_i)$ for $i = 1$ or 2, so for any $a'$, $a'b \in \mathcal{L}(Q_i) \subset \mathcal{L}(Q_1 \oplus Q_2)$. If $ab \in \mathcal{L}(Q_1 \otimes Q_2)$ then $ab \in \mathcal{L}(Q_i)$ for $i = 1$ and 2, so likewise $a'b$ for any $a'$.

If $\mathcal{L}$ is infinitary and $ab \in \mathcal{L}'$, let $a'$ be chosen. If $a'b \in \mathcal{L}$ then also $ab \in \mathcal{L}$, which is impossible. Thus, $a'b \in \mathcal{L}'$.

8.3.12 Corollary $\mathcal{L}_P$ is closed under union and intersection.

8.3.13 Note Ken McMillan has shown that $\mathcal{L}_P$ is closed under relative complement, as well: that $\mathcal{L} \in \mathcal{L}_P \Rightarrow \mathcal{L}(P) \setminus \mathcal{L} \in \mathcal{L}_P$. For example, for $Q_i$ as in Example 8.3.1, each $Q_i$ is $P$-adic (as already observed). Setting $\widehat{Q}_i = \widehat{Q}_i^L \otimes \widehat{Q}_i^U$, where $\widehat{Q}_i^L$ and $\widehat{Q}_i^U$ are formed from $Q_i^L$ and $Q_i^U$ by interchanging the cycle set and recur edges $(Z(Q_i^L) = \{\{0\}\}$, $R(Q_i^U) = \{(0,1),(1,1)\}$, $R(Q_i^L) = Z(Q_i^U) = \phi)$, gives $\mathcal{L}(\widehat{Q}_i) = \mathcal{L}(Q_i)'$. By Lemma (8.3.11), $\widehat{Q}_i$ is $P$-adic as well. Incidentally, even if $P$ is as in Example 8.3.1, it is not the case that $\mathcal{L}_P = \{\mathcal{L}_f \mid f \in \mathcal{F}\}$ where $\mathcal{F}$ is the set of all Boolean combinations of satisfaction sets of strong-fairness constraints on $V(P)$, and for $f \in \mathcal{F}$, $\mathcal{L}_f = \{\mathbf{x} \in S(L)^\omega \mid \mathbf{x} \text{ has a run in } f\}$, although it is true that $\{\mathcal{L}_f \mid f \in \mathcal{F}\}$ is closed under complementation. The reason is that strong fairness alone cannot capture sequentiality. For example, let $P$ be the $\mathbb{B}[x]$-process with $V(P) = I(P) = \{0,1\}$, $R(P) = Z(P) = \phi$ and $P(i,j) = x^{-j}$, where $x^{-0} = x$, $x^{-1} = \sim x$, for $i, j \in \{0, 1\}$. Then, for $\bar{x} \equiv \sim x$, $\mathcal{L} = (x + \bar{x})^+ (\bar{x}x)^\omega \in \mathcal{L}_P$ but $\mathcal{L} \neq \mathcal{L}_f$ for any $f \in \mathcal{F}$. (This example is due to Ken McMillan.)

This section concludes with an algorithm for testing (8.3.3), which requires only constant space when the $Q_i$'s are $P$-adic. Replacing $P$ in (8.3.3) with $P \otimes T^*$, this test is equivalent by (8.1.3) to the emptiness test

8.3.14 $\quad \mathcal{L}(P \otimes Q_1 \otimes \cdots \otimes Q_k) = \phi$ .

As a point of reference, it is instructive to see first what happens in the special case of Streett automata or when the $Q_i$'s define strong fairness constraints on $P$. We start with Streett automata. Recall that 166                           Chapter 8. Reduction of Verification a Streett automaton $P$ is a Muller $L$-$\omega$-automaton whose repetition sets are defined in terms of, say, $k$ strong fairness constraints $(L_i, U_i)$, $i = 1, \ldots, k$. The following is a decision procedure for testing $\mathcal{L}(P) = \phi$.

---
Initially, $S = \{V(P)\}$.
Iterate to an invariant value $\hat{S}$ of $S$:
    for each    $C \in S$, set:
$$I_C = \{i \mid C \subset U_i'\},$$
$$V_C = C \cap \bigcap_{i \in I_C} L_i',$$
$$S_C = \text{strongly connected components of } V_C.$$
$S$ becomes $\bigcup_{C \in S} S_C$

---

8.3.15 Theorem $\mathcal{L}(P) = \phi$ if and only if $\hat{S} = \phi$.

Let $e = |E(P)|$, $n = |V(P)|$. Each iteration of this algorithm entails exploring $e$ state transitions of $P$ to find the strongly connected components [Tar72], as well as $nk$ Boolean tests to define each of $I_C$ and $V_C$. The number of iterations required to compute $\hat{S}$ depends on whether $k < n$. As the partial order under inclusion of the elements $C$ of the respective $S$'s can support a chain of distinct sets of length at most $n$, and each iteration increases by 1 the length of the maximal such chain, the required number of iterations is no more than $n$. Moreover, as that partial order induces a partial order on the $I_C$'s, the length of the maximal such a chain can be at most $k$. Therefore, the algorithm terminates in (at most) $m = \min\{k, n\}$ iterations. Thus, the overall complexity of this algorithm is $O(m(e + nk))$, comparable to [EL85] for $k < n$. For $k > n$, this reduces to $O(kn^2)$, i.e., linear in $k$ for fixed $n$. However, from an implementational perspective, the $nk$ Boolean tests of each iteration can be achieved efficiently with bit vector operations on the incidence matrices which define the sets $L_i$, $U_i$ and $V_C$. Thus, for $k < n$ the $k^2 n$ term is of little practical significance and the $ke$ term dominates.

Now we present a decision procedure for (8.3.14) which applies generally, requires only constant space $\max_i |E(P \otimes Q_i)|$ when the $Q_i$'s are $P$-adic, and moreover requires time linear in $k$ when each $Q_i$ defines a strong fairness constraint on $P$, as in Example 8.3.1. Let $P, Q_1, \ldots, Q_k$ be arbitrary $L$-processes. Set $G_0 = \{V(P)\}$ and for $r \geq 0$, $1 \leq i \leq k$, define inductively $$\hat{G}_{rk+i} = \left\{ \Pi_{V(P)} C \mid C \in \mathcal{B}((P \otimes Q_i)|_{D \times V(Q_i)}), \ D \in G_{i-1} \right\}$$

8.3. P-adic Processes (where $(P \otimes Q_i)|_{D \times V(Q_i)}$ is the restriction (6.2.21) of $P \otimes Q_i$ to $D \times V(Q_i) \subset V(P \otimes Q_i)$, and $\Pi_{V(P)} C$ is the projection of $C$ to $V(P)$). For each $j$, let $G_j$ be the set of maximal elements (ordered by inclusion) of $\widehat{G}_j$.

The decision procedure for (8.3.14) in case the $Q_i$'s are $P$-adic, consists of iterating $G_j$ to a fixed value, which plays the role of $\widehat{S}$ for Streett automata: the fixed value is empty if and only if (8.3.14) holds. For each $r$, $G_{rk}$ is the analog of each iterated value of $S$ (the intermediate $G_{rk+i}$ terms for $1 \leq i < k$ correspond to the calculation of the intersections $V_C$). If each $Q_i$ defines a strong fairness constraint as in Example 8.3.1, then each state of $V(P)$ lies in at most 2 elements of a $G_j$ (cf. (8.3.1)), since projected bad cycles of $P \otimes Q_i$ which are not disjoint are linearly ordered by inclusion. In the general case, an element of $V(P)$ may lie in $2^{|P|}$ elements of $G_{rk+i}$ (cf. Figure 8.1). This would seem to require storing up to $2^{|P|}$ subsets of $V(P)$ as $r$ gets large. However, by lexicographically ordering the subsets of $V(P)$, we may limit each $\widehat{G}_i$ to a single set and thereby reduce the storage requirement to $|V(P)|$, at the expense of at most $2^{|P|}k$ iterations (for $P$-adic $Q_i$'s).

Figure 8.1: $P$, $Q$ are $\mathbb{B}[x]$-processes, $Q$ is $P$-adic and for $\tilde{x} = \sim x$, $R(P) = Z(P) = Z(Q) = \phi$, $R(Q) = \{(0,1)\}$, we have $\mathcal{L}(P \otimes Q) = \mathcal{L}(Q) = (x+\tilde{x})^+(x^\omega + \tilde{x}^\omega)$. In fact, $Q$ is a $Q^L$ of Example 8.3.1 with a single recur edge removed. This is enough to allow projected elements of $\mathcal{B}(P \otimes Q)$ to overlap in $V(P)$, something impossible if $Q$ defines a strong fairness constraint. Here, $G_1 = \Pi_{V(P)} \mathcal{B}(P \otimes Q)$ contains $\{0, -1\}$, $\{0, 1\}$.

168  Chapter 8. Reduction of Verification

8.3.16 Theorem *For $P$, $Q_i$ and $G_j$ as above,* a) $G_j = \phi$ (some $j$) $\Rightarrow \mathcal{L}(P \otimes Q_1 \otimes \cdots \otimes Q_k) = \phi$;

b) $\mathcal{L}(P \otimes Q_1 \otimes \cdots \otimes Q_k) = \phi \Rightarrow$ *for some $j$ $G_j = \phi$, provided each $Q_i$ is $P$-adic.*

Figure 8.2: Situation in the proof of (8.3.16)

Proof.
a) Suppose $x \in \mathcal{L}(P \otimes Q_1 \otimes \cdots \otimes Q_k)$ has an accepting run $v$. Then $v$ has the form $v = (v_0, v_1, \ldots, v_k)$ for $v_0$ an accepting run of $x$ in $P$ and $v_i$ an accepting run of $x$ in $Q_i$, for $1 \leq i \leq k$. Thus, for some $K \in \mathcal{B}(P \otimes Q_1 \otimes \cdots \otimes Q_k)$, $\mu(v) \subset K$ and so, in particular, for some $C_1 \in \mathcal{B}(P \otimes Q_1)$, $\phi \neq \mu(v_0, v_1) \subset \Pi_{V(P \otimes Q_1)} K \subset C_1$ and thus $$\mu(v_0) \subset \Pi_{V(P)} K \subset \Pi_{V(P)} C_1 \in G_1 \ .$$

Moreover, if $\mu(v_0) \subset D_i \subset D_{i-1} \subset \cdots \subset D_1$ with $D_j \in G_j$ for $1 \leq j \leq i$ and $\Pi_{V(P)} K \subset D_i$, then, since $\Pi_{V(P \otimes Q_{i+1})} K$ is strongly connected and contained in $V(P \otimes Q_{i+1})^0$, for some $C_{i+1} \in \mathcal{B}((P \otimes Q_{i+1})|_{D_i \times V(Q_{i+1})})$, $$\mu(v_0, v_{i+1}) \subset \Pi_{V(P \otimes Q_{i+1})} K \subset C_{i+1}$$

8.3. P-adic Processes and thus $D_{i+1} \equiv \Pi_{V(P)}C_{i+1} \in G_{i+1}$ and $\mu(v_0) \subset D_{i+1} \subset D_i$. Hence, by induction on $j$, $G_j \neq \phi$ for all $j$.

(b) First, note that for some $m \leq 2^{|P|}$, $G_{mk+i} = G_{mk}$ for all $i \geq 0$. Suppose $D_{mk} \in G_{mk}$. Then there is some $\mathbf{x} \in \mathcal{L}(P \otimes Q_k)$ with a run $(\mathbf{v}_0, \mathbf{v}_k)$ such that $\mu(\mathbf{v}_0, \mathbf{v}_k) \subset C \in \mathcal{B}((P \otimes Q_k)|_{D_{mk-1} \times V(Q_{mk})})$ for some $C$ with $\Pi_{V(P)}C = D_{mk}$ and some $D_{mk-1} \in G_{mk-1}$. Thus, $\mu(\mathbf{v}_0) \subset D_{mk} \subset D_{mk-1}$. Now, suppose $\mu(\mathbf{v}_0) \subset D_k \subset \cdots \subset D_i$ with $D_j \in G_j$, for $1 \leq i \leq j \leq mk$, and $(\mathbf{v}_0, \mathbf{v}_{i+1}, \ldots, \mathbf{v}_k)$ is an accepting run of $\mathbf{x}$ in $P \otimes Q_{i+1} \otimes \cdots \otimes Q_k$, for some $i$, $1 < i < k$. Since $D_i \in G_i$ and $G_{mk}$ is invariant under iterations in $r$ of $G_{rk}$, there exists some accepting run $(\mathbf{w}_0, \mathbf{w}_i)$ in $P \otimes Q_i$ of (say) $\mathbf{y} \in \mathcal{L}(P \otimes Q_i)$, with $\mu(\mathbf{w}_0) \subset D_i$. (If there were no such accepting run, then another iteration in $r$ would result in $G_{(m+1)k} \neq G_{mk}$.) Since $D_i = \Pi_{V(P)}C$ for some $C \in \mathcal{B}((P \otimes Q_i)|_{D_{i-1} \times V(Q_i)})$ where $D_{i-1} \in G_{i-1}$, it follows that $D_i \subset D_{i-1}$. Since $D_{mk} \subset D_i$ and $D_i$ is strongly connected, we may suppose that in fact, for some $n$, $w_{0j} = v_{0j}$ for $j \geq n$ (redefining $w_{0j}$ as necessary). Thus, for $j \geq n$, $x_j \leq P(v_{0j}, v_{0j+1}) \leq s_P(v_{0j})$, while $y_j \leq P(v_{0j}, v_{0j+1}) * Q_i(w_{ij}, w_{ij+1})$. In particular, $y_j \leq s_P(v_{0j})$ and $y_j \leq Q_i(w_{ij}, w_{ij+1})$, so $s_P(v_{0j}) * Q_i(w_{ij}, w_{ij+1}) \neq 0$, for all $j \geq n$. Since $Q_i$ is $P$-faithful, $s_P(v_{0j}) \leq Q_i(w_{ij}, w_{ij+1})$, whereas $x_j \leq s_P(v_{0j})$, and thus $x_j \leq Q_i(w_{ij}, w_{ij+1})$ for all $j \geq n$. Since $Q_i$ is infinitary, $\mathbf{x} \in \mathcal{L}(Q_i)$. Let $\mathbf{v}_i$ be an accepting run of $\mathbf{x}$ in $Q_i$. Then $(\mathbf{v}_0, \mathbf{v}_i)$ is an accepting run of $\mathbf{x}$ in $P \otimes Q_i$ and so $(\mathbf{v}_0, \mathbf{v}_i, \mathbf{v}_{i+1}, \ldots, \mathbf{v}_k)$ is an accepting run of $\mathbf{x}$ in $P \otimes Q_i \otimes \cdots \otimes Q_k$. By backward induction on $i$, it follows that $\mathbf{x} \in \mathcal{L}(P \otimes Q_1 \otimes \cdots \otimes Q_k)$.

This theorem gives a way to check (8.3.14) for arbitrary $Q_i$'s (irrespective of whether each $Q_i$ is $P$-adic), as follows:

```
i = 0
while i < t ≡ 2^|P|k :
    i → i + 1
    if G_i = φ, report (8.3.14) holds; EXIT
find  x ∈ L(P) with accepting run² v, μ(v) ⊂ D ∈ G_t
i = 0
while i < k :
    i → i + 1
    if x ∉ L(Q_i), repeat³ algorithm with P ⊗ Q_i
        in place of P, for {Q_j | j ≠ i}
report (8.3.14) fails — x ∈ L(P ⊗ Q_1 ⊗ ··· ⊗ Q_k) \ L(T)
```

8.4 Automatic Localization Reduction

Suppose it is required to verify (8.2.1) and in fact for some $j$

8.4.1 $\qquad \mathcal{L}(P_{i_1} \otimes \cdots \otimes P_{i_j}) \subset \mathcal{L}(T)$ .

Then by the language intersection property, (8.2.1) follows. If $j$ is small, then we say $T$ is a *local* property of $P = \otimes P_i$. In this case, verification of (8.2.1) is tractable, if only we can identify the $P_{i_k}$'s. Of course, one could try first each $P_i$ alone, then all pairs, then all triples and so on. However this would result in an unacceptable (exponential) time complexity.

Instead, we prefer an algorithm which quickly finds a counter-example to (8.2.1) or some subset of $P_i$'s satisfying (8.4.1) which, if not minimal, at least is heuristically small. Such an algorithm proceeds by successive approximations. The basic idea is to form the directed graph of dependencies among the processes, rooted at $T$, and to follow this graph in forming successive partial tests (8.4.1). In each iteration, a test of the form (8.4.1) is conducted. If it succeeds, then (8.2.1) holds. If it fails, then the error track $E$ is tested against $P$ (a simpler test than (8.2.1), because the error trace is high restrictive). If $E$ is consistent with $P$, then (8.2.1) fails. Otherwise, the point of inconsistency of $P$ and $E$ is used to expand the set of processes in the test (8.4.1), which then is repeated on the expanded set. If $T$ is a local property, this algorithm often will find a small set of processes for which the test (8.4.1) is definitive with respect to (8.2.1): one will succeed if and only if the other does. (Another algorithm with the same objective is proposed in [BSV93].)

Compared with testing (8.2.1), it is computationally simple (and part of most finite-state verification algorithms) to find an *error track* comprising a path $p = (p_0, \ldots, p_m, \ldots, p_n)$ in $Q = P_{i_1} \otimes \cdots \otimes P_{i_j}$ if (8.4.1) fails, such that for some $x \in \mathcal{L}(Q) \setminus \mathcal{L}(T)$, $$v = p_0 \cdots p_{m-1}(p_m \cdots p_n)^\omega$$

is a run of $x$.

---

[2] It always is possible to find $x$ of the form $x = y' \cdot y^\omega$ for $v$ of the form $v = w' \cdot w^\omega$ with $w, w' \in V(P)^*$. By Lemma (8.3.5), if the $Q_i$'s are $P$-faithful, then the choice of $x$ for a given $v$ is immaterial.

[3] If the $Q_i$'s are all $P$-adic, then this recursive call is unreachable.

8.4. Automatic Localization Reduction

Part of the localization reduction algorithm tries to covert the path $p$ to a path $\widehat{p} = (\widehat{p}_0, \ldots, \widehat{p}_m, \ldots, \widehat{p}_n, \ldots, \widehat{p}_s)$ in $P$ such that the projection to $V(Q)$ of each $\widehat{p}_i \in V(P)$ is $p_i$ for $i \leq n$, the corresponding $p_j$ for $j > n$, and moreover, for some $r \leq s$, $(\widehat{p}_s, \widehat{p}_r) \in E(P) \setminus R(P)$, $(\widehat{p}_i, \widehat{p}_{i+1}) \notin R(P)$ for $r \leq i \leq s$, $\{\widehat{p}_r, \widehat{p}_{r+1}, \ldots, \widehat{p}_s\} \cap (V(P) \setminus C) \neq \phi$ for all $C \in Z(P)$.

In this case, there is a $y \in \mathcal{L}(P) \setminus \mathcal{L}(T)$ such that $$\widehat{v} = \widehat{p}_0 \cdots \widehat{p}_{m-1} \cdots (\widehat{p}_r \cdots \widehat{p}_s)^\omega$$

is a run of $y$.

Given $p$, to find a $\widehat{p}$ is NP-complete in $(k-j)n$. However, when $j$ is small, so is $n$. The algorithm follow$(p, P)$ given here finds a $\widehat{p}$ when one exists, and in practice does not appear to be a bottleneck. If follow$(p, P)$ fails to find a $\widehat{p}$ (because none exists), it returns with a recommendation for a new $Q$. As each successive $Q$ includes a larger number of $P_i$'s, the overall procedure terminates (at least when $Q = P$).

For $I \subset \{1, \ldots, k\}$ let $P^I = \bigotimes_{i \in I} P_i$ and for $v \in V(P)$ let $v^I = \Pi_{V(P^I)}(v)$. (Thus, for $I = \{i_1, \ldots, i_j\}$, $P^I = Q$ and $v^I = (v_{i_1}, \ldots, v_{i_j})$.) For $(v, w) \in V(P)^2$ let $$\widehat{\mu}(I, (v, w)) = \left\{ J \supset I \mid \sum_{u = w^J} P^J(v^J, u) = 0 \right\}$$

and let $\mu(I, (v, w))$ be the minimal elements of $\widehat{\mu}(I, (v, w))$ (under inclusion). Thus, $\mu(I, e)$ defines a set of minimal extensions of $P^I$, each of which disables $P^I(e)$. For $p$ as above, let $\xi(p)$ be the B-processes with $I(\xi(p)) = \{p_0\}$, $E(\xi(p)) = \{(p_i, p_{i+1}) \mid 0 \leq i < n\} \cup \{(p_n, p_m)\}$, $R(\xi(p)) = Z(\xi(p)) = \phi$. For $W = \{(u, v) \in V(P) \times V(Q) \mid u^I = v\}$, let $P_p$ be the subprocess of $P \otimes \xi(p)$ restricted to $W$: $P_p = (P \otimes \xi(p))|_W$. If $\mathcal{L}(P_p) \neq \phi$, follow$(p, P)$ returns a $\widehat{p}$ as above, which is a counterexample to (8.2.1). Otherwise follow$(p, P)$ returns $J_p \supset I$, as follows. For $w \in V(P_p)$, let $\widehat{w} = \Pi_{V(P)}(w)$, and for $e = (v, w) \in E(P_p)$ let $\widehat{e} = (\widehat{v}, \widehat{w})$. Set $$H_p = \left\{ \bigcup_{e \in E(P_p)} J_e \mid J_e \in \mu(I, \widehat{e}) \right\}$$

and let $J_p$ be a minimal element (or any element, but the smaller the better, for the efficiency of the algorithm) of $H_p$.

Chapter 8. Reduction of Verification

8.4.2 Lemma $\mathcal{L}((P^{J_p})_p) = \phi$.

Thus, $p$ cannot be lifted to a counterexample $\hat{p}$ to (8.2.1). The localization reduction algorithm now iterates, setting $Q = P^{J_p}$, and for this new value of $Q$, we test $\mathcal{L}(Q) \subset \mathcal{L}(T)$. As with (8.4.1), if this test succeeds, (8.2.1) follows. Otherwise, we iterate the construction above.

---
follow($p, P$)

if $\mathcal{L}(P_p) \neq \phi$, compute error track $\hat{p}$,
  return FAILS ($\mathcal{L}(P) \subset \mathcal{L}(T)$ is false); EXIT
return minimal element $J_p \in H_p$ ---
localization reduction input:      $P_0 = T^\#, P_1, \ldots, P_k; P = P_0 \otimes \cdots \otimes P_k$
initially:  $J = \{0\}$
while       $\mathcal{L}(P^J) \neq 0$
            find $p$ generating accepting run in $\mathcal{L}(P^J)$
            follow($p, P$)
            $J = J_p$
return PASS ($\mathcal{L}(P) \subset \mathcal{L}(T)$ is true)

---

8.4.3 Theorem *The localization reduction algorithm terminates, returning PASS if and only if $\mathcal{L}(P_1 \otimes \cdots \otimes P_k) \subset \mathcal{L}(T)$.*

8.5 Homomorphic Reduction

The reduction afforded by localization is a particular case of homomorphic reduction, described next. Since it is more general, homomorphic reduction typically is substantially more powerful than automatic localization. However, unlike localization, here the homomorphism must be "guessed" (although the correctness of the guess can be checked automatically). It is a useful exercise to determine the homomorphism defined by the automatic localization algorithm (cf. Example 4.2.20).

8.5.1 Definition Suppose $P$ is an $L$-process, $T$ is an $L$-automaton, $P'$ is an $L'$-process, $T'$ is an $L'$-automaton, and $$\Phi : S(L)^\omega \to S(L')^\omega$$

is a language homomorphism satisfying $$\Phi \mathcal{L}(P) \subset \mathcal{L}(P'), \quad \Phi \mathcal{L}(T^\#) \subset \mathcal{L}(T'^\#).$$

8.5. Homomorphic Reduction

Then $\Phi$ is said to be *co-linear* for $(P,T;\ P',T')$. If in addition $$\Phi\mathcal{L}(T) \subset \mathcal{L}(T')$$

and in fact $\Phi\mathcal{L}(P) = \mathcal{L}(P')$, then $\Phi$ is said to be *strongly* co-linear for $(P,T;\ P',T')$.

8.5.2 Theorem *Let $\Phi$ be a language homomorphism co-linear for $(P,T;\ P',T')$ and suppose $T'$ is strongly deterministic. Then*

$$\mathcal{L}(P') \subset \mathcal{L}(T') \Rightarrow \mathcal{L}(P) \subset \mathcal{L}(T)\ .$$

*If $\Phi$ is strongly co-linear then*

$$\mathcal{L}(P') \subset \mathcal{L}(T') \Leftrightarrow \mathcal{L}(P) \subset \mathcal{L}(T)\ .$$

Proof. $\mathcal{L}(T)' \subset \mathcal{L}(T^\#)$, and since $T'$ is strongly deterministic, $\mathcal{L}(T'^\#) = \mathcal{L}(T')'$. Thus, $\Phi(\mathcal{L}(T)') \subset \Phi\mathcal{L}(T^\#) \subset \mathcal{L}(T'^\#) = \mathcal{L}(T')'$ so $$\mathcal{L}(T)' \subset \Phi^{-1}\Phi(\mathcal{L}(T)') \subset \Phi^{-1}(\mathcal{L}(T')')$$

so $\Phi^{-1}\mathcal{L}(T') \subset \mathcal{L}(T)$.

(See Figure 8.2A.)

Since $\Phi\mathcal{L}(P) \subset \mathcal{L}(P') \subset \mathcal{L}(T')$, $$\mathcal{L}(P) \subset \Phi^{-1}\Phi\mathcal{L}(P) \subset \Phi^{-1}\mathcal{L}(T') \subset \mathcal{L}(T)\ .$$

If $\Phi$ is strongly co-linear, then in addition, $$\mathcal{L}(P) \subset \mathcal{L}(T) \Rightarrow \mathcal{L}(P') = \Phi\mathcal{L}(P) \subset \Phi\mathcal{L}(T) \subset \mathcal{L}(T')\ .$$

If for strongly deterministic $T'$ there exists a homomorphism which is co-linear for $(P,T;P',T')$, we say $(P',T')$ is a *(homomorphic) reduction*

174          Chapter 8. Reduction of Verification of $(P, T)$.[4] As already noted, there is no loss of expressiveness in assuming that $T'$ is strongly deterministic. In Section 8.11 we present a general algorithmic method to determine if a given language homomorphism is co-linear. Unfortunately, this method gives only a sufficient condition for strong co-linearity: in the case that the language homomorphism $\Phi$ is onto $S(L')^\omega$. In this case, we may check strong co-linearity by checking: $\Phi\mathcal{L}(P) \subset \mathcal{L}(P')$, $\Phi\mathcal{L}(T^\#) \subset \mathcal{L}(T'^\#)$, $\Phi\mathcal{L}(T) \subset \mathcal{L}(T')$ and $\Phi\mathcal{L}(P_i^\#) \subset \mathcal{L}(P_i'^\#)$ $\forall i \in I(P')$, where $P_i' = (L_{P'}, M_{P'}, \{i\}, R(P'), Z(P'))$, as is seen from Theorem 8.5.3 and Corollary 8.5.5.

It is easy to test whether $\Phi$ is onto, using Theorem 4.2.7, by checking that $\widehat{\varphi}|_{S(L)}$ is onto $S(L')$. This can be done during the run-time of any of the language containment algorithms, by compiling a list — explicitly, or symbolically as predicates — of $S = \{\widehat{\varphi}(x) | x \in S(L)\}$ and then testing at the end of the run whether $\sum S = 1$.

8.5.3 Theorem *Suppose* $\Phi : S(L)^\omega \to S(L')^\omega$ *is a language homomorphism onto, $P$ is an $L$-process and $Q$ is an $L'$-process, with $M_Q$ deterministic. For each $i \in I(Q)$, define the $L'$-process*

$$Q_i = (L_Q, M_Q, \{i\}, R(Q), Z(Q)) .$$

*Then*

$$\Phi\mathcal{L}(P^\#) \subset \mathcal{L}(Q_i^\#) \; \forall i \in I(Q) \Rightarrow \mathcal{L}(Q) \subset \Phi\mathcal{L}(P) .$$

Proof. Let $\varphi : L' \to L$ be the homomorphism with $\widehat{\varphi}|_{S(L)}$ equal to the support of $\Phi$. By Theorem 4.2.7 and Lemmas 6.3.4, 6.3.6, $(\Phi\mathcal{L}(P))' = \mathcal{L}(\widehat{\varphi}P)' \subset \mathcal{L}(\widehat{\varphi}P^\#) = \Phi\mathcal{L}(P^\#) \subset \mathcal{L}(Q_i^\#) = \mathcal{L}(Q_i)' \; \forall i \in I(Q)$, the last by Lemma 6.2.30, so $$(\Phi\mathcal{L}(P))' \subset \bigcap_{i \in I(Q)} \mathcal{L}(Q_i)' ,$$

or $$\mathcal{L}(Q) = \mathcal{L}(\oplus Q_i) = \cup \mathcal{L}(Q_i) \subset \Phi\mathcal{L}(P) .$$

8.5.4 Theorem *Suppose* $\Phi : S(L)^\omega \to S(L')^\omega$ *is a language homomorphism onto, $A$ is an $L$-automaton and $B$ is a deterministic $L'$-automaton. Then*

$$\Phi\mathcal{L}(A^\#) \subset \mathcal{L}([B]^\#) \Rightarrow \mathcal{L}(B) \subset \Phi\mathcal{L}(A) .$$

---

[4] Homomorphic reduction can render tractable the analysis of arbitrarily large models. In certain cases, parameterized models (such as a model containing a queue of length $N$) can be analyzed for all (unbounded) values of a parameter $N$: see Chapter 9. In other cases, homomorphic reduction can reduce the analysis of an infinite-state model to that of a finite-state model, as in [KM91].

8.5. Homomorphic Reduction

Proof. With $\hat\varphi$ as in the previous proof, $\mathcal{L}(B) = \mathcal{L}([B]) = \mathcal{L}([B]^\#)' \subset (\Phi\mathcal{L}(A^\#))' = \mathcal{L}(\hat\varphi A^\#)' \subset \mathcal{L}(\hat\varphi A^{\#\#}) = \mathcal{L}(\hat\varphi A) = \Phi\mathcal{L}(A)$.

8.5.5 Corollary *Suppose $P$ is an $L$-process, $T$ is an $L$-automaton, $P'$ is an $L'$-process with $M_{P'}$ deterministic, $T'$ is an (arbitrary) $L'$-automaton and $\Phi : S(L)^\omega \to S(L')^\omega$ is a language homomorphism onto. Set $P'_i = (L_{P'}, M_{P'}, \{i\}, R(P'), Z(P')) \; \forall i \in I(P')$. If:*

$$\Phi\mathcal{L}(P) \subset \mathcal{L}(P'),$$
$$\Phi\mathcal{L}(P^\#) \subset \mathcal{L}(P'^{\#}_i) \; \forall i, \; \text{and}$$
$$\Phi\mathcal{L}(T) \subset \mathcal{L}(T')$$

*then*

$$\mathcal{L}(P) \subset \mathcal{L}(T) \Rightarrow \mathcal{L}(P') \subset \mathcal{L}(T').$$

Proof. By Theorem 8.5.3, $\Phi\mathcal{L}(P) = \mathcal{L}(P')$ so $\mathcal{L}(P) \subset \mathcal{L}(T) \Rightarrow \mathcal{L}(P') = \Phi\mathcal{L}(P) \subset \Phi\mathcal{L}(T) \subset \mathcal{L}(T')$.

8.5.6 Note For a "global" task $T$, it can be difficult to find a sufficiently simple reduction $(P', T')$ for $(P, T)$, i.e., with $|V(P')|$ small. Nonetheless, one may be able to find a "task decomposition" (cf. Section 8.2) consisting of $L$-automata $T_1, \ldots, T_n$ defining "local" tasks such that $$\cap \mathcal{L}(T_i) \subset \mathcal{L}(T),$$

and (since the $T_i$ are local) such that each $(P, T_i)$ admits of a much simpler reduction than $(P, T)$. Thus, an often successful strategy is to find a "good" decomposition $T_1, \ldots, T_n$, find reductions $(P'_i, T'_i)$ for $(P, T_i)$, verify that $\mathcal{L}(P'_i) \subset \mathcal{L}(T'_i)$ and thus conclude that $\mathcal{L}(P) \subset \mathcal{L}(T_i) \; \forall i$, giving $$\mathcal{L}(P) \subset \cap \mathcal{L}(T_i) \subset \mathcal{L}(T).$$

In practice, decomposing $T$ sometimes can be relatively straightforward, with each $T_i$ corresponding to a sequential "step" (of appropriate size) of the global task $T$.

8.5.7 Example Suppose $P$ is an $L$-process, $\pi$ is a partition of $S(L)$, $\bar\pi = \{\sum_{x \in s} x | s \in \pi\}$ and for $L' = \mathbb{B}[\bar\pi]$, let $\varphi : L' \to L$ be the inclusion homomorphism induced by $\pi$ (Definition 4.2.21). Let $\Phi$ be the language homomorphism with support $\hat\varphi|_{S(L)}$. If $T$ is an $L'$-automaton (a fortiori an $L$-automaton, since $L' \subset L$ is a subalgebra) then $\varphi T = T$, as shown in Example 4.2.20. Let $P'$ be any $L'$-process with $\mathcal{L}(P') = \mathcal{L}(\hat\varphi P)$ (for 176                           Chapter 8. Reduction of Verification example, $P'$ may be derived from the $L'$-process $\hat\varphi P$ by application of a state-minimization procedure to $\hat\varphi P$, as described in Section 8.9). Then by Lemma 6.3.6, $\mathcal{L}(P') = \mathcal{L}(\hat\varphi P) = \Phi \mathcal{L}(P)$, while $\Phi \mathcal{L}(T) = \mathcal{L}(\hat\varphi T) = \mathcal{L}(T)$ and $\Phi \mathcal{L}(T^\#) = \mathcal{L}(\hat\varphi T^\#) = \mathcal{L}(T^\#)$. Thus $\Phi$ is strongly co-linear for $(P, T, P', T)$ and (whether or not $T$ is strongly deterministic).

$$\mathcal{L}(P) \subset \mathcal{L}(T) \Leftrightarrow \mathcal{L}(P') \subset \mathcal{L}(T).$$

8.5.8 Example When $P = \otimes P_i$ is a product of independent $L$-processes and $L = \Pi L_{P_i}$, the technique of Example 8.5.7 can be applied incrementally (with a weaker conclusion), as follows. Find respective partitions $\pi_i$ of $S(L_{P_i})$ such that $T$ is an $L'$-automaton for $L' = \Pi \mathbb{B}[\pi_i]$. (That is, $T$ is invariant under the inclusion homomorphism $\varphi: L' \to L$; note that $L' = \mathbb{B}[\pi]$ where $\pi$ is the least common refinement of the $\pi_i$'s viewed as partitions of $S(L)$.) Let $P'_1$ be any $L'$-process with $\mathcal{L}(P'_1) = \mathcal{L}(\hat\varphi P_1)$ and for each $i > 0$, let $P'_i$ be any $L'$-process with $$\mathcal{L}(P'_i) = \mathcal{L}(P'_{i-1} \otimes \hat\varphi P_i).$$

In particular, $P'_i$ may be a state minimization of $P'_{i-1} \otimes \hat\varphi P_i$, or $P'_i$ may be $P'_{i-1} \otimes Q_i$ where $Q_i$ is a state minimization of $\hat\varphi P_i$ relative to $P'_{i-1}$, as described in Section 8.5 (which may be more feasible, computationally). Let $P'$ be the final $P'_i$ of this iteration. Then by Corollary 6.3.8, $\Phi \mathcal{L}(P) = \mathcal{L}(\hat\varphi P) \subset \mathcal{L}(\otimes \hat\varphi P_i) = \mathcal{L}(P')$, and thus $$\mathcal{L}(P') \subset \mathcal{L}(T) \Rightarrow \mathcal{L}(P) \subset \mathcal{L}(T).$$

Notice that $\Phi$ may not be strongly co-linear in this case; however, if all the partitions are trivial ($\pi_i = S(L_{P_i})$), then $\varphi$ is the identity and surely $\Phi$ is strongly co-linear.

8.6 Homomorphic Refinement

Homomorphic reduction provides a mechanism for a top-down development methodology based upon "successive refinement", illustrated in Figures 8.3, 8.4. This is a methodology driven by the creation of a succession of models, from more abstract to more detailed. Each model is taken as a "specification" of the succeeding model (which sometimes is called its "implementation[5]"), and verification is used to check the consistency of each specification with the preceding specification. The ---
[5]Although "implementation" is fairly common terminology in this context, it may be an unfortunate choice of words: for some, "implementation" connotes a program each of whose variables holds some value, whereas "specification" commonly suggests

8.6. Homomorphic Refinement succession has the property that any task whose performance is verified at one level of abstraction is guaranteed to be performed at all subsequent levels. This permits verification of each respective property in the simplest model in which it can be defined. As "global" properties which involve large portions of the system often can be stated in fairly abstract terms (*e.g.*, "the message gets delivered"), abstraction often can make the difference between such a test being feasible or not. Successive refinement has another very important feature: it permits early "debugging" of a relatively simple abstraction of the target implementation, before the target implementation is created. Such an abstraction may be created relatively quickly (think of it as a "rapid prototype"), and is much easier and faster to debug than the target implementation. It thus permits system debugging early in the design cycle, a well-known important factor in speeding up system development [Gab94].

The general concept of stepwise refinement is quite old, and has been studied in various aspects (*e.g.*, [LS84], [LT87], [AL91]). However, there is a circle of thinking which supports the view that one may start with a high-level (abstract) specification, refine it in a linear fashion down to a model which may be physically implemented (adding more detail at each step, as just outlined) and be done. It is thought that if each model is consistent with its more abstract specification (in the refinement succession), then one knows that the lowest-level model is true to each of its specifications, and this completes the verification process.

Unfortunately, this simple ideal is insufficient in practice. The problem is that when one designs an abstract model, the design, although abstract, embodies much intuition, technique and learned practice which is hard to delineate specifically. The specific problem is that having created a complete high-level design specification (level 1 or Lv1 in Figure 8.4), the designer cannot know with assurance that it will behave as intended. Therefore, it must be tested for many properties, the tasks $T_{11}, T_{12}, \ldots$. It is of some concern to come up with a sufficient list of tasks to obtain good "coverage" of the model Lv1. The concern is that a "verified" design will be lead to an implementation which is found to have logical faults (attributable to a behavior whose absence was not among the verified properties). In practice, it seems to be the case that

---

*constraint*, which places no restriction on unreferenced variables. In this sense, an "implementation" (at a higher level of abstraction) would not be considered to be refined by a second "implementation" (at a lower level of abstraction) if the second referenced a variable which the first did not. This linguistic conundrum vanishes if we agree to refer to *each* level of abstraction as a "specification" (in the sense of constraint).

178                    Chapter 8.  Reduction of Verification such embarrassments can be avoided through sufficient design reviews and "brain-storming" to come up with a sufficient list of tasks [HK90]. To this end it is useful to encourage overlap and redundancy in the definition of tasks. However, in theory, the potential for that embarrassment appears unavoidable.

Figure 8.3: Development methodology: abstraction is modelled by a nondeterministic pause, serving as a place-holder for several sequential events in a refinement. A Boolean algebra homomorphism $\varphi$ maps each abstract event to the set of refined events which implements the abstract event. Although this may induce a mapping of states as shown in the figure, in general there need be no such state map.

8.6. Homomorphic Refinement                                           179

Figure 8.4: Development Methodology: top-down development by successive refinement It could be argued that the "real" top-level specification is $\cap \mathcal{L}(T_{1i})$ or, $T_1$ if $\mathcal{L}(T_1) = \cap \mathcal{L}(T_{1i})$. Philosophically there may be no problem with this at level 1 (Lv1) but it becomes a problem at the next refinement (Lv2) and all subsequent refinements. The problem is that Lv2 adds detail to Lv1 in the sense of Figure 8.3: "pause" selections of Lv1 may be expanded into routines which perform computation, and nonde- 180                          *Chapter 8. Reduction of Verification* terministic choice in Lv1 may be determined as well through addition of more structure. It is the verification of these new routines and structures which comprise the tests involving $T_{21}, T_{22}, \ldots$ . It is likely false that $\cap \mathcal{L}(T_{2i}) \subset \mathcal{L}(P_1)$ if $P_1$ is the Lv1 model. One might suggest to redefine the Lv1 model to be $P_1 \otimes T_1^\#$. However, $T_1$ can be quite complex, as $\mathcal{L}(T_1) = \cap \mathcal{L}(T_{1i})$ and the proof obligation $\Phi\mathcal{L}(P_2 \otimes T_2^\#) \subset \mathcal{L}(P_1 \otimes T_1^\#)$ ($P_2$ the old Lv2, $\mathcal{L}(T_2) = \cap \mathcal{L}(T_{2i})$) would be unnecessarily onerous, in view of the fact that one really wants only $\Phi\mathcal{L}(P_2) \subset \mathcal{L}(P_1)$, the inheritance of $T_1$ to $P_2$ being guaranteed.

Another factor which interferes with the linear ideal of stepwise refinement is reduction: to verify task $T_{11}$ in the Lv1 model $P_1$, one in fact reduces the test $\mathcal{L}(P_1) \subset \mathcal{L}(T_{11})$ to a reduced test $\mathcal{L}(R_{11}) \subset \mathcal{L}(T'_{11})$ as discussed in the previous section. There may be little connection among the $R_{1j}$'s, each referring to a different part of the model.

Finally, the tasks $T_{ij}$ have less standing in the design than the $P_i$'s (the $T_{ij}$'s may come and go). For all those reasons, it is thought better to conceive of the stepwise refinement hierarchy as "hairy" (Figure 8.4) rather than linear.

Given two system models at successive levels of detail, say a "more abstract" $L'$-process $P'$ and a "more detailed" $L$-process $P$, we "verify the refinement" of $P'$ to $P$ (*cf.* Figure 8.3) by constructing a homomorphism $\varphi : L' \to L$ such that the language homomorphism $\Phi$ with support $\widehat{\varphi}|_{S(L)}$ satisfies $$\Phi\mathcal{L}(P) \subset \mathcal{L}(P') .$$

We say $P$ is a *refinement* of $P'$ if there is such a $\Phi$. If $P$ is a refinement of $P'$, then for any strongly deterministic $L'$-automaton $T'$ for which $$\mathcal{L}(P') \subset \mathcal{L}(T')$$

it follows from Theorem 8.5.2 that $$\mathcal{L}(P) \subset \mathcal{L}(\varphi T')$$

since by Lemma 6.3.13, $\Phi\mathcal{L}(\varphi T'^\#) \subset \mathcal{L}(T'^\#)$. This shows that the fact that $P$ refines $P'$ guarantees that any task performed by $P'$ is performed by $P$ (more precisely, that if $T'$ is performed by $P'$, then $\varphi T'$ is performed by $P$).

Ideally, the last model in the refinement hierarchy, LvN, should contain sufficient detail to allow it to be compiled into software and/or synthesized into hardware (or into some combination of each, in the case of 8.7. Node-Recurring Transform 181 a software/hardware "co-design"). (The COSPAN system has this feature, for example.) In this case, assuming there are no faults introduced by the compiler/synthesizer, assuming the environment behaves as modeled (and there are no atom bombs), assuming the verification software has no faults and assuming this theory is mathematically correct, then (in some sense which cannot be made precise) the implementation will perform all the tasks which were verified.

Incidentally, not every refinement of a stable process is stable, even if the refining homomorphism $\Phi$ is 1-1 and onto: given a stable process $P'$ and a determinization $P$ of $P'$, the identity provides a refining homomorphism showing $P$ is a refinement of $P'$ while, as already discussed, in all but trivial cases $P$ cannot be stable. Thus, stability must be checked at each level of refinement, or ensured at each level through application of Theorem 7.6.12.

8.7 Node-Recurring Transform

Suppose $A$ is a strongly deterministic $L$-automaton with $Z(A) = \{C\}$ and $R(A) = \phi$. Define a new $L$-automaton $A'$ to be $A$, except $Z(A') = \phi$ and $R(A') = \{(v,w)|w \notin C\}$. Then clearly, $\mathcal{L}(A') = \mathcal{L}(A)'$. Note that each state $w$ of $A'$ has the property that if $(v,w) \in R(A')$ for some $v \in V(A')$, then $(v,w) \in R(A')$ for every $v \in V(A')$. Such an $A'$ is said to be "node-recurring". A node-recurring automaton $A$ with $Z(A) = \phi$ has the property that we may reverse the above transformation: we may define $A'$ to be $A$ with $R(A') = \phi$ and $$Z(A') = \{\{v \in V(A)|(v,w) \notin R(A) \text{ for any } w\}\}.$$

If $A$ is strongly deterministic, then again $\mathcal{L}(A') = \mathcal{L}(A)'$. Given an arbitrary $A$, we wish to transform $A$ to permit this transformation. We may do this by splitting states $w$ for which $(v,w) \in R(A)$ for some $v$, into $w^-$ and $w^+$ with $w^+$ absorbing all the recur edges into $w$. The details of this construction follow.

8.7.1 Definition Let $X$ be an $L$-process (respectively, $L$-automaton). Say $X$ is *node-recurring* if $(v,w)$, $(v',w) \in E(X)$ and $(v,w) \in R(X) \Rightarrow (v',w) \in R(X)$. The *node-recurring transform* of $X$ is the $L$-process (respectively, $L$-automaton) $\langle X \rangle$ defined as follows: if $X$ is node-recurring, $\langle X \rangle = X$; otherwise, $$V(\langle X \rangle) = V(X) \times \{0,1\}$$

182                    Chapter 8.  Reduction of Verification $$M_{\langle X\rangle}((v,t),(v',t')) = \begin{cases} M(v,v') & \text{if} \quad \begin{array}{l}(v,v') \in R(X) \\ \text{and } t' = 1 \\ \text{or} \\ (v,v') \notin R(X) \\ \text{and } t' = 0\end{array} \\ 0 & \text{else} \end{cases}$$

$$R(\langle X\rangle) = \{((v,t),(v',1)) \mid (v,v') \in R(X)\},$$
$$Z(\langle X\rangle) = \{\{(v,t) \mid v \in C\} \mid C \in Z(X)\},$$
$$I(\langle X\rangle) = \{(v,0) \mid v \in I(X)\}.$$

(See Figure 8.4A.)

> This may be implemented as an extra bit in the state variable of $X$ which is *set* each time a recur edge is crossed and *unset* each time a non-recur edge is crossed

8.7.2 Lemma $M_X$ *complete* $\Rightarrow M_{\langle X\rangle}$ *complete.*

8.7.3 Lemma *For any L-process (respectively, L-automaton) $X$, $\langle X\rangle$ is a node-recurring L-process (respectively, L-automaton).*

8.7.4 Lemma $\mathcal{L}(\langle X\rangle) = \mathcal{L}(X)$ *and* $\langle X\rangle$ *is [strongly] deterministic if and only if $X$ is.*

8.8 Simple Decomposition

8.8.1 Definition A process or automaton $X$ is *simple* if $Z(X) = \phi$ or $R(X) = \phi$ and the elements of $Z(X)$ are pairwise disjoint.

8.8.2 Definition Let $X$ be simple, and set $$Z_X = V(\langle X \rangle) \setminus \{w \in V(\langle X \rangle) \mid (v,w) \in R(\langle X \rangle) \text{ for some } v \in V(\langle X \rangle)\},$$

$$R_X = \{(v,w) \in E(X) \mid \text{not both } v, w \text{ are in the same cycle set of } X\}.$$

If $P$ is a simple $L$-process with $Z(P) = \phi$, define the $L$-automaton $$\tilde{P} = (M_{\langle P \ast \rangle}, I(\langle P \rangle), \phi, \{Z_P\});$$

otherwise, define the $L$-automaton $$\tilde{P} = (M_{P\ast}, I(P), R_P, \phi).$$

If $A$ is a simple $L$-automaton with $Z(A) = \phi$, define the $L$-process $$\tilde{A} = (L, M_{\langle A \rangle}, I(\langle A \rangle), \phi, \{Z_A\});$$

otherwise, define the $L$-process $$\tilde{A} = (L, M_A, I(A), R_A, \phi).$$

8.8.3 Lemma *Let $X$ be simple. Then $\mathcal{L}(X) = \mathcal{L}(\tilde{X})$.*

Proof. Suppose $X$ is an $L$-process [respectively, $L$-automaton]. If $Z(X) = \phi$ then $\mathbf{x} \in \mathcal{L}(X)$ if and only if $\mathbf{x}$ has a run $\mathbf{v}$ in $\langle X \rangle$ which crosses each [some] edge of $R(\langle X \rangle)$ a finite [an infinite] number of times if and only if $\mathbf{x}$ has a run $\mathbf{v}$ in $\langle X \rangle$ which eventually stays inside [is infinitely often outside] $Z_X$ if and only if $\mathbf{x} \in \mathcal{L}(\tilde{X})$; otherwise, $R(X) = \phi$ and $\mathbf{x} \in \mathcal{L}(X)$ if and only if $\mathbf{x}$ has a run $\mathbf{v}$ in $X$ which is infinitely often outside each [eventually stays inside some] $C \in Z(X)$ if and only if $\mathbf{x} \in \mathcal{L}(\tilde{X})$.

8.8.4 Corollary *Let $X$ be a simple, strongly deterministic $L$-automaton (respectively, $L$-process). Then $\tilde{X}^\#$ is an $L$-automaton (respectively, $L$-process) satisfying $\mathcal{L}(\tilde{X}^\#) = \mathcal{L}(X)'$.*

8.8.5 Theorem *Let $P$ be an $L$-process with $M_P$ deterministic. Then there exist simple strongly deterministic $L$-automata $A_0, \ldots, A_n$ with $n < (1 + |Z(P)|)^{|I(P)|}$, such that*

$$\mathcal{L}(P) = \cap \mathcal{L}(A_i).$$

184  Chapter 8. Reduction of Verification

Proof. Let $P_0 = (L_P, M_P, I(P), R(P), \phi)$, let $D_1, \ldots, D_n$ be a partition of $Z(P)$ such that elements of each $D_i$ are pairwise disjoint, let $P_i = (L_P, M_P, I(P), \phi, D_i)$ for $1 \leq i \leq n$ and set $A_i = \tilde{P}_i$ for $0 \leq i \leq n$. First, assume that $P$ is strongly deterministic. Then each $x \in \mathcal{L}(P)$ has a unique accepting run in $P$, so $\mathcal{L}(P) = \mathcal{L}(\odot P_i)$ and hence $$\mathcal{L}(P) = \mathcal{L}(\odot P_i) = \cap \mathcal{L}(P_i) = \cap \mathcal{L}(\tilde{P}_i) = \cap \mathcal{L}(A_i) \ .$$

Next, as in (6.2.36), write $$\mathcal{L}(P) = \mathcal{L}(\oplus Q_i) = \cup \mathcal{L}(Q_i)$$

for strongly deterministic $Q_i$. Thus, by the previous case, for some strongly deterministic $L$-automata $A_{ij}$, $\mathcal{L}(Q_i) = \bigcap_j \mathcal{L}(A_{ij})$, so $$\mathcal{L}(P)' = \bigcap_i \bigcup_j \mathcal{L}(A_{ij})' = \bigcup_{j_1, j_2, \ldots} \bigcap_i \mathcal{L}(A_{ij_i})' \ .$$

Thus, $$\mathcal{L}(P) = \bigcap_{j_1, j_2, \ldots} \bigcup_i \mathcal{L}(A_{ij_i}) = \bigcap_{j_1, j_2, \ldots} \mathcal{L}\left(\bigotimes_i A_{ij_i}\right) \ .$$

8.8.6 Theorem Let $A$ be an $L$-automaton. Then $\exists$ simple $L$-processes $P_0, \ldots, P_n$ with $n \leq |Z(A)|$ and with each $M_{P_i}$ deterministic if $A$ is, such that $$\mathcal{L}(A) = \cup \mathcal{L}(P_i) \ .$$

If $A$ is strongly deterministic, so is each $P_i$.

Proof. As in Theorem 8.8.5 with "$A$" and "$P$" interchanged, for simple $L$-automata $A_i$, setting $P_i = \tilde{A}_i$, $\mathcal{L}(A) = \mathcal{L}(\oplus A_i) = \cup \mathcal{L}(A_i) = \cup \mathcal{L}(\tilde{A}_i) = \cup \mathcal{L}(P_i)$.

8.8.7 Definition Say any such $A_i$'s as constructed in the proof of Theorem 8.8.5 (respectively, any such $P_i$'s as constructed in the proof of Theorem 8.8.6) afford a *simple decomposition* of $P$ (respectively, $A$).

8.8.8 Notes
1. For an $L$-process $P$, if $R(P) = \phi$ then $Z_P = V(P)$ so $\mathcal{L}(A_i) \subset \mathcal{L}(A_0)$ for each $i > 0$ and thus $A_0$ is superfluous if $Z(P) \neq \phi$. Likewise, for an $L$-automaton $A$, if $R(A) = \phi$ then $\phi = \mathcal{L}(P_0) \subset \mathcal{L}(P_i)$ for each $i > 0$, so $P_0$ is superfluous if $Z(A) \neq \phi$.

8.8. Simple Decomposition

2. If $X_0,\ldots,X_n$ is a simple decomposition of $X$ and $\varphi$ is a homomorphism, then $\varphi X_0,\ldots,\varphi X_n$ is a simple decomposition of $\varphi X$.

3. In the proof of (8.8.5), many or all of the components of $\otimes A_{ij}$, may be merged into a single automaton $A_{ij}$ with $M_{A_{ij}} = M_P$ — all, if $P$ is node-recurring. However, it is the exponent $|I(P)|$ in the complexity bound which is the real threat to tractability. Nonetheless, as a practical matter, the effect of the exponent $|I(P)|$ can be entirely overcome, if a certain style of writing the $P_i$'s is adopted. Indeed, since strongly deterministic Streett automata are fully expressive (Section 6.2) and strong fairness can be expressed in terms of the 4-state process described in Example 8.3.1, there is no loss of expressiveness in adopting the assumption that $P = \otimes P_i$ where each $P_i$ either is strongly deterministic or else is a strong fairness constraint, represented as in (8.3.1). In this case, the strongly deterministic $P_i$'s all can be decomposed in terms of simple decompositions, each with $n \leq 1 + |Z(P_i)|$ members, since $|I(P_i)| = 1$; the remaining components each can be represented directly (without going through the simple decomposition) as a 4-state strongly deterministic $L$-automaton described in terms of the 4-state $L$-process of (8.3.1), with $L$ and $U$ reversed and $\oplus$ replaced by $\otimes$ (cf. (6.2.8)). Thus, as a practical matter, the $n$ of Theorem 8.8.5 may be limited to $1 + |Z(P)|$ (without the exponent $|I(P)|$).

8.8.9 Theorem *Let $Q$ be an $L$-process, $R$ an $L'$-process with simple decomposition $R_1,\ldots,R_n$, let $\varphi : L' \to L$ be a Boolean algebra homomorphism and let $\Phi : S(L)^\omega \to S(L')^\omega$ be the language homomorphism with support $\widehat{\varphi}|_{S(L)}$. Then*

$$\Phi\mathcal{L}(Q) \subset \mathcal{L}(R)$$

*if and only if*

$$\mathcal{L}(Q) \subset \mathcal{L}(\varphi R_i) \ \forall i \ .$$

Proof.

$\Rightarrow$. By Lemmas 6.3.13, 6.3.6 and Theorem 8.8.5, have $\mathcal{L}(Q) \subset \mathcal{L}(\varphi R) = \Phi^{-1}\mathcal{L}(R) = \Phi^{-1} \cap \mathcal{L}(R_i) = \cap \Phi^{-1}\mathcal{L}(R_i) = \cap \mathcal{L}(\varphi R_i)$ so $$\mathcal{L}(Q) \subset \mathcal{L}(\varphi R_i) \text{ for all } i \ .$$

$\Leftarrow$. By Lemma 6.3.6, $\cap \mathcal{L}(\varphi R_i) = \cap \Phi^{-1}\mathcal{L}(R_i) = \Phi^{-1} \cap \mathcal{L}(R_i) = \Phi^{-1}\mathcal{L}(R) = \mathcal{L}(\varphi R)$. Thus $\mathcal{L}(Q) \subset \mathcal{L}(\varphi R_i) \ \forall i \Rightarrow \mathcal{L}(Q) \subset \cap \mathcal{L}(\varphi R_i) = \mathcal{L}(\varphi R)$ so $\Phi\mathcal{L}(Q) \subset \mathcal{L}(R)$.

186    *Chapter 8. Reduction of Verification*

Recall from Definition 6.2.34 that for an automaton $A$, $[A]$ is its (equivalent) strong determinization.

8.8.10 Corollary *If $M_R$ is deterministic then*

$$\Phi\mathcal{L}(Q) \subset \mathcal{L}(R) \Leftrightarrow \mathcal{L}(Q \otimes [\varphi R_i]^\#) = \phi \text{ for all } i .$$

8.8.11 Theorem *Let $A$ be an $L$-automaton with simple decomposition $A_1, \ldots, A_n$, let $B$ be an $L'$-automaton, let $\varphi : L' \to L$ be a Boolean algebra homomorphism and let $\Phi : S(L)^\omega \to S(L')^\omega$ be the language homomorphism with support $\tilde\varphi|_{S(L)}$. Then*

$$\Phi\mathcal{L}(A) \subset \mathcal{L}(B)$$

*if and only if*

$$\mathcal{L}(A_i) \subset \mathcal{L}(\varphi B) \; \forall i .$$

Proof.

$\Rightarrow$. By Lemma 6.3.13 and Theorem 8.8.6, have $\cup \mathcal{L}(A_i) = \mathcal{L}(A) \subset \mathcal{L}(\varphi B)$ so $$\mathcal{L}(A_i) \subset \mathcal{L}(\varphi B) \text{ for all } i .$$

$\Leftarrow$. $\mathcal{L}(A) = \cup \mathcal{L}(A_i) \subset \mathcal{L}(\varphi B)$ so by Lemma 6.3.6, $\Phi\mathcal{L}(A) \subset \mathcal{L}(B)$.

8.8.12 Corollary *If $B$ is deterministic then*

$$\Phi\mathcal{L}(A) \subset \mathcal{L}(B) \Leftrightarrow \mathcal{L}(A_i \otimes [\varphi B]^\#) = \phi \; \forall i .$$

8.8.13 Corollary *Let $T_1, \ldots, T_n$ be $L$-automata with respective simple decompositions $T_{i,j}$ and let $T$ be a deterministic $L'$-automaton. Then*

$$\Phi(\cap \mathcal{L}(T_i)) \subset \mathcal{L}(T)$$

*if and only if*

$$\mathcal{L}(T_{1j_1} \otimes \cdots \otimes T_{kj_k} \otimes [\varphi T]^\#) = \phi$$

*for all $(j_1, \ldots, j_k)$.*

8.9 State Homomorphism

Classically, homomorphisms have been presented in terms of a map from the state space of one automaton to that of another (both over the same alphabet) [Gin68, §5.3–4]. For $L$-processes (or $L$-automata) $P$ and $Q$, the existence of a map $$\theta : V(P) \to V(Q)$$

which satisfies $P(v,w) \leq Q(\theta v, \theta w)$ for all $v, w \in V(P)$ implies $\mathcal{L}(P) \subset \mathcal{L}(Q)$, provided $\theta$ "preserves" $I(P)$, $R(P)$ and $Z(P)$ in a sense defined below (Definition 8.9.4). However, the converse: $\mathcal{L}(P) \subset \mathcal{L}(Q)$ does not imply the existence of such a map. This is an incompleteness of the classical theory, corrected in the development given here, specifically, Lemma 6.3.13. For processes, the state map $\theta$ can be understood as providing a determinization of the target automaton relative to the domain automaton through a deterministic image of the target: cf. Definition 3.2.4. The deterministic image adds state information to the language, enabling discrimination among states, in the language. The "state homomorphism" — a language homomorphism with this state information added — essentially determinizes the image relative to the domain by allowing the language map to designate the succession of states. Thus, the "state homomorphism" $\theta$ discussed in this section is in fact nothing more than a component of the support of an (ordinary) language homomorphism (the state component), where the respective Boolean algebras have been augmented to accommodate the respective deterministic images of $P$ and $Q$, as in (3.2.4). (For $L$-automata, an extra "death" state would need to be added, as it is in the dual of a process, in order to preserve completeness.) However, as the state component of a language homomorphism has some special structure properties, it is singled out for special attention. For example, a state homomorphism is a *simulation map* (one direction of a bisimulation [KS90]) and thus preserves all ∀CTL properties [CGL92].

If $P$ is deterministic, then one can generate a language-equivalent $Q$ (and the map $\theta : P \to Q$) automatically through application of a state-minimization procedure (cf. Example 8.5.7) subject to preserving the separation of recur/nonrecur edges and disjointness of cycle sets. Such a procedure may be constructed from the Hopcroft algorithm [Hop71], [Gri73] which runs in time $|V(P)| \log |V(P)|$. Moreover, it is possible to compute the equivalent minimum-state automaton in time $O(n^2)$ for $n$ states in the *reduced* automaton (independent of the size of the original automaton) [LY92] (see also [BFH91], [ACH+92], [YL93], especially for application to timed models). The Hopcroft algorithm may be further 188 Chapter 8. Reduction of Verification adapted (without affecting its running time) to allow for the *relative minimization* of a component: if $P = \otimes P_i$, then $P_1$ may be minimized by Hopcroft's algorithm relative to the selections of $P$ possible at each state of $P_1$. Thus, the state space of $P_1$ may be further reduced by utilizing information that certain selections ("inputs") are not possible at certain states of $P_1$. This state space reduction may be carried even further, but at considerably greater expense (the problem of finding a minimal reduction then becomes NP-hard), by using the state-splitting algorithm of Paull and Unger [PU59].[6] However, all these reductions must in some way preserve the acceptance structure of the process or automaton. A straight-forward way to do this is to impose a condition such as in Definition 8.9.4, but this may be overly restrictive: there may be another way to preserve the acceptance structure, which allows a greater reduction of the state space. Finding a more general such reduction is complicated, however, by the fact that for $L$-processes and $L$-automata there can be no minimal-state canonical form: there are examples of nonisomorphic minimal-state $L$-automata (i.e., $A$, $B$ with $|V(A)| = |V(B)| = \min\{|V(X)| : \mathcal{L}(X) = \mathcal{L}\}$ for some $\omega$-regular language $\mathcal{L}$, while the directed graphs associated with $M_A$ and $M_B$ are nonisomorphic [Sta83, see ex. 2]).

The succeeding results demonstrate the special role of a "state" homomorphism in verifying a language homomorphism.

8.9.1 Theorem *Let $P$ be an $L$-process, $Q$ be a node-recurring $L'$-process with simple decomposition $Q_1, \ldots, Q_n$, let $\varphi : L' \to L$ be a homomorphism and let $\Phi : S(L)^\omega \to S(L')^\omega$ be the language homomorphism with support $\widehat{\varphi}|_{S(L)}$. Suppose $\theta : V(P) \to V(Q)$ is a map satisfying $\theta I(P) \subset I(Q)$, and for all $v, w \in V(P)$*

$$P(v,w) \leq \varphi Q(\theta(v), \theta(w)) .$$

*Then for $\Delta = \{(v, \theta(v)) \mid v \in V(P)\}$,*

$$\mathcal{L}((P \otimes \varphi Q_i^\#)|_\Delta) = \phi \; \forall i \; \Rightarrow \; \Phi \mathcal{L}(P) \subset \mathcal{L}(Q) .$$

Proof. Let $K = L \cdot \mathbb{B}[V(P)]$, $K' = L' \cdot \mathbb{B}[V(Q)]$, and let $\psi : K' \to K$ be the homomorphism with support $\widehat{\psi} = \widehat{\varphi} \times \theta$ (for $s \in S(L)$, $v \in V(P)$,

---

[6]See also [Ung69]; [GL65]. F. Somenzi has reported to me that he has applied this effectively to state machines of a few hundred states. He says: "The algorithm requires the enumeration of the so-called prime compatibles. Giving up optimality, one may just consider the smaller set of maximal compatibles. However, in one contrived example we have, a machine with about 50 states has more than 3 million maximal compatibles. In principle, one should solve a 0-1 integer program with over 3 million variables to find the optimum solution". Other heuristics are described in [HRSJ91].

8.9. State Homomorphism $\widehat{\psi}(s*v) = \overline{\widehat{\varphi}(s)}*\theta(v))$. Then each $\widehat{Q}_i$ is a deterministic $K'$-automaton by Lemma 3.2.5, so $\varphi\widehat{Q}_i$ is a deterministic $K$-automaton by Lemma 3.3.7. The result follows from Corollary 8.1.5.

8.9.2 Theorem *Let $A$ be a node-recurring $L$-automaton with simple decomposition $A_1,\ldots,A_n$, let $B$ be an $L'$-automaton and let $\varphi$ and $\Phi$ be as in Theorem 8.9.1. Suppose $\theta : V(A) \to V(B)$ satisfies $\theta I(A) \subset I(B)$ and for all $v,w \in V(A)$,*

$$A(v,w) \leq \varphi B(\theta(v),\theta(w)) \ .$$

*Then for $\Delta = \{(v,\theta(v)) \mid v \in V(A)\}$,*

$$\mathcal{L}((A_i \otimes \varphi B^\#)|_\Delta) = \phi \ \forall i \ \Rightarrow \Phi\mathcal{L}(A) \subset \mathcal{L}(B) \ .$$

8.9.3 Lemma *Let $P$ be an $L$-process, $Q$ an $L'$-process, and let $\varphi : L' \to L$ be a homomorphism and let $\Phi$ be the language homomorphism with support $\widehat{\varphi}|_{S(L)}$, let $f : I(P) \to I(Q)$ and set $I = \{(i,f(i)) \mid i \in I(P)\}$. Suppose $R = (P \otimes \varphi Q)_I$ has the properties*

1. $((v,w),(v',w')) \in E(R^*), (w,w') \in R(Q) \Rightarrow (v,v') \in R(P)$;

2. $\forall D \in Z(Q) \ \exists C \in Z(P)$ such that $$\Pi_{V(P)}\{(v,w) \in V(R^*) \mid w \in D\} \subset C \ .$$

3. $\forall (v,w) \in V(R^*), s_P(v) \leq \varphi s_Q(w)$.

*Then*

$$\Phi\mathcal{L}(P) \subset \mathcal{L}(Q) \ .$$

8.9.4 Definition *Let $P$ be an $L$-process, $Q$ an $L'$-process, $\varphi : L' \to L$ a homomorphism, $\Phi : S(L)^\omega \to S(L')^\omega$ the language homomorphism with support $\widehat{\varphi}|_{S(L)}$ and suppose*

$$\theta : V(P) \to V(Q)$$

is a map, satisfying

1. $\theta I(P) \subset I(Q)$;

2. $P(v,w) \leq \varphi Q(\theta(v),\theta(w)) \ \forall \ v,w \in V(P)$;

190                      Chapter 8. Reduction of Verification

3. $\theta^{-1}R(Q) \subset R(P)$, where $\theta(v,w) = (\theta(v), \theta(w))$;

4. $\forall\, D \in Z(Q)\ \exists\, C \in Z(P)$ such that $\theta^{-1}(D) \subset C$.

Then the pair $(\Phi, \theta)$ is said to be a *state homomorphism* from $P$ to $Q$, written
$$(\Phi, \theta) : P \to Q\ .$$

If $\theta$ is onto, the containment/inequalities of 1.–3. are replaced by equalities and
$$Z(P) = \{\theta^{-1}(D) \mid D \in Z(Q)\}$$
then $(\Phi, \theta)$ is said to be *exact*.

8.9.5 Lemma *If* $(\Phi, \theta) : P \to Q$ *is a state homomorphism, then*
$$\Phi\mathcal{L}(P) \subset \mathcal{L}(Q)$$
*and for all* $v \in V(P)$,
$$s_P(v) \leq s_{\varphi Q}(\theta(v))\ .$$

8.9.6 Theorem *Let* $(\Phi, \theta) : P \to Q$ *be an exact state homomorphism. Then*
$$\Phi\mathcal{L}(P) = \mathcal{L}(Q)$$
*and for all* $v \in V(P)$, $s_P(v) = s_{\varphi Q}(\theta(v))$.

8.9.7 Note The exact homomorphisms are *bisimulations* [KS90]: those maps which preserve all properties defined by CTL, CTL* and ECTL formulae (see the discussion in Section 7.5 and [Sif83], [CGL92], [BBLS93]). In fact, exactness is a very restrictive condition, ruling out, for example, the important abstraction of a specific succession of actions by a nondeterministic delay (Figure 8.3).

8.9.8 Lemma *Let $A$ be an $L$-automaton, $B$ an $L'$-automaton, let $\varphi$ and $\Phi$ be as in Lemma 8.9.3 and $\ker \varphi \neq 0$, let $f : I(A) \to I(B)$ and set $I = \{(i, f(i)) \mid i \in I(A)\}$. Suppose $R = (A \otimes_\varphi B)_I^\#$ has the properties*

1. $((v,w),(v',w')) \in E(R^*),\ (v,v') \in R(A) \Rightarrow (w,w') \in R(B)$;

2. $\forall\, C \in Z(A)\ \exists\, D \in Z(B)$ *such that*
$$\Pi_{V(B)}\{(v,w) \in V(R^*) \mid v \in C\} \subset D\ .$$

8.9. State Homomorphism

Then
$$\Phi \mathcal{L}(A) \subset \mathcal{L}(B) .$$

Suppose furthermore $f$ is onto, and

1'. $((v,w),(v',w')) \in E(R^*)$, $(v,v') \in R(A) \Leftarrow (w,w') \in R(B)$;

2'. $\forall D \in Z(B) \ \exists C \in Z(A)$ such that
$$\Pi_{V(A)}\{(v,w) \in V(R^*) \mid w \in D\} \subset C .$$

Then
$$\Phi \mathcal{L}(A) = \mathcal{L}(B) .$$

8.9.9 Definition Let $A$ be an $L$-automaton, $B$ an $L'$-automaton, $\varphi : L' \to L$ a homomorphism, $\Phi$ the language homomorphism with support $\widehat{\varphi}|_{S(L)}$ and suppose
$$\theta : V(A) \to V(B)$$
is a map satisfying 1. $\theta I(A) \subset I(B)$;
2. $A(v,w) \leq \varphi B(\theta(v), \theta(w)) \ \forall \ v,w \in V(A)$;
3. $R(A) \subset \theta^{-1} R(B)$;
4. $\forall \ C \in Z(A) \ \exists \ D \in Z(B)$ such that $\theta(C) \subset D$.

Then the pair $(\Phi, \theta)$ is said to be a *state homomorphism* from $A$ to $B$, written
$$(\Phi, \theta) : A \to B .$$

If $\theta$ is onto, the containment/inequalities of 1.–3. are replaced by equalities and
$$Z(A) = \{\theta^{-1}(D) \mid D \in Z(B)\}$$
then $(\Phi, \theta)$ is said to be *exact*.

8.9.10 Theorem Let $A$ be an $L$-automaton, $B$ and $L'$-automaton and $(\Phi, \theta) : A \to B$ a state homomorphism. Then
$$\Phi \mathcal{L}(A) \subset \mathcal{L}(B) .$$

If $(\Phi, \theta)$ is exact then
$$\Phi \mathcal{L}(A) = \mathcal{L}(B) .$$

8.10 Automorphic Reduction of Symmetries

A special case of homomorphic reduction for (8.2.1) arises through symmetries of $P = \otimes P_i$.

8.10.1 Definition Let $X$ be an $L$-process or an $L$-automaton, suppose $\varphi : L \to L$ is an automorphism, let $\Phi$ be the language homomorphism with support $\widehat{\varphi}|_{S(L)}$ and suppose $\theta : V(X) \to V(X)$ is a bijection. Moreover, suppose $(\Phi, \theta)$ is exact. Then $(\Phi, \theta)$ is said to be a *state automorphism*.

A state automorphism may arise from a symmetry in a single component, when $\varphi$ is the identity and $\theta$ is induced by a map on the components, which is the identity on all but one component. For example, say $P = \otimes P_i$ and for $v = (v_1, \ldots, v_k) \in V(P)$, $\theta(v)_i = v_i$ for all but one value of $i$. An example of such a state automorphism appears in Appendix D. The circular queue presented there may be considered as a component of a larger system. All states with the same selection lie in the same orbit of the rotation map which rotates the states of the queue. By associating together all states with the same selection, in this example, the resulting state space drops in size by 2 orders of magnitude, a reduction which divides the size of the system of which it is a component. This automorphic reduction is less interesting, however, as it arises as a special case of state minimization, discussed in the previous section. This is true of all cases in which $\varphi$ is the identity, even if we allow the action of an entire group of automorphisms.

A more interesting and undoubtedly most common type of automorphic reduction arises from a permutation of various of the components of a product under a state automorphism. This corresponds to a structural symmetry in the global model. For example, suppose $P = A \otimes B \otimes C$, $\theta_A : V(A) \to V(B)$ is 1-1 and onto, and $\theta : V(P) \to V(P)$ by $\theta(v_A, v_B, v_C) = (\theta_A^{-1}(v_B), \theta_A(v_A), v_C)$. An example of this appears in the crossroad traffic controller example presented in Section 1.1. The automorphism $\varphi$ defined there induces a state automorphism through the component relations $\varphi A = B$, $\varphi B = A$. Again, in a fashion to be described, one may consider the orbits of the induced state map as defining an equivalence class and perform the verification test on the quotient process, illustrated in Figure 8.6.

One of the earliest discussions of reduction relative to symmetry appeared in [AKS83a]. In the example described there, the alternating bit protocol, the symmetry was not induced by a rotation within a single

8.10. Automorphic Reduction of Symmetries process such as in the circular queue, nor in a permutation of components as in the crossroad traffic controller. Rather, the symmetry was of a global nature, reflecting the symmetry between a global state representing a current message with check bit 0 vs. 1.

In all these cases, one achieves a reduction in the form of a quotient process whose states are the orbits of the state map in the original process. A special case of this reduction is when $\varphi$ is restricted to be the identity as in the first example (but $\theta$ is an arbitrary permutation of global states, subject to $(id, \theta)$ being a state automorphism). This special case recently has been applied in branching-time model-checking [CFJ93], [ES93], [ID93]. By restricting the Boolean algebra homomorphism to be the identity (after projecting the Boolean algebra of state propositions to the subalgebra relevant to the formula with respect to which their model is checked), they consider reductions obtained by applying a group of state automorphisms in the same way: two states are equivalent if they lie in the same orbit under the action of the group. Determining whether two states lie in the same orbit can be done in time quadratic in the number of states (assuming preprocessing time polynomial in the number of states and number of group generators): simply take the union of the state transition relations defined by the group generators; two states are in the same orbit if and only if they lie in the same strongly connected component of the graph defined by that union. However, this type of reduction (when $\Phi = id$) is a special case of minimization with respect to bisimulation equivalence for branching-time logic (such as CTL), and is a special case of state minimization for linear-time logic for automata; each of these can be done in time $O(pn^2)$ for a quotient of size $n$ and $p$ inputs [LY92].

Here, we consider the case of cyclic groups (generated by a single state automorphism), but allow the greater generality of a nontrivial Boolean algebra homomorphism, in place of the identity map. This may have considerable practical value, as in the last two examples cited above. Moreover, the problem of identifying elements in the same orbit is tractable for this special case. (Note that since taking quotients is noncompositional, i.e., it does not distribute over product, applying group generators one at a time in successive quotients is of no value as a reduction, since it requires building the larger space before computing the smaller space.)

8.10.2 Definition Let $L$ be a finite Boolean algebra, let $X$ be an $L$-process or an $L$-automaton and let $\alpha = (\Phi, \theta)$ be a state automorphism 194                     *Chapter 8. Reduction of Verification* of $X$. An *orbit* of $\alpha$ is a set of the form $$[v] \equiv \{\theta^n(v) \mid n \geq 0\}$$

for some $v \in V(X)$, where $\theta^n$ is $n$-fold composition. For $C \subset V(X)$, set $[C] = \{[v] \mid v \in C\}$.

8.10.3 Lemma $v \sim w \Leftrightarrow [v] = [w]$ *is an equivalence relation.*

8.10.4 Definition Suppose $L$, $X$ and $\alpha$ are as in (8.10.2), and $X$ is node-recurring. The *quotient* $X/\alpha$ is a B-process (respectively, B-automaton) defined as follows:

$V(X/\alpha)$ is the set of orbits of $\alpha$ ;

$\widehat{v} \in I(X/\alpha) \Leftrightarrow v \in I(X)$ for some $v \in \widehat{v}$ ;

$(\widehat{v}, \widehat{w}) \in E(X/\alpha) \Leftrightarrow (v,w) \in E(X)$ for some $v \in \widehat{v}, w \in \widehat{w}$ ;

$(\widehat{v}, \widehat{w}) \in R(X/\alpha) \Leftrightarrow (v,w) \in R(X)$ for some $v \in \widehat{v}, w \in \widehat{w}$ ;

$C \in Z(X/\alpha) \Leftrightarrow \bigcup_{\widehat{v} \in C} \widehat{v} \in Z(X)$ .

8.10.5 Lemma $\widehat{v} \in I(X/\alpha), v \in \widehat{v} \Rightarrow v \in I(X)$.

8.10.6 Lemma $(v,w) \in E(X), ([v],[w]) \in R(X/\alpha) \Rightarrow (v,w) \in R(X)$.

Proof. By the definition of quotient, for some $v' \in [v], w' \in [w]$, we have $(v',w') \in R(X)$. Then for some $n \geq 0$, $\theta^n(w') = w$. Since $\alpha$ is a state automorphism, $(\theta^n(v'), w) \in R(X)$. Thus, since $X$ is node-recurring, $(v,w) \in R(X)$.

8.10.7 Lemma *For* $C \subset V(X), C \in Z(X) \Leftrightarrow [C] \in Z(X/\alpha)$.

8.10.8 Theorem $\mathcal{L}(X) = \varphi \Leftrightarrow \mathcal{L}(X/\alpha) = \varphi$.

Proof. Suppose v is a run of $X$, $\mathbf{v} = (v_0, v_1, \ldots)$. Let $[\mathbf{v}]$ denote $([v_0], [v_1], \ldots)$. By definition of the quotient $[\mathbf{v}]$ crosses a recur edge of the quotient each time v crosses a recur edge of $X$. Furthermore, by

8.10. Automorphic Reduction of Symmetries

Figure 8.5: Situation in the proof of (8.10.6).

Lemma 8.10.6, each time $v$ crosses a nonrecur edge of $X$, $[v]$ crosses a nonrecur edge of $X/\alpha$. Moreover, by Lemma 8.10.7, if $\mu(v) \subset C \in Z(X)$ then $\mu([v]) \subset [C] \in Z(X/\alpha)$. Finally, if $\mu([v]) \subset \widehat{C} \in Z(X/\alpha)$ then by Lemma 8.10.7, $\widehat{C} = [C]$ for some $C \in Z(X)$ and thus, by the definition of $Z(X/\alpha)$, $\mu(v) \subset C$.

8.10.9 Example We return once again to the example of the crossroad traffic controller of Section 1.1. If we consider $X = A \otimes B \otimes C$ then $\mathcal{L}(X) \subset \mathcal{L}(T_A) \Leftrightarrow \mathcal{L}(X \otimes T_A^\#) = \phi$. Hence, we may attempt to apply automorphic reduction to $X \otimes T_A^\#$. However, this is asymmetric on account of the asymmetry contributed by $T_A^\#$. On the other hand, if instead we decide to test $\mathcal{L}(X) \subset \mathcal{L}(T_1)$ or $\mathcal{L}(X) \subset \mathcal{L}(T_2)$, these both are symmetric, and the previous theorem applies. For simplicity, let us consider the test $\mathcal{L}(X \otimes T_1^\#) = \phi$. Let $\Phi$ be the language homomorphism induced by the automorphism $\varphi$ defined in Section 1.1. Set $P = X \otimes T_1^\#$. We seek a state automorphism $\alpha = (\Phi, \theta)$ where $\theta : V(P) \to V(P)$. The desired map is induced by the process map $\varphi A = B$, $\varphi B = A$, $\varphi C = C$. Note that this map establishes a de facto state map: the $i$-th state of $A$ maps to the $i$-th state of $B$ and vice versa. This induces the required $\theta$, simply by reordering the state components to their original order. For example, considering $\varphi$ as a process map, $$\varphi P = (\varphi A) \otimes (\varphi B) \otimes (\varphi C) \otimes (\varphi T_1)$$
$$= B \otimes A \otimes C \otimes T_1 .$$

Restoring the original order gives $$\theta(v_i, v_j, w, u) = (v_j, v_i, 1 - w, u)$$

196                    Chapter 8. Reduction of Verification where $v_i$, $v_j$, $w$, $u \in \{0,1\}$ refer to the original of the state in the respective process. Thus, for $v = $ (STOP, GO, go_A, 1) $\in V(P)$, $$\theta(v) = (GO, STOP, go\_B, 1).$$

Since $\theta^2 = id$, $|[v]| = 2$ for all $v \in V(P)$. The quotient $P^*/\alpha$ is illustrated in Figure 8.6.

Figure 8.6: The graph of $P^*$ reduces to its quotient $P^*/\alpha$ as shown. Here, the state of $T_1$, which is identically 1, is suppressed; the states of $A$, $B$, $C$ are abbreviated.

8.10.10 Notes

1. In general, if $X$ is an $L$-process or $L$-automaton and $\alpha = (\Phi, \theta)$ is a state automorphism on $X$, if $\theta^n = id$ and $\theta^m \neq id$ for $0 < m < n$, then $|[v]| = n$ for each $v \in V(X)$, so $|X/\alpha| = \frac{1}{n}|X|$.

8.11. Homomorphism Verification

2. If $(\Phi, \theta)$ is a state automorphism and $\varphi$ is the Boolean algebra automorphism induced by $\Phi$, say $\varphi : L \to L$, then $\widehat{\varphi} = \varphi^{-1}$ is also an automorphism. The orbits of $\varphi$ partition $L$ and induce a subalgebra $L' \subset L$ as in Example 4.2.21. Thus, there could be a temptation to define the quotient as an $L'$-process (or $L'$-automaton) instead of a $\mathbb{B}$-process (or $\mathbb{B}$-automaton) as was done. However, that would be pointless, as the reduction induced by the inclusion homomorphism $L' \to L$ (cf. (4.2.21)) preserves neither compositionality nor language.

3. Of course it would be pointless to compute a quotient $X/\alpha$ from $X$, as it is the computational complexity associated with building $X$ which we are trying to avoid. There are a few ways to deal with this problem. If states are generated explicitly, as each state is generated (to be stored in a reached state table), its orbit can be generated, and it need be stored only if no representative of its orbit has yet been reached, as suggested in [AKS83a]. On the other hand, as this orbit computation could be expensive, it is better to try to find a function from a state to a representative, as suggested in [ID93]. It could be simpler to allow the function to return various representatives (as long as the number of distinct values is not too large) than insist upon a unique representative for each orbit. If states are generated implicitly as described in Chapter 10, then a relation which defines the state automorphism can be used to define a unique representative of each orbit, as in [CFJ93]. This then is combined with the transition relation to define the transition relation for the quotient.

8.11 Homomorphism Verification

In order to verify a homomorphic reduction as in Theorem 8.5.2, we are required to verify co-linearity. For this, we require the test $$\Phi(\mathcal{L}_1) \subset \mathcal{L}_2 \qquad (*)$$

where $\mathcal{L}_1 = \mathcal{L}(X)$ and $\mathcal{L}_2 = \mathcal{L}(X')$ for processes $X, X'$ (over possibly different Boolean algebras) whose transition matrices we may assume (by Theorem 6.2.55) to be deterministic, and $\Phi$ is a language homomorphism. To verify strong co-linearity, we require the same test for automata $X, X'$ which (by Theorem 6.2.54) we may assume to be deterministic. To verify a task decomposition we need a test of $(*)$ for $\mathcal{L}_1 = \cap \mathcal{L}(T_i)$, $\mathcal{L}_2 = \mathcal{L}(T)$ for deterministic automata $T_i, T$. Finally, in order to use Theorems 8.8.9, 8.8.11 we require a test of the containment $(*)$ when $X$ is a process and $X'$ is an automaton (respectively, $X$ is an automaton and $X'$ is a process). Thus, in general, it is sufficient to 198                           Chapter 8. Reduction of Verification provide algorithms for the following four cases: $\mathcal{L}_1 = \mathcal{L}(P)$ for a process $P$, $\mathcal{L}_1 = \bigcap_{i=1}^{k} \mathcal{L}(A_i)$ for automata $A_1, \ldots, A_k$, and similarly for $\mathcal{L}_2$, but with deterministic transition structures. Tests for these four cases are summarized in the table: Figure 8.7.

Let $\varphi$ be the Boolean algebra homomorphism whose support is the support of $\Phi$. Each Test in the table is a necessary and sufficient condition for (∗) in each respectively case.

| $\mathcal{L}_1$ \ $\mathcal{L}_2$ | $\mathcal{L}_2 = \mathcal{L}(Q)$ for $L'$-process $Q$ with $M_Q$ deterministic. | $\mathcal{L}_2 = \bigcap_{i=1}^{m} \mathcal{L}(B_i)$ for deterministic $L'$-automata $B_1, \ldots, B_m$. |
|---|---|---|
| $\mathcal{L}_1 = \mathcal{L}(P)$ for $L$-process $P$ | 1. Construct simple decomposition $\mathcal{L}(Q) = \cap \mathcal{L}(Q_i)$<br>2. Test for each $i$:<br>$\mathcal{L}(P \otimes (\varphi Q_i)^*) = \phi$<br>cxty: $\|P\|\|Q\|(1 + \|Z(Q)\|)$ per (8.8.8.3) | Test for each $i$<br>$\mathcal{L}(P \otimes \|\varphi B_i\|^*) = \phi$<br>cxty: $\sum \|P\|\|B_i\|$ |
| $\mathcal{L}_1 = \bigcap_{i=1}^{k} \mathcal{L}(A_i)$ for arbitrary $L$-automata $A_1, \ldots, A_k$ | 1. Construct simple decomposition for each $i$<br>$\mathcal{L}(A_i) = \cup \mathcal{L}(A_{ij})$<br>2. Construct simple decomposition $\mathcal{L}(Q) = \cap \mathcal{L}(Q_i)$<br>3. Test for each $(j_1, \ldots, j_k, i)$<br>$\mathcal{L}(A_{1j_1} \otimes \cdots \otimes A_{kj_k} \otimes (\varphi Q_i)^*) = \phi$<br>cxty: $(\Pi\|A_i\|\|Z(A_i)\|)\|Q\|(\|Z(Q)\| + 1)$ | 1. Construct simple decomposition for each $i$<br>$\mathcal{L}(A_i) = \cup \mathcal{L}(A_{ij})$<br>2. Test for each $(j_1, \ldots, j_k, i)$<br>$\mathcal{L}(A_{1j_1} \otimes \cdots \otimes A_{kj_k} \otimes \|\varphi B_i\|^*) = \phi$<br>cxty: $\sum (\Pi\|A_i\|\|Z(A_i)\|)\|B_j\|$ |

Figure 8.7: Verifying the homomorphism $\Phi(\mathcal{L}_1) \subset \mathcal{L}_2$

8.12 Lifting Homomorphisms

Typically, a "system" $P$ is modelled as a product of processes: $P = \otimes P_i$. If $P'$ is a reduction of $P$ (cf. Theorem 8.5.2) it is common that $P'$ also is formed as a product $P' = \otimes P_i'$ with a correspondence between various $P_j$'s and $P_i'$ for each $i$. As a special case of this, the following theorem shows that in order to verify $\Phi \mathcal{L}(P) \subset \mathcal{L}(P')$, it is enough to verify $\Phi \mathcal{L}(P_i) \subset \mathcal{L}(P_i')$ for each $i$. Since the complexity of $P$

8.12. Lifting Homomorphisms tends to grow geometrically with the number of its components, it is far simpler to conduct the component tests. The Corollary 8.12.4 gives an important generalization which is more practical, in that it covers the lifting of homomorphisms from components.

8.12.1 Theorem *Let $P_1, \ldots, P_m$ be $L$-processes, $Q_1, \ldots, Q_n$ be $L'$-processes and $\Phi : S(L)^\omega \to S(L')^\omega$ a language homomorphism. Suppose for some indices $j_{i1}, \ldots, j_{im_i}$ whose union ($1 \leq i \leq n$) is $1, \ldots, m$, $\Phi \mathcal{L}(P_{j_{i1}} \otimes \cdots \otimes P_{j_{im_i}}) \subset \mathcal{L}(Q_i) \; \forall i$. Then*

$$\Phi \mathcal{L}(\otimes P_i) \subset \mathcal{L}(\otimes Q_i) .$$

Proof. By Lemma 6.2.39.

8.12.2 Note If $P$ is an $L'$-process and $L' \subset L$ (subalgebra) then $P$ is an $L$-process.

8.12.3 Definition For any $L$-automaton or $L$-process $X$, define $\mathbb{B}(X)$ to be the smallest subalgebra of $L$ such that $X$ is a $\mathbb{B}(X)$-automaton or a $\mathbb{B}(X)$-process, respectively.

While Theorem 8.12.1 gave the means to patch together a system homomorphism from homomorphisms on components, for this result, each component homomorphism must be defined on all of $L$, an unnecessary burden. We finally may make this result practical by showing that in fact the patching can be implemented by "lifting" homomorphisms of subalgebras, as in the homomorphism product construction given by the Lifting Lemma 2.2.1.

8.12.4 Corollary *Suppose $P_1, \ldots, P_m$ are $L$-processes and $Q_1, \ldots, Q_n$ are independent $L'$-processes with $L' = \Pi L_{Q_j}$, and $\forall i \; \mathbb{B}(Q_i) \subset \prod_{j \in J_i} L_{Q_j}$, for some $J_i \subset \{1, \ldots, n\}$. Suppose further that for each $i$ there is a homomorphism*

$$\varphi_i : L_{Q_i} \to L$$

*such that for $\psi_i = \prod_{j \in J_i} \varphi_j$ and for some $I_i \subset \{1, \ldots, m\}$ with $\bigcup_{i=1}^{n} I_i = \{1, \ldots, m\}$, we verify that*

$$\mathcal{L}(\bigotimes_{j \in I_i} P_j) \subset \mathcal{L}(\psi_i Q_i) .$$

200                    Chapter 8. Reduction of Verification

If $\Phi : S(L)^\omega \to S(L')^\omega$ is the language homomorphism with support $(\widehat{\Pi_{\varphi_i}})|_{S(L)}$, then
$$\Phi\mathcal{L}(\odot P_i) \subset \mathcal{L}(\otimes Q_i) .$$

8.12.5 Notes

1. The $I_i$'s may overlap, as may the $J_i$'s.

2. The same result holds (requiring fewer — but more stringent tests) if we replace $\mathbb{B}(Q_i)$ with $\mathbb{B}(R_i)$ and $\mathcal{L}(\psi_i Q_i)$ with $\mathcal{L}(\psi_i R_i)$ for $R_i = \bigotimes_{j \in H_i} Q_j$ with $\cup H_i = \{1, \ldots, n\}$, and $\psi_i = \prod_{h \in H_i} \prod_{j \in J_h} \varphi_j$.

3. Let $P$ be an $L$-process and $T$ an $L$-automaton. Suppose $L', L'' \subset L$ are independent subalgebras, $\mathbb{B}(T) \subset L'$ and $\Pi_{L'}(L_P)$ is a subalgebra of $L$. Then
$$\mathcal{L}(P) \subset \mathcal{L}(T) \Leftrightarrow \mathcal{L}(\Pi_{L'} P) \subset \mathcal{L}(T)$$
(as in Lemma 3.2.6) and it may be more convenient to deal with the $L'$-process $\Pi_{L'} P$ and the $L'$-automaton $T = \Pi_{L'} T$, than with the $L$-process $P$. In fact, it may be possible to apply a standard state minimization algorithm (such as that of Hopcroft [Hop71]) to $\Pi_{L'} P$, and thereby derive an $L'$-process $P'$ with $|V(P')| < |V(P)|$ and $\mathcal{L}(P') = \mathcal{L}(\Pi_{L'} P)$. A common way of thinking of the projection $\Pi_{L'}$ is as an "internalizing" of the selections $S(L'')$. A significant practical observation is that a "missing" $\varphi_i$ in Corollary 8.12.4 corresponds to such an internalizing of the selections $S(L_{Q_i})$, that is, projecting out of $L_{Q_i}$. Therefore, in actual verification, it is prudent to take note of such a missing $\varphi_i$ and to understand that the result of the verification corresponds to such a projection.

4. In view of note 3., the question arises: what is the appropriate abstract model for a given step of successive refinement (Figure 8.4) — the $L$-process $P$ or the $L'$-process $\Pi_{L'} P$ (or $P'$)? There is no absolute answer to this, except that in order to verify the inheritance of task-performance to each successive refinement, $L'$ must be big enough to contain $\mathbb{B}(T)$ for each task $T$ proved for $P$. Additionally, $L'$ should contain all components of $L$ necessary to define the "significant" behaviors of $P$. Another possible reason to use a larger $L'$ is to allow for the more stringent test of note 2., where in fact for each $H_i$, the enlarged $\psi_i$ serves as a "helper" to resolve nondeterminism in a "principle" $Q_i$, in much the same fashion as a state homomorphism of Section 8.5.

5. A convenient way to define a homomorphism $\varphi : L' \to L$ (especially for small component homomorphisms $\varphi = \varphi_i : L' = L_{Q_i} \to L$)

8.12. Lifting Homomorphisms is through an "if-then-else" syntax involving $S(L')$: if the atoms of $L'$ are represented by the values of a scalar variable $\alpha - S(L') = \{(\alpha = a_1), (\alpha = a_2), \ldots\}$, then by Corollary 2.1.13 every homomorphism $\varphi$ may be defined uniquely as a linear extension of $$\varphi(\alpha = a_1) = \text{EXPR}_1$$
$$\varphi(\alpha = a_2) = \text{EXPR}_2$$
$$\vdots$$

where the $\text{EXPR}_i$ are expressions in the variables defining $L$, as long as the $\text{EXPR}_i$'s are mutually exclusive and sum to 1. Thus, every homomorphism may be defined through the syntactic representation:

$$\text{hom } \alpha := \quad a_1 \quad \text{if } \text{EXPR}_1$$
$$\text{else } a_2 \quad \text{if } \text{EXPR}_2$$
$$\vdots$$
$$\text{else } a_n$$

and every such syntactic representation defines a homomorphism. If $\text{EXPR}_1, \sim\text{EXPR}_1 * \text{EXPR}_2, \ldots, \sim\text{EXPR}_1 * \cdots * \sim\text{EXPR}_{n-1}$ are all satisfiable, then $\ker \varphi$ is all sums of the form $\sum_j (\alpha = a_{i_j})$ where $i_j > n$, i.e. $\ker \varphi$ is generated by all atoms $(\alpha = a_i)$ where $a_i$ is in the range of $\alpha$ but does not appear in the above "hom" declaration.

6. The currently best known method for generating reductions is guessing: guess $P'$, $T'$ and $\Phi$ based upon knowledge of $P$ and $T$ (and the parts of $P$ upon which $T$ depends); then a computer which implements the algorithms of Figure 8.7 may be used to verify that $\Phi$ is co-linear for $(P, T; P', T')$. This has been demonstrated to be quite effective, in a spectrum of controller models arising in industrial settings, especially controllers for communication protocols and cache coherency protocols, for example [HK90]. In practice, this method often involves several iterations: given $(P', T')$, find an artifactual error $\mathbf{x} \in \mathcal{L}(P') \setminus \mathcal{L}(T')$ — artifactual since $\Phi^{-1}(\mathbf{x}) \cap \mathcal{L}(P) = \phi$ — adjust the candidate reduction $(P', T')$ accordingly, and repeat. Likewise, the guess may in fact fail to be a reduction, in which case it is similarly adjusted and repeated. These iterations have not generally been found to be a bottleneck in the methodology. Finding the minimal reduction $(P', T')$ ($|P'|$ minimal) such that $$\Phi^{-1}(\mathcal{L}(P') \setminus \mathcal{L}(T')) \subset \mathcal{L}(P) \setminus \mathcal{L}(T)$$

is more difficult than finding a minimal exact reduction of $(P, T)$, and the latter problem is NP-complete in $|E(T)|$ [Kur87b, Corollary to Proposition 6]. However, this is feasible when $|E(T)|$ is small (and $|E(T)|$ often 202                             Chapter 8. Reduction of Verification is small). The foregoing presupposes that $P$ actually can be constructed explicitly (cf. Example 8.5.7). However, it is typical that $P = \otimes P_i$ cannot be constructed explicitly (otherwise, reduction would be only of marginal benefit). In case $P$ cannot be constructed explicitly, finding a minimal reduction is NP-complete in $|E(T)| + \sum_i |E(P_i)|$, rendering it computationally infeasible in practice. Therefore, one must rely upon "guessing" as described above, or some other heuristic. Especially in a case that analysis is performed by someone who is less than intimately familiar with the system design, "guessing" may not be a viable approach for generating reductions; thus, one seeks a more automatable heuristic for generating reductions, such as the one described in Example 8.5.8. However, that heuristic may not give adequate results on account of the potential that the sizes of the intermediate reductions $P'_i$ may grow unnecessarily large, due to the arbitrary ordering of reductions imposed by the (arbitrary) ordering of the components $P_i$. Furthermore, no suggestion was given in Example 8.5.8 concerning how coarse to allow the partitions $\pi_i$ to be, (other than the required consistency with $T$). A viable alternative is given next. Starting with $T$, take the coarsest portion $\pi$ consistent with $T$; $\forall i$ let $P_i^{(1)}$ be a state minimization of $P_i$ relative to $\pi$, and test $\mathcal{L}(P^{(1)}) \subset \mathcal{L}(T^{(1)})$, where $P^{(1)} = \otimes P_i^{(1)}$ and $T^{(1)} = T$ (or more precisely, $T^{(1)} = \hat{\varphi}T$ where $\varphi$ is the induced homomorphism). If the language containment test fails, it is easy to test a counterexample $x$ generated from that failure against $P = \otimes P_i$ (without explicitly constructing the product) to see if $\Phi^{-1}(x) \cap \mathcal{L}(P) \neq \phi$; if yes, then $y = \Phi(x)$ for some $y \in \mathcal{L}(P)$ and $y \notin \mathcal{L}(T)$. Otherwise, find a minimal refinement $\pi^{(2)}$ of $\pi$ together with a minimal expansion of the state spaces of $P_i^{(1)}$ (split some states of $P_i^{(1)}$ by distinguishing otherwise equivalent states in $P_i$) so that for the resulting $P_i^{(2)}$, with $P^{(2)} = \otimes P_i^{(2)}$, $\Psi^{-1}(x) \cap \mathcal{L}(P^{(2)}) = \phi$, where $\Psi$ is induced by the inclusion homomorphism $\Psi : \mathbb{B}[\bar{\pi}] \to \mathbb{B}[\pi^{(2)}]$ (cf. Example 8.5.7). For $T^{(2)} = \Psi T^{(1)}$, test $\mathcal{L}(P^{(2)}) \subset \mathcal{L}(T^{(2)})$, and iterate as above. Each $(P^{(i)}, T^{(i)})$ is a reduction of $(P, T)$, and $|P^{(i)}|$ increases monotonically, so there is no intermediate blow-up as in Example 8.5.8. Furthermore, for some $n$, $P^{(n)} = P$ and $T^{(n)} = T$ so this algorithm is a decision procedure for testing $\mathcal{L}(P) \subset \mathcal{L}(T)$, through a series of sufficient tests of increasing complexity. One serious drawback of this algorithm may be that it advances too slowly: $n$ is too large. Therefore, it could be worthwhile to let $\pi^{(i+1)}$ be a larger than minimal refinement of $\pi^{(i)}$ or split more than the minimal possible number of states in $P_j^{(i)}$, in order to accelerate the algorithm. One implementation of this is the localization reduction algorithm of Section 8.4.

Chapter 9

Structural Induction

This chapter, taken from [KM89], deals with the formal verification of finite state systems that have an arbitrary number of isomorphic components. Many protocols that occur in computers and communication are finite state, but are parameterized on the number of components in the system. For example, a network protocol may allow for an arbitrary number of hosts, or a system bus protocol may allow for an arbitrary number of processors. Since the structure of the system is *defined* inductively, some form of inductive reasoning is required to prove that the system performs a given task. This chapter presents a technique for inductively generalizing a single test on a system of fixed size in order to show that another system, defined in terms of an integer parameter, performs the given task for all values of the parameter. This makes it possible to use finite state verification systems, such as COSPAN to verify parameterized designs. The method also may be useful for systems of fixed size, since it reduces the size of the system that must be checked automatically. This is significant because of the number of states of a system grows exponentially with the number of components. The basis of this method is the *structural induction theorem* for processes, Theorem 9.1.1.

There are a number of methods for verifying properties of systems with an unbounded number of isomorphic processes. The regularity of systems of isomorphic processes may facilitate the construction of a homomorphic reduction in such systems, with or without exploiting the symmetry through an automorphic reduction as in Section 8.10. The analysis of the reduced system may be carried out automatically in time

Chapter 9. Structural Induction linear in the size of the reduced system. However, the available reduction algorithms are not guaranteed to provide a tractable reduction, or find one, when one exists (they are not optimal). Moreover, systems of unbounded size are not verifiable using the techniques developed thus far. Browne, Clarke and Grumberg [BCG86] introduced a method which uses an indexed form of branching-time temporal logic for specifications. Their method requires the *ad hoc* establishment of a form of bisimulation equivalence [KS90] between global state graphs of systems of different size. This equivalence must be strong enough so that any two states in the same equivalence class satisfy the same set of formulas in the logic. In practice, this means that several restrictions must be placed on the logic. One of these restrictions is that the "next-time" operator is not allowed. Another restriction is that it is not possible to nest process quantifiers, with the consequence that some global system properties cannot be stated. Another method, due to German and Sistla [GS92], uses a linear-time temporal logic for specifications (again, the next-time operator is not allowed). Their method is fully automatic (*i.e.*, a bisimulation on structures of arbitrary size need not be established). By means of a distinguished "control" process, it is possible to check some global properties (although process quantifiers are not present in the logic). Unfortunately, the decision algorithm for this case is doubly exponential in the process size. Methods similar to those described in this chapter can be found in [WL89, SG89].

The induction method presented here does not show satisfaction of a temporal logic formula by a model, but is based upon testing language containment of $L$-processes. The actual method is not restricted to $L$-processes, however, but is quite general, applying to any models with an associated transitive reflexive relation (such as language containment), and may be, for example, one of the preorders for CCS processes [Hen88, Wal88]. There is no requirement that all systems, regardless of the size parameter, satisfy the same set of formulas in a logic. This makes the present method substantially more flexible than the methods mentioned above. In particular, "next-time" properties and global properties such as mutual exclusion are easily specified. The method is not fully automatic, since an "invariant" process must be provided to carry out the induction step. Given this process, however, the checking procedure reduces to an ordinary language-containment check for $L$-process (of fixed size).

Often the invariant process may be obtained by composing a small number of the system processes, then making minor modifications. In other cases, no modification is necessary; there exists some finite num-

*9.1. The Structural Induction Theorem* 205 ber of system processes which will serve as an invariant. Then again, there may be cases where a simple invariant process can be constructed based on an *ad hoc* abstraction of an arbitrary subset of the system processes. With an invariant in hand, the induction theorem requires us to show three things. First, the "base case": the invariant must have all the behaviors of the product of some finite number $m$ of system processes. Second, the "induction step": the product of the invariant with the $(m+1)^{th}$ system process is generalized by the invariant. Finally, the "satisfaction test": the invariant process must perform the task. Of course, it is not necessary to guess a correct invariant at the first attempt. Since the above three checks may be carried out automatically, it is easy to experiment with different invariants until a correct one is found. For an application of the induction theorem to a network protocol, see [KMOS94].

9.1 The Structural Induction Theorem

Let $\mathcal{P}$ be a set of $L$-processes and let $\varphi : L \to L$ be a Boolean algebra homomorphism which for any $P \in \mathcal{P}$, satisfies $\varphi P \in \mathcal{P}$. Thus, $\varphi$ induces a map $\varphi : \mathcal{P} \to \mathcal{P}$.

9.1.1 Theorem *Let $\{P_1, P_2, \ldots, P_n\}$ and $\{Q_1, Q_2, \ldots, Q_n\}$ be two sets of processes in $\mathcal{P}$. Let $m$ be an integer $1 \leq m < n$ such that for all $i$ satisfying $m < i < n$, $P_{i+1} = \varphi(P_i)$ and for all $i$ satisfying $m \leq i < n$, $Q_{i+1} = \varphi(Q_i)$. If*

$$\mathcal{L}\left(\bigotimes_{i=1}^{m} P_i\right) \subset \mathcal{L}(Q_m) \tag{9.1}$$

*and*

$$\mathcal{L}(Q_m \otimes P_{m+1}) \subset \mathcal{L}(Q_{m+1}) \tag{9.2}$$

*then for all $k$ satisfying $m \leq k \leq n$,*

$$\mathcal{L}\left(\bigotimes_{i=1}^{k} P_i\right) \subset \mathcal{L}(Q_k). \tag{9.3}$$

Proof. If $n = m + 1$ then (9.3) follows from (5.1.16), (9.1) and (9.2) directly. Otherwise, applying properties (3.3.7.c) and (6.3.7.a) of $\varphi$ to proposition (9.2) above, we have $$\mathcal{L}(\varphi(Q_m) \otimes \varphi(P_{m+1})) \subset \mathcal{L}(\varphi(Q_{m+1})) \tag{9.4}$$

206                              *Chapter 9. Structural Induction* and $P_{m+2} = \varphi(P_{m+1})$, $Q_{m+1} = \varphi(Q_m)$ and $Q_{m+2} = \varphi(Q_{m+1})$. Applying $\varphi$ to (9.2), get $$\mathcal{L}(Q_{m+1} \otimes P_{m+2}) \subset \mathcal{L}(Q_{m+2}) \qquad (9.5)$$

and, by repeated application of the above two steps, $$\forall i, m \leq i < n : \mathcal{L}(Q_i \otimes P_{i+1}) \subset \mathcal{L}(Q_{i+1}). \qquad (9.6)$$

Using the monotonicity property of $\otimes$, we compose both sides of (9.1) with $P_{m+1}$ to obtain $$\mathcal{L}\left(\bigotimes_{i=1}^{m+1} P_i\right) \subset \mathcal{L}(Q_m \otimes P_{m+1}) \qquad (9.7)$$

which, using (9.6) and the transitivity of $\leq$ gives us $$\mathcal{L}\left(\bigotimes_{i=1}^{m+1} P_i\right) \subset \mathcal{L}(Q_{m+1}). \qquad (9.8)$$

Again, by repeated application of these two steps, $$\forall k, m \leq k \leq n : \mathcal{L}\left(\bigotimes_{i=1}^{k} P_i\right) \subset \mathcal{L}(Q_k) \qquad (9.9)$$

The significance of theorem 9.1.1 is that the antecedents, conditions (9.1) and (9.2), make no reference to $n$, the number of processes in the array. Thus, by proving two propositions about arrays of fixed size $m$, we may draw a conclusion about an array of arbitrary size $n$. In general, given an array $P = \bigotimes_{i=1}^{n} P_i$, and a specification (or task) $T$, we can use the theorem to prove some statement of the form $\mathcal{L}(P) \subset \mathcal{L}(T)$, or $\mathcal{L}(P') \subset \mathcal{L}(T)$, where $P'$ is some reduction of $P$. In order to do this, we need the following elements: the process invariant $Q_i$, the homomorphism $\varphi$, and a method of automatically verifying conditions (9.1) and (9.2). Given these, we will be able to replace the problem of verifying $\mathcal{L}(P) \subset \mathcal{L}(T)$ or $\mathcal{L}(P') \subset \mathcal{L}(T)$ with verifying $\mathcal{L}(Q_n) \subset \mathcal{L}(T)$ or $\mathcal{L}(Q'_n) \subset \mathcal{L}(T)$. In the cases of interest, $T$ is independent of $n$, $Q_n$ has a fixed size independent of $n$, and these tests are straight-forward.

We should note that although the automatic checks require only a single invariant process $Q_m$, the proof of the theorem involves a sequence of processes $Q_m \ldots Q_n$. The reason for using this sequence will become apparent when we consider an example of ring structured systems. In

9.2 Example: Dining Philosophers this case we would like the invariant to apply to the behavior visible at the ends of a string of processes of arbitrary length. Since the "end" process is parameterized on $i$, the invariant also must be parameterized on $i$. Although the invariant is parameterized, we can prove (9.1) and (9.2) using only a fixed parameter $m$.

Although we require very little structure for the theorem (only (5.1.16), (3.3.7.c), (6.3.7.a)), in order to apply the theorem, we make use of some additional structure, namely that $\otimes$ is associative and for all $P, Q, R \in \mathcal{P}$,

- $\otimes$ is left-monotonic with respect to $\subset$, i.e., $$\mathcal{L}(P) \subset \mathcal{L}(Q) \Rightarrow \mathcal{L}(R \otimes P) \subset \mathcal{L}(R \otimes Q) ; \quad (9.10)$$

- $\otimes$ is decreasing with respect to $\subset$, i.e., $$\mathcal{L}(P \otimes Q) \subset \mathcal{L}(Q) ; \quad (9.11)$$

- $\otimes$ is symmetric with respect to $\subset$, i.e., $$\mathcal{L}(P \otimes Q) \subset \mathcal{L}(R) \Leftrightarrow \mathcal{L}(Q \otimes P) \subset \mathcal{L}(R) ; \quad (9.12)$$

- $\otimes$ is idempotent with respect to $\subset$, i.e., $$\mathcal{L}(P) \subset \mathcal{L}(P \otimes P) . \quad (9.13)$$

Note that from (9.11) and (9.13), $\mathcal{L}(P \otimes P) \subset \mathcal{L}(P) \subset \mathcal{L}(P \otimes P)$; from (9.11) and (9.12), $\mathcal{L}(P \otimes Q) \subset \mathcal{L}(P)$; and from (5.1.16) and (9.10), $\mathcal{L}(P) \subset \mathcal{L}(Q, R) \subset \mathcal{L}(S) \Rightarrow \mathcal{L}(P \otimes R) \subset \mathcal{L}(Q \otimes S)$ so, in particular, by (9.13), $$\mathcal{L}(P) \subset \mathcal{L}(Q), \ \mathcal{L}(P) \subset \mathcal{L}(R) \Rightarrow \mathcal{L}(P) \subset \mathcal{L}(Q \otimes R) . \quad (9.14)$$

The structural induction theorem applies in any setting where the process preorder has the properties.

9.2 Example: Dining Philosophers

We assume the reader is familiar with Dijkstra's famous Dining Philosopher's paradigm [Dij71]. By breaking the symmetry of the network, we present an implementation which prevents deadlock, and hence 208                               Chapter 9.  Structural Induction starvation of the philosophers. This is accomplished through introduction of a "negative" token (the "encyclopedia"), which is passed around the ring of philosophers [Kur85a]. The rules of the game are as follows. Each philosopher is in one of three states: thinking, eating, or reading (the encyclopedia). A thinking philosopher who becomes hungry may begin eating if neither of his neighbors is currently eating, and if his neighbor to the right is not hungry. However, if he is not hungry, and his neighbor to the right is currently reading, he takes the encyclopedia and enters the reading state.

Our formal model of the algorithm for $n$ dining philosophers is the $L$-process $P = \bigotimes_{i=1}^{n} P_i$, where $P_i$ is as defined below. Each process $P_i$ has three states: THINK, EAT and READ. The initial state of $P_i$ is THINK for $i > 1$ and READ for $i = 1$. Thus the encyclopedia starts at philosopher 1, breaking the symmetry. The Boolean algebra $L$ is defined in terms of $n$ selection variables, $x_1 \ldots x_n$, all of which have the domain {*think, hungry, eat, read*}. The process model for $P_i$ is defined in the $S/R$ language [KK86] in Figure 9.1: a process is formed by instantiating a proctype through respective substitution of selection variables $x_1, x_2, \ldots$ in place of the formal parameters of type *selection* in the proctype declaration P(). (In the instantiation of P() for $i = n$, $x_1$ substitutes for the formal parameter x_i_plus_1.) The trans statement defines the allowable values of the local selection variable as a function of each state, as a name-list within braces, and defines the conditions for making a transition from one state to another. For example, in the THINK state, a philosopher process $P_i$ may select either $x_i = think$ or $x_i = hungry$. It makes a transition to the EAT state if $x_i = hungry$ and it is not blocked, where blocking is defined by a macro to be the condition where either neighbor is selecting *eat* (i.e., holding both forks) or the right neighbor is selecting *hungry* (i.e., philosophers defer to their right). (Although we do not discuss it further here, this algorithm may be symmetrized by introducing $n$ initial states into the "system" process $P$ of $n$ philosophers: for $1 \leq i \leq n$, the $i^{th}$ initial state of $P$ having $P_i$ in the READ state, and all the others in the THINK state. The same analysis we give here applies to this symmetrized case as well.)

Each process $P_i$ has a single cycle set, {EAT}, which represents the assumption that no philosopher will remain in the eating state forever. (a Weight-Watcher convention).

We prove first that that the first philosopher $P_1$ does not starve, for any $n$. Then we prove that for all $1 \leq k \leq n$, philosopher $P_k$ does not starve. We assume that $n > 4$. The cases $1 \leq n \leq 4$ can be checked explicitly using COSPAN. The condition that $P_1$ does not

9.2. Example: Dining Philosophers

```
type selection : (think,hungry,eat,read)
type state : (THINK,EAT,READ)

proctype P(x_i_minus_1, x_i_plus_1 : selection;
           initial : state)
  import x_i_minus_1, x_i_plus_1
  stvar $ : state
  selvar x : selection
  init initial
  macro Blocked :=
          (x_i_minus_1: hungry,eat) + (x_i_plus_1: eat)
  cyset {EAT}
  trans
    THINK {think,hungry}
      -> EAT   : (x = hungry) * ~Blocked
      -> READ  : (x = think) * (x_i_minus_1 = read)
      -> THINK : else;
    EAT {eat, think}
      -> THINK : (x = think) * (x_i_minus_1 ~= read)
      -> READ  : (x = think) * (x_i_minus_1 = read)
      -> EAT   : else;
    READ {read}
      -> THINK : x_i_plus_1 = think
      -> READ  : else;
end
```

Figure 9:
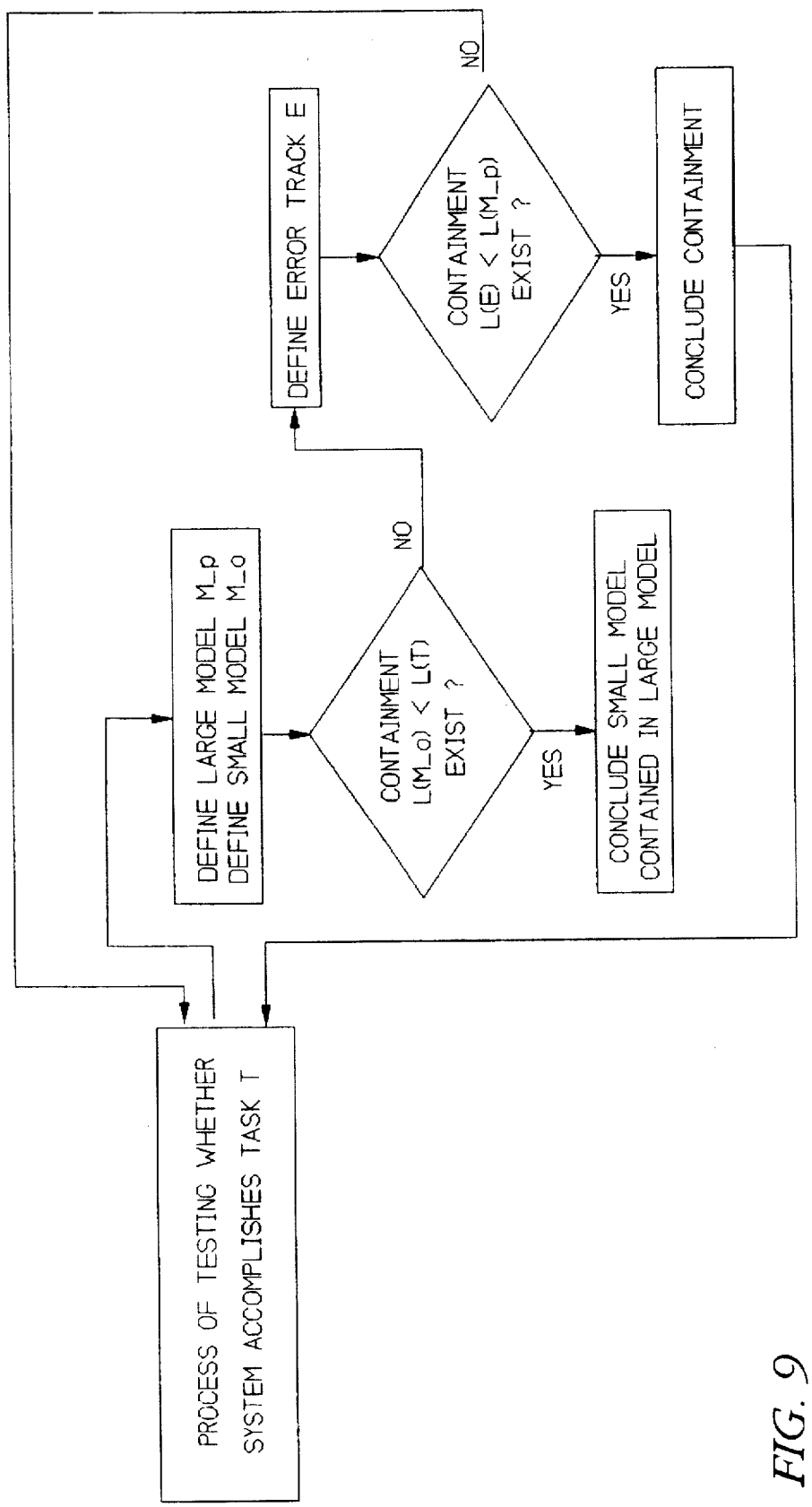

Figure 9.1: The philosopher process $P_i$.

starve is represented by the language of the "task" process $T_i$, defined in $S/R$ in Figure 9.2 (for input parameter $x = x_i$). The language of $T_i$ is the set of all sequences consistent with the transition structure of $T_i$, except those in which the selection of $x$ eventually is constantly $hungry$. This language is defined by a two state process, which enters state 1 when the selection $x_i = hungry$, and state 0 otherwise. The cycle set $\{1\}$ excepts from the language all sequences which cause the process eventually to remain in state 1.

We choose $\varphi$ to be the Boolean algebra homomorphism induced by the following mapping of selection variables:

- $x_1 \rightarrow x_1$

210                Chapter 9. Structural Induction

```
proctype T(x_i : selection)
  import x_1
  stvar $ : (0,1)
  init 0
  cyset {1}
  trans
    0,1
      -> 1 : x_i = hungry
      -> 0 : else;
end
```

Figure 9.2: The task process $T_i$.

- $x_i \to x_{i+1}$, for all $1 < i < n$
- $x_n \to x_1$

This map shifts all of the variables up by one, except $x_1$; the variable $x_n$ wraps around to $x_1$. Note that under this map, the induced homomorphism maps the atom $$(x_1 = a_1) \wedge \ldots \wedge (x_n = a_n)$$

to the atom $$(x_1 = a_1) \wedge \ldots \wedge (x_1 = a_n),$$

which is 0 unless $a_1 = a_n$.

The process invariant $Q_i$ is defined to be $P_{i-1} \otimes P_i \otimes R_i$, where $R_i$ is the two-state process of Figure 9.3. This process guarantees that if $P_i$ selects *read*, then eventually $P_{i-1}$ will select *read*.

For all $i$ satisfying $3 \leq i < n$, $P_{i+1} = \varphi(P_i)$ and $R_{i+1} = \varphi(R_i)$ (since $x_1 \to x_1$), by the definition of $\varphi$. Hence, since $\varphi$ satisfies (3.3.7.c), for all $i$ with $4 \leq i < n$, $$\begin{aligned} Q_{i+1} &= P_i \otimes P_{i+1} \otimes R_{i+1} \\ &= \varphi(P_{i-1}) \otimes \varphi(P_i) \otimes \varphi(R_i) \\ &= \varphi(Q_i) . \end{aligned}$$

Thus, we can apply Theorem 9.1.1 for $m = 4$. Using COSPAN, we automatically verify the following assertions:

$$\mathcal{L}\left(\bigotimes_{i=1}^{4} P_i\right) \subset \mathcal{L}(Q_4). \qquad (9.15)$$

9.2. Example: Dining Philosophers

```
proctype R(x_1,x_i_minus_1 : selection)
  import x_1,x_i_minus_1
  stvar $ : (0,1)
  init 0
  cyset {1}
  trans
    0
      -> 1 : (x_1 = read) * (x_i_minus_1 ~= read)
      -> 0 : else;
    1
      -> 0 : (x_i_minus_1 = read)
      -> 1 : else;
end
```

Figure 9.3: The process $R_i$ $$\mathcal{L}(Q_4 \otimes P_5) \subseteq \mathcal{L}(Q_5). \tag{9.16}$$

Thus, by Theorem 9.1.1, we conclude that $$\mathcal{L}\left(\bigotimes_{i=1}^{n} P_i\right) \subseteq \mathcal{L}(Q_n). \tag{9.17}$$

This proof is very close in structure to the proof one might write by hand [Kur85a]. In this case, one would argue by induction starting with some small number of processors as the base case. Here, the base case is, if $P_1$ is reading, then eventually $P_3$ will read. This corresponds to (9.15). The induction step in our hand proof would be that if ($P_1$ is reading) $\Rightarrow$ ($P_i$ will read), then ($P_1$ is reading) $\Rightarrow$ ($P_{i+1}$ will read). This corresponds (through applications of $\varphi$) to (9.16); Theorem 9.1.1 tells us we only need to test the case ($i = 4$). In the induction step, to prove something about $P_i$, we rely on the behavior of philosophers $P_{i-1}, P_i$. Thus, our hand proof of the invariant would make reference to philosophers $P_{i-1}$ and $P_i$. Similarly, our invariant process $Q_i$ includes processes $P_i$ and $P_{i-1}$.

The proof of the induction step would run roughly as follows: if philosopher $P_{i-1}$ eventually has the encyclopedia, then since philosopher $P_i$ cannot stay in the eating state forever, eventually philosopher $P_i$ becomes unblocked. If philosopher $P_i$ becomes unblocked, it eventually selects thinking, and hence takes the encyclopedia from philosopher 212  Chapter 9. Structural Induction $P_{i-1}$, entering the reading state. Although this is a fairly vague argument which fails to address the many possible cases, there is no need to formalize it, since the induction step is checked automatically by COSPAN. An informal understanding of this proof is necessary in order to construct the invariant process $Q_i$. In particular, one must understand the protocol well enough to realize that philosophers $P_{i-1}$ and $P_i$ are necessary to the induction step, and thus must be included in $Q_i$. However, one can obtain this information by trial and error, since COSPAN provides behavioral traces as counterexamples if the induction step fails. This is in fact how the invariant presented here was obtained.

We complete the verification that philosopher $P_1$ never starves, as follows. Using COSPAN, we check $$\mathcal{L}(P_1 \otimes P_2 \otimes Q_n) \subset \mathcal{L}(T_1). \tag{9.18}$$

(It is necessary to include philosopher $P_2$ in order to prevent $P_1$ from being blocked indefinitely, which would be the case if selection ($x_2 = eat$) were true indefinitely.) From the result of the induction (9.17), the monotonicity and associativity of $\otimes$ and (9.13), we conclude that $$\mathcal{L}(\bigotimes_{i=1}^{n} P_i) \subset \mathcal{L}(P_1 \otimes P_2 \otimes Q_n) \tag{9.19}$$

and hence $$\mathcal{L}\left(\bigotimes_{i=1}^{n} P_i\right) \subset \mathcal{L}(T_1). \tag{9.20}$$

The process $Q_i$ is defined in terms of the three processes $P_{i-1}$, $P_i$ and $R_i$. This imposes the syntactic requirement that the same variable $x_{i-1}$ be substituted for x_i_minus_1 in both the instantiation of P() representing $P_i$ and the instantiation of R() representing $R_i$, as well as for x in the instantiation of P() representing $P_{i-1}$. Likewise, the same variable $x_i$ must be substituted for x_i_plus_1 in the instantiation of P() representing $P_{i-1}$, and for x in the instantiation of P() representing $P_i$. The S/R code which defines $Q_i$ thus must declare the four selection variables $x_{i-2}$, $x_{i-1}$, $x_i$ and $x_{i+1}$. However, beyond the correspondences among the formal parameters just stated, there is no semantic significance to the subscripts of these variables. In particular, with one caveat, the selection variable $x_n$ appearing in (9.18) attaches no special significance to the $n$; it may just as well be represented by the 3-character string x_n. The caveat concerns the relationship between $n$ and other indices. The check (9.18) in fact corresponds to 2 separate

9.2. Example: Dining Philosophers cases: $n = 5$ and $n > 5$; the variable $x_{n-2}$ in the definition of $Q_n$ is the same as the variable $x_3$ in the definition of $P_2$ if and only if $n = 5$. (In fact, it is easily seen that the case $n > 5$ is more general, and thus only that case need be checked.) Another potential issue in this regard concerns the verification of (9.16): the x_i_plus_1 associated with $P_5$ gets $x_6$ if $n > 5$, but gets $x_1$ if $n = 5$. However, as this variable does not correspond to any other variable in the S/R representation of (9.16), any syntactic representation is satisfactory.

Finally, we prove that $P_k$ does not starve for all $1 \leq k \leq n$. This result cannot be obtained purely by symmetry of the ring, because our assumption that $P_1$ initially has the encyclopedia breaks the symmetry. Instead, we check the following relation using COSPAN:

$$\mathcal{L}(P_1 \otimes P_2 \otimes Q_k \otimes P_{k+1} \otimes Q_n) \subset \mathcal{L}(T_k). \tag{9.21}$$

Verification of (9.21) is accomplished through several separate COSPAN checks, corresponding to various values of $k$ within the range $4 \leq k \leq n$; each check imposes different requirements upon associations among the substituted variables. For simplicity, assume $n \geq 10$. The cases for $n < 10$ can be verified explicitly, using COSPAN. When $n \geq 10$ and $k \geq 4$, (9.21) is checked according to the following cases: $k = 4$ (requiring association of variables in $P_2$ and the copy of $P_3$ in $Q_4$); $k = 5$ ($P_2$ and $P_4$ share the variable $x_3$); the (single) case $5 < k < n - 4$ (applicable when $n > 10$); $n - 4 \leq k \leq n$ (5 cases - when $k = n$, the check (9.21) reduces to $\mathcal{L}(P_1 \otimes P_2 \otimes Q_n) \subset \mathcal{L}(T_n)$). In fact, as with the verification of (9.18), there is one case of (9.21) which is more general than all the others, namely the (single) case $5 < k < n - 4$. This can be seen by application of monotonicity and (9.11-9.13). Therefore, it suffices to check this one case in order to verify (9.21).

We already have proved by theorem 1 (9.3) that for $4 \leq k \leq n$, $\mathcal{L}(\bigotimes_{i=1}^{k} P_i) \subset \mathcal{L}(Q_k)$. Hence, by monotonicity and (9.11-9.13), $$\mathcal{L}\left(\bigotimes_{i=1}^{n} P_i\right) \subset \mathcal{L}\left(\bigotimes_{i=1}^{k} P_i\right) \subset \mathcal{L}(P_1 \otimes P_2 \otimes Q_k) \tag{9.22}$$

and $$\mathcal{L}\left(\bigotimes_{i=1}^{n} P_i\right) \subset \mathcal{L}(P_{k+1} \otimes Q_n) \tag{9.23}$$

so, by (9.14)

$$\mathcal{L}\left(\bigotimes_{i=1}^{n} P_i\right) \subset \mathcal{L}(P_1 \otimes P_2 \otimes Q_k \otimes P_{k+1} \otimes Q_n) \tag{9.24}$$

214    Chapter 9. Structural Induction and thus
$$\mathcal{L}\left(\bigotimes_{i=1}^{n} P_i\right) \subset \mathcal{L}(T_k). \tag{9.25}$$

The cases $k = 2, 3$ for $n \geq 10$ can be verified explicitly using COSPAN, in the same way that the case $k = 1$ was verified.

This proof works because $P_1$, $P_2$ and $Q_n$ are sufficient to guarantee that $P_1$ is reading infinitely often. This and $Q_k$ guarantee that $P_{k-1}$ is reading infinitely often. Along with the fact that $P_{k+1}$ does not eat forever, this is enough to show that $P_k$ does not starve.

By using COSPAN[1] to check relations between fixed processes with no free parameters, we have proved a property of a parameterized system of $n$ processes. This proof is automatically checked to the following extent. The conclusion (9.25) can be stated formally in the syntax of the $S/R$ language. In principle, it could be verified automatically by COSPAN for any fixed value of the parameter $n$, but not simultaneously for all $n$. In order to prove (9.25) simultaneously for all $n$, we have presented three checks involving a fixed number of processes, which are verified by COSPAN. Then, by the induction theorem, we concluded in effect that (9.25) would be verified by COSPAN for any given value of $n$ (presuming COSPAN could deal with the computational complexity associated with that $n$). This conclusion is based on the reasoning presented in this paper, and this reasoning is not checked by COSPAN (although it could theoretically be checked in a theorem-prover interfaced with COSPAN).

There is an interesting alternative process invariant for this problem which was discovered by Peter Ramadge. It turns out that the induction carries through if we simply let $Q_7 = \bigotimes_{i=1}^{7} P_i$, projecting the language onto the state variables $x_n, x_1, x_7, x_8$. In other words, viewed from the ends, a segment of 7 philosophers is indistinguishable from 8 philosophers. This property holds for no number less than 7. Although we do not know the reason for this, it illustrates a very simple approach to generating process invariants.

---

[1] The input text for the example is available upon request to k@research.att.com.

Chapter 10

Binary Decision Diagrams

Recent advances in the manipulation of data-structures for binary decision diagrams (BDD's) [Bry86], [BBR90], [Rud93] facilitate checking language containment for far larger system models than has been hitherto possible (cf. [BCM+90]). In this chapter, taken from [TBK91], two BDD-based algorithms are given for testing that the language of an $L$-process is empty, thereby giving a test for language containment, via (8.1.3). Of the two algorithms, one has a time advantage and the other has a space advantage. Each has increased significantly the size of system models which can be verified. For a selected problem with a scalable structure, it was shown using the verification system COSPAN, that whereas with the non-BDD language containment algorithm, the verification running time grows exponentially with the size of the state space, and the effective size of the system which could be verified is $10^7$ states, the BDD-based algorithms empirically demonstrate a running time which increases linearly with the size of the state space [TBK91]. This allowed verification of the system model scaled to $10^{18}$ states, in roughly the same time as was required to verify the $10^7$-state model using explicit enumeration (the non-BDD algorithm). Moreover, commercial system models with orders of magnitude larger state spaces still, have been verified using these new algorithms (these models are not scalable, and hence the performance of non-BDD and BDD-based algorithms cannot be directly compared). A more detailed report on the implementation of these algorithms in COSPAN is found in [HTKB93].

Chapter 10. Binary Decision Diagrams

The use of BDD's facilitates the manipulation of sets of states (the set of satisfiability of a Boolean function describing the state transition predicate). Since the domain of operation is sets of states rather than individual states, the feasibility of these algorithms is governed not by the size of the underlying state space, but by the complexity of the underlying Boolean functions. Empirical evidence indicates that for the class of problems which arise naturally as verification problems, the use of the BDD-based algorithms can significantly extend the set of feasible models.

Although not without drawbacks (BDD-based algorithms run slower in some cases, and are extremely sensitive to implementation issues such as variable-ordering and memory de-allocation), the BDD-based algorithms described here have proved to be an important tool for extending the power of language-containment checking.

On account of the drawbacks just mentioned, especially the problem of variable-ordering, the BDD-based algorithms have not yet replaced the explicit enumeration algorithms, however. Although this may happen at some point, with the advent of new BDD-based algorithms and supporting heuristics, in the meantime, experience shows that a good practical verification strategy is to use both BDD-based algorithms and explicit algorithms together, choosing whichever algorithm best matches the given verification problem.

A special case of the language containment problem is to show that given two deterministic finite state machines, every input/output sequence possible in one is possible in the other. Such a test is performed by computing the product of the two machines, and demonstrating that for each product state reachable from a pair of component initial states, the component outputs are identical. This can be done very effectively with binary decision diagrams using the implicit enumeration technique introduced by Coudert *et al.* [CBM89], the first published application of BDD's to verification. This method cannot be generalized directly to perform a language containment check for $\omega$-regular languages, which is significantly more complex. A formulation of a language containment problem in terms of $\mu$-calculus was given in [BCM+90], for deterministic Büchi automata (which cannot express all $\omega$-regular languages: see Note 6.1.6).

Application of BDD's to formal verification is a rapidly expanding field of research, generating dozens of new results each year. For a good introduction to the details, see [Bry92]. For a more expansive insight into this field, see McMillan's excellent book [McM93a].

10.1 Terminology and Notation

Binary Decision Diagrams. A binary decision diagram (BDD) [Lee59], [Ake78], [Bry86] is a data structure which represents a Boolean function $f : B^n \to B$, where $B = \{0,1\}$. In the form introduced by Bryant [Bry86], BDD representations (also known as *ordered* BDD's or OBDD's, since they are based upon a fixed ordering of the Boolean input variables $B$) have three main advantages: they are reasonably small for a large class of interesting Boolean functions, they are canonical for a given ordering of the input variables, and they can be directly manipulated to perform efficiently all basic Boolean operations. All other known representations of Boolean functions fail to have at least one of these properties. Truth tables, for example, are of exponential size. Boolean networks are efficient representations in terms of storage requirements and Boolean operations, but are poor representations for tautology checking, which is a vital primitive operation for verification algorithms.

A BDD representing a Boolean function $f$ is a directed acyclic graph (DAG) whose leaves are the constant nodes 0 and 1, and whose internal nodes can only implement an if-then-else operation, where the conditional part is restricted to being the value of an input variable. In addition, on any path from the root to a leaf, a conditional or branching variable can appear at most once, and in some specified order [Bry86]. For a given variable ordering, a BDD can be seen as the DAG obtained from the Shannon decomposition of $f$ for that ordering by maximal sharing of common subexpressions.

States, Sets of States, and State Relations. Finite state machines usually are encoded in terms of multivalued variables, and the idea to represent a synchronous system in terms of current-state and next-state variables is not new (*e.g.*, [AKS83b]). What is new, is the potential to exploit this representation through BDD's. To be able to represent a set of states $S$ with BDD's, we encode multivalued variables with a small set of binary variables using an encoding that minimizes the number of BDD nodes [SKMB90], and we represent as a BDD the *characteristic function* of $S$. For simplicity, we associate a set with its characteristic function.

We also need to represent with BDD's the state transition relation $T(x,y)$ of the system (given in terms of *current* state $x$ and *next* state $y$). Using a transition relation instead of a transition function has two main advantages: it allows us to handle non-determinism, and it allows us 218                    *Chapter 10. Binary Decision Diagrams* to abstract away from the representation the specific conditions under which a given transition is possible. The transition relation can be interpreted as a set of pairs of states; we represent its characteristic function as a BDD. Other binary state relations also can be represented that way. One binary relation of particular interest is the transitive closure $R(x,y)$ of the transition relation $T(x,y)$.

It also is useful in some cases to extend the BDD representation of the transition relation to incorporate input variables $i$. In that case the transition relation becomes a ternary relation $T(x,i,y)$, which can be interpreted as a set of triplets, whose characteristic function again is represented as a BDD.

Primitive Operations

Boolean Operations. We can operate directly on BDD's to perform all the usual set operations: union, intersection, complementation. These operations actually are performed on the characteristic functions of the corresponding sets; thus the Boolean or operator ($+$) denotes union, the Boolean and operator ($\cdot$) denotes intersection, and the Boolean not operator (not $S = \overline{S}$) denotes complementation.

Projection. To use binary relations, we also need to be able to perform a projection onto a set of variables. For example, to compute the set $R_1$ of states reachable in one step from a given set of states $R$, where $R$ and $R_1$ are represented by their characteristic functions $R(x)$ and $R_1(x)$, we need to be able to compute the set $\{y | \exists x\ T(x,y) \cdot R(x) = 1\}$. We overload the existential quantifier to denote this projection operator as follows: $R_1(y) = \exists x\, (T(x,y) \cdot R(x))$. The projection operator can be computed directly on a BDD representation [BCM$^+$90], by decomposing it into simple operations as illustrated below:

$$\begin{aligned}
\exists (x_{i_1},\ldots,x_{i_k}) f &= \exists x_{i_1} \ldots \exists x_{i_k} f \\
\exists x, f(x_1,\ldots,x_n) &= f_{x_i}(x_1,\ldots,x_n) + f_{\overline{x_i}}(x_1,\ldots,x_n) \\
f_{x_i}(x_1,\ldots,x_n) &= f(x_1,\ldots,x_{i-1},1,x_{i+1},\ldots,x_n) \\
f_{\overline{x_i}}(x_1,\ldots,x_n) &= f(x_1,\ldots,x_{i-1},0,x_{i+1},\ldots,x_n)
\end{aligned}$$

Fixed Point Computations. The last operators we need to describe our algorithm are fixed point operators. Let $F$ be a function mapping

10.2. From Automata to BDD's the power set $2^S$ of some finite set $S$ into itself. For simplicity, we associate a set with its characteristic function. Throughout, we assume $F$ is *monotone*, i.e. that $A \subseteq B$ implies that $F(A) \subseteq F(B)$. We define lfp($F$), the least fixed point of $F$ and gfp($F$), the greatest fixed point of $F$, as follows:

$$\text{lfp}(F) = \bigcap_{A=F(A)} A$$
$$\text{gfp}(F) = \bigcup_{A=F(A)} A .$$

Let $F^0$ be the identity function, and let $F^{i+1} = F \circ F^i$ be the function obtained by applying $F$ to the result of $F^i$. Since $F$ is monotone and operates on a finite set, one can easily show that there is some integer $i \geq 0$ such that: $F^i(\phi) = F^{i+1}(\phi) = \text{lfp}(F)$, and similarly some integer $j \geq 0$ such that $F^j(S) = F^{j+1}(S) = \text{gfp}(F)$. The check for termination of fixed point computations is a tautology check, for which the use of BDD's is an important asset.

A simple example of a fixed point computation is the computation of the set of states $R(x)$ reachable from a given set of states $I(x)$. $R$ is equal to lfp($F$), where $F$ is the following function operating on sets $c$ of states:

$$F(c)(x) = I(x) + \exists y (T(y,x) \cdot c(y)) \qquad (10.1)$$

A related fixed point computation is the computation of the set of states $I(x)$ than can reach a given set of states $R(x)$. $I(x)$ is equal to lfp($F$), where $F$ is the function:

$$F(c)(x) = R(x) + \exists y (T(x,y) \cdot c(y)). \qquad (10.2)$$

A more complex example is the computation of the transitive closure $R(x,y)$ of the transition relation $T(x,y)$. In that case, we compute the fixed point of a function operating on relations (sets of pairs of states). $R(x,y)$ is equal to lfp($F$) where $F$ is the following function:

$$F(c)(x,y) = T(x,y) + \exists z (T(x,z) \cdot c(z,y)). \qquad (10.3)$$

10.2 From Automata to BDD's

We assume that the language containment problem $\mathcal{L}(S) \subset \mathcal{L}(T)$ has been translated into a language emptiness problem for an $L$-process Chapter 10. Binary Decision Diagrams $P$ via Lemma 8.1.3. Since the $L$-process $S$ which defines the system model commonly is defined as a product of component processes, this product will be manifest in the representation of $P$ as well. In this section we describe how to construct the transition relation for the $L$-process $P$, defined in terms of component processes. Henceforth, assume $P = S \otimes T^*$ is decomposed as $P = \otimes P_i$. We seek to check if $\mathcal{L}(P) = \varnothing$.

Building the Transition Relation. Since $V(P) = XV(P_i)$ and $P = \otimes P_i$, transition relation of $P$ can be described as the Boolean and of the transition relations of the individual processes.

For any given (component) process $P$, we build first the partial transition relation $PT_P(x_P, i, y_P)$. $PT_P(x_P, i, y_P) = 1$ if and only if state $y_P$ of $P$ is reachable in one step from state $x_P$ under selection $i$. $PT_P$ not only depends on the present state and next state of process $P$, but also on the selection $i$ of the entire system. The selection variables are not externally generated: they are the aggregate outputs of all processes at state $x = (x_{P_1}, \ldots, x_{P_n})$. Thus we also need to represent, for each process $P$, the possible selections of that process. This is done by building another relation: $O_P(x_P, i_P)$, where $i_P$ represents the selection variables that correspond to the outputs of process $P$. $O_P(x_P, i_P) = 1$ if and only if the selection $i_P$ can be generated by process $P$ at state $x_P$. The full transition relation of process $P$ is the conjunction of these two relations:

$$T_P(x, i, y) = PT_P(x_P, i, y_P) \cdot O_P(x_P, i_P)$$

The global transition relation $T(x, y)$ for the entire system then is computed by taking the conjunction of the transition relations of its component processes, and applying the existential quantification operator to $T$ to remove any dependency on the selection variables $i$:

$$T(x, y) = \exists i \left( \prod_{j=1}^{n} T_{P_j}(x_{P_j}, i, y_{P_j}) \right) \qquad (10.4)$$

Representation of Recur Edges. We represent recur edges implicitly in the transition relation. We add a dummy Boolean selection variable $r$ to the transition relation. This variable is not removed by existential quantification during the computation of the transition relation. Thus the transition relation is actually a function of three sets of variables: $\hat{T}(x, r, y)$. $\hat{T}(x, 1, y) = 1$ if and only if $y$ is reachable from

10.3. Algorithm I: Transitive Closure $x$ in one step across a recur edge, and $\hat{T}(x,0,y) = 1$ if and only if $y$ is reachable from $x$ in one step across an edge that is not a recur edge.

Representation of Cycle Sets. Cycle sets are sets of states and are directly represented as BDD's. We use the notation $(C_1(x), \ldots, C_n(x))$ to designate the Boolean functions which define the cycle sets.

10.3 Algorithm I: Transitive Closure

As we have reduced the language containment check to an emptiness check for $L$-processes, this is logically is equivalent to checking that every reachable cycle in the state transition graph of the system either contains a recur edge or is entirely contained in one of the cycle sets. We present here an algorithm that can perform this check through implicit enumeration. Neither states nor cycles nor recur edges are enumerated explicitly. The algorithm proceeds in five steps:

1. We first compute the set of reachable states $R(x)$ from a set of initial states $I(x)$.

2. We remove the recur edges from the transition relation and restrict the transition relation to reachable states, by using $T(x,y) = R(x) \cdot \hat{T}(x,0,y)$.

3. We compute the transitive closure $R(x,y)$ of $T(x,y)$. A pair $(x,y)$ satisfies $R(x,y) = 1$ if $y$ can be reached from $x$ in one or more transitions.

4. For each cycle set $C_i$, we use $R(x,y)$ to enumerate implicitly all states in some cycle not contained in $C_i$. The union of these sets of states is called $NC_{C_i}$ (for *Not Contained in $C_i$*).

5. We compute the intersection of the sets $NC_{C_i}$. The language containment check succeeds if and only if this intersection is empty.

These steps are elaborated below.

Computing Reachable States. Computing the set of reachable states is done by computing the least fixed point of the function $F$ of equation (10.1). In this computation, we use all edges, whether they are recur edges or not.

Chapter 10. Binary Decision Diagrams

Removing Recur Edges. Once the set of reachable states $R(x)$ has been computed, we simplify the transition relation by removing all states that are not reachable. We also remove all the recur edges from the transition relation. This can be done *only after* the set of reachable states has been computed; otherwise we may miss some cycles that do not contain any recur edges but are only reachable from the initial states through recur edges. We simplify the transition relation as follows:

$$T(x,y) = R(x) \cdot \hat{T}(x,0,y) \qquad (10.5)$$

Since we have removed from the transition relation all the states that are not reachable and all the state transitions that occur only through recur edges, the cycles remaining in the state graph represented by $T(x,y)$ are exactly the cycles that are reachable from an initial state and do not contain any recur edge. At this point, to complete the language emptiness check, we only need to verify that every cycle in $T(x,y)$ is contained in one of the cycle sets.

Computing the Transitive Closure of the Transition Relation.
We have discussed earlier how to compute the transitive closure $R(x,y)$ of the transition relation $T(x,y)$ as the least fixed point of the function $F$ given in equation (10.3).

We can deduce cyclic relationships from $R(x,y)$. A pair of states $(x,y)$ belongs to $R(x,y)$ if and only if $y$ can be reached from $x$ in one or more transitions. Consequently, a pair of states $(x,y)$ belongs to $R(x,y) \cdot R(y,x)$ if and only if $x$ is reachable from $y$ and $y$ is reachable from $x$. This is equivalent to saying that there is a cycle containing both $x$ and $y$, or that $x$ and $y$ belong to the same strongly connected component of the state transition graph.

Implicit Enumeration of Unaccepted Cycles. For each cycle set $C_i$ we compute the set $NC_{C_i}$ as follows:

$$NC_{C_i}(x) = \exists y (R(x,y) \cdot R(y,x) \cdot \overline{C_i}(y)) \qquad (10.6)$$

where $\overline{C_i}$ is the complement of the cycle set $C_i$. A state $x$ belongs to $NC_{C_i}$ if and only if there exists a cycle containing $x$ not entirely contained in $C_i$. We now show that the set $NC_{C_i}$ implicitly enumerates all the unaccepted cycles with respect to $C_i$, i.e. all the cycles not contained in $C_i$.

10.4. Algorithm II: The Emerson-Lei Formula

10.3.1 Theorem *Every reachable cycle is contained in at least one of the cycle sets $C_i$ iff the set $\overline{NC}$ is empty, where:*

$$NC = \bigcap_{1 \leq i \leq n} NC_{c_i} \qquad (10.7)$$

The proof of this result relies on the following lemma:

10.3.2 Lemma *Let $SCC$ be the set of strongly connected components of the state transition graph. Then $NC_{C_i}$ is the union of all the strongly connected components in $SCC$ not entirely contained in $C_i$:*

$$NC_{C_i} = \bigcup_{\substack{c \in SCC \\ c \not\subseteq C_i}} c \qquad (10.8)$$

Proof. Let $c \in SCC$ be such that $c \not\subseteq C_i$. Let $x$ be any element of $c$, and $y$ be an element of $c - C_i$. Then the pair $(x, y)$ belongs to the set $R(x, y) \cdot R(y, x) \cdot \overline{C_i}(y)$ and thus $x$ belongs to $NC_{C_i}$. Conversely, let $x$ be an element of $NC_{C_i}$. There is an element $y$ such that $x$ and $y$ belong to the same cycle $c$ and $y$ does not belong to $C_i$. This cycle $c$ is contained in the strongly connected component $C$ containing $x$. $C$ is not contained in $C_i$ and thus $x$ belongs to $\bigcup_{c \in SCC, c \not\subseteq C_i} c$.

Proof of 10.3.1. We first prove that if $NC \neq \phi$ then there is a cycle not contained in any of the cycle sets $C_i$. Let $x$ be an element of $NC$; $x$ is contained in a (unique) strongly connected component $C$, which is a cycle. From the lemma we deduce that $C$ is not contained in any of the $C_i$. Conversely, suppose that there is a cycle $c$ not contained in any of the cycle sets $C_i$. Let $C$ be the strongly connected component containing $c$. A fortiori $C$ is contained in none of the $C_i$. Thus, according to the lemma, $C$ is contained in all of the sets $NC_{C_i}$, whose intersection is therefore not empty.

10.4 Algorithm II: The Emerson-Lei Formula

In [EL86] Emerson and Lei introduced a restricted form of the propositional Mu-Calculus [Koz83] that is at least as expressive as many of the commonly used temporal logics, including FCTL (CTL extended with fairness constraints [CES86, BCM+90]). The formula Emerson and Lei introduced to express an FCTL fairness constraint in the Mu-Calculus

Chapter 10. Binary Decision Diagrams can be adapted to handle cycle sets in the context of an $\omega$-regular language containment check,[1] in replacement of the second part of the previous algorithm (Sections 10.3 and 10.3).

The Emerson-Lei formula computes a set $NC_\mu$ that we will prove is equal to the set of reachable states from which the set $NC$ of equation (10.7) can be reached. $NC_\mu$ is thus empty if and only if $NC$ is, and can be computed in place of $NC$ to detect unaccepted cycles. $NC_\mu$ is obtained as the greatest fixed point of the following function $F$:

$$F(c)(x) = c(x) \cdot \prod_{i=1}^{n} \exists y (T(x,y) \cdot \text{lfp}(G_i^c)(y)) \qquad (10.9)$$

Evaluation of $F$ requires the computation of $n$ least fixed points, one per function $G_i^c$, for each iteration of $F$. For a given set $c$, $G_i^c$ is defined as follows:

$$G_i^c(d)(x) = c(x) \cdot \left(\overline{C_i}(x) + \exists y (T(x,y) \cdot d(y))\right) \qquad (10.10)$$

A state $x$ belongs to $\text{lfp}(G_i^c)$ if there is a path starting from $x$ and entirely contained in $c$ whose end point does not belong to $C_i$ (cf. equation (10.2)).

10.4.1 Theorem $NC_\mu$ is the set of reachable states from which $NC$ can be reached.

We will need the following lemmas in the proof of theorem 10.4.1:

10.4.2 Lemma $\text{lfp}(G_i^c) \subseteq c$.

10.4.3 Lemma Let $c$ be a fixed point of $F$, i.e. $F(c) = c$. Then each point of $c$ has a successor in $c$.

Proof. Let $x$ be an element of $c$. Since $F(c)(x) = c(x) = 1$, in particular there is a state $y$ such that $T(x,y) = 1$ and $\text{lfp}(G_1^c)(y) = 1$. Lemma 10.4.2 and the second equality imply that $y$ is an element of $c$, and the first equality implies that $y$ is a successor of $x$.

10.4.4 Lemma If $c$ is a fixed point of $F$, then from each point of $c$ and each integer $i$, $1 \leq i \leq n$, there is a path entirely included in $c$ that ends at a point in $\overline{C_i}$.

---
[1] This general idea originated with K. McMillan.

10.4. Algorithm II: The Emerson-Lei Formula

Proof. Let $x$ be an element of $c$, and $i$ an integer between 1 and $n$. Since $F(c)(x) = c(x) = 1$, in particular there is a state $y$ such that $T(x,y) = 1$ and $\mathrm{lfp}(G_i^c)(y) = 1$. Since $y$ belongs to $\mathrm{lfp}(G_i^c)$, there is a path from $y$ to a point outside $C_i$ that is entirely included in $c$, which extends to a path from $x$ to a point outside $C_i$ entirely included in $c$.

Proof of 10.4.1. Let $NC'$ be the set of all reachable states from which $NC$ can be reached. We want to prove that $NC_\mu = NC'$.

To show that $NC' \subseteq NC_\mu$, since $NC_\mu = \mathrm{gfp}(F)$, it is sufficient to prove that $F(NC') = NC'$. Since $F(c) \subseteq c$ is always true, we simply have to prove that $F(NC') \supseteq NC'$. For a given $i$, $\mathrm{lfp}(G_i^{NC'})$ is the set of states from which there is a path entirely included in $NC'$ whose end point does not belong to $C_i$. Since any point in $NC'$ reaches $NC$, and any point in $NC$ is on a cycle not entirely included in $C_i$, we have: $NC' \subseteq \mathrm{lfp}(G_i^{NC'})$, and, with lemma 10.4.2, we obtain $NC' = \mathrm{lfp}(G_i^{NC'})$. Thus:

$$F(NC') = NC'(x) \cdot \exists y (T(x,y) \cdot NC'(y))$$

In other words, $F(NC')$ contains all the points of $NC'$ that have a successor in $NC'$. Since every point in $NC'$ has a successor in $NC'$, we have $F(NC') \supseteq NC'$.

Conversely, let $x$ be a state in $NC_\mu$. We are going to show that $x$ can reach a cycle not included in any of the $C_i$, which is enough to show that $x$ belongs to $NC'$. Let $G$ be the directed graph obtained by restricting the state transition graph to $NC_\mu$. Because $NC_\mu$ is a fixed point of $F$, by lemma 10.4.3 each state in $NC_\mu$ has a successor in $NC_\mu$. Thus each node in $G$ has a successor. Let $DG$ be the DAG obtained from $G$ by collapsing all the connected components of $G$. Let $C$ be a leaf of $DG$ that is reachable from $x$. Let $x_0$ be an arbitrary state in $C$. Because $NC_\mu$ is a fixed point of $F$, by lemma 10.4.4 there is a state $y_1$ reachable in one step from $x_0$ such that from $y_1$, there is a path entirely contained in $NC_\mu$ that ends outside $C_1$. This path has to be entirely contained in $C$, because $C$ corresponds to a leaf of $DG$. Let $x_1$ be the end point of that path. Similarly, we can find a path from $x_1$ to $x_2$, entirely contained in $C$, such that the end point $x_2$ does not belong to $C_2$. This path can be continued to a path entirely contained in $C$ that contains, for each $C_i$, a state not included into $C_i$. Thus $C$ is an unaccepted cycle, which proves that $C \subseteq NC$. Since $C$ is reachable from $x$, we have proved that $x$ belongs to $NC'$.

10.5 Implementation Issues

Computation of the Transition Relation. The storage requirement for the computation of the transition relation often can be reduced dramatically by exploiting the following algebraic identity: $\exists (x,y)(f(x,y) \cdot g(y)) = \exists y (g(y) \cdot \exists x f(x,y))$. This reduction is obtained by ordering the computation of the partial products in (10.4) in order to facilitate the elimination of variables by existential quantification.

Computation of the Reachability Relation. The most computationally expensive step in the algorithm of section 10.3 is the computation of the transitive closure of $T(x,y)$. It relies on the fixed point computation of equation (10.3), which requires three sets of simultaneously active state variables, instead of two for equations (10.1), (10.9) and (10.10). To make efficient use of BDD's in this context, we need to find effective variable ordering heuristics to use in equation (10.3).

Variable Ordering. In the worst case it can happen that *every* variable ordering is bad. Bryant has shown that for a circuit which performs integer multiplication on input words of size $n$, represented as an OBDD, *every* variable ordering gives an exponential number of BDD nodes (i.e., vertices in the DAG representing the BDD) [Bry91]. On account of the inevitable intractability of OBDD's in the worse case, an enormous amount of effort has gone into devising heuristics for finding a "good" variable ordering: one which gives a relatively small number of nodes in the BDD. A simple heuristic is to reflect in the variable ordering the initial decomposition of the system as a network of finite state machines. For each finite state machine, the binary variables encoding the present state and the next state of the machine are interleaved using an ordering heuristic such as the one introduced in [TSL+90] or the more recent techniques of [JPHS91]. The global variable ordering is deduced from the variable ordering of each machine by concatenation of the orderings. For example, for a system composed of $n$ machines $(M_i)_{1 \leq i \leq n}$, each having only two possible states, and for a given ordering $\sigma$ of these machines, if the present state of $M_i$ is represented by one binary variable $x_i$ and the next state of $M_i$ is represented by one binary variable $y_i$, the global variable ordering we use is given by: $(x_{\sigma(1)}, y_{\sigma(1)}, x_{\sigma(2)}, y_{\sigma(2)}, \ldots, x_{\sigma(n)}, y_{\sigma(n)})$. To choose the order of concatenation $\sigma$, we use a heuristic that clusters the component finite state machines in order to minimize the interaction between clusters. Reducing interaction between clusters should lead to smaller informa-

10.5. Implementation Issues tion transfer between levels in the BDD's and thus to smaller BDD's [Bry91]. This clustering can be achieved in a variety of ways, e.g. using the heuristic of [TSL+90] and is better done before selection variables are removed from the transition relation. To introduce a third set $z$ of variables, as needed in equation (10.3), we simply interleave the $z$ variables with the $x$ and $y$ variables. If only one state variable is needed per machine, and if we suppose that $\sigma(i) = i$ for simplicity, the ordering would be: $(x_1, y_1, z_1, x_2, y_2, z_2, \ldots, x_n, y_n, z_n)$.

Another approach is to use dynamic reordering of variables [Rud93], which has been found to be quite effective in many cases, when used in conjunction with these other methods. McMillan [McM94] has shown that if a model has a tree structure in its variable dependency graph, this can be exploited through the use of BDD trees in place of OBDD's.

As the general variable-ordering problem is intractable, finding good heuristics currently is a very active area of research, too active to be documented here. Unfortunately, so far, it seems that each heuristic works very well on some small class of problems, but fails miserably on many others, with little ability to predict from the model, when the heuristic will succeed. A notable exception to this is the BDD trees of McMillan which, although no panacea, at least can be related to the structure of the models on which they do well.

Iterative Squaring. The least fixed point of the predicate transformer $F$ of equation (10.3) can be computed with logarithmically fewer iterations using *iterative squaring* [BCM+90]. This method consists of computing lfp($F$) where $F$ is the following function:

$$F(c)(x,y) = T(x,y) + \exists z (c(x,z) \cdot c(z,y)) \qquad (10.11)$$

Implicit Enumeration of Unaccepted Cycles. The second most difficult computation in the algorithm of section 10.3 is equation (10.6). The BDD size of $R(x,y)$, which represents the transitive closure of the transition relation $T(x,y)$, is expected to be significantly larger than the BDD size of $C_i(x)$, which represents only a set of states. As a heuristic, it is better to compute the product $R(y,x) \cdot \overline{C_i}(y)$ first, and to compute the second Boolean and combined with the projection operator in a single pass over the BDD's, reducing the need for temporary storage [BCM+90]. Using this technique, we do not need to store the product $R(x,y) \cdot R(y,x)$ at any given point of the computation.

A second optimization is based on the use of the *generalized cofactor*,

Chapter 10. Binary Decision Diagrams as defined in [TSL+90] (see below). This operator was initially proposed by Coudert et al. in [CBM89] and called the *constraint* operator. The generalized cofactor of a Boolean function $f$ by a Boolean function $c$ is a Boolean function $f_c$ that has, in most cases, a smaller BDD representation than $f$ and can be substituted for $f$ in some contexts.

Given a Boolean function: $f = (f_1, \ldots, f_m) : B^n \to B^m$ and a subset of $B^n$ represented by its characteristic function $c$, the generalized cofactor $f_c = ((f_1)_c, \ldots, (f_m)_c)$ is a function from $B^n$ to $B^m$ whose range is equal to the image of $c$ by $f$. For a single output function $f : B^n \to B$, the pair $(f, c)$ can be interpreted as an incompletely specified function whose onset is $f \cdot c$ and don't care set $\bar{c}$. Under this interpretation, the generalized cofactor $f_c$ can be seen as a heuristic to select a representative of the incompletely specified function $(f, c)$ that has a small BDD representation. The generalized cofactor $f_c$ depends in general on the variable ordering used in the BDD representation. If $c$ is a cube (i.e., product term), the generalized cofactor $f_c$ is equal to the usual cofactor of a Boolean function, and is, in that case, independent of the variable ordering.

10.5.1 Definition Let $c : B^n \to B$ be a non-null Boolean function. We define the mapping $\pi_c : B^n \to B^n$ as follows:

if $c(x) = 1$  $\pi_c(x) = x$
if $c(x) = 0$  $\pi_c(x) = y$ where $c(y) = 1$ and $d(x, y)$ is minimal, for $d(x, y) = \sum_{1 \leq i \leq n} |x_i - y_i| 2^{n-i}$

10.5.2 Lemma $\pi_c$ is the projection that maps a minterm $x$ to the minterm $y$ in the onset of $c$ which is closest to $x$ according to the distance function $d$. The particular form of $d$ guarantees the uniqueness of $y$ in this definition, for any given ordering of $x$.

10.5.3 Definition Let $f : B^n \to B$ and $c : B^n \to B$, with $c \neq 0$. The generalized cofactor of $f$ with respect to $c$, denoted by $f_c$, is the function $f_c = f \circ \pi_c$ (i.e. $f_c(x) = f(\pi_c(x))$). If $f : B^n \to B^m$, then $f_c : B^n \to B^m$ is the function whose components are the cofactors by $c$ of the components of $f$.

The generalized cofactor can be computed very efficiently in a single bottom-up traversal of the BDD representations of $f$ and $c$ [TSL+90].

Chapter 10. Binary Decision Diagrams reachable states, as in section 10.3, we store the sets $R_k$ that contain exactly the states reachable from an initial state in $k$ transitions or less. In case of failure, we compute the smallest $k$ for which the set $R_k \cap \left( \bigcap_{1 \leq i \leq n} NC_{C_i} \right)$ is not empty. We pick an arbitrary state $x_k$ in this set, and compute the strongly connected component containing $x_k$, which is $c(x) = R(x, x_k) \cdot R(x_k, x)$. We can report $c(x)$ as an unaccepted cycle; $c(x)$ is guaranteed to be a cycle with the shortest distance to an initial state. To report a failure track leading to $c(x)$, we compute iteratively a sequence of states $(x_{k-1}, \ldots, x_0)$ such that $x_{i+1}$ is reachable from $x_i$ in one transition and $x_i$ is in $R_i$, by picking for $x_i$ any state $x$ contained in $R_i(x) \cdot T(x, x_{i+1})$. In particular, $x_0$ is guaranteed to be an initial state. The sequence $(x_0, \ldots, x_k)$ can then be used as an error track leading to the unaccepted cycle $c(x)$. We obtain with this algorithm an unaccepted cycle closest to the set of initial states, but we do not necessarily find the smallest unaccepted cycle.

A natural question is whether we could report the smallest unaccepted cycle containing $x_k$. The answer is: probably not if the number of cycle sets is large. The problem of finding the smallest cycle containing $x_k$ that contains a point in each of the sets $\overline{C_i}$ can be reformulated as the following decision problem: given a strongly connected directed graph, $n$ sets of nodes $(A_1, \ldots, A_n)$ and an integer $B$, is there a tour that visits each of the sets $A_i$ and is of length $B$ or less? This decision problem can easily be shown to be NP-complete, by reducing to it a version of the traveling salesman problem [GJ79]. In practice we can resort to a bounded depth branch and bound algorithm to find a short unaccepted cycle containing $x_k$. The branching part of the search selects which set $A_i = \overline{C_i}$ to visit next.

Appendices

Appendix A

(See Figure 8.6A.)

Appendices

Appendix B

```
proc X    /*The Crossroads system X', reduced relative to TA*/ proc A    /*Avenue A*/
   import C
   selvar # : (no_cars, cars_waiting, cars_going)
   stvar $ : (STOP, GO)
   init STOP
   trans STOP      {no_cars, cars_waiting}
       ->GO   : (A: cars_waiting)*(C: go_A)
       ->STOP : else;

GO        {cars_going, no_cars}
       ->STOP : (A: no_cars) + (A: cars_going)*(C: go_B)
       ->GO   : else;

end A proc B    /*Reduced B: B''*/
   selvar # : (null)
   stvar $ : (0)
   init 0
   trans 0         {null}
       ->0   : true end B proc C    /*Traffic Controller C', reduced relative to TA*/
   import A, B
   selvar # : (pause, go_A, go_B)
   stvar $ : (go_A, go_B)
   init go_A, go_B
   trans go_A      {pause, go_A}
       ->go_B : (C: go_A)*(B: null)
       ->go_A : (C: go_A)*(B: null) + (C:pause);

go_B      {pause, go_B}
       ->go_A : (C: go_B)*(A: cars_waiting)
       ->go_B : else;

end C end X
```

*Appendices*                                                                 233

```
monitor TA   /*TASK: "all cars on A eventually get through"*/
   import X
   stvar $ : (0,1)
   init 0
   recur 0->0, 1->0
   trans 0 -> 1 : (X.A: cars_waiting)
     -> 0 : else;

1 -> 0 : (X.A: no_cars) + (X.A: cars_going)
     -> 1 : else;

end TA
```

Appendix C

```
monitor TA /*TASK: "all cars on A eventually get through, or C eventually
pauses forever*/
import X
stvar $ : (0,1,2)
init 0
recur 0->0, 1->0, 2->0
cyset {2}
trans 0 -> 1 : (X.A: cars_waiting)
  -> 0 : else;

1,2 -> 0 : (X.A: no_cars) + (X.A: cars_going)
   -> 2 : else*(X.C: pause)
   -> 1 : else;

end TA
```

Appendix D

Reduction of a Circular Queue (See Figure 8.6B.)

```
/* CIRCULAR QUEUE */
#define Length 4
proctype QUEUE(length: integer; reset, put, pop: boolean; dat_len: integer;
        data: (0..dat_len))
    import   reset, put, pop, data
    selvar
            urd    : (0..dat_len);
            status : (not_full, full)
    asgn    urd    := DATA[head].#,
            status := full ? (TAIL.# +1) mod length = HEAD.# | not_full proc DATA[i<Length] : INT(0,      data         ? (i = TAIL.#)*put
                              | $
                              )
    proc HEAD : INT(0,       0                ? reset
                     | ($+1) mod length    ? pop
                     | $
                     )
    proc TAIL : INT(0,       0                ? reset
                     | ($+1) mod length    ? put
                     | $
                     )
    end QUEUE()
```

*This Q models a queue of 3 4-bit words; it has 786432 reachable states (multiplying the size of the rest of the state space of which it is a component): this may result in a system model which is TOO BIG to formally verify.*

*Appendices*

```
proc Q : QUEUE(Length, (RESET: 1), (PUT: 1), (POP: 1),
2^4-1, INPUT.#)
```

*When the functionality of Q is only peripheral to the property which is to be verified, we may take a "meat-cleaver" approach to the model, using the key word 'free' to replace the model Q with a 1-state model Q' which non-deterministically outputs from its single state all the output tokens of Q. As $\mathcal{L}(Q) < \mathcal{L}(Q')$, any (regular) property we can verify using Q' therefore holds with Q as well; however, Q' is TOO SMALL to hold the information necessary to verify, e.g., data-delivery.*

```
free proc Q :
QUEUE(Length, (RESET: 1), (PUT: 1), (POP: 1),
2^4-1, INPUT.#)
```

*For a more exacting reduction, especially when the function of Q is central to the property to be verified, we use the key word 'reduce' to replace Q with an equivalent reduced model Q': $\mathcal{L}(Q) = \mathcal{L}(Q')$; thus, this reduction is EXACT. In this example, Q' has only 4369 states. However, as these 4369 states multiply the size of the rest of the state space as before, even this reduction may result in a prohibitively large model.*

```
reduce proc Q :
QUEUE(Length, (RESET: 1), (PUT: 1), (POP: 1),
2^4-1, INPUT.#)
```

*For each specific property we seek to verify, we may not need the full power of Q. For example, to verify data-delivery in a data-independent system, we verify first the validity of collapsing 'dat_len' data tokens to 2 tokens (one modelling the token to be delivered, the second modelling all others), using the 'hom' declaration. Then, application of 'reduce' gives a queue model of only 15 states. The 'hom' declaration defines a homomorphism from the 2-token system to the $2^4 - 1$-token system.*

```
hom    Qred.wrd := 1 ? Q.wrd=1 | 0
       /* collapses 'dat_len' data tokens into
       2 abstract data-tokens */
reduce proc Qred :
QUEUE(Length, (RESET: 1), (PUT: 1), (POP: 1), 1,
INPUT.#)
```

235

Appendices

Often, it is possible to do better yet through use of non-determinism, by guessing at a reduced (non-deterministic) model Qred, verifying the consistency of the reduction $\mathcal{L}(Q) \to L(Qred)$, and then verifying the property using Qred. In the case of data-delivery, the following 4-state non-deterministic model is verified to work for *any* given value of 'Length' and 'dat_len', using the 'hom' declaration. (To verify data-delivery, Q need only be guaranteed to produce eventually the token 'wrd=1' once it gets it; the 'recur' construct helps guarantee eventuality). This reduction is not exact, as Qred (for example), can generate more 'Q.wrd=0' tokens than it receives 'data=0' tokens.

```
macro  Q_has_1 := (Q.HEAD.$ <= Q.TAIL.$)*
                 +[i in 0.. Length-1]((Q.HEAD.$<=i)*(i<Q.TAIL.$)*(Q.DATA[i].$=1))
               + (Q.TAIL.$ < Q.HEAD.$)*
                 +[i in 0.. Length-1](((Q.HEAD.$<=i)+(i<Q.TAIL.$))*(Q.DATA[i].$=1))
hom    Qred.wrd := 1 ? (Q.wrd=1)*(Q.TAIL.# ~= Q.HEAD.#) | 0,
       /* collapses 'dat_len' data tokens into 2 abstract data-tokens */
       Qred.MGR.# := empty      ? Q.TAIL.# = Q.HEAD.#,
       Qred.status := Q.status,
               |  full_1      ? ((Q.TAIL.#+1 -Q.HEAD.#) mod Length = 0)*
                                (Q.wrd = 1)
               |  full_0      ? (Q.TAIL.#+1 -Q.HEAD.#) mod Length = 0
               |  ok_1        ? Q.wrd = 1
               |  ok_0,
       /*"STATE" HOMOMORPHISM*/
       Qred.MGR.$ := empty       ? Q.TAIL.$ = Q.HEAD.$
               |  still_have_   ? Q_has_1*(POP: 1)*(Q.wrd ~= 1)
               |  have_1        ? Q_has_1
               |  only_0s proc Qred /* Reduction of Q relative to verifying data-delivery */
     import   RESET, PUT, POP, INPUT
     selvar   wrd    : (0,1);
              status : (not_full, full)
     rsel     wrd := 1 ? (MGR: ok_1, full_1) | 0,
              status := full ? (MGR: full_0, full_1) | not_full proc MGR
          import   RESET, PUT, POP, INPUT
          selvar   # : (empty, ok_0, full_0, ok_1, full_1)
          stvar    $ : (empty, only_0s, have_1, still_have_1)
          init     empty
          recur    * ->still_have_1
                   /* models assumption of only finitely
                      many 0's ahead of any 1 */
          trans empty              {empty}
                      ->have_1        : (PUT: 1)*(INPUT: 1)
```

*Appendices*                                                                                    237

```
        ->only_0s          : (PUT: 1)*else
        ->$                : else;

have_1, still_have_1   {ok_0, full_0, ok_1, full_1}
        ->only_0s          : (POP: 1)*(#: ok_1, full_1)
        ->still_have_1     : (POP: 1)*(#: ok_0, full_0)
        ->empty            : (RESET: 1) + (POP: 1)*(#: ok_1, full_1)
        ->$                : else;

only_0s                {ok_0, full_0}
        ->empty            : (RESET: 1) + (POP: 1)
        ->have_1           : (PUT: 1)*(INPUT: 1)
        ->$                : else + (POP: 1)

end MGR
end Qred
```

*Appendices*

Appendix E  Tools

The following list of generally available noncommercial tools, presented roughly in order of debut, is representative of tools which support decision procedures for formal verification. Although incomplete, it contains the better-known ones which are generally available (as far as this writer knows). Not included in this list is a large collection of tools for nonalgorithmic automated proof-checking/theorem-proving: Boyer-Moore, HOL, PVS, Occum, Gypsy, Otter, Larch, Nuprl, to name a few of the best-known ones.

Clarke's EMC [CES86] (emc@g.cs.cmu.edu)
    Sifakis' XESAR [QS82] (sifakis@vercours.imag.fr or
        caesar@imag.fr)
    AT&T Bell Labs' COSPAN [HK90], [HTKB93]
        (k@research.att.com)
    Holzmann's SPIN and SuperTrace [Hol88], [Hol91]
        (gerard@research.att.com)
    The Madrid Lotos Laboratory's LOLA [QPF89]
        (quemada@dit.upm.es)
    The Edinburgh Concurrency Workbench [CPS93]
        (rance@science.csc.ncsu.edu or lfcs@ed.ac.uk)
    de Simone and Roy's AUTO/AUTOGRAPH [RS92]
        (vr@cma.cma.fr)
    Larsen's TAV [LT88], [BLS92] (klg@iesd.auc.dk)
    Dill's Murφ [DDHY92] based on Chandy and Misra's *Unity*
        (dill@hobum.stanford.edu)
    FDR from Oxford, U.K., based on Hoare's CSP [Hoa85]
        (fdr-request@comlab.ox.ac.uk)
    Halbwachs' Lesar, based on LUSTRE [Hal93]
        (halbwachs@imag.fr)
    McMillan's SMV, based on Clarke's CTL [McM93a]
        (mcmillan@cadence.com)
    The Berkeley Development Group's HSIS, based on COSPAN and
        SMV [HSIS94], [HB94] (brayton@ic.berkeley.edu).
    Sifakis' KRONOS [HNSY94] (sifakis@vercours.imag.fr)
    Henzinger's HyTech [AHH93] (tah@cs.cornell.edu)

Versions of the BDD routines of SMV and HSIS are embedded in COSPAN, which in turn is interconnected with the specification language and analysis routines of SPIN, supported by Nalumasu (ratan@cs.utah.edu), as well as with those of SMV and HSIS, and is interoperable with the HOL and the Larch automated theorem-

*Appendices* provers via a connection to Lamport's TLA [KL93], supported by Engberg's TLP (urban@daimi.aau.dk) and Foissotte's translation tools (elsa@research.att.com). SMV and HSIS have been the focus of much recent interest in the hardware development community, as they are available for nonresearch commercial use at no charge, and incorporate many advanced BDD routines. There also are commercially available tools: *VFormal*, developed by BULL (France) and marketed by Compass Technologies; Chrysalis Symbolic Design's *Design Verifier*; IBM's *Booles Eye*. A commercial version of COSPAN which supports VHDL and Verilog through a graphical interface, is available from AT&T MicroElectronics.

240  *Appendices*

Bibliography

[ACH+92] R. Alur, C. Courcoubetis, N. Halbwachs, D. Dill, and H. Wong-Toi. Minimization of Timed Transition Systems. *Lecture Notes in Computer Science (LNCS)* 630, pages 341–354, (1992). [151, 187]

[AD90] R. Alur and D. L. Dill. Automata for Modeling Real-Time Systems. *Lecture Notes in Computer Science (LNCS)* 443, pages 322–335, (1990). [29, 151]

[AD94] R. Alur and D. L. Dill. A Theory of Timed Automata. *Theoretical Computer Science* 126, pages 183–235, (1994). [29, 150–152]

[AHH93] R. Alur, T. A. Henzinger, and P.-H. Ho. Automatic Symbolic Verification of Embedded Systems. In *Proc. 14th Ann. Real-Time Systems Symposium IEEE*, pages 2–11, 1993. [238]

[AHV93] R. Alur, T. Henzinger, and M. Y. Vardi. Parametric Real-Time Reasoning. *25th ACM Symposium on Theory of Computing (STOC)*, pages 592–601, (1993). [151]

[AIKY93] R. Alur, A. Itai, R. P. Kurshan, and M. Yannakakis. Timing Verification by Successive Approximation. *Lecture Notes in Computer Science (LNCS)* 663, pages 137–150, 1993. [151, 152]

[Ake78] S. B. Akers. Binary Decision Diagrams. *IEEE Transactions on Computers* C-27, pages 506–516, (1978). [217]

[AKS83a] S. Aggarwal, R. P. Kurshan, and K. Sabnani. A Calculus for Protocol Specification and Validation. In *Protocol Specification, Testing and Verification III*, pages 19–34. North-Holland, 1983. [29, 110, 192, 197]

242                                                           Bibliography

[AKS83b] S. Aggarwal, R. P. Kurshan, and D. Sharma. A Language for the Specification and Analysis of Protocols. In *Protocol Specification, Testing and Verification III*, pages 35-50. North-Holland, 1983. [110, 217]

[AL91] M. Abadi and L. Lamport. The Existence of Refinement Mappings. *Theoretical Computer Science* 82, pages 253-284, (1991). [27, 177]

[AL93] M. Abadi and L. Lamport. Conjoining Specifications. *SRC Research Report* 118, (1993). [113]

[Arn85] A. Arnold. A Syntactic Congruence for Rational $\omega$-Languages. *Theoretical Computer Science* 39, pages 333-335, (1985). [27]

[AR88] I. Aalbersberg and G. Rozenberg. Theory of Traces. *Theoretical Computer Science* 60, pages 1-82, (1988). [147]

[AS85] B. Alpern and F. B. Schneider. Defining Liveness. *Inf. Proc. Letters* 21, pages 181-185, (1985). [27, 29]

[AS87] B. Alpern and F. B. Schneider. Recognizing Safety and Liveness. *Distributed Computing* 2, pages 117-126, (1987). [27, 29]

[AVCM93] C. M. Angelo, D. Verkest, L. Claesen, and H. De Man. On the Comparison of HOL and Boyer-Moore for Formal Hardware Verification. *Formal Methods in System Design* 2, pages 45-72, (1993). [6]

[BAMP81] M. Ben-Ari, Z. Manna, and A. Pnueli. The Temporal Logic of Branching Time. In *Eighth ACM Symposium on Principles of Programming Languages (POPL)*, pages 164-176. *Acta Informatica* 20 (1983) 207-226, 1981. [27]

[Bar89] J. Barwise. Mathematical Proofs of Computer System Correctness. *Notices* 36, pages 884-851, (1989). [5, 6]

[BBLS93] S. Bensalem, A. Bouajjani, C. Loiseaux, and J. Sifakis. Property Preserving Simulations. *Lecture Notes in Computer Science (LNCS)* 663, pages 260-273, (1993). [124, 190]

[BBR90] K. L. Brace, R. E. Bryant, and R. L. Rudell. Efficient Implementation of a BDD Package. In $27^{th}$ *ACM/IEEE Design Automation Conference*, June 1990. [215]

*Bibliography* 243

[BBRS92] G. Barnes, J. F. Buss, W. L. Ruzzo, and B. Schieber. A Sublinear Space, Polynomial Time Algorithm for Directed $s-t$ Connectivity. In *Proc. 7th IEEE Structure in Complexity Thy. Conf.*, pages 27–33, (1992).  [157]

[BCG86] M. C. Browne, E. M. Clarke, and O. Grumberg. Reasoning About Networks with Many Identical Finite State Processes, 1986. In *ACM Symposium Principles of Distributed Computing (PODC)* 5.  [204]

[BCM+90] J. R. Burch, E. M. Clarke, K. L. McMillan, D. L. Dill, and L. J. Hwang. Symbolic Model Checking: $10^{20}$ States and Beyond, LICS; Sequential Circuit Verification Using Symbolic Model Checking, IEEE Design Automation Conference (DAC), 1990.  [7, 8, 215, 216, 218, 223, 227]

[BFH91] A. Bouajjani, J.-C. Fernandez, and N. Halbwachs. Minimal Model Generation. *Lecture Notes in Computer Science (LNCS)* 531, pages 197–203, (1991).  [151, 187]

[BL69] J. R. Büchi and L. H. Landweber. Solving Sequential Conditions by Finite-State Strategies. *Trans. Amer. Math. Soc.* 138, pages 295–311, (1969).  [26, 27]

[BL84] W. W. Bledsoe and D. W. Loveland, editors. *Automated Theorem Proving: After 25 Years*, Contemporary Math 29. Amer. Math. Soc., 1984. Especially the paper "Proof-Checking, Theorem-Proving and Program Verification" by R. S. Boyer and J. S. Moore, 119–132.  [6]

[BLS92] A. Borjesson, K.G. Larsen, and A. Skou. Generality in Design and Compositional Verification Using TAV. In *Proc. of FORTE'92*, (1992). Full version to appear in Formal Methods in System Design.  [238]

[BM79] R. S. Boyer and J. S. Moore. *A Computational Logic*. Academic Press, NY, 1979.  [6]

[Bry86] R. E. Bryant. Graph Based Algorithms for Boolean Function Manipulation. *IEEE Transactions on Computers* C-35, pages 677–691, (1986).  [215, 217]

[Bry91] R. E. Bryant. On the Complexity of VLSI Implementations and Graph Representations of Boolean Functions with Application to Integer Multiplication. *IEEE Transactions on Computers* 40, pages 205–213, (1991).  [226, 227]

244                                                                    Bibliography

[Bry92]     R. E. Bryant. Symbolic Boolean Manipulation with Ordered
            Binary Decision Diagrams. *ACM Computing Surveys* 24,
            pages 293–318, (1992).                                    [216]

[BSV93]     F. Balarin and A. Sangiovanni-Vincentelli. An Iterative Ap-
            proach to Language Containment. *Lecture Notes in Com-
            puter Science (LNCS)* 697, pages 29–40, (1993).       [170]

[Büc60]     J. R. Büchi. Weak Second-Order Arithmetic and Finite
            Automata. *Z. Math. Logik Grundlagen Math.* 6, pages 66–
            92, (1960).                                                [26]

[Büc62]     J. R. Büchi. On a Decision Method in Restricted Second-
            Order Arithmetic. In *Methodology and Philosophy of Sci-
            ence. Proc., 1960 Stanford Intern. Congr.*, pages 1–11,
            Stanford, Calif., 1962. Stanford Univ. Press.           [26, 82]

[Büc73]     J. R. Büchi. The Monadic Theory of $\omega_1$. In *Decidable
            Theories II*. Lecture Notes in Mathematics 328, pages 1–
            127. Springer, Berlin, 1973.                               [26]

[BVW94]     O. Bernholtz, M. Vardi, and P. Wolper. An Automata-
            Theoretic Approach to Branching-Time Model Check-
            ing. *Lecture Notes in Computer Science (LNCS)*. (1994).
            [27, 28, 125]

[CAV]       International Conf. on Computer-Aided Verification. The
            proceedings to date have been published as *Lecture Notes
            in Computer Science (LNCS)* 407 (1989), 531 (1990), 575
            (1991), 663 (1992), 697 (1993), 818 (1994).          [5]

[CBM89]     O. Coudert, C. Berthet, and J. C. Madre. Verification of Se-
            quential Machines Based on Symbolic Execution. In *Proc. of
            the Workshop on Automatic Verification Methods for Finite
            State Systems (CAV)*, Grenoble, France, 1989.        [216, 228]

[CDFV88]    R. Cieslak, C. Desclaux, A. Fawaz, and P. Varaiya. Su-
            pervisory Control of Discrete Event Processes with Partial
            Observations. *IEEE Transactions on Automatic Control*
            33, pages 249–260, (1988).                              [27]

[CDK93]     E. M. Clarke, I. A. Draghicescu, and R. P. Kurshan. A
            Unified Approach for Showing Language Containment and
            Equivalence Between Various Types of $\omega$-Automata. *In-
            formation Processing Letters* 46, pages 301–308, (1993).
            [29, 81, 85]

*Bibliography*

[CE82]    E. M. Clarke and E. A. Emerson. Design and Synthesis of Synchronization Skeletons for Branching Time Temporal Logic. In *Proc. Logic of Programs Workshop*, Lecture Notes in Computer Science (LNCS) 131, pages 52–71. Springer-Verlag, 1982. [6, 27]

[CES86]    E. M. Clarke, E. A. Emerson, and A. P. Sistla. Automatic Verification of Finite-State Concurrent Systems Using Temporal Logic Specifications. *Trans. Prog. Lang. Syst.* 8, pages 244–263, (1986). [27, 223, 238]

[CF69]    P. Cartier and D. Foata. Problèmes Combinatoires de Commutation et Réarrangements. *Lecture Notes in Mathematics* 85, (1969). [147]

[CFJ93]    E. Clarke, T. Filkorn, and S. Jha. Exploiting Symmetry in Temporal Logic Model Checking. *Lecture Notes in Computer Science (LNCS)* 697, pages 450–462, (1993). [193, 197]

[CG77a]    R. S. Cohen and A. Y. Gold. Theory of $\omega$-Languages I: A Study of Various Models of $\omega$-Type Generation and Recognition. *Journal of Computer and System Sciences* 15, pages 169–184, (1977). [27]

[CG77b]    R. S. Cohen and A. Y. Gold. Theory of $\omega$-Languages II: A Study of Various Models of $\omega$-Type Generation and Recognition. *Journal of Computer and System Sciences* 15, pages 185–208, (1977). [27]

[CG87]    E. M. Clarke and O. Grumberg. Research on Automatic Verification of Finite State Concurrent Systems. *Ann. Reviews in Computer Science* 2, pages 269–290, (1987). [27]

[CGK89]    E. M. Clarke, O. Grumberg, and R. P. Kurshan. A Synthesis of Two Approaches for Verifying Finite State Concurrent Systems. *Lecture Notes in Computer Science (LNCS)* 363, pages 81–90, (1989). Also in *J. Logic and Computation* 2, pages 605–618, (1992). [7, 8, 27, 123]

[CGL92]    E. M. Clarke, O. Grumberg, and D. Long. Model Checking and Abstraction. In *Proc. 19th Symposium Princ. Prog. Langs. (POPL)*, pages 343–354. ACM, 1992. [124, 190]

[Cho63]    N. Chomsky. Formal Properties of Grammars. In *Handbook of Mathematical Psychology* 2, pages 323–418. John Wiley & Sons, 1963.

Bibliography

[Cho74] Y. Choueka. Theories of Automata on $\omega$-Tapes: A Simplified Approach. *J. Computer Sys. Science* 8, pages 117–141, (1974). [xii, 12, 25–27, 48, 70, 72, 74, 78, 82, 83, 99]

[Cho78] Y. Choueka. Finite Automata, Definable Sets, and Regular Expressions Over $\omega^n$-Tapes. *J. Computer System Science* 17, pages 81–97, (1978). [27]

[Chu63] A. Church. Logic, Arithmetic and Automata. In *Proc. 1962 Internat. Cong. Math.*, pages 15–22. Mittag-Leffler Inst., 1963. [27]

[CM58] N. Chomsky and G. A. Miller. Finite State Languages. *Inf. Control* 1, pages 91–112, (1958). [26]

[CM84] E. M. Clarke and B. Mishra. Automatic Verification of Asynchronous Circuits. *Lecture Notes in Computer Science (LNCS)* 164, (1984). [27]

[Coh91] J. Cohen. On the Expressive Power of Temporal Logic for Infinite Words. *Theoretical Computer Science* 83, pages 301–312, (1991). [27]

[CPS93] R. Cleaveland, J. Parrow, and B. Steffen. The Concurrency Workbench: A Semantics-Based Tool for the Verification of Finite-State Systems. *TOPLAS* 15, pages 36–72, (1993). [238]

[CVW86] C. Courcoubetis, M. Y. Vardi, and P. Wolper. Reasoning About Fair Concurrent Programs. In *Proc. 18th ACM Symposium on Theory of Computing (STOC)*, pages 283–294, Berkeley, 1986. [27, 29]

[CVWY92] C. Courcoubetis, M. Y. Vardi, P. Wolper, and M. Yannakakis. Memory-Efficient Algorithms for the Verification of Temporal Properties. *Formal Methods in System Design* 1, pages 275–288, (1992). [29]

[CY88] C. Courcoubetis and M. Yannakakis. Verifying Temporal Properties of Finite-State Probabilistic Programs. In *Proc. 29th Found. Comput. Science (FOCS)*, pages 338–345, 1988. Revised as "The Complexity of Probabilistic Verification", JACM (to appear). [4, 29]

[CY90] C. Courcoubetis and M. Yannakakis. Markov Decision Processes and Regular Events. In *Proc. 17th Int'l Coll. Automata, Languages and Programming (ICALP90) Lecture Notes in Computer Science (LNCS)* 443, (1990). [4]

*Bibliography*

[DDHY92] D. L. Dill, A. J. Drexler, A. J. Hu, and C. H. Yang. Protocol Verification as a Hardware Design Aid. In *IEEE International Conference on Computer Design: VLSI in Computers and Processors*, pages 522–525. IEEE Computer Society, 1992. [238]

[DHWT92] D. L. Dill, A. J. Hu, and H. Wong-Toi. Checking for Language Inclusion Using Simulation Preorders. *Lecture Notes in Computer Science (LNCS)* 575, (1992). [29]

[Dij71] E. W. Dijkstra. Hierarchical Ordering of Sequential Processes. *Acta. Inf.* 1, pages 115–138, (1971). [207]

[Dil89] D. L. Dill. *Trace Theory for Automatic Hierarchical Verification of Speed-Independent Circuits*. MIT Press, 1989. [29]

[EC80] E. A. Emerson and E. M. Clarke. Characterizing Correctness Properties of Parallel Programs Using Fixpoints. In *Proc. 7th Int. Colloquium on Automata, Languages and Programming (ICALP)*, Lecture Notes in Computer Science (LNCS) 85, pages 169–181. Springer-Verlag, 1980. [27]

[EC82] E. A. Emerson and E. M. Clarke. Using Branching Time Temporal Logic to Synthesize Synchronization Skeletons. *Science Computer Programming* 2, pages 241–266, (1982). [27]

[Eil74] S. Eilenberg. *Automata, Languages and Machines*. Academic Press, New York, 1974. [27]

[EJ88] E. A. Emerson and C. S. Jutla. The Complexity of Tree Automata and Logic of Programs. In *Proc. 29th IEEE Symposium on Found. of Computer Science*, pages 328–337, 1988. [27]

[EL85] E. A. Emerson and C. L. Lei. Modalities for model checking: Branching time strikes back. In *Proc. Symposium Princ. Prog. Langs. (POPL)*, pages 84–96. ACM, 1985. In *Science of Computer Programming*, 8 275–306 (1987). [27, 84, 85, 89, 123, 166]

[EL86] E. A. Emerson and C. L. Lei. Efficient Model Checking in Fragments of the Propositional Mu-Calculus. In *Proc. Symposium Logic in Computer Science (LICS)*, pages 267–278. IEEE, 1986. [27, 11, 223]

248                                             Bibliography

[Eme90]   E. A. Emerson. Temporal and Modal Logic. In *Handbook of Theoretical Computer Science*, volume B, chapter 16, pages 995–1072. Elsevier, 1990.                    [27–29, 125]

[ES93]    E. Emerson and A. Sistla. Symmetry and Model Checking. *Lecture Notes in Computer Science (LNCS)* 697, pages 463–478, (1993).                                  [193]

[FKL93]   J. Feigenbaum, J. A. Kahn, and C. Lund. Complexity Results for POMSET Languages. *SIAM J. on Discr. Maths.* 6, pages 432–442, (1993).                         [147]

[FMJJ92]  J.-C. Fernandez, L. Mounier, C. Jard, and T. Jéron. On-the-Fly Verification of Finite Transition Systems. *Formal Methods in System Design* 1, pages 251–273, (1992).   [29, 158]

[Gab94]   D. A. Gabel. Software Engineering. *IEEE Spectrum*, pages 38–41. Jan. 1994.                                   [9, 177]

[GH82]    Y. Gurevich and L. Harrington. Trees, Automata and Games. In *Proc. ACM Symposium on Theory of Computing (STOC)*, pages 60–65, 1982.                          [26]

[Gin68]   A. Ginsburg. *Algebraic Theory of Automata*. Academic Press, New York, 1968.                                  [187]

[GJ79]    M. R. Garey and D. S. Johnson. *Computers and Intractability*. Freeman, 1979.                                 [155, 230]

[GK94]    O. Grumberg and R. P. Kurshan. How Linear Can Branching-Time Be? In *Int'l.Conf. on Temporal Logic (ICTL '94)*, Bonn, Germany, 1994.                          [124]

[GL65]    A. Grasselli and F. Luccio. A Method for Minimizing the Number of Internal States in Incompletely Specified Sequential Networks. *IEEE Trans. EC-14*, pages 350–359, (1965).  [188]

[GL91]    O. Grumberg and D. E. Long. Model Checking and Modular Verification. *Lecture Notes in Computer Science (LNCS)* 527, (1991).                                  [124, 156]

[Gor88]   M. Gordon. A Proof-Generating System for Higher-Order Logic. *Kluwer SECS* 35, pages 73–128, (1988).           [6]

[GPSS80]  D. Gabbay, A. Pnueli, S. Shelah, and J. Stavi. The Temporal Analysis of Fairness. In *Seventh ACM Symposium on*

*Bibliography* 249

*Principles of Programming Languages (POPL)*, pages 163–173. Las Vegas, Nev., 1980. [27]

[Gri73] D. Gries. Describing an Algorithm by Hopcroft. *Acta Inf.* 2, pages 97–109, (1973). [187]

[GRS90] R. Graham, B. Rothschild, and J. Spencer. *Ramsey Theory.* Wiley, 1990. [80]

[GS91] S. Graf and B. Steffen. Compositional Minimization of Finite State Systems. *Lecture Notes in Computer Science (LNCS)* 531, pages 186–196, (1991). [158]

[GS92] S. M. German and A. P. Sistla. Reasoning About Systems with Many Processes. *J. ACM* 39, pages 675–735, (1992). [204]

[Gup92] A. Gupta. Formal Hardware Verification Methods: A Survey. *Formal Methods in System Design* 1, pages 151–238, (1992). [7]

[GW91] P. Godefroid and P. Wolper. Approach to Model Checking. In *6th LICS*, pages 406–415, 1991. [147]

[Hal74] P. Halmos. *Lectures on Boolean Algebras.* Springer-Verlag, 1974. [34, 54]

[Hal93] N. Halbwachs. *Synchronous Programming of Reactive Systems.* Kluwer, 1993. [238]

[HB94] R. Hojati and R. K. Brayton. An Environment for Formal Verification Based on Symbolic Computations. Technical report. University of California, Berkeley, 1994. [238]

[HBK93] R. Hojati, R. K. Brayton, and R. P. Kurshan. BDD-Based Debugging of Designs Using Language Containment and Fair CTL. *Lecture Notes in Computer Science (LNCS)* 697, pages 41–58, (1993). [8]

[HD93] A. Hu and D. Dill. Efficient Verification with BDD's Using Implicitly Conjoined Invariants. *Lecture Notes in Computer Science (LNCS)* 697, pages 3–14, (1993). [157]

[Hen88] M. Hennessy. *Algebraic Theory of Processes.* MIT Press, 1988. [28, 204]

250                                          *Bibliography*

[HK90]    Z. Har'El and R. P. Kurshan. Software for Analytical Development of Communications Protocol. *AT&T Tech. J.* 69, pages 45–59, (1990).      [8, 9, 22, 145, 178, 201, 238]

[HM85]    M. C. B. Hennessy and R. Milner. Algebraic Laws for Nondeterminism and Concurrency. *J. ACM* 32, pages 137–161, (1985).      [28, 126]

[HNSY94]  T. A. Henzinger, X. Nicollin, J. Sifakis, and S. Yovine. Symbolic Model-Checking for Real-Time Systems. *Information and Computation* 111, pages 193–244, (1994).      [151, 238]

[Hoa85]   C. A. R. Hoare. *Communicating Sequential Processes*. Prentice Hall, Englewood Cliffs, NJ, 1985.      [126, 238]

[Hol88]   G. J. Holzmann. An Improved Protocol Reachability Analysis Technique. *Software Practice and Experience* 18, pages 137–161, (1988).      [147, 238]

[Hol91]   G. J. Holzmann. *Design and Validation of Computer Protocols*. Prentice Hall, 1991.      [126, 147, 238]

[Hop71]   J. E. Hopcroft. An $n \log n$ algorithm for minimizing the states in a finite automaton. In Paz Kohavi, editor, *Theory of Machines and Computations*, pages 189–196. Academic Press, 1971.      [187, 200]

[HRSJ91]  G. D. Hachtel, J.-K. Rho, F. Somenzi, and R. Jacoby. Exact and heuristic algorithms for the minimization of incompletely specified state machines. In *Proc. Eur. Conf. Design Automat*, pages 184–191, 1991.      [188]

[HS65]    J. Hartmanis and R. E. Stearns. On the Computational Complexity of Algorithms. *Trans. Amer. Math. Soc.* 117, pages 285–306, (1965).      [26]

[HSB94]   R. Hojati, V. Singhal, and R. K. Brayton. Edge-Streett/Edge-Rabin Automata Environment for Formal Verification Using Language Containment. unpublished, 1994.      [85, 88, 89, 162]

[HSBK93]  R. Hojati, T. Shiple, R. K. Brayton, and R. P. Kurshan. A Unified Environment for Language Containment and Fair CTL Model Checking. In *Proc. Design Automation Conf. (DAC)*, 1993.      [8]

*Bibliography* 251

[HSIS94] HSIS Development Group. HSIS: A BDD-Based Environment for Formal Verification. Technical report, U. C. Berkeley, 1994. [8, 238]

[HTKB93] R. Hojati, H. Touati, R. P. Kurshan, and R. K. Brayton. *Efficient ω-Regular Language Containment.* Lecture Notes in Computer Science (LNCS) 663, pages 396–409. Springer-Verlag, 1993. [8, 22, 215, 229, 238]

[HU79] J. E. Hopcroft and J. D. Ullman. *Introduction to Automata Theory, Languages, and Computation.* Addison-Wesley, 1979. [xii, 24, 26, 70, 114]

[Hun89] W. A. Hunt, Jr. Microprocessor Design Verification. *Journal of Automated Reasoning* 5, pages 429–460, (1989). [6]

[ID93] C. N. Ip and D. L. Dill. Better Verification through Symmetry. International Conference on Computer Hardware Description Languages (CHDL), pages 87–100, 1993. [193, 197]

[Joy88] J. Joyce. Formal Verification and Implementation of a Microprocessor. In G. Birtwistle and P. A. Subrahmanyam, editors, *VLSI Specification, Verification and Synthesis*, pages 129–157. Kluwer Academic Press, Boston, 1988. [6]

[JPHS91] S. W. Jeong, B. Plessier, G. D. Hachtel, and F. Somenzi. Variable Ordering for FSM Traversal. In *International Workshop on Logic Synthesis*, May 1991. [157, 226]

[Kam68] J. A. W. Kamp. *Tense Logic and the Theory of Linear Order.* PhD thesis, University of California, Los Angeles, 1968. [27]

[Kam85] M. Kaminski. A Classification of ω-Regular Languages. *Theoretical Computer Science* 36, pages 217–220, (1985). [27]

[KK86] J. Katzenelson and R. P. Kurshan. S/R: A language for specifying protocols and other coordinating processes. In *Proc. 5th Int'l. IEEE Phoenix Conf. Computer Commun.*, pages 286–292, 1986. [120, 208]

[KL93] R. P. Kurshan and L. Lamport. Formal Verification that a 64-Bit Multiplier Multiplies Correctly. *Lecture Notes Computer Science (LNCS)* 697, pages 166–179, 1993. [8, 86, 238]

252

*Bibliography*

[Kla91] N. Klarlund. Progress Measures for Complementation of ω-Automata with Applications to Temporal Logic. In *Proc. 32nd Conf. on Foundations of Computer Science (FOCS)*, pages 358–367. IEEE, 1991.  [27, 84]

[Kla93] N. Klarlund. Determinizing asynchronous automata, DAIMI PB-460. Technical report, Dept. C.S., Aarhus Univ., 1993.  [70]

[Kle56] S. C. Kleene. Representation of Events in Nerve Nets and Finite Automata. *Automata Studies (Annals of Mathematics Studies 34)*. Princeton, (1956).  [26]

[KM89] R. P. Kurshan and K. L. McMillan. A Structural Induction Theorem for Processes. *Proc. Conf. Princ. Distrib. Comput. (PODC)*, pages 239–247, (1989). To appear in *Inf. Comput.* [xii, 12, 203]

[KM91] R. P. Kurshan and K. L. McMillan. Analysis of Digital Circuits Through Symbolic Reduction. *IEEE Trans. CAD* 10, pages 1356–1371, (1991).  [3, 130, 174]

[KMOS94] R. Kurshan, M. Merritt, A. Orda, and S. Sachs. A Structural Linearization Principle for Processes. *Formal Methods in System Design* 5, pages 227–244, (1994).  [205]

[Koz77] D. Kozen. Lower Bounds for Natural Proof Systems. *Proc 18th Symposium Found. Computer Science (FOCS)*, pages 254–266, (1977).  [155]

[Koz83] D. Kozen. Results on the Propositional Mu-Calculus. *Theoretical Computer Science*, pages 333–354, (1983).  [223]

[KR63] K. B. Krohn and J. L. Rhodes. Algebraic Theory of Machines. In *Mathematical Theory of Automata*, pages 341–384. Polytechnic Press, Brooklyn, 1963.  [26]

[KS90] P. C. Kanellakis and S. A. Smolka. CCS Expressions, Finite State Processes, and Three Problems of Equivalence. *Inf. Computation* 86, pages 43–68, (1990).  [28, 187, 190, 204]

[Kur85a] R. P. Kurshan. Modelling Concurrent Processes. *Symposium Applied Math.* 31, pages 45–57, (1985). [29, 110, 208, 211]

[Kur85b] R. P. Kurshan. Proposed Specification of BX.25 Link Layer Protocol. *AT&T Tech. J.* 64, pages 559–596, (1985). [110]

*Bibliography* 253

[Kur87a] R. P. Kurshan. Complementing Deterministic Büchi Automata in Polynomial Time. *J. Computer Sys. Science* 35, pages 59–71, (1987). [92]

[Kur87b] R. P. Kurshan. Reducibility in Analysis of Coordination. *LNCIS* 103, pages 19–39, (1987). [29, 156, 159, 201]

[Kur90] R. P. Kurshan. Analysis of Discrete Event Coordination. *Lecture Notes in Computer Science (LNCS)* 430, pages 414–453, (1990). [xii, 29, 156]

[Kur94a] R. P. Kurshan. Automata-Theoretic Verification of Coordinating Processes. *Lecture Notes in Control and Inf. Sciences* 199, pages 16–28, (1994). [xii]

[Kur94b] R. P. Kurshan. *Homomorphic Reduction of Coordination Analysis*. IMA, Springer-Verlag, 1994. [xii]

[Kur94c] R. P. Kurshan. Models Whose Checks Don't Explode. *Lecture Notes in Computer Science (LNCS)* 818, pages 222–233, (1994). [xii]

[Kur94d] R. P. Kurshan. The Complexity of Verification. In *Proc. 26th ACM Symposium on Theory of Computing (STOC)*, pages 365–371, Montreal, 1994. [xii, 29]

[Lad77] R. E. Ladner. Application of Model-Theoretic Games to Discrete Linear Orders and Finite Automata. *Information and Control* 33, pages 281–303, (1977). [28]

[Lam91] L. Lamport. The Temporal Logic of Actions. Technical report, Systems Research Center Report 79, Digital Equip. Corp., 1991. [27]

[Lan69] L. H. Landweber. Decision Problems for $\omega$-Automata. *Math. Sys. Theory* 4, pages 376–384, (1969). [26, 27]

[Lee59] C. Y. Lee. Representation of Switching Circuits by Binary-Decision Programs. *Bell Systems Technical Journal* 38, pages 985–999, (1959). [217]

[Lin88] P. A. Lindsay. On Alternating $\omega$-Automata. *J. Comput. System Science* 36, pages 16–24, (1988). [27]

[Lip75] R. J. Lipton. Reduction: A Method of Proving Properties of Parallel Programs. *Comm. ACM* 18, pages 717–721, (1975). [124]

254                                                             Bibliography

[Lon93]   D. E. Long. *Model Checking, Abstraction, and Compositional Verification.* PhD thesis, CMU, 1993.   [156]

[LP85]    O. Lichtenstein and A. Pnueli. Checking that Finite-State Concurrent Programs Satisfy Their Linear Specifications. In *Proc. 13th ACM Symposium on Principles of Programming Languages (POPL)*, pages 97–107, 1985.   [27, 123]

[LPZ85]   O. Lichtenstein, A. Pnueli, and L. Zuck. The Glory of the Past. *Lecture Notes in Computer Science (LNCS)* 193, pages 196–218, (1985).   [27–29]

[LS84]    S. S. Lam and A. U. Shankar. Protocol Verification Via Projections. *IEEE Transactions on Software Engineering* 10, pages 325–342, (1984).   [177]

[LT87]    N. A. Lynch and M. R. Tuttle. Hierarchical Correctness Proofs for Distributed Algorithms. In *Proc. of the 6th Annual ACM Symposium on Principles of Distributed Computing (PODC)*, pages 137–151, 1987.   [126, 145, 177]

[LT88]    K. G. Larsen and B. Thomsen. A Modal Process Logic. In *Proceeding on Logic in Computer Science (LICS)*, 1988. [238]

[LY92]    D. Lee and M. Yannakakis. Online Minimization of Transition Systems. In *Proc. 24th ACM Symposium on Theory of Computing (STOC)*, pages 264–274, 1992.   [187, 193]

[Maz84]   A. Mazurkiewicz. Traces Histories and Graphs: Instances of a Process Monoid. In *Mathematical Foundations of Computer Science*, Lecture Notes in Computer Science (LNCS) 176, pages 115–133. Springer, Berlin, 1984.   [147]

[MC81]    J. Misra and K. M. Chandy. Proofs of Networks of Processes. *IEEE Trans. Software Eng.* SE-7, pages 417–426, (1981).   [111]

[McM93a]  K. L. McMillan. *Symbolic Model Checking.* Kluwer, 1993. [7, 8, 157, 216, 238]

[McM93b]  K. L. McMillan. Unfoldings to Avoid State Explosion Problem in the Verification of Asynchronous Circuits. *Lecture Notes in Computer Science (LNCS)* 663, pages 164–177, (1993).   [7, 147]

*Bibliography*

[McM94] K. L. McMillan. Hierarchical Representations of Discrete Functions, with Application to Model Checking. *Lecture Notes in Computer Science (LNCS)* 818, pages 41–54, (1994). [157, 227]

[McN66] R. McNaughton. Testing and Generating Infinite Sequences by a Finite Automaton. *Inf. Control* 9, pages 521–530, (1966). [26, 99]

[Mea55] G. Mealy. A Method for Synthesizing Sequential Circuits. *Bell System Technical J.* 34, pages 1045–1079, (1955). [26, 114]

[MH84] S. Miyano and T. Hayashi. Alternating Finite Automata on $\omega$-Words. *Theoretical Computer Science* 32, pages 321–330, (1984). [27]

[Mil80] R. Milner. A Calculus of Communicating Systems. *Lecture Notes in Computer Science (LNCS)* 92, (1980). [28, 126]

[Moo56] E. F. Moore. Gedanken Experiments on Sequential Machines. In C. E. Shannon and J. McCarthy, editors, *Automata Studies*, Ann. Math. Studies 34, pages 129–153. Princeton Univ. Press, Princeton, NJ, 1956. [26, 114]

[Moo64] E. F. Moore. *Sequential Machines*. Addison-Wesley, Reading, MA. 1964. [114]

[MP43] W. S. McCulloch and W. Pitts. A Logical Calculus of the Ideas Immanent in Nervous Activity. *Bulletin of Mathematical Biophysics* 5, pages 115–133, (1943). [26]

[MP81] Z. Manna and A. Pnueli. Verification of concurrent programs: The temporal framework. In J. S. Moore R. S. Boyer, editor, *The Correctness Problem in Computer Science*, pages 215–273. Academic Press, 1981. [27]

[MP87] Z. Manna and A. Pnueli. Specification and Verification of Concurrent Programs ∀-Automata. In *Proc. 14th Symposium Princ. Prog. Lang. (POPL)*, pages 1-12. ACM, 1987. [29, 84]

[MP90] Z. Manna and A. Pnueli. Tools and Rules for the Practicing Verifier. In *Carnegie Mellon Computer Science: A 25-year Commemorative*. ACM Press, 1990. [8, 24]

256                                                              Bibliography

[MS87]   D. E. Muller and P. E. Schupp. Alternating Automata on Infinite Trees. *Theoretical Computer Science* 54, pages 267–276, (1987). [27]

[MS93]   O. Maler and L. Staiger. On Syntactic Congruences for ω-Languages. Preprint, 1993. [27]

[Mul63]  D. E. Muller. Infinite Sequences and Finite Machines. *Proc. IEEE Symposium Switch. Cir. Thy. Logic Design* 4, pages 3–16, (1963). [26]

[MW84]   Z. Manna and P. Wolper. Synthesis of Communicating Processes from Temporal Logic Specifications. In *ACM Trans. on Programming Languages and Systems* 6, pages 68–93, 1984. [27]

[NP85]   M. Nivat and D. Perrin. *Automata on Infinite Words*. Lecture Notes in Computer Science (LNCS) 192. Springer-Verlag, 1985. [27]

[NSY92]  X. Nicollin, J. Sifakis, and S. Yovine. Compiling Real-Time Specifications into Extended Automata. *IEEE Trans. Software Eng.* 18, pages 794–804, (1992). [151]

[OL82]   S. Owicki and L. Lamport. Proving Liveness Properties of Concurrent Programs. *Trans. ACM* 4, pages 455–495, (1982). [27]

[Par81]  D. Park. Concurrency and Automata on Infinite Sequences. *Lecture Notes in Computer Science (LNCS)* 104, pages 167–183, (1981). [27]

[Pec86]  J.-P. Pecuchet. On the Complementation of Büchi Automata. *Theoretical Computer Science* 47, pages 95–98, (1986). [27]

[Pel94]  D. Peled. *On Projective and Separable Properties, Colloquium on Trees in Algebra and Programming*. Edinburgh, 1994. [147]

[Per84]  D. Perrin. Recent Results on Automata and Infinite Words. In *Mathematical Foundations of Computer Science*, Lecture Notes in Computer Science (LNCS) 176, pages 134–148. Springer-Verlag, 1984. [27]

[Pet81]  J. L. Peterson. *Petri Net Theory and The Modeling of Systems*. Prentice-Hall, 1981. [7]

*Bibliography* 257

[Pet91] I. Peterson. Software Failure: Counting up the Risks. *Science News* 140, page 388, (1991). [4]

[Pnu77] A. Pnueli. The Temporal Logic of Programs. In *Proc. of the Eighteenth Symposium on Foundations of Computer Science (FOCS)*, pages 46–57, Providence, RI, 1977. [27, 28]

[Pnu81] A. Pnueli. The Temporal Semantics of Concurrent Programs. *Theoretical Computer Science* 13, pages 45–60, (1981). [27, 28]

[PP93] D. Perrin and J. E. Pin. *Mots Infinis*, DRAFT. Institut Blaise Pascal, LITP, Paris, 1993. [27]

[PR89a] A. Pnueli and R. Rosner. On the Synthesis of a Reactive Module. In *16th ACM Symposium on Principles of Programming Languages (POPL)*, pages 179–190, (1989). [27]

[PR89b] A. Pnueli and R. Rosner. On the Synthesis of an Asynchronous Reactive Module. *Lecture Notes Computer Science (LNCS)* 372, pages 652–671, (1989). [27]

[PR91] H. Plünnecke and W. Reisig. Bibliography of Petri Nets 1990, in Advances in Petri Nets 1991, (1990/91). [7]

[PU59] M. C. Paull and S. H. Unger. Minimizing the Number of States in Incompletely Specified Sequential Switching Functions. *IRE Trans. EC-8*, pages 356–367, (1959). [188]

[QPF89] J. Quemada, S. Pavon, and A. Fernadez. State Exploration by Transformation with LOLA. *Lecture Notes in Computer Science (LNCS)* 407, pages 294–302, (1989). [238]

[QS82] J. P. Queille and J. Sifakis. Specification and Verification of Concurrent Systems in CESAR. *Lecture Notes Computer Science (LNCS)* 137, pages 337–351, (1982). [6, 27, 238]

[Rab69] M. O. Rabin. Decidability of Second-Order Theories and Automaton Infinite Trees. *Trans. Amer. Math. Soc.* 141, pages 1–35, (1969). [26, 27]

[Rab72] M. O. Rabin. Automata on Infinite Objects and Church's Problem. *Reg. Conf. Ser. Math.* 13, (1972). [27]

[Ram89] P. J. Ramadge. Some Tractable Supervisory Control Problems for Discrete Event Systems Modeled by Büchi Automata. *IEEE Transactions on Automatic Control* 34, pages 10–19, (1989). [27, 29]

Bibliography

[RS59]    M. O. Rabin and D. Scott. Finite Automata and Their Decisions Problems. *IBM J. Res. and Dev.* 3, pages 114–125, (1959). (Reprinted in [Mo64] 63–91). [24, 26, 64, 68]

[RS92]    V. Roy and R. De Simone. Auto/Autograph. *Formal Methods in System Design* 1, pages 239–249, 1992. [238]

[RU71]    N. Rescher and A. Urquart. *Temporal Logic.* Springer-Verlag, Berlin, 1971. [27]

[Rud93]    R. Rudell. Dynamic Variable Ordering for Ordered Binary Decision Diagrams. In *Proc. International Conference on Computer-Aided Design*, pages 42–47, 1993. [157, 215, 227]

[RW87]    P. J. Ramadge and W. M. Wonham. Supervisory Control of a Class of Discrete-Event Processes. *SIAM J. Control and Optimization* 25, pages 206–230, (1987). [27]

[Saf88]    S. Safra. On the complexity of $\omega$-automata. In *Proc. 29th Found. Computer Science (FOCS)*, pages 319–327, 1988. [26, 27, 29, 81, 83–85]

[Saf92]    S. Safra. Exponential Determinization for $\omega$-Automata with Strong-Fairness Acceptance Condition. In *Proc. 24th ACM Symposium on Theory of Computing (STOC)*, pages 275–282, 1992. [26, 27, 29, 84–86]

[Sav70]    W. Savitch. Relationships Between Nondeterministic and Deterministic Tape Complexities. *J. Computer System Science* 4, pages 177–192, (1970). [156]

[SC85]    A. P. Sistla and E. M. Clarke. The Complexity of Propositional Linear Temporal Logics. *Journal of the ACM* 32, pages 733–749, (1985). [6, 27]

[SG89]    Z. Shtadler and O. Grumberg. Network Grammars, Communication Behaviors and Automatic Verification. In *Workshop on Automatic Verification Methods for Finite State Systems*, Lecture Notes in Computer Science 407, pages 151–165. Springer-Verlag, 1989. [204]

[Sha49]    C. E. Shannon. Synthesis of Two-Terminal Switching-Circuits. *Bell System Tech. Journal* 28, pages 59–98, (1949). [26]

[Sie70]    D. Siefkes. *Decidable Theories I — Büchi's Monadic Second-Order Successor Arithmetics.* Springer, Berlin, 1970. Lecture Notes in Mathematics 120. [26]

*Bibliography*

[Sif83] J. Sifakis. Property Preserving Homomorphisms of Transition Systems. *Lecture Notes in Computer Science (LNCS)* 164, pages 458–473, (1983). [124, 190]

[Sik49] R. Sikorski. On the Inducing of Homomorphisms by Mappings. *Fund. Math.* 36, pages 7–22, (1949). [60]

[Sik69] R. Sikorski. *Boolean Algebras*. Springer-Verlag, 1969. [39, 57, 60]

[SKMB90] A. Srinivasan, T. Kam, S. Malik, and R. K. Brayton. Algorithms for Discrete Function Manipulation. In *IEEE International Conference on Computer-Aided Design*, pages 92–95, November 1990. [217]

[Sta83] L. Staiger. Finite-State $\omega$-Languages". *J. Comput. System Science* 27, pages 434–448, (1983). [27, 188]

[Sta85a] L. Staiger. The Entropy of Finite-State $\omega$-Languages. *Problems of Control and Information Theory* 14, pages 383–392, (1985). [27]

[Sta85b] E. W. Stark. A Proof Technique for Rely/Guarantee Properties. *Lecture Notes in Computer Science* 206, pages 369–391, (1985). [111]

[Str82] R. S. Streett. Propositional Dynamic Logic of Looping and Converse is Elementary Decidable. *Inf. Control* 54, pages 121–141, (1982). [27, 82]

[SV89] S. Safra and M. Y. Vardi. On $\omega$-Automata and Temporal Logic. In *Proc. 21st ACM Symposium on Theory of Computing (STOC)*, pages 127–137, 1989. [27, 29, 82, 85, 86]

[SVW87] A. P. Sistla, M. Y. Vardi, and P. Wolper. The Complementation Problem for Büchi Automata, with Applications to Temporal Logic. *Theoretical Computer Science* 49, pages 217–237, (1987). [27, 29, 122]

[Tar72] R. E. Tarjan. Depth-First Search and Linear Graph Algorithms. *SIAM J. Comput.* 1, pages 146–160, (1972). [155, 166]

[TB73] B. A. Trakhtenbrot and Y. M. Barzdin. *Finite Automata*. North-Holland, Amsterdam, 1973. Translated from Russian. [27]

Bibliography

[TBK91] H. Touati, R. K. Brayton, and R. P. Kurshan. Testing Language Containment for $\omega$-Automata Using BDD's. In *International Workshop on Formal Methods in VLSI Design*, Miami, January 1991. ACM SIGDA. To appear in *Inf. Comput.* [xii, 12, 215]

[Thi91] J. Thistle. Control of infinite behavior of discrete-event systems. 1991. Ph.D. Thesis, U. Toronto. [24, 27]

[Tho79] W. Thomas. Star-Free Regular Sets of $\omega$-Sequences. *Inf. Control* 42, pages 148–156, (1979). [27, 28, 122]

[Tho81] W. Thomas. A Combinatorial Approach to the Theory of $\omega$-Automata. *Information and Control* 48, pages 261–283, (1981). [28]

[Tho87] W. Thomas. On Chain Logic, Path Logic, and First-Order Logic over Infinite Trees. Symposium on Logic in Computer Science, pages 245–257, 1987. [27]

[Tho90] W. Thomas. Automata on infinite objects. In *Handbook of Theoretical Computer Science* B, chapter 4, pages 165–186. Elsevier, 1990. [27, 28, 125]

[Tse59] M. Tsetlin. Nonprimitive Circuits (in Russian). *Problemy Kibernetiki* 2, (1959). [33]

[TSL+90] H. J. Touati, Hamid Savoj, B. Lin, R. K. Brayton, and Alberto Sangiovanni-Vincentelli. Implicit State Enumeration of Finite State Machines using BDD's. In *ICCAD'90*, November 1990. [157, 226–229]

[Tur36] A. M. Turing. On Computable Numbers, with an Application to the Entscheidungsproblem. *Proc. London Math. Soc.* Ser 2–42, pages 230–265, (1936). [26]

[Ung69] S. H. Unger. *Asynchronous Sequential Switching Circuits*. John Wiley, 1969. (Reprinted by Krieger). [188]

[Val91] A. Valmari. A Stubborn Attack on State Explosion. *Lecture Notes in Computer Science (LNCS)* 531, pages 25–42, (1991). [147]

[Var85] M. Y. Vardi. Automatic Verification of Probabilistic Concurrent Finite-State Programs. In *Proc. 26th IEEE Symposium on Foundations of Computer Science (FOCS)*, pages 327–338. Portland, 1985. [4, 83]

*Bibliography*

[Var87] M. Y. Vardi. Verification of Concurrent Programs — The Automata-Theoretic Framework. In *Proc. 2nd IEEE Symposium on Logic in Computer Science (LICS)*, pages 161–176, Ithaca, 1987. [29]

[Var89] M. Y. Vardi. Unified Verification Theory. In *Proc. Temporal Logic in Specification — 1987*, Lecture Notes in Computer Science (LNCS) 398, pages 202–212. Springer-Verlag, 1989. [29]

[Var91] M. Y. Vardi. Verification of Concurrent Programs — The Automata-Theoretic Framework. *Annals of Pure and Applied Logic* 51, pages 79–98, (1991). [29]

[von56] J. von Neumann. Probabilistic Logics and the Synthesis of Reliable Organisms from Unreliable Components. *Automata Studies*, Princeton, pages 43–98, (1956). [26]

[VW86a] M. Y. Vardi and P. Wolper. An Automata-Theoretic Approach to Automatic Program Verification. In *Proc. (1st) IEEE Symposium on Logic in Computer Science (LICS)*, pages 322–331, Boston, 1986. [27, 29]

[VW86b] M. Y. Vardi and P. Wolper. Automata-Theoretic Techniques for Modal Logic of Programs. *J. Computer and System Sciences* 32, pages 183–221, (1986). [27, 29]

[VW94] M. Y. Vardi and P. L. Wolper. Reasoning About Infinite Computation Paths. *Inf. Comput.* 115, pages 1–37, (1994). [262]

[WA85] W. Wadge and E. Ashcroft. *LUCID, The Dataflow Programming Language*. Academic Press, 1985. [120]

[Wag79] K. Wagner. On $\omega$-Regular Sets. *Information and Control* 43, pages 123–177, (1979). [27]

[Wal88] D. Walker. Bisimulations and Divergence in CCS. In *Third Annual Symposium on Logic in Computer Science (LICS)*, pages 186–192. Computer Society Press, 1988. [28, 204]

[Wig92] A. Wigderson. The Complexity of Graph Connectivity. In *Proc. 17th FOCS and Lecture Notes in Computer Science (LNCS)* 629, pages 112–132, (1992). [156]

Bibliography

[WL89] P. Wolper and V. Lovinfosse. Verifying Properties of Large Sets of Processes with Network Invariants. In *Workshop on Automatic Verification Methods for Finite Systems*, Lecture Notes in Computer Science (LNCS) 407, pages 68–80. Springer-Verlag, 1989. [204]

[WL93] P. Wolper and D. Leroy. Reliable Hashing Without Collision Detection. *Lecture Notes in Computer Science (LNCS)* 697, pages 59–70, (1993). [29]

[Wol83] P. Wolper. Temporal Logic Can Be More Expressive. *Inf. Control* 56, pages 72–99, (1983). [6, 27, 28, 123]

[Wol86] P. Wolper. Expressing Interesting Properties of Programs in Extended Temporal Logic. In *Proc. 13th ACM Symposium Principles of Prog. Langs. (POPL)*, pages 184–193, 1986. [10, 27]

[Wol89] P. Wolper. On the Relation of Programs and Computations to Models of Temporal Logic. *Lecture Notes in Computer Science (LNCS)* 398, pages 75–123, (1989). [27]

[WVS83] P. L. Wolper, M. Y. Vardi, and A. P. Sistla. Reasoning About Infinite Computation Paths. In *Proc. 24th IEEE Symposium on Foundation of Computer Science (FOCS)*, pages 185–194, Tuscon, 1983. An expanded version appears in [VW94]. [28, 29]

[Yeh83] R. Yeh. Software Engineering. *IEEE Spectrum*, pages 91–94, (1983). [4]

[YL93] M. Yannakakis and D. Lee. An Efficient Algorithm for Minimizing Real-Time Transition Systems. *Lecture Notes in Computer Science (LNCS)* 697, pages 210–224, (1993). [187]

[Zi87] W. Zielonka. Notes on Finite Asynchronous Automata. *RAIRO Inform. Théoretique et Appl.* 21, pages 99–135, (1987). [147]

Glossary $'$ (5.1.11) 66
$2^V$ (6.2.4) 82
$\oplus$ (3.1.3) 46, (5.1.13) 67, (6.2.31) 96
$\otimes$ (3.1.3) 47, (5.1.13) 67, (6.2.31) 96
$\times$ (3.1.1) 46
$\wedge$ (5.1.13) 67
$\cong$ (2.1.7) 35
$= 6$
$\beta(\mathbf{v})$ (6.2.10) 92
$\emptyset$ (empty set) (2.1) 35
$\varphi$ (4.2.1) 53
$\varphi A$ (5.3.1) 72
$\widehat{\varphi}$ (4.2.1) 53
$\mu(\mathbf{v})$ (6.2.1) 81
$\rho(A)$ (6.2.4) 82
$\Pi_{L'} M$ (3.3.5) 49
$\Pi_{L'} A$ (5.3.6) 73
$\Pi \varphi_\iota$ (2.2.2) 43
$\mathcal{B}(P)$ (8.1.6) 154
$\mathcal{C}(P)$ (7.6.1) 127
$\mathcal{L}(A)$ (5.1.1) 64, 82, (6.2.11) 92
$\mathcal{L}^+(P)$ (7.6.21) 141
$\mathcal{L}^*(P)$ 148
$\mathcal{L}_\beta(A)$ (6.2.11) 92
$\mathcal{L}_\mu(A)$ (6.2.11) 92
$[A]$ (6.2.34) 96
$A^\#$ (5.1.9) 66, (6.2.26) 95
$\bar{A}$ (8.8.2) 183
$\mathbb{B}$ (2.1.21) 39
$\mathbb{B}(U)$ (2.1.21) 39
$\mathbb{B}(X)$ (8.12.3) 199
$\mathbb{B}[V]$ (2.1.21) 39
$\mathbb{B}[x_1, \ldots, x_k]$ (2.1.24) 40
$E(M)$ (3.1.1) 46
$I(A)$ (6.2.9) 91
id (2.1.12) 37
$k(\mathcal{L})$ (6.1.3) 77
ker $\varphi$ (2.1.8) 36
$\lim \mathcal{L}$ (6.1.7) 78
$M_A$ (6.2.9) 91
$P|_W$ (6.2.21) 94
$P^+$ (7.6.29) 143
$P^*$ (6.2.22) 94
$P^o$ (8.1.6) 154
$P^\#$ (5.1.6) 65, (6.2.19) 94
$P_I$ (8.1.4) 154
$R(A)$ (6.2.9) 91
$\mathbf{SF}(L, U)$ (6.2.2) 81
$s_M(v)$ (3.1.1) 46
$s_X(v)$ (5.1.3) 64, (6.2.15) 92
$S(L)$ (2.1.3) 34
$S(L)^+$ (4.1.1) 51
$S(L)^\omega$ (4.1.1) 51
$S_P(v)$ (5.1.4) 65, (6.2.16) 93
$\widehat{S}_P$ (7.6.10) 133
$[v]$ (8.10.2) 194
$V(M)$ (3.1.1) 46
$V^2$ (3.1.1) 46
$\mathbf{WF}(L, U)$ (6.2.3) 82
$(X)$ (8.7.1) 181
$X/\alpha$ (8.10.4) 194
$Z(A)$ (6.2.9) 91

APPENDIX B

Picking the Next Free Fence to Minimize the number of Free Selections, a minimal flow computation.

Starting with:

the active variables, the old free fence on its boundary, and a set vars_f of old free fence variables to be made active, Find:

the new set of active variables, by finding its new free fence on its boundary.

The new free fence will always have a minimal product of free selections given what stvars are active, and if a limit for the product is given with -#freesels=, successive stvars will be activated until the limit is met.

===

So: given the old active vars and the free-fence vars to be made active: make the new vars active. Now find successive stvar fences starting from the new active vars, and going outward through free variables. Label the stvar fences 1, 2 ... N. Set VCUT = N+1. These are the forward stvar fences, selected by the set of variables to be made active.

Now label any other stvar fences encountered starting from all active variables (the backward fences) N+2 ... NN. These labels are used to determine which stvars to favor including in the active set later. If -#disconnect is specified, advance the newly activated variables to the first stvar fence. (The directionality has been saved in the fence labels.)

===

The problem is converted into a minimal flow problem by 1. saying we want to minimize the sum of logs of selections on the new free fence, instead of the product of free selections;

2. dividing each variable into an input ivariable and an output ovariable with a single channel between them having capacity equal to the log of the number of free selections for the variable;

3. joining each ovariable to foriegn ivariables it depends on with an infinite capacity channel.

The active variables are an infinite source of flow to the variables they depend on (so the old free fence is fed by an infinite source), and each stvar ovariable has an infinite-capacity channel to an infinite sink.

Thus the flow will be limited by the capacity of certain ivariable-to-ovariable channels internal to original variables. These limiting variables form the new free fence.

===

The computation of flow given this graph (source, channels, sink) is done with the usual maximal flow algorithm (see Wagner, ``Principles of Operations Research'', Appendix I, ``Advanced Topics in Network Algorithms'', Prentice Hall, 1975, p 953-958).

[zero all flows, and all nodes marked Sink-side except the source marked Source-side.

Look at a source-side node; if any channel to a sink-side node has a flow that's less than capacity, mark the channel Plus, and mark the far node Source-side; if any channel from a sink-side node has a flow that's nonzero, mark the channel Minus, and mark the far node Source-side.

If the sink is finally marked Source-side, then there's a path from source to sink marked with Plus and Minus's, along which flow can be improved.

Find this path (we use bfs), and how much it can be improved. This is the minimal remaining capacity on Plus channels and the minimal existing flow in Minus channels along the path.

Increase (Plus) and decrease (Minus) the flow along this path, and start over with the new flow.

When there's no path to the sink, the flow is maximal.]

When finding the path, paths from stvars to sink are favored, so the flow stays as close to the source as possible.
(There may be other distant flows giving the same capacity.)

Given the maximal flow, the new free fence is given by the variables whose ivariable-to-ovariable channel limits the flow.

Complication: how to find which variables limit the flow:

For each variable with capacity i-o flow, increase the capacity of the channel and look for a flow-improving source-to-sink path. If the path is found, the variable limits the flow, and hence is on the new free fence. Restore its original capacity if so. If not, leave the capacity increased for the variable. After all the limiting variables have been found, restore all the capacities to the original values.

The order in which variables are checked determines whether near or far variables wind up on the free fence, given a tie. (For example, a linear chain of equal-capacity variables; any one of them limits the flow after all the capacities on the others are increased. -#maxvars says pick the most distant variable (ie. increase the capacities on the near ones first in this test).

If an undesired variable winds up on the free fence, give its i-o channel infinite capacity and recompute the flow. Undesired variables are: stvars, or any selver that's tied to an active stvar within a selection predicate.

===

Limiting the flow, -#freesels=.

If the resulting flow exceeds -#freesels, the network is changed by shutting down the stvar-to-sink channels on selected stvars. (This will eventually drop the maximal flow and thus move the discovered new free fence outward.) One stvar is shut down per iteration.

First, if there's a stvar in the maximal flow, shut it down.

If not, pick the largest-flow stvar with label less than VCUT. This will be in the forward direction, defined by the original variables-to-be-activated.

If there are none, pick the lowest-label (ie. nearest) stvar in the backward set, with label greater than VCUT.

Having shut a stvar-to-sink channel down, increase VCUT,
so the directionality is gradually lost from the problem
as the solution grows.

===

-#slowdisconnect=M

The flow computation is iterated M times whether the number
of free selections resulting is big or small; this advances
the fence past M stvars on the average, is the idea, rather
than just advancing past the first stvar fence all at once.
If the width of the first stvar fence is less than M, M is
reset to the actual fence width.

The option can be used as well as -#disconnect, which then
performs both actions.

====

```
Flow, main program
:raflowmain (v, usedisconnect)
:Vertex *v;
:{
:       if (FDEBUG & 1) printf ("flow analysis to get free fence:\n");
:       flowfirst = 0;
:       aslow = sharp_slowdisconnect;
:       /* label stvars with layer distance from v; then label
backward-direction stvars with higher numbers outward */
:       raseqstvars (v); /* set stvar sequence outward from v */
:       /* advance v to stvar fence, zero v, if flagged */
:       if (usedisconnect) v = raflowdisconnect (v);
:       /* set up flow graph from R_ACTIVE and v */
:       raarcs (v);
:       if (FDEBUG & 16) radumpgraph ("initial graph:", asource,
asink, nodes, arcs);
:       /* iterate until freesels satisfied (if any) or do once */
:       do {
:               if (FDEBUG & 1) printf ("find max flow\n");
:               raflowzero (arcs);
:               raflow (asource, asink, nodes, arcs);
:       } while (raflowiterate (asource, asink, nodes, arcs));
:       if (FDEBUG & 16) radumpgraph ("finished flow:", asource,
asink, nodes, arcs);
:       if (FDEBUG & 1) printf ("final ");
:       if (!raflowok (asource, asink, nodes, arcs)) {
```

```
:           raflowfree (asource, asink, nodes, arcs);
:           return 0;
:       }
:       /* flag the computed free fence */
:       rasetfreecut (asource, asink, nodes, arcs);
:       raflowfree (asource, asink, nodes, arcs);
:       return 1;
:}
```

Sequence stvar fences 1 2 ... first in the direction
of the newly activated vars; set vcut; then sequence
other stvar fences outward from the active set in
general.

```
:/* sequence stvars in ext.asgn.x outward from vars_f */
:raseqstvars (v)
:Vertex *v;
:{
:       Vertex *u, *w, *z;
:       Dchain *d, *dv;
:       int seq = 0;
:       int layer = 0;
:
:       for (dv = 0; v; v = v->ext.ra.fl) dv = dchain (dv, v); /* save
v */
:       setextx (proc); /* clear ext.asgn.x */
:       rafllink (0, proc, raproc30); /* clear mark and visit */
:       for (v = 0, d = dv; d; d = d->next) { d->v->ext.ra.fl = v; v
= d->v; }
:       for (u = v; u; u = u->ext.ra.fl) u->ext.ra.visit = 1;
:       do {
:               z = 0;
:               while (u = v) {
:                       for (v = 0; u; u = u->ext.ra.fl) {
:                               for (d = u->ext.ra.dep; d; d = d->next) {
:                                       w = d->v;
:                                       if (w->ext.ra.visit) continue;
:                                       w->ext.ra.visit = 1;
:                                       if (w->ext.ra.stat == R_ACTIVE) continue;
:                                       if (w->op == STVAR) {
:                                               w->ext.asgn.x = layer + 1;
:                                               seq++;
:                                               w->ext.ra.fl = z;
:                                               z = w;
:                                       } else {
:                                               w->ext.asgn.x = layer;
:                                               w->ext.ra.fl = v;
:                                               v = w;
:                                       }
:                               }
:                       }
:               }
:               if (!layer && (FDEBUG & 1)) printf ("%d fence stvars
outward from vars_f\n", seq);
```

```
:               if (!layer++ && aslow && aslow > seq) {
:                   if (FDEBUG & 1) printf ("reducing #slowdisconnect
to %d\n", seq);
:                   aslow = seq;
:               }
:       } while (v = z);
:       if (FDEBUG) printf ("%d total stvars outward from vars_f with
%d layers\n", seq, layer);
:       vcut = ++layer; /* make a layer gap for vcut to count thru in
raflowiter() */

:       /* sequence unlabeled stvars outward from R_ACTIVE */
:       v = rafllink (0, proc, raproc17);
:       for (u = v; u; u = u->ext.ra.fl) u->ext.ra.visit = 1;
:       do {
:           z = 0;
:           while (u = v) {
:               for (v = 0; u; u = u->ext.ra.fl) {
:                   for (d = u->ext.ra.dep; d; d = d->next) {
:                       w = d->v;
:                       if (w->ext.ra.visit) continue;
:                       w->ext.ra.visit = 1;
:                       if (w->op == STVAR) {
:                           w->ext.asgn.x = layer + 1;
:                           seq++;
:                           w->ext.ra.fl = z;
:                           z = w;
:                       } else {
:                           w->ext.asgn.x = layer;
:                           w->ext.ra.fl = v;
:                           v = w;
:                       }
:                   }
:               }
:           }
:           layer++;
:       } while (v = z);
:       if (FDEBUG) printf ("%d reachable stvars outside vars_f and
active set\n", seq);

:       /* restore initial v */
:       for (v = 0, d = dv; d; d = d->next) { d->v->ext.ra.fl = v; v
= d->v; }
:       dchainfree (dv);
:}
``` if -#disconnect, advance the newly activated vars to
the first stvar fence.

```
:/* advance v to disconnect */
:Vertex *
:raflowdisconnect (v)
:Vertex *v;
:{
```

```
:       Vertex *u, *w;
:       Dchain *d;
:       if (FDEBUG & 1) printf ("#disconnect, advance to stvar
fence\n");
:       rafllink (0, proc, raproc30); /* clear visit and mark */
:       for (u = v; u; u = u->ext.ra.fl) {
:               u->ext.ra.free &= ~2;
:               u->ext.ra.stat = R_ACTIVE;
:               u->ext.ra.visit = 1;
:       }
:       while (u = v) {
:               for (v = 0; u; u = u->ext.ra.fl) {
:                       for (d = u->ext.ra.dep; d; d = d->next) {
:                               w = d->v;
:                               if (w->ext.ra.visit) continue;
:                               if (w->ext.ra.free != 2) continue;
:                               w->ext.ra.free &= ~2;
:                               w->ext.ra.stat = R_ACTIVE;
:                               if (FDEBUG & 1) { printf ("activate "); plays
(w); printf (" from "); plays (u); printf ("\n"); }
:                               if (w->op != STVAR) {
:                                       w->ext.ra.fl = v;
:                                       v = w;
:                               }
:                       }
:               }
:       }
:       return 0;
: }

Set up the flow graph for the free variables, the active
set represented by a source, and each free stvar tied
to a sink.

:raproc38 (v) Vertex *v; { ANODE (v, 0) = 0; ANODE (v, 1) = 0;
return 0; }
:/* set up flow graph for free tree reachable from v list and
R_ACTIVE's */
:raarcs (v)
:Vertex *v;
:{
:       double raarcscale ();
:       Vertex *u, *w;
:       Value temp;
:       Dchain *d;
:       struct anode *a, *b;
:       struct arc *c, *cc;
:       rafllink (0, proc, raproc38); /* zero ANODE() fields */
:       /* set Vars_f R_ACTIVE */
:       for (u = v; u; u = u->ext.ra.fl) {
:               u->ext.ra.free &= ~2;
:               u->ext.ra.stat = R_ACTIVE;
:       }
:       temp.v = 0;
```

Find the maximal flow for the graph

```
:raflow (asource, asink, nodes, arcs)
:struct anode *asource, *asink, *nodes;
:struct arc *arcs;
:{
:    while (raincrflow (asource, asink, nodes, arcs)) {
:        if (!radoincrflow (asource, asink)) error ("raflow
botch2");
:    }
:}
```

Look for a path increasing the flow

```
:raincrflow (asource, asink, nodes, arcs)
:struct anode *asource, *asink, *nodes;
:struct arc *arcs;
:{
:    struct anode *a, *b, *m, *z;
:    struct arc *c;
:    struct alist *l;
:
:    /* unmark all nodes and arcs */
:    for (c = arcs; c; c = c->next) c->pm = 0;
:    for (a = nodes; a; a = a->next) a->m = 0;
:
:    /* mark outward arcs with more cap. or inward arcs in use */
:    asource->nm = 0;
:    m = asource;
:    asource->m = 1;
:    do {
:        z = 0;
:        while (m && m != asink) {
:            for (l = m->out; l; l = l->next) {
:                if (l->c->current >= l->c->cap) continue;
:                b = l->c->b;
:                if (b->m) continue;
:                b->m = 1;
:                b->nm = z;
:                z = b;
:                l->c->pm = 1;
:                if (b == asink) return 1; /* favor sink */
:            }
:            for (l = m->in; l; l = l->next) {
:                if (l->c->current <= 0) continue;
:                a = l->c->a;
:                if (a->m) continue;
:                a->m = 1;
:                a->nm = z;
:                z = a;
:                l->c->pm = -1;
:            }
:            m = m->nm;
```

```
        }
    } while (m = z);
    if (FDEBUG & 4) printf ("raincrflow %d\n", m == asink);
    return m == asink;
}
```
Implement the path increasing the flow

```
radoincrflow (asource, asink)
struct anode *asource, *asink;
{
    struct anode *a, *b, *m, *mm;
    struct alist *l;
    struct arc *c;
    int min;
    /* reached sink, find path of increase */
    m = asink;
    m->nm = 0;
    m->prev = 0;
    for (a = nodes; a; a = a->next) a->m = 0;
    m->m = 1;
    while (mm = m) {
        for (m = 0; mm; mm = mm->nm) {
            for (l = mm->out; l; l = l->next) {
                if (!l->c->pm) continue;
                b = l->c->b;
                if (b->m) continue;
                b->m = 1;
                b->nm = m;
                m = b;
                b->prev = l->c;
            }
            for (l = mm->in; l; l = l->next) {
                if (!l->c->pm) continue;
                a = l->c->a;
                if (a->m) continue;
                a->m = 1;
                a->nm = m;
                m = a;
                a->prev = l->c;
            }
        }
    }
    if (!asource->prev) return 0;

/* find flow increase */
    min = (unsigned)-0 >> 1;
    c = asource->prev;
    while (c) {
        if (c->pm > 0) {
            if (c->cap - c->current < min) min = c->cap - c->current;
            c = c->b->prev;
        } else {
            if (c->current < min) min = c->current;
```

```
                    c = c->a->prev;
            }
    }
    /* increase the flow */
    if (FDEBUG & 1) printf ("flow increase factor = %g\n", raunlog
(min));
    c = asource->prev;
    while (c) {
            if (c->pm > 0) {
                    if (FDEBUG & 4) { printf ("incr "); plays (c->a->v);
printf (" "); plays (c->b->v); printf ("\n"); }
                    c->current += min;
                    if (c->cap == 0 || c->current > c->cap) c->current
= c->cap;
                    c = c->b->prev;
            } else {
                    if (FDEBUG & 4) { printf ("decr "); plays (c->a->v);
printf (" "); plays (c->b->v); printf ("\n"); }
                    c->current -= min;
                    if (c->current < 0) c->current = 0;
                    c = c->a->prev;
            }
    }
    return min;
}
```

Should the flow be iterated?  shut down a stvar if so.

```
/* does the found flow need iteration */
raflowiterate (asource, asink, nodes, arcs)
struct anode *asource, *asink, *nodes;
struct arc *arcs;
{
    struct arc *c, *cc;
    int i, j;
    /* if bad free fence element (nofree or mate of active stvar)
unfree it */
    if (cc = raflowbadpair (asource, asink, nodes, arcs)) {
            if (FDEBUG & 1) {
                    printf ("selvar/stvar pair straddles fence ");
                    plays (cc->b->v);
                    printf ("/");
                    plays (cc->b->v->ext.ra.alt);
                    printf (", iterate\n");
            }
            cc->a->nofree = 1;
            /* if already marked nofree, punt */
            if (cc->b->nofree) goto sigh;
            cc->b->nofree = 1;
            cc->cap = log (2.) * BITS * rascale;
            return 1;
    }
sigh:
```

```
:       source = build (PROC, 0, (Line*)0, choosename ("source"),
temp);
:       sink = build (PROC, 0, (Line*)0, choosename ("sink"), temp);
:       asource = raanode (source, 1);
:       asink = raanode (sink, 0);
:
:       /* get R_ACTIVE nodes and hang their dep's on source */
:       v = rafllink (0, proc, raproc17);
:       for (u = v; u; u = u->ext.ra.fl) {
:               for (d = u->ext.ra.dep; d; d = d->next) {
:                       w = d->v;
:                       if (w->ext.ra.stat == R_ACTIVE) continue;
:                       if (ANODE (w, 0)) continue;
:                       ANODE (w, 0) = raanode (w, 0);
:                       ANODE (w, 1) = raanode (w, 1);
:                       raarc (ANODE (w, 0), ANODE (w, 1));
:                       raarc (asource, ANODE (w, 0));
:               }
:       }
:
:       /* complete reachable free graph from source */
:       for (a = nodes; a; a = a->next) {
:               if (a->input) continue;
:               for (d = a->v->ext.ra.dep; d; d = d->next) {
:                       w = d->v;
:                       if (w->ext.ra.stat == R_ACTIVE) continue;
:                       if (!ANODE (w, 0)) {
:                               ANODE (w, 0) = raanode (w, 0);
:                               ANODE (w, 1) = raanode (w, 1);
:                               b = a->next; a->next = nodes; nodes =
nodes->next; a->next->next = b;
:                               raarc (ANODE (w, 0), ANODE (w, 1));
:                       }
:                       raarc (a, ANODE (w, 0));
:               }
:       }
:
:       /* hang sink on stvars */
:       for (a = nodes; a; a = a->next) {
:               if (a->output && a->v->op == STVAR) raarc (a, asink);
:       }
:
:       /* reverse the arc list if -#maxvars; this will cause the
:               most distant selvars to be freed in case of ties */
:       if (sharp_maxvars) for (c = arcs, arcs = 0; c; c = cc) {
:               cc = c->next;
:               c->next = arcs;
:               arcs = c;
:       }
:
:       /* set scaling of flow */
:       rascale = raarcscale (nodes, arcs);
:
: }
```

```
        ++flowfirst;
        rabadstvar = 0;
        rabadfreesels = 0; /* in case cc */
        if (!cc && raflowok (asource, asink, nodes, arcs) && flowfirst
> aslow) return 0;

/* close off a stvar-to-sink link */
        cc = 0;

/* if stvar is in minimal cut, remove it */
        for (c = arcs; c; c = c->next) if (c->b == asink && c->a ==
rabadstvar && c->cap) { cc = c; goto rm; }

/* rm largest flow stvar in vars_f direction with smallest seq
*/
        i = 1;
        j = (unsigned)-0 >> 1;;
        for (c = arcs; c; c = c->next) {
            if (c->b == asink && c->a->v->ext.asgn.x < vcut &&
(c->current > i || c->current == i && c->a->v->ext.asgn.x < j)) {
                cc = c;
                i = c->current;
                j = c->a->v->ext.asgn.x;
            }
        }
        if (cc) goto rm;

/* remove closest stvar with flow */
        for (c = arcs; c; c = c->next) {
            if (c->b == asink && c->current && c->a->v->ext.asgn.x
< j) {
                cc = c;
                j = c->a->v->ext.asgn.x;
            }
        }
rm:
        if (cc) {
            if (FDEBUG & 1) printf ("close off stvar sink "), plays
(cc->a->v), printf ("\n");
            cc->cap = 0;
        }
        /* after freeselcount failure, increase vcut to begin
including
            backwards directions layer by layer in the biggest-flow
            category above
        */
        if (rabadfreesels) vcut++;
        return 1;
}
```

HOMOMORPHISM VERIFICATION

Hom check:     HOM : PROCESS -> AUTOMATON cospan -g file1.sr file2.sr

Concatinates file2.sr to the end of file1.sr, and performs an ordinary
cospan run on the result, subject to assigning the file2.sr variables
according to the (file2.sr) 'hom' declarations (and returning an error
at run time, if such an assignment is illegal).

The 'hom' declarations all are of the form:
        hom file2.sr_variable := function(file1.sr variables)
If 'file2.sr_variable' is a state variable, then the legality of the
assignment is checked at the end of "crank" (ie, as a next-state),
otherwise it is checked at the time of the assignment (ie, as a current-
state).

If a file2.sr process refers to a variable which is declared in file1.sr
but not in file2.sr, then the value of that variable is taken from
file1.sr (a parse-time warning is given).

Hom check:     HOM : PROCESS_1 -> PROCESS_2 cospan -f file1.sr file2.sr

This has the effect of running 'cospan -g file1.sr file2.sr' several times,
except that the definition of the 'recur' edges and 'cyset's changes with
each run. Virtually all of this can be done from 'analyze.c' in analyze()
check_path(), and match(), as the same "crank" code will be used for each run.
Let i=0..N index the several runs.

If there are no 'recur' or 'cyset' declarations in file2.sr, N=0; run exactly
as with 'cospan -g', except "cyset checking" is short-circuited,
so as to always returns "ok" (no need to run Tarjan SCC algorithm, just run
reachability and the 'cospan -g' selection-compatability check).

Else, for i=0, if there are 'recur' declarations, have 'analyze.c' PACK the
'plus' bit at the end of each global state, as follows:

With the packing of the initial states, 'plus' gets packed with value 0.
In the global state transition
        (STATE,plus)->(NEXT_STATE,plus')
if STATE->NEXT_STATE crosses a 'recur' edge of file2.sr
(a global state transition of the form v1,v2,...,vk -> w1,w2,...,wk where
for some j, have 'recur vj->wj' (or 'recur *->wj' or 'recur vj->*') in file2.sr)
set plus'=1, else set plus'=0.

Also, disregard all the cyset declarations in file2.sr,
ignore the 'recur's in file2.sr with regard to their usual interpretation
(saying which end of the "boundary queue" to put the cranked NEXT_STATE)

APPENDIX C

```
using the 'recur's of file2.sr only to define the updating of plus. Create
a cyset mask for {plus:=0}.
That's i=0.

If originally, there were no 'cyset's in file2.sr, N=0; DONE.
Else (or if there are no 'recur's but there are 'cyset's),
we need to have done a small pre-processing step in init_cysets() in 'ccoda.c':
in the code that writes the 'cyset' masks into "crank", put a MARK seperating
the cysets of different processes. Within a process, put a mark to split
cysets so that between marks, no 2 cysets overlap--
cyset (1,2}, {3), (1,4}, (3,5)
becomes
{1,2}, {3} X {1,4}, {3,5}
Then N = number of strings of cysets between X's (N=2 here).
(If there are no 'recur's in file2.sr, but there are 'cyset's,
we don't do step i=0, and start our work with i=1.)
NB: packing the 'plus' bit applies only to step i=0.

Runs for i=1..N are each as follows:
disregard all 'recur's in file2.sr; ignore the 'cyset' declarations in file2.sr
with regard to their usual interpretation.
Treat each global state transition V->W as you would a recur edge
UNLESS both V,W are in the same set of the i-th 'cyset' string
X..1..X..2..X..3..X...
(Note: here 'V' and 'W' are global states; if V=v1,v2,...,vk W=w1,w2,...,wk
and vj,wj are in the same set of the i-th 'cyset' string
    X (vj,wj,..), {..} X
then we say "V and W are in the same set of the i-th cyset".]

(Cyset/recur's of file1.sr are treated normally, and are separate from this description.)

Error report: we can print out (stderr) before we start:
    Hom check: 1 [or 0] recur checks; N cyset checks.
As we proceed through the i=0..N loop,
print out:
    Recur check passed.
    Cyset check 1 passed.
    Cyset check 2 passed.
    ...
    Cyset check N passed.
If the recur check (i=0) fails, just print on stdout:
    Recur check failed:
and do the error-reporting actions done by 'cospan -g'.
If the i-th cyset check fails, print on stdout:
    Cyset check i failed:
    proc .X.Y.Z:
    cyset { states}, {states}, ..
and do the error-reporting actions done by 'cospan -g'.

We should optimize this by eliminating a part of the '-g' check in all but the
1st step: '-g' checks that selections of file1.sr map (under the hom
declared in file2.sr) to selections valid at the associated states in file2.sr;
since the graphs will be the same in each step,
we need to do these checks only in the first step (i=0 or i=1).
```

In each run (for i>0), the graph (and hence the RST) will be the same. The
only differences will be the order of the search, and which edges are recur
edges. We should reuse the RST for each subsequent run. (We only need to
clear the fields of the RST having to do with cycle detection, which are set
during the search (eg the perm bit) or are dependent upon the order of the
search.)

In 'ccoda.c' we must alter liststate() to print out the value of the plus-bit
after the values of the various component states.

If there is no 'hom' declaration in file2.sr, this should cause a compilation
error.

Hom check:     HOM : AUTOMATON_1 -> AUTOMATON_2 cospan -e file1.sr file2.sr

We in effect run 'cospan -g' several times as above, indexed over
i=1..N.

If there are no 'recur' or 'cyset' declarations in file1.sr, return:
    file1.sr defines empty language (Hom verified).
and stop.

Else, if there are 'recur' declarations in file1.sr, have 'analyze.c' PACK the
'plus' bit at the end of each global state, as follows:

With the packing of the initial states, 'plus' gets packed with value 0.
In the global state transition
    (STATE,plus)->(NEXT_STATE,plus')
If STATE->NEXT_STATE crosses an "active" (see below) 'recur' edge of file1.sr
set plus'=1, else set plus'=0.

Create in effect, a cyset for 'plus=0':
    cyset {plus:=0}
(ie, create a cyset mask for {plus:=0}).

Pre-process the 'cyset' declarations in file1.sr as before.

We make runs for i=1..N
where i cycles over a succession of definitions of which 'recur's and 'cyset's
are "active". Treat each global state transition V->W as a recur edge
UNLESS both V,W are in the same set of some "active" 'cyset' declaration.
(Cyset/recur's of file2.sr are treated normally, and are separate from this description.)

Definition of ACTIVE recur/cyset declaration:
let T1,T2,...,Tn be the proc/monitors defined at the root of file1.sr (ie, top
level processes) which have at least 1 cyset or recur declaration (including
all sub-processes, sub-sub-processes, etc.).
For each Tj, let Rj be (all) the recur declarations of Tj,
and let Zj1,Zj2,.. be the list of cyset declarations in Tj (after splitting).
An "active assignment" consists of a selection, for each j=1..n, of ONE of

```
      Rj,Zj1,Zj2,..    (*)
to be "active". For the definition of run i=1..N, i cycles over all such
active assignments.
If mj is the number of elements in the list (*), then N = m1*m2*...*mn.

Error report: we can print out (stderr) before we start:
      Hom check: n automata in domain
As we proceed through the i=1..N loop,
print out:
      Check i out of N passed.
If the i-th check fails, print on stdout:
      Check i failed:
for each j=1..n print out:
      Automaton Tj:
followed by the active Rj/Zjk for that run.
and do the error-reporting actions done by 'cospan -g'.
```

```
May 11 11:04 1993  patent.n.m Page 1

=====
runtime loop -e -f
     homfcycle = i in the spec; homfinit(i) is 0 if there is no
             test i in hom -f.
.....
homfloop:
     if (HCMf && !homfinit (homfcycle)) goto homfdone;
     if (HCMe && homcycle >= homfncycle) goto homfdone;
     if (HCMf) {
           if (!homfcycle) fprintf (stderr, "\nStarting recur check\n");
           else fprintf (stderr, "\nStarting cyset check %d of %d\n", homfcycle, homfncycle - 1);
           homfprhy (homfcycle);
     } if (HCMe) {
           fprintf (stderr, "\nstarting test %d in [0..%d]\n", homfcycle, homfncycle - 1);
           homeinit (homfcycle, 1);
     }
     .....

=====
hom -f: homfinit(i) sets up for run i (0=recur, 1..homfncycle-1 for cysets)
     homfcy_num=number of domain cysets + plus=0 cyset
     ncys=number of domain cysets - 1 + number of target cysets ever to be
          used as recur edges
     homflow = first target cyset to be used as recur edge
     homfhigh = first target cyset not to be used as recur edge
     homfi = first nonzero word of state mask
     homfj = last nonzero word + 1 of state mask
...
homfinit (level)
{
     int i, j, k, l;
     extern int homfcy_num, cy_num, ncys;
     for (i = 0; i < statesize; i++) newstate[i] = 0;
     homfplus = 0;
     homflevel = level;
     if (level == 0) {
           homfi = homfj = 0;
           cy_num = homfcy_num;
           return run_recur;
     } cy_num = homfcy_num - 1;
     homfhigh = homfcy_num;
     for (l = 0; l < level; l++) {
           homflow = homfhigh;
           if (homflow >= ncys) return 0;
           for (homfhigh = homflow + 1; homfhigh < ncys; homfhigh++) {
                 if (!stsame (cyset[homflow].p, cyset[homfhigh].p)) goto mark;
                 for (i = 1; i < cyset[homfhigh].len; i++)
                       if (!stsame (cyset[homfhigh].p, cyset[homfhigh].p+2*i*statesize)) goto mark;
                 for (i = 1; i < cyset[homflow].len; i++)
                       if (!stsame (cyset[homflow].p, cyset[homflow].p+2*statesize*i)) goto mark;
                 for (i = homflow; i < homfhigh; i++)
                 for (j = 0; j < cyset[i].len; j++)
                 for (k = 0; k < cyset[homfhigh].len; k++)
                       if (stsame (cyset[i].p+(2*j+1)*statesize,
                                   cyset[homfhigh].p+(2*k+1)*statesize))
                             goto mark;
           } mark:
           for (i = 0; i < statesize; i++) if (cyset[homflow].p[i]) break;
           if (i >= statesize) {
                 warning ("warning: zero mask in cyset homflevel %d\n", l + 1);
                 l = 0;
           } homfi = i;
           while (i < statesize) if (cyset[homflow].p[i++]) homfj = i;
     } return 1;
}

=====
hom -f: code to check whether the transition oldstate->newstate is within
        the active target cysets homflow<=...<homfhigh; if so, this is
        not a recur edge; if not, this is a recur edge.

HCMefBIT has only the sign bit set, and is used to set plus
        nonzero, which indicates a recur edge. (plus is also counted
```

```
up and down by bona fide domain recur edges with each resolution.
if it's already set, no need to check the target's active cysets;
otherwise, OR in HOMefBIT or not according as oldstate and newstate
are both in the same target active cysets.)

(this code is included in crank() after resolution, to set
plus if this ought to be created as a recur edge)

#define HOMfI \
    int c, i, j, k; \
    extern homfi, homfj, homflow, homfhigh; \
    if (plus & ~HOMefBIT) goto homfbreak; \
    for (c = homflow; c < homfhigh; c++) { \
        for (k = 0; k < cyset[c].len; k++) { \
            for (i = homfi; i < homfj; i++) { \
                if ((cyset[c].p[i+2*STATESIZE*k]&newstate[i])!=cyset[c].p[i+(2*k+1)*STATESIZE]) g
oto nomatch; \
            } \
            for (j = 0; j < cyset[c].len; j++) { \
                for (i = homfi; i < homfj; i++) { \
                    if ((cyset[c].p[i+2*STATESIZE*j]&oldstate[i])!=cyset[c].p[i+(2*j+1)*STAT
ESIZE])goto nomatchj; \
                } \
                goto homfbreak; \
            nomatchj:; \
            } \
        nomatch:; \
        } \
    } \
    plus |= HOMefBIT; \
homfbreak:; \

=====
hom -e -f: generate code to check recur edges. if this is a recur edge
    increment 'plus' or (HOMf and target) 'homfplus' or
    (HOMe and domain) homeplus(proc), which generates 'homeplus[X]'
    where 'X' is the subscript corresponding to this proc.  Thus
    a 'recur' that's satisfied effects one of
        plus    (normally treated recur, no hom, hom -f domain,
                 or hom -e target)
        homfplus (hom -f target recur)
        homeplus[X] (hom -e domain recur)
    (this code writes out (using out(tabs,"format",var,var,...)) the
    C code that appears in the recur checks of crank(), where it is
    checked if the current resolution is a recur edge. in the case
    of -f target or -e domain recurs, the setting of plus is deflected
    into other variables, either homfplus or homeplus[X] respectively.
    notice that only the variable written changes depending on
    hom -f target, hom -e domain, or ''normal'' recurs.]

/* Generate code for checking the RHS of recurs */
/* Note: if the only recur is of the type *->A, The following will generate
 an empty swtch, which is harmless but ugly */
if (recurs) {
    out (2, "switch(S->r){\n");
    for (i=0,w=proc->child.v;i<recurs;w=w->sibling)
        if (w->op==RECUR) {
            if (w->child.v->type.i == '*') {
                out (2, "}\n");
                indent--;
            }else out (2,"case %d:\n", i++);
            out (3, "if(");
            if ((u = w->child.v->sibling)->type.i == '*')
                if (HOMe && !endom) {
                    out (0, "!(S->a)++");
                    homeplus (proc);
                    out (0, ",S->a= %d;\n",
                        w->child.v->type.i=='*'?-1:1);
                }
                else out (0, "!(S->a)&splus++,S->a= %d;\n",
                        HOMf&&endom ? "homf" : "",
                        w->child.v->type.i=='*'?-1:1);
            else while (u) {
                if (stvar) {
                    out (0, "S->");
                    cid(stvar->name);
```

```
May 31 11:58 1993  patent.hom Page 3 out (3, "(!S->>j]==");
                        if (u->op == '@') {
                                expl(u->child.v);
                                if (proc->type.p.paus)
                                        out(0,"&&(S->q[S->j]==SET[!(S->L)");
                        } else {
                                expl(u);
                                if (proc->type.p.paus)
                                        out(0,"&&(S->q[S->j]==SET[!(S->L)");
                        }
                if (u = u->sibling) out (0, "||");
                else {
                        if (HOMe && !endom) {
                                out (3, ")(!if((!S->a)++)");
                                homeplus (proc);
                                out (0, ",S->a= %d;\n",
                                        w->child.v->type.i=='*'?-1:1);
                                out (3, "else if(S->a==%d)--",
                                        w->child.v->type.i=='*'?-1:1);
                                homeplus (proc);
                                out (0, ",S->a=0;\n");
                        }
                        else {
                                out (3, ")(if((!S->a)&splus++,S->a= %d;)\n",
                                        HOMf&&endom ? "homf" : "",
                                        w->child.v->type.i=='*'?-1:1);
                                out (3, "else if(S->a==%d)&splus--,S->a=0;\n",
                                        w->child.v->type.i=='*'?-1:1,
                                        HOMf&&endom ? "homf" : "");
                        }
                }
                if (w->child.v->type.i == '*')
                        indent++;
                        break;
                else if (i == recurs)
                        out (3, "}\n");
                        break;
                else out (3, "break;\n");
        }

=====
hom -f: code to check target recurs and target active cysets
        (consider BEG_RESOLVE and CONT_RESOLVE cases)
        if this is a recur run (homflevel=0) check if homfplus is set,
        indicating a target recur edge; if so, set the plus' state variable
        to drop out of the plus'=0 cyset.
        HOMf2 is normally true, and means that hom failures should
        result in the plus' state being set to a sink state 2, and
        the target state should be completely zero'd.  There is
        a bit of logic supporting saving the former target state
        so it can be restored at the beginning of the next crank()
        iteration.
        If this is not the recur run (homflevel>0), invoke HOMfI
        above to check whether oldstate->newstate lies within
        active target cysets, which will determine if this edge
        is to be called a recur edge.

(this code writes C code that appears in crank() after the new
        state has been written into newstate[])
-----
                if (HOMf) {
                        out (2, "switch(f) {\n");
                        out (2, "case BEG_INIT:\n");
                        out (2, "case CONT_INIT:\n");
                        out (3, "set(newstate+%d,%d,%d,0);\n",
                                homfword, homfbits, PLUS2);
                        if (HOMf2) {
                                out (3, "oldstate=oldstsave;\n");
                                out (3, "if(ff)goto nomfc;\n");
                        }
                        out (3, "break;\n");
                        out (2, "case BEG_RESOLVE:\n");
                        out (2, "case CONT_RESOLVE:\n");
                        out (3, "if(!homflevel) {\n");
                        if (!HOMf2 && !homfcount (target, RECUR)) {
```

```
                                           1993  patent.hom Page 4 out (4, "plus=1;\n");
                                                      out (4, "set(newstate+%d,%d,%d,0);\n",
                                                              homfword, homfbits, PLUSZ);
                                              }
                                              else {
                                                      out (4, "if(homfplus)set(newstate+%d,%d,%d,1);",
                                                              homfword, homfbits, PLUSZ);
                                                      out (0, "else set(newstate+%d,%d,%d,0);\n",
                                                              homfword, homfbits, PLUSZ);
                                              }
                                              out (3, "}\n");
                                              out (3, "else HOMfI\n");

=====
hom -f: code to put hom failures into sink state plus'=2
        ff is set on a hom failure: if either this or plus'=2 in oldstate,
        set plus'=2 in newstate and zero the target state.
        (this code is continued from the above)
-----
                                      if (HOMf2) {
                                              if (!async) stabil_error();
                                              out (3, "if(ff||oldstate[%d]&0x%x) {\n",
                                                      (homfword * BITS + homfbits + PLUSZ - 1) / (int)BITS,
                                                      1 << (homfword * BITS + homfbits + PLUSZ - 1) % (int)BITS);
                                              out (4, "if(homflevel)truncate=1;\n");
                                              out (3, "homfc:\n");
                                              out (4, "if(!svflag) {\n");
                                              out (5, "register int i;\n");
                                              out (5, "for(i=0; i<STATESIZE; i++)svnewstate[i]=newstate[i];\n");
                                              out (5, "svflag=1;\n");
                                              out (4, "}\n");
                                              i = target->ext.offset;
                                              j = homfword * BITS + homfbits + PLUSZ - 1;
                                              if(i % BITS) {
                                                      out (4, "newstate[%d]&=0x%x;\n",
                                                              i / BITS,
                                                              (1 << i % BITS) - 1);
                                                      i += BITS;
                                              }
                                              for (i -= i % BITS; i / BITS < j / BITS; i = BITS * (i / BITS + 1)) {
                                                      out (4, "newstate[%d]=0;\n",
                                                              i / BITS);
                                              }
                                              if (j / BITS == target->ext.offset / BITS)
                                                      out (4, "newstate[%d]|=0x%x;\n",
                                                              j / BITS, 1 << j % BITS);
                                              else
                                                      out (4, "newstate[%d]=0x%x;\n",
                                                              j / BITS, 1 << j % BITS);
                                              out (3, "}\n");
                                      }
                                      out (2, "}\n");
                              }
=====
hom -e data structures:
        [these are arrays accessible to crank() at run-time]
-----
/* hom -e */

/*
 *NCYS number of cysets, includes domain, plus, and target cysets
 *NCYPN number of cysets in domain
 *NPNUM number of root processes in domain with recurs or cysets
 *       in themselves or children
 *
 *    cyset[NCYS], saved in cys[NCYS], then overwritten by target
 *            cysets and any of the plus=0 cysets
 *    cysetid[NCYS], string identifying the process owning the cyset
 *    cypn[NCYPN], index of domain root process in home[] to which
 *            this cyset belongs
 *    homepnum[NPNUM] is 1 if there are recurs for a root proc,
 *            0 if there are only cysets. (used to be an indirect
 *            pointer to homeplus[i] or a dummy integer, now changed)
 *    homeactive[NPNUM+1] index of processes in home[] for which
 *            cysets are the active choice (and not recurs).
 *            every transition has to be checked to see if it's
 *            within one of these cysets (#define HOMeI does this)
 *            homeactive[k]==-1 flags end of the current list.
```

```
May 11 11:58 1993  patent.ncm P-.   5

*      home[NPNUM] one for each domain root process which has recurs
*              or cysets (or its children do)
*                      int n; number of choices for recur and cyset groups
*                      int nr; number of recurs
*                      int ncy; number of cyset groups
*                      int cyl,cyu; cyl<=i<cyu in cys[i] are the cysets
*                                      belonging to this root process
*                      int el,eh; el<=i<eh in cys[i] are the active cysets
*                                      (in which caset this index is in
*                                       homeactive[])
*                      int ei,ej; ei<=j<ej are the words in each active
*                              cyset cys[i].p[j] which have non-zero
*                              masks, only these need to be checked.
*
*      homeplus[NPNUM] state plus bit for each root process, set when
*              recur edge is crossed
* cyset[i] after homeinit() is called contains the target cysets, if any.
*
* cy_num is set to cover these and any added plus=0 cysets, depending
* on which recurs are active in the domain.
*/ struct home {
        int n;   /* number of recurs and cyset groups */
        int nr;  /* number of recurs */
        int ncy; /* number of cyset groups */
        int cyl,cyu; /* lower and upper+1 index of cysets in cyset[] = cys[] */
        int el, eh; /* active cyset limits in cys[] */
        int ei, ej; /* state word limits */
};

#define NCYS (sizeof cyset / sizeof *cyset)
#define NPNUM (sizeof homepnum / sizeof *homepnum)
/*#define NCYPN (sizeof cypn / sizeof *cypn)  /*doesn't work for zero! */
                (so it's defined explicitly elsewhere)

=====
hom -e: homeinit(level, print)   set up for recurs (level=0) or cysets,
        print cysets if print!=0

(this code is executed at run time to fill in the hom -e data
        structures above)
-----
#define HOmeINIT \
homeinit (level, print) \
{ \
        static int first; \
        int i, j, k; \
        for (i = 0; i < STATESIZE; i++) newstate[i] = 0; \
        for (i = 0; i < NPNUM; i++) homeplus[i] = 0; \
        if (first == 0) { \
                first = 1; \
                for (i = 0; i < NCYS; i++) cys[i] = cyset[i]; \
                for (i = 0; i < NPNUM; i++) \
                        if (homepnum[i]) home[i].nr++; \
                for (i = 0; i < NCYPN; i++) { \
                        j = *cypn[i]; \
                        if (!home[j].cyu) home[j].cyl = i; \
                        home[j].cyu = i + 1; \
                } \
                for (i = 0; i < NPNUM; i++) homecygrp (i, NCYS, 0, 0); \
                for (i = 0; i < NPNUM; i++) { \
                        home[i].n = home[i].ncy; \
                        if (home[i].nr) home[i].n++; \
                } \
                for (i = NCYPN + NPNUM; i < NCYS; i++) cyset[i - NCYPN - NPNUM] = cys[i]; \
        } \
        cy_num = NCYS - NCYPN - NPNUM; \
        j = 0; \
        for (i = 0; i < NPNUM; i++) { \
                k = level % home[i].n; \
                level /= home[i].n; \
                k = (k + home[i].n - 1) % home[i].n; \
                if (print) fprintf (stderr, "process %s:\n", hometxt[i]); \
                if (k == home[i].ncy) { \
                        cyset[cy_num++] = cys[NCYPN + i]; \
                        if (print) { \
                                if (home[i].nr == 1) fprintf (stderr,"\trecur\n"); \
```

```
May 27 11:59 1993  patent.hcm    6 else fprintf (stderr, "\t%d recurs\n", home[i].nr); \
                        } \
                        continue; \
                } \
                j = homecygrp (i, k, j, print); \
        } \
        homeactive [j] = -1; \
        j = 1; \
        for (i = 0; i < NPNUM; i++) j *= home[i].n; \
        return j; \
} \ homecygrp (index, level, put, print) \
{ \
        int i, j, k, l; \
        extern int  homfhigh,homflow; \
        ++level; \
        homfhigh = home[index].cyl; \
        for (l = 0; l < level; l++) { \
                homflow = homfhigh; \
                if (homflow >= home[index].cyu) { \
                        home[index].ncy = 1; \
                        return put; \
                } \
                for (homfhigh = homflow + 1; homfhigh < home[index].cyu; homfhigh++) { \
                        if (!stsame (cys[homflow].p, cys[homfhigh].p)) goto mark; \
                        for (i = 1; i < cys[homfhigh].len; i++) \
                                if (!stsame (cys[homfhigh].p, cys[homfhigh].p+2*i*STATESIZE)) goto mark; \
                        for (i = 1; i < cys[homflow].len; i++) \
                                if (!stsame (cys[homflow].p, cys[homflow].p+2*STATESIZE*i)) goto mark; \
                        for (i = homflow; i < homfhigh; i++) \
                        for (j = 0; j < cys[i].len; j++) \
                        for (k = 0; k < cys[homfhigh].len; k++) \
                                if (stsame (cys[i].p+(2*j+1)*STATESIZE, \
                                            cys[homfhigh].p+(2*k+1)*STATESIZE)) \
                                        goto mark; \
                } \
        mark: \
                for (i = 0; i < STATESIZE; i++) if (cys[homflow].p[i]) break; \
                if (i >= STATESIZE) { \
                        warning ("warning: zero mask in cyset homflevel %d proc %s\n", l + 1, hometxt[index]); \
                        i = 0; \
                } \
                home[index].ei = i; \
                while (i < STATESIZE) if (cys[homflow].p[i++]) home[index].ej = i; \
                home[index].el = homflow; \
                home[index].eh = homfhigh; \
        } \
        homeactive[put] = index; \
        if (print) { \
                fprintf (stderr, "\tcyset group %d\n",level); \
                for (i = home[index].el; i < home[index].eh; i++) \
                        homeprintcy (i); \
        } \
        return put + 1; \
} \ homeprintcy (i) \
{ \
        int j, k; \
        k = 1; \
        for (j = i - 1; j >= 0 && strcmp (*cysetid[i], *cysetid[j]) == 0; j--) k++; \
        fprintf (stderr, "\t\t\tproc %s cyset number %d\n", *cysetid[i], k); \
} \

=====
hom -e: homeprcy(), list choices for recur and cysets, doing a dummy
        homeinit() to set up the home[] array

[executed at run-time]
-----
homeprcy() \
{ \
        int j, k, l; \
        homeinit (0, 0); \
        for (j = 0, l = 1; j < NPNUM; j++) l *= home[j].n; \
        fprintf (stderr, "hom -e: %d tests\n", l); \
        for (k = 0; k < NPNUM; k++) { \
                fprintf (stderr, "\t%d choices proc %s\n", home[k].n, hometxt[k]); \
```

```
May 21 11:58 1993  parent.hom     : 7 if (home[k].nr) fprintf (stderr, "\t\trecurs=%d\n", home[k].nr); \
                    if (home[k].ncy) { \
                            fprintf (stderr, "\t\tcysets=%d groups=%d\n", home[k].cyu-home[k].cyl, home[k].ncy); \
                            for (j = home[k].cyl; j < home[k].cyu; j++) \
                                    homeprintcy (j); \
                    } \
            } \
            return 1; \
    }

=====
hom -e: same as HOMfI for hom -f, but check if oldstate->newstate
        is within any domain active cysets, and make this a recur
        edge if so (set plus nonzero)
-----
#define HOMeI \
{ \
        int c, i, j, k, l, m; \
        extern int homflow,homfhigh,homfi,homfj;\
        extern Cyset cys[];\
        if (plus &= ~HOMefBIT) goto homebreak; \
        for (l = 0; (m = homeactive[l]) >= 0; l++) { \
                homflow = home[m].el; \
                homfhigh = home[m].eh; \
                homfi = home[m].ei; \
                homfj = home[m].ej; \
                for (c = homflow; c < homfhigh; c++) { \
                        for (k = 0; k < cys[c].len; k++) { \
                                for (i = homfi; i < homfj; i++) { \
                                        if ((cys[c].p[i+2*STATESIZE*k]&newstate[i])!=cys[c].p[i+(2*k+1)*STATESIZE])goto nomatch; \
                                } \
                                for (j = 0; j < cys[c].len; j++) { \
                                        for (i = homfi; i < homfj; i++) { \
                                                if ((cys[c].p[i+2*STATESIZE*j]&oldstate[i])!=cys[c].p[i+(2*j+1)*STATESIZE])goto nomatchj; \
                                        } \
                                        goto homematch; \
                                nomatchj:; \
                                } \
                        nomatch:; \
                        } \
                } \
                plus |= HOMefBIT; \
                break; \
        homematch:; \
        } \
homebreak:; \
}

=====
hom -e: set the "plus" bit for each root process if homeplus[] is set.
        the cyset for each will be active or not according as this is
        a recur test or a cyset test for the respective root process.
        then invoke HOMeI above to check recur edge for base procs with
        active cysets.

[this code writes C code that appears in crank() after newstate
        has been written out.]
-----
        if (HOMe) {
                int i, n;
                n = homeproc (target);
                out (2, "switch(f) {\n");
                out (2, "case BEG_RESOLVE:\n");
                out (2, "case CONT_RESOLVE:\n");
                out (3, "wd=newstate+%d; bit=%d;\n",
                        homfword, homfbits);
                for (i = 0; i < n; i++)
                        out (3, "if (homeplus[%d])PACK(1,1) else PACK(0,1);\n", i);
                out (3, "HOMeI\n");
                out (2, "}\n");
        }
```

Nov 28 15:44 1994 patent.ra Page

=====
Main program for reduction:
-----

```
ramain (p)
Vertex *p;
{
        raenstring (p);  /* insert range into string variables */
        rasetcode (p, p); /* insert selvar 'code' in code procs */
        rasetfile2 (p); /* set rafile2 to point at head of file2 */
        radepend (p); /* dependency tree */
        raread (rafile); /* read reduction file */
        if (Vars || Vars_r || Vars_c) if (OPTq) {
                sysmsg ("%s: !Vars lines after M_o, is already result of -q, exit",
                        rafile);
                exit (1);
        }
        rasetM (); /* set up *.M file */
        ramodels (p); /* get M_p and M_o models, mark free and root */
        if (raMfp) {
                if (!OPTq) {
                        fprintf (raMfp, "%s\n", M);
                        fprintf (raMfp, "%s\n", M_p);
                        fprintf (raMfp, "%s\n", M_o);
                }
                raprmodel (raMfp, p, 2);
        }
        raprune (p, p->ext.parent); /* prune items marked prune */
        ramap (p); /* execute mapping from last resize */
        rafree (p); /* make nondet asgns for freed vars */
        raclrcode (p); /* take out inserted code selvar */
        raunpause (p); /* clear pause bits if free or no stvar left */
        raprmodel (stdout, p, 1); /* print free counts */
        if (raMfp) {
                raprmodel (raMfp, p, 1);
                fclose (raMfp);
        }
        if (OPTq) raqstvars(p); /* create qstvars for the error track input */
        if (OPTq) razeeman (p); /* create zeeman state splitting stvar */
        if (DUMP) printf ("free counts:\n"), rastats (p); /* count free cases */
        raclearname (p); /* clear tags */
        if(sharp_ptree||DUMP)ptree2(p,0);
        fflush (stdout);
}
```

=====
!Define the variable dependency graph on the set of all variables of
!the original *.sr model: for variables x, y, there is a directed edge
!x->y if y is dependent upon x.
-----

```
/* form dependency graph for proc p */
radepend (p)
Vertex *p;
{
        Vertex *stvar, *selvar, *u, *v, *w, *x;
        int blocks;
        if (!p || p->op != PROC || proc->type.p.free) return;
        for (v = p->child.v; v; v = v->sibling) {
                switch (v->op) {
                case RSEL:
                case ASGN:
                case ASGN_ARROW:
                        u = lhsvar (v);
                        u->ext.ra.nonselect = 1;
                        radepx (u, v->child.v);
                        radepx (u, v->child.v->sibling);
                        break;
                case PROC:
                        radepend (v);
                        break;
                case TRANS:
                        /* count trans blocks, find stvar and selvar */
                        blocks = 0;
                        for (w = p->child.v; w; w = w->sibling)
                                if (w->op == ASGN || w->op == ASGN_ARROW || w->op == RSEL)
                                        getvar (w->child.v)->ext.ra.nonselect = 1;
                                else if (w->op == TRANS) blocks++;
                        stvar = selvar = 0;
                        for (w = p->child.v; w; w = w->sibling)
```

APPENDIX D

```
Nov 28 15:44 1994  patent.ra Page if (w->op == STVAR && !w->ext.ra.nonselect) stvar = w;
                                else if ((w->op == SELVAR || w->op == LOCVAR) && w->ext.ra.nonselect == 0 && !w-
>child.v)
                                        selvar = w;
                        if (stvar) stvar->ext.ra.alt = selvar;
                        if (selvar) selvar->ext.ra.alt = stvar;
                        for (w = v->child.v; w; w = w->sibling) switch (w->op) {
                        case ',': /* state preds */
                                for (x = w->child.v; x; x = x->sibling) {
                                        radepx (stvar, x);
                                        if (blocks > 1) radepx (selvar, x);
                                }
                                break;
                        case '{': /* selections */
                                for (x = w->child.v; x; x = x->sibling) {
                                        radepx (selvar, x);
                                        if (x->op == '@') radepx (selvar, stvar);
                                }
                                break;
                        case ARROW: /* next state and pred */
                                for (x = w->child.v; x; x = x->sibling) {
                                        radepx (stvar, x);
                                }
                        }
                        if (blocks > 1) radepx (selvar, stvar);
                        break;
                case CODE: /* selvar in following node, set up by rasetcode() */
                        u = v->sibling;
                        if (u->op != SELVAR) error ("botched code selvar!");
                        for (w = v->child.v; w && w->type.i != '$'; w = w->sibling->sibling) {
                                radepx (u, w->sibling);
                        }
                        break;
                case XILL: /* selvar in following node, set up by rasetcode() */
                        u = v->sibling;
                        if (u->op != SELVAR) error ("botched kill selvar!");
                        radepx (u, v->child.v);
                        break;
                }
        }
}

/* u depends on expression or var v */
radepx (u, v)
Vertex *u, *v;
{
        Vertex *w;
        if (!u || !v) return;
        switch (v->op) {
        case STVAR: case SELVAR: case LOCVAR:
                deplink (u, v);
                break;
        case 0:
                if (v->type.i == ASSIGN) deplink (u, v->child.v);
                break;
        case '.':
                for (w = v->child.v; w->sibling; w = w->sibling)
                        if (w->op == '[') radepx (u, w->child.v->sibling);
                if (w->op == '[') {
                        radepx (u, w->child.v->sibling);
                        w = w->child.v;
                }
                if (w->op == 0 && w->type.i == ASSIGN) radepx (u, w->child.v);
                break;
        default:
                for (w = v->child.v; w; w = w->sibling) radepx (u, w);
                break;
        }
}

/* link u depends on v if not already there, and not self */
deplink (u, v)
Vertex *u, *v;
{
        if (!u || !v || u == v) return;
        if (!u->name || !v->name) cerror (v->line, "botch in deplink"), exit (1);
        u->ext.ra.dep = dchainuniq (u->ext.ra.dep, v);
        if(DEP||DUMP){plays (u); printf("->"); plays(v); printf("\n");}
```

Nov 28 15:44 1994 patent.ra Page

```
=====
! The dependency sub-graph relative to a free list
! is formed from the dependency graph by removing every edge which enters a node
! in the completion of the free list which is not of type 'integer'.
! Say a variable is "connected" to the root list if there is a directed path from
! it to a variable in the completion of the root list, in the dependency
! sub-graph relative to the free list.
!
! The "pruning" step:
! In forming the reduced model, we:
!   * free all variables in the free list except those of type 'integer', and
!   * remove all variables which neither are in the completion of the root list
!     nor are connected to the root list.

notes:  "type 'integer'" is called a rangeless free variable below.
        pruned, free, and active are respectively 0, RA_FREE, and RA_ACTIVE.
        This status goes into var->ext.ra.stat; in the case of a -#followT
        run (was -q) this is done twice, once to match the run to be followed,
        and once with the full M/M_p model.  The previous ext.ra.stat is saved
        in ext.ra.ostat; thus both statuses of the variable are available.

rangeless free variables are 'not pruned' by being reactivated in rawiden().
-----

/* set up model for option optq */
ramodelx (proc, optq)
Vertex *proc;
{
        int size;
        int i;
        Vertex *p, *u, *v, *w, *stvarlist;
        Dchain *d;
        char *s;
        /* if empty set M to all procs in file2 */
        if (!M) {
                M = (char*) zmalloc (0, size = 6);
                strcpy (M, "!M:");
                for (p = rafile2; p; p = p->sibling) {
                        if (p->name) {
                                M = (char*) zmalloc (M, size += strlen (p->name->s) + 2);
                                strcat (M, "\t");
                                strcat (M, p->name->s);
                        }
                }
                printf("M default: %s\n",M);
                if (!OPTq) {
                        fprintf (rafp, "%s\n", M);
                        printf (" !M: appended to %s\n", rafile);
                }
        }
        if (!M_p) {
                M_p = (char*) zmalloc (0, 6);
                strcpy (M_p, "!M_p:");
                printf ("M_p default: %s\n", M_p);
                if (!OPTq) {
                        fprintf (rafp, "%s\n", M_p);
                        printf (" !M_p: appended to %s\n", rafile);
                }
        }
        /* set root=1 pessimistic root in each M_p root item */
        for (s = M + 3; v = ravar (proc, s); s = ranextvar (s))
                v->ext.ra.root = 1;
        /* if free list in M_p, set free=1 in each M_p free list item */
/*      if (*s++ == ';')             M_p used to be root ; free */
        if (M_p && (s = M_p + 5))
                while (v = ravar (proc, s)) {
                        v->ext.ra.free = 1;
                        s = ranextvar (s);
                }
        /* two iterations for boolean cyset marking */
        for (i = 0; i < 2; i++) {
                /* root and free status to boolean cyset procs from 'C' ghosts */
                rabcyset (proc, 0);
                /* complete M_p free list with ext.ra.free=1 */
                /* link items with ext.ra.free > 0 */
                v = rafllink (0, proc, raproc0);
```

Nov 28 15:44 1994 patent.ra Page

```
                    /* set free-1 on every child */
                    for (u = v; u; u = u->ext.ra.fl) racomplete (u, raproc6);
                    /* complete M_p root list */
                    /* link items with ext.ra.root set */
                    v = rafllink (0, proc, raproc1);
                    for (u = v; u; u = u->ext.ra.fl) racomplete (u, raproc2);
            }
            /* if M_o empty, set to minimal disconnects of M_p */
            /* not in root list */
            if (!M_o) {
                    /* clear ra.mark. will mean interchange stvar and selvar */
                    rafllink (0, proc, raproc13);
loop:
                    /* link unfree items with ext.ra.root set */
                    stvarlist = rafllink (0, proc, raproc3);
                    v = rafllink (0, proc, raproc4);
                    if (DUMP) { ralist ("initial stvarlist", stvarlist); ralist ("selvar list", v); }
                    for (u = stvarlist; u; u = u->ext.ra.fl) u->ext.ra.visit = 1;
                    for (u = v; u; u = u->ext.ra.fl) u->ext.ra.visit = 1;
                    /* propagate up dependency graph to stvars */
                    while (u = v) {
                            for (v = 0; u; u = u->ext.ra.fl) {
                                    for (d = u->ext.ra.dep; d; d = d->next) {
                                            if ((w = d->v)->ext.ra.visit) continue;
                                            w->ext.ra.visit = 1;
                                            if (w->op == STVAR && !w->ext.ra.mark || w->op != STVAR && w->ext.ra.mar
k) {
                                                    w->ext.ra.fl = stvarlist;
                                                    stvarlist = w;
                                            }
                                            else {
                                                    w->ext.ra.fl = v;
                                                    v = w;
                                            }
                                    }
                            }
                    }
                    /* mark free |= 2 for each unvisited neighbor of stvarlist */
                    if (DUMP) ralist ("output stvarlist", stvarlist);
                    for (u = stvarlist; u; u = u->ext.ra.fl)
                            for (d = u->ext.ra.dep; d; d = d->next)
                                    if (!(w = d->v)->ext.ra.visit)
                                            w->ext.ra.free |= 2;
                    /* check we don't have stvar-selvar pair with root and free */
                    i = 0; /* need iteration flag */
                    for (u = stvarlist; u; u = u->ext.ra.fl) if (!u->ext.ra.free && u->op == STVAR)
                            for (d = u->ext.ra.dep; d; d = d->next)
                                    if (!(w = d->v)->ext.ra.visit && u->ext.ra.alt == w && (w->ext.ra.free & 2)) {
                                            /* interchange stvar-selvar idents */
                                            u->ext.ra.mark = 1;
                                            w->ext.ra.mark = 1;
                                            /* unfree both */
                                            u->ext.ra.free &= 1;
                                            w->ext.ra.free &= 1;
                                            i = 1;
                                            printf("disconnect spans stvar-selvar pair, iterating. "), plays (u); pr
intf(" "), plays (w), printf("\n");
                                    }
                    if (i) goto loop;
                    /* link minimal path prefixes with ext.ra.free & 2 tails, default M_o free list */
                    v = rafreelink (0, proc, 2); /* link free&2 min prefixes */
                    M_o = (char*) zmalloc (0, 6);
                    strcpy (M_o, "!M_o:");
                    for (u = v; u; u = u->ext.ra.fl) {
                            M_o = (char*) zmalloc (M_o, strlen (M_o) + 2);
                            strcat (M_o, "\t");
                            M_o = racatname (M_o, u);
                    }
                    if (OPTq) printf ("-q: re-created ");
                    printf("M_o default: %s\n",M_o);
                    if (!OPTq) {
                            fprintf (rafp, "%s\n",M_o);
                            printf (" !M_o: appended to %s\n", rafile);
                    }
            }
            fflush (rafp);
            /* mark M_o free list with free=2 */
            for (s = M_o + 5; v = ravar (proc, s); s = ranextvar (s))
```

Nov 28 15:44 1994 patent.ra Page

```
                v->ext.ra.free |= 2;
        if (*s == ';') error ("';' in M_o free list");
        /* two iterations for boolean cyset marking */
        for (i = 0; i < 2; i++) {
                /* copy free and root status from boolean cyset 'C' ghosts */
                rabcyset (proc, 0);
                /* complete M_o free list */
                /* gather items with free&2 set */
                v = rafllink (0, proc, raproc12);
                /* complete them with free|=2 */
                for (u = v; u; u =u->ext.ra.fl) racomplete (u, raproc15);
        }

/* so:
                ra.root=1       M_p root or completion
                ra.free&1       M_p free or completion
                ra.free&2       M_o free or completion
        */
        /* propagate out from root list to free list, mark stat=R_ACTIVE */
        /* link variables with ra.root = 1 */
        v = rafllink (0, proc, raproc9);
        /* set unfree ones active */
        i = optq ? 1 : 3; /* item is really free is ra.free&i nonzero */
        for (u = v; u; u = u->ext.ra.fl) if (!(u->ext.ra.free&i)) u->ext.ra.stat = R_ACTIVE;
        /* link R_ACTIVE variables */
        v = rafllink (0, proc, raproc19);
        while (u = v) {
                for (v = 0; u; u = u->ext.ra.fl) {
                        for (d = u->ext.ra.dep; d; d = d->next) {
                                if ((w = d->v)->ext.ra.stat) continue;
                                if (w->ext.ra.free&i) w->ext.ra.stat = R_FREE;
                                else {
                                        w->ext.ra.stat = R_ACTIVE;
                                        w->ext.ra.fl = v;
                                        v = w;
                                }
                        }
                }
        }
        /* widen R_ACTIVE as necessary to eliminate rangeless free variables */
        rawiden (proc);
        /* make boolean cyset stvars active if condition is R_ACTIVE */
        raboolcysets (proc);
        /* make kills active if condition is R_ACTIVE */
        rakills (proc);
        /* mark path components with active or free as appropriate */
        /* link items with stat==R_ACTIVE */
        v = rafllink (0, proc, raproc10);
        for (u = v; u; u = u->ext.ra.fl)
                for (w = u; w; w = w->ext.parent) w->ext.ra.stat = R_ACTIVE;
        /* link items with stat==R_FREE */
        v = rafllink (0, proc, raproc11);
        for (u = v; u; u = u->ext.ra.fl)
                for (w = u; w && w->ext.ra.stat != R_ACTIVE; w = w->ext.parent)
                        w->ext.ra.stat = R_FREE;
}

/* widen ra.stat R_ACTIVE to eliminate:
        rangeless freed variables;
        active stvar/selvar's with inactive mates
        stvars used in PBIT op
*/
rawiden (proc)
Vertex *proc;
{
        Vertex *u, *v, *w;
        Dchain *d;
loop:
        /* link items with ra.stat == R_FREE */
        v = rafllink (0, proc, raproc16);
        /* form list of rangeless stat==R_FREE items */
        for (w = 0, u = v; u; u = v) {
                v = u->ext.ra.fl;
                if (!u->ext.range || u->op == STVAR && u->ext.parent->type.p.paus) {
                        u->ext.ra.fl = w;
                        w = u;
                        if (u->ext.range) printf ("pausing stvar "); else
                        printf ("rangeless free var "); plays (u); printf (", activated\n");
```

```
Nov 28 15:44 1994  patent.ra Page

}
    }
    for (u = w; u; u = u->ext.ra.fl) u->ext.ra.stat = R_ACTIVE; /* make active */
    /* link active items */
    v = rafllink (0, proc, raproc17);
    while (u = v) {
            for (v = 0; u; u = u->ext.ra.fl) {
                    for (d = u->ext.ra.dep; d; d = d->next) {
                            if ((w = d->v)->ext.ra.stat == R_ACTIVE) continue;
                            if (!w->ext.range) {
                                    w->ext.ra.stat = R_ACTIVE; /* make active */
                                    w->ext.ra.fl = v;
                                    v = w;
                                    printf ("rangeless free var "); plays (w); printf (", activated\n");
                            }
                            else {
                                    w->ext.ra.stat = R_FREE; /* make free */
                            }
                    }
            }
    }
    /* link vars that are not active with ra.alt mate that is active */
    v = rafllink (0, proc, raproc18);
    if (!v) return;
    /* make them active */
    for (u = v; u; u = u->ext.ra.fl) u->ext.ra.stat = R_ACTIVE;
    for (u = v; u; u = u->ext.ra.fl)
            printf ("activate "), plays (u), printf (" stvar/selvar pair\n");
    /* make neighbors of them free if not active */
    for (u = v; u; u = u->ext.ra.fl)
            for (d = u->ext.ra.dep; d; d = d->next)
                    if ((w = d->v)->ext.ra.stat != R_ACTIVE) w->ext.ra.stat = R_FREE;
    goto loop;
}
=====
!The next step is 'variable-resizing':
!after the freeing/pruning step, for each variable x, check if (aside from
!a possibe free assignment of x or import declaration):
!       i) every appearence of x is of the form:
!                x=constant
!           or
!                x-=constant
!           or
!                (x: constant_list)
!       and
!       ii) if x is the unique selvar of a proc A, then every appearence of
!            'A:' is of the form:
!                (A: constant_list)
!       and
!       iii) the union of the constant's and constant_list's of i) and ii)
!            omits at least 2 elements in the range of x;
![so, this excludes '->x', 'x<5' and 'x+1=5', for example]
!if i-iii hold, and % is the 1st value in the range of x omitted under iii),
!redefine the range of x to be the union of iii) and the value %: say, new_range.
!If x is freed, then its free assignment is relative to 'new_range'. Otherwise,
!x is not freed; in this case, suppose F is the (logical) expression to which x
!is assigned (ie, the assignment of x is equivalent to x:=F or x->F);
!then redefine the assignment of x as:
!       x:= F ? (F: new_range) | %
!(or x-> F ? .., accordingly). This re-definition of the assignment
!of x is important on account of the reducing step, described next. (It also
!may be worthwhile in case of a bdd run, when the size of x is reduced by at
!least 1 bit.)
notes:      this has been extended somewhat, to accept asgn x:=y, where y is
      resizable.  then y takes on the constant list developed for x
      as well as its own, ie. the conditions of resizablility propagate
      rightwards through assignment.  If x is not resizable, then neither
      is y.

all variables, free or active, are candidates for resizing, except
      booleans and hom'd variables are never resized.

the % value is used for strings if % is available; otherwise
      Other or Other[number] is used as necessary to find an unused
      string.  For integers, the first available value between 0 and
      the maximum is used, to avoid extending the range when possible.

ranosize () sets a variable unresizable
```

Nov 28 15:44 1994  patent.ra Page

```
        ravvar () sets up a rhs chain for propagating resizability
        raaminusb (a, b) forms a list of everything in list 'a'
                that is not in list 'b'
        In the ccode version, translation is done if possible by a table
                rather than a sequence of if's; the '?' is marked by an ASGN type
                to say this should be attempted.
-----
/* set up resize info in ext.ra.resize and ext.ra.cnst.
        variables are included only if ext.ra.stat > 0 in
        themselves and every ext.parent. otherwise skipped
        as if not present.

ext.ra.resize = 1 if this variable is to be resized
        ext.ra.cnst is then a Dchain with values tested for this
                variable or its lhs's, ie. x:=var, var includes
                values tested also for x. intersection of ext.range
                and ext.ra.cnst will be the new ext.range, plus
                an 'Other' value that is in ext.range and not in
                ext.ra.cnst.

v = rahole (u) gives an ''other'' to the list u->ext.ra.cnst
                that's in ext.range
                v = (Vertex*) (0/INTEGER or STRING)value
        ramap (proc) actually implements the resizing from this
        in the parse tree.
*/
raresize (p)
Vertex *p;
{
        if (sharp_noresize) return; /* no resizing if #resize set */
        ravcheck (p); /* mark variables unsizable */
        raunsize (p); /* propagate nosize of lhs to rhs in a:=b, a->b */
        radups (p); /* eliminate dups in ext.ra.cnst chains */
        raproprhs (p); /* propagate = ~= to rhs of x:=y */
        rasetsz (p); /* set ext.ra.resize = 1 on vars to use ext.ra.cnst */
}

/* check use of variables for v=const v~=const v=w */
ravcheck (p)
Vertex *p;
{
        Vertex *v, *w, *x, *y, *stvar, *selvar;
        if (!p || p->op != PROC) return;
        if (!p->ext.ra.stat) return;
        if (p->type.p.free) {
                for (v = p->child.v; v; v = v->sibling)
                        if (v->op == HOM && (w = getvar3 (v->child.v))) {
                                if (!w->ext.ra.stat) continue;
                                ravorconst (ragetv (v->child.v), v->child.v->sibling, 1);
                                w->ext.ra.nosize = 1;
                        }
                return;
        }
        for (v = p->child.v; v; v = v->sibling) switch (v->op) {
        case ASGN: case ASGN_ARROW: case RSEL:
                /* hom included for resize-alone testing. used for
                        comparison as well as assignment, so save
                        any const values */
        case HOM:
                if ((!(w = getvar3 (v->child.v)) || !w->ext.ra.stat) break;
                ravorconst (ragetv (v->child.v), v->child.v->sibling, v->op == HOM);
                if (v->op == HOM) w->ext.ra.nosize = 1; /* can't resize hom */
                continue;
        case TRANS:
                stvar = rastvar (p);
                if (!stvar || !stvar->ext.ra.stat) break;
                selvar = stvar->ext.ra.alt;
                for (w = v->child.v; w; w = w->sibling) switch (w->op) {
                case ',':
                        for (x = w->child.v; x; x = x->sibling)
                                if (x->type.i == BOOLEAN) raexpr (x);
                                else ravconst (stvar, x, 1);
                        break;
                case '{':
                        for (x = w->child.v; x; x = x->sibling) {
                                y = x->op == AT ? x->child.v : x;
                                if (ragetv (y)) ravvar (selvar, y);
                                else raexpr (y);
```

Nov 28 15:44 1994 patent.ra Page

```
                        }
                        break;
                case ARROW:
                        for (x = w->child.v; x; x = x->sibling) {
                                ravorconst (stvar, x->child.v, 0);
                                for (y = x->child.v->sibling; y; y = y->sibling)
                                        raexpr (y);
                        }
                        break;
                }
                break;
        case RECUR:
                stvar = 0;
                for (w = v->child.v; w; w = w->sibling)
                        if (w->op == 'Q') stvar = getvar3 (w->child.v);
                if (!stvar) stvar = rastvar (p);
                if (!stvar || !stvar->ext.ra.stat) break;
                for (w = v->child.v; w; w = w->sibling)
                        if (w->op != 'Q' && w->type.i != '*') ravconst (stvar, w, 1);
                break;
        case CYSET:
                stvar = rastvar (p);
                for (w = v->child.v; w; w = w->sibling)
                        if (w->op == ';') {
                                for (x = w->child.v; x; x = x->sibling)
                                        ravconst (ragetv (x->child.v), x->child.v->sibling, 1);
                        }
                        else if (!stvar) {
                                cerror (v->line, "can't find unasgn'd stvar for cyset");
                                break;
                        }
                        else ravconst (stvar, w, 1);
                break;
        case PROC:
                ravcheck (v);
                break;
        case CODE:
                for (w = v->child.v; w->type.i != '$'; w = w->sibling->sibling)
                        raexpr (w->sibling);
                break;
        case KILL:
                raexpr (v->child.v);
                break;
        case BIGMAC:
                for (w = v->child.v; w; w = w->sibling)
                        raexpr (w);
                break;
        }
}

/* return variable itself, and check subscripts if any */
Vertex *
ragetv (v)
Vertex *v;
{
loop:
        if (v->op == APOST) v = v->child.v;
        if (v->op == '.')
                for (v = v->child.v; v->sibling; v = v->sibling)
                        rasubscr (v);
        rasubscr (v);
        if (v->op == '|')
                v = v->child.v;
        if (v->op == '.') goto loop;
        if (v->op || v->type.i != ASSIGN)
                return 0;
        return v->child.v;
}

/* variable v must have variable or const(s) */
ravorconst (v, v2, saveconst)
Vertex *v, *v2;
{
        Vertex *u;
        int i;
        if (!v->ext.ra.stat) return;
        if (ragetv (v2)) ravvar (v, v2);
        else if (v2->op == '?') {
```

```
Nov 28 15:44 1994  patent.ra Page for (i = 0, u = v2->child.v; u; u = u->sibling)
                        if (i = 1 - i) ravorconst (v, u, savecnst);
                        else raexpr (u);
        }
        else if (v2->op == '(') {
                for (u = v2->child.v; u; u = u->sibling)
                        ravorconst (v, u, savecnst);
        }
        else ravconst (v, v2, savecnst);
}

/* variable v must have variable v2 assigned to it */
ravvar (v, v2)
Vertex *v, *v2;
{
        Vertex *u;
        Dchain *d;
        if (!v->ext.ra.stat) return;
        if (u = ragetv (v2)) {
                d = v->ext.ra.rhs;
                if (u != v) v->ext.ra.rhs = dchainuniq (v->ext.ra.rhs, u);
                if (DUMP) if (d != v->ext.ra.rhs) ravdump (v, v2, "<-");
        }
        else {
                ranosize (v, v2);
                raexpr (v2);
        }
}

/* mark nosize in rhs's of nosize variables */
raunsize (p)
Vertex *p;
{
        Dchain *d;
        Vertex *u;
        if (!p || !p->op || !p->name) return;
        switch (p->op) {
        case LOCVAR: case SELVAR: case STVAR:
                if (p->child.v) break;
                /* do not resize booleans */
                if (p->type.i == BOOLEAN) p->ext.ra.nosize = 1;
                /* do not resize stvars used in PBIT */
                if (p->ext.asgn.pbit) p->ext.ra.nosize = 1;
                if (!p->ext.ra.nosize) break;
                for (d = p->ext.ra.rhs; d; d = d->next)
                        if (!(u = d->v)->ext.ra.nosize) {
                                u->ext.ra.nosize = 1;
                                if (DUMP) ravdump (u, p, "NS\t");
                                raunsize (u);
                        }
        }
        for (u = p->child.v; u; u = u->sibling) raunsize (u);
}

/* propagate ra.cnst upstream to rhs variables that accept it */
raproprhs (p)
Vertex *p;
{
        Dchain *ad, *new, *d;
        if (!p || !p->op || !p->name) return;
        switch (p->op) {
        case LOCVAR: case SELVAR: case STVAR:
                if (p->ext.ra.nosize) break;
                for (d = p->ext.ra.rhs; d; d = d->next) {
                        if (d->v->ext.ra.nosize) continue;
                        ad = raaminusb (p->ext.ra.cnst, d->v->ext.ra.cnst);
                        if (DUMP) {
                                plays (p);
                                printf (" <- ");
                                plays (d->v);
                                printf (" adds:");
                                racdump (ad);
                                printf ("\n");
                        }
                        /* add ad to rhs */
                        if (ad) {
                                new = raundup (radcat (ad, d->v->ext.ra.cnst, 1));
                                dchainfree (d->v->ext.ra.cnst);
```

```
Nov 28 15:44 1994  patent.ra Page d->v->ext.ra.cnst = new;
                              dchainfree (ad);
                              raproprhs (d->v);
                      }
              }
      }
      for (p = p->child.v; p; p = p->sibling) raproprhs (p);
}

/* set resize on variables that have ra.cnst list < ext.range by 2 */
rasetsz (p)
Vertex *p;
{
      Dchain *excess, *d, *e;
      Value temp;
      Vertex *v, *w;
      if (!p || !p->op || !p->name) return;
      switch (p->op) {
      case LOCVAR: case SELVAR: case STVAR:
              if (p->child.v) break;
              if (p->ext.ra.nosize) break;
              if (d = radsibling (p->ext.range)) {
                      excess = raaminusb (d, p->ext.ra.cnst);
                      if (racount (excess) >= 2) p->ext.ra.resize = 1;
                      if (DUMP) {
                              plays (p);
                              printf (" /was:"); racdump (d); printf (" /cnst:"); racdump (p->ext.ra.cnst);
                              printf (", resize saves %d", racount (excess));
                              if (p->ext.ra.resize) {
                                      e = dchain (0, rahole (p));
                                      printf (", extra:");
                                      racdump (e);
                                      dchainfree (e);
                              }
                              else printf (", insufficient");
                              printf ("\n");
                      }
                      dchainfree (excess);
                      dchainfree (d);
              }
              else {
                      p->ext.ra.resize = 1;
                      if (DUMP) plays (p), printf (" sized to"), racdump (p->ext.ra.cnst), printf ("\n");
              }
      }
      for (p = p->child.v; p; p = p->sibling) rasetsz (p);
}

/* map assignments to resized variables */
/* does the entire tree, assumed now pruned by raprune () */
ramap (p)
Vertex *p;
{
      ramap1 (p); /* resize selvars/stvars */
      ramap2 (p); /* alter parse tree */
}

/* resize variables */
ramap1 (v)
Vertex *v;
{
      Dchain *range, *limited, *d;
      if (!v || !v->name || !v->ext.ra.stat) return;
      switch (v->op) {
      case SELVAR: case LOCVAR: case STVAR:
              if (!v->ext.ra.resize) break;
              if (range = rarange (v)) {
                      d = raaminusb (range, v->ext.ra.cnst);
                      limited = raaminusb (range, d);
                      dchainfree (range);
                      dchainfree (d);
              }
              else limited = radefrange (v);
              if (1) {
                      printf ("resize "); plays (v);
                      printf (":");
                      d = radsibling (v->ext.range);
                      if (v->type.i == STRING && racount (d) == strings - !!raother) printf (" (all)");
```

```
Nov 28 15:44 1994  patent.ra Page else if (!d) printf (" (all)");
                                else racdump (d);
                                dchainfree (d);
                                printf (" ->");
                                racdump (limited);
                                if (range) printf (" +");
                                else printf (" ;");
                        }
                        if (range) limited = dchain (limited, rahole (v));
                        v->ext.range = ravchain (limited);
                        if (1) {
                                d = dchain (0, rahole (v));
                                racdump (d);
                                dchainfree (d);
                                printf ("\n");
                        }
                        dchainfree (limited);
                        break;
                }
        if (v->op) for (v = v->child.v; v; v = v->sibling) ramap1 (v);
}

/* alter constants and asgn's in parse tree */
ramap2 (p)
Vertex *p;
{
        Vertex *v, *w, *x, *stvar, *selvar, **y;
        Dchain *range, *limited, *d;
        if (!p || p->op != PROC || p->type.p.free) return;
        for (v = p->child.v; v; v = v->sibling) switch (v->op) {
        case ASGN: case ASGN_ARROW: case RSEL:
        case HOM:
                ramapexpr (getvar3 (v->child.v), &v->child.v->sibling);
                rascompress (&v->child.v->sibling);
                break;
        case TRANS:
                stvar = rastvar (p);
                selvar = stvar->ext.ra.alt;
                for (w = v->child.v; w; w = w->sibling) switch (w->op) {
                case ',':
                        break;
                case '(':
                        for (y = &w->child.v; y[0]; y = &y[0]->sibling)
                                ramapexpr (selvar, y);
                        rascompress (&w->child.v);
                        break;
                case ARROW:
                        for (x = w->child.v; x; x = x->sibling) {
                                ramapexpr (stvar, &x->child.v);
                        }
                        break;
                }
                break;
        case PROC:
                ramap2 (v);
                break;
        case INIT:
                if (v->child.v->op != ASSIGN) {
                        if (!(stvar = rastvar (p))) { cerror (v->line, "can't find unasgn'd stvar for init"); break; }
                        for (y = &v->child.v; y[0]; y = &y[0]->sibling)
                                ramapexpr (stvar, y);
                        racompress (v->child.v);
                }
                else {
                        for (w = v->child.v; w; w = w->sibling) {
                                ramapexpr (getvar3 (w->child.v), &w->child.v->sibling);
                                racompress (w->child.v->sibling);
                        }
                }
                break;
        }
} ramapexpr (p, av)
Vertex *p, **av;
{
        extern int srbddflag; /* sr.c */
```

Nov 28 15:44 1994  patent.ra Page

```
	Vertex *u, *v, *w, *x, *y, *vs;
	Value temp;
	long low, high;
	Dchain *d, *e;
	int i;
	if (!p->ext.ra.resize) return;
	if (!(v = *av)) return;
	if ((u = getvar3 (v)) && u->ext.ra.resize && !diff (p->ext.range, u->ext.range) && rasame (p->ext.ra.cnst, u->ext.ra.cnst))
		/* tangled web:
		    if we don't map selvar=expr, can't take identity
		    as allowing no mapping stvar=selvar */
		if (srbddflag || homverify || p->op != STVAR || u->op == STVAR)
			return;
	if (v->op == '(') {
		for (av = &v->child.v; av[0]; av = &av[0]->sibling)
			ramapexpr (p, av);
		return;
	}
	if (v->op == '?') {
		for (i = 0, av = &v->child.v; av[0]; av = &av[0]->sibling)
			if (i = 1 - i) ramapexpr (p, av);
		return;
	}
	if (v->op == AT) return ramapexpr (p, &v->child.v);
	if (v->op == DOTS || !v->op && v->type.i != ASSIGN) {
		ramapconst (p, av);
		return;
	}
	/* the mapping is unnecessary for assigning to selvars,
	which have no overflow problem and don't extend the state
	space; for speed just bypass the translation (it could be left
	in) */
	if (!srbddflag && !homverify && p->op != STVAR && !p->ext.ra.qst) return;
	w = 0;
	*av = 0;
	vs = v->sibling; v->sibling = 0;
	for (e = d = ralimits (p, v); d; d = d->next) {
		if (d->v->op == DOTS) {
makedot:
			low = ralow (d->v);
			high = rahigh (d->v);
			while (d->next)
				if (ralow (d->next->v) > high + 1) break;
				else {
					d = d->next;
					high = rahigh (d->v);
				}
			x = raneed (low, high, d->v);
			x = raditto (x); /* make copy for parse tree */
			temp.v = ditto (v, d->v->line, 0, (Vertex*)0);
			temp.v->sibling = x->child.v->sibling;
			x->child.v->sibling = 0;
			y = build ('>', BOOLEAN, v->line, (Name*)0, temp);
			temp.v = raditto (v);
			temp.v->sibling = x->child.v;
			relver (x); /* not using the DOTS node, only children */
			temp.v = build ('<', BOOLEAN, v->line, (Name*)0, temp);
			temp.v->sibling = y;
			y = build ('*', BOOLEAN, v->line, (Name*)0, temp);
			y->sibling = w;
			w = y;
		}
		else {
			if (d->next && ralow (d->next->v) <= rahigh (d->v) + 1) goto makedot;
			x = raditto (d->v);
			temp.v = raditto (v);
			temp.v->sibling = x;
			y = build ('=', BOOLEAN, v->line, (Name*)0, temp);
			y->sibling = w;
			w = y;
		}
	}
	dchainfree (e);
	if (!w) {
		/* disjoint range, just set Other */
		*av = raditto (rahole (p));
		av[0]->sibling = vs;
```

Nov 28 15:44 1994  patent.ra Page

```
                return;
        }
        if (w->sibling) {
                temp.v = w;
                w = build ('+', BOOLEAN, v->line, (Name*)0, temp);
        }
        w->sibling = raditto (rahole (p));
        v->sibling = w;
        temp.v = v;
        /* flag this '?' with type ASGN which seems to be harmless,
        but makes conversion to table easy in ccoda.c */
        *av = build ('?', ASGN, v->line, (Name*)0, temp);
        av[0]->sibling = vs;
}

/* alter constants in parse tree for assignment to p */
ramapconst (p, av)
Vertex *p, **av;
{
        Dchain *d, *e, *r;
        Vertex *v, **x;
        Vertex *w;
        if (!p->ext.ra.resize) return;
        switch ((v = *av)->op) {
        case AT:
                return ramapconst (p, &v->child.v);
        case DOTS:
                r = rarange (p);
                d = dchain (0, v);
                e = raaminusb (r, d);
                dchainfree (d);
                d = raaminusb (r, e);
                dchainfree (e);
                av[0] = av[0]->sibling;
                for (e = d; e; e = e->next) {
                        w = raditto (e->v);
                        w->sibling = av[0];
                        av[0] = w;
                }
                dchainfree (d);
                d = dchain (0, v);
                e = raaminusb (d, r);
                if (e) {
                        w = raditto (rahole (p));
                        w->sibling = av[0];
                        av[0] = w;
                }
                dchainfree (d);
                dchainfree (e);
                dchainfree (r);
                return;
        case '{':
                for (x = &v->child.v; x[0]; x = &x[0]->sibling)
                        ramapexpr (p, x);
                return;
        }
        if (v->op || v->type.i != INTEGER && v->type.i != STRING)
                cerror (p->line, "ramapconst botch!"), exit (1);
        d = dchain (0, v);
        r = rarange (p);
        e = raaminusb (d, r);
        dchainfree (d);
        dchainfree (r);
        if (e) {
                dchainfree (e);
                *av = raditto (rahole (p));
                av[0]->sibling = v->sibling;
        }
}
=====
-#followT runs.

create a new selvar corresponding to every stvar in the M_p model
that was not in the M_o model.

(ra.c)
-----
/* create qstvars for the error track input, for stvars that
```

Nov 28 15:44 1994 patent.ra Page

```
are in the M_o model (as well as the M_p model)
they are selvars linked to the stvar.

the M_p stvar has  ra.qstvar pointing to the new ones, and ra.qst=0
        the M_o qstvar is a selvar flagged  ra.qst=1 and points back
                in ra.qstvar to the M_p stvar
insert ASGN selvar := stvar as a formal place holder as well.
(to keep the code legal if not further processed.)
*/
raqstvars (p)
Vertex *p;
{
        Vertex *v, *u, *w;
        Value temp;
        if (!p || !p->op || p->op == PROC && p->type.p.free) return;
        switch (p->op) {
        case STVAR:
                if (!p->ext.ra.ostat) break;
                if (p->ext.ra.qstvar) break;
                u = p->sibling; p->sibling = 0;
                v = ditto (p, (Line*)0, 0, (Vertex*)0);
                v->ext.ra = p->ext.ra;
                v->ext.bounds = 0; /* selvar without any dimension */
                v->ext.range = v->ext.ra.orange; /* ext.range saved by rapush() from M_o */
                v->ext.ra.cnst = v->ext.ra.ocnst;
                v->ext.ra.resize = v->ext.ra.oresize;
                ramap1 (v); /* re-create M_o size for the former stvar */
                temp.v = p;
                v->ext.ra.orange = build (0, ASSIGN, p->line, (Name*)0, temp); /* expr. for ramapexpr() to map */ ramapexpr (v, &v->ext.ra.orange);
                temp.v = v;
                w = build (0, ASSIGN, p->line, (Name*)0, temp);
                temp.v = p;
                w->sibling = build (0, ASSIGN, p->line, (Name*)0, temp);
                temp.v = w;
                v->sibling = build (ASGN, 0, p->line, (Name*)0, temp);
                v->sibling->sibling = u;
                v->name = choosename ("eQ");
                v->op = SELVAR;
                p->ext.ra.qstvar = v;
                v->ext.ra.qstvar = p;
                v->ext.ra.qst = 1;
                v->ext.ra.alt = 0;
                v->ext.ra.nonselect = 1;
                insert (v, p->ext.parent);
                if (1||DUMP) {
                        printf ("M_o qstvar "); plays (v);
                        printf (" linked to "); plays (p);
                        printf ("\n");
                }
                break;
        }
        if (p->op) for (v = p->child.v; v; v = v->sibling) raqstvars (v);
}
=====
write out the new model using old M_o and !Vars from -#followT run
(see conditions in spec)
-----

/* compute new M_o free list from Vars and old M_o model */
ranewfree (proc)
Vertex *proc;
{
        Dchain *d;
        int i;
        Vertex *u, *v, *w;
        int vars, vars_cr;
        /* drop ra.free&2 if ra.stat is R_ACTIVE (from rawiden ()) */
        rafllink (0, proc, raproc33);
        /* set ra.free = 2 on pruned unfree variables */
        rafllink (0, proc, raproc34);
        /* get L, old M_o active free list: items with ra.stat==R_FREE and ra.free==2 */
        /* (ra.free&1 indicates M_p freed, these are ignored here) */
        v = rafllink (0, proc, raproc20);
        if (!v) {
                cerror (proc->line, "Empty M_o model, nothing more can be freed! exit");
                return 1;
```

Nov 28 15:44 1994 patent.ra Page

```
        }
        /* mark ext.ra.L for L */
        for (u = v; u; u = u->ext.ra.f1) u->ext.ra.L = 1;
        if (1||DUMP) ralist ("L:", v);

/* mark items in Vars if they are M_o free==2 */
        vars = ramarkset (Vars, proc, raproc21);
        /* mark items in Vars_c Vars_r if they are not R_ACTIVE */
        vars_cr = ramarkset (Vars_c, proc, raproc22) + ramarkset (Vars_r, proc, raproc22);

/* case 1: get vars_f from Vars & L */
        if (v = rafllink (0, proc, raproc23)) {
                printf ("doing case 1: Vars_f = L * Vars\n");
                return rawritenew (v, proc);
        }

/* case 2: get vars_f via vars_cc */
        if (!vars_cr) goto case3;
        /* clear ext.ra.visit */
        rafllink (0, proc, raproc25);
        /* link L items */
        v = rafllink (0, proc, raproc24);
        i = 0;
        /* propagate out from L to vars_cr */
        for (u = v; u; u = u->ext.ra.f1) u->ext.ra.visit = 1;
        while (!i && (u = v)) {
                for (v = 0; u; u = u->ext.ra.f1) {
                        for (d = u->ext.ra.dep; d; d = d->next) {
                                if ((w = d->v)->ext.ra.visit) continue;
                                w->ext.ra.visit = 1;
                                if (w->ext.ra.vars_cr) i = 1;
                                w->ext.ra.f1 = v;
                                v = w;
                        }
                }
        }
        if (!v) {
                printf ("no element of L depends on Vars_c or Vars_r, try case 3\n");
                goto case3;
        }
        for (u = v; u; u = u->ext.ra.f1) if (u->ext.ra.vars_cr) u->ext.ra.vars_cc = 1;
        if (1||DUMP) ralist ("Vars_cc:", v);
        /* clear ext.ra.visit */
        rafllink (0, proc, raproc25);
        /* link vars_cc */
        v = rafllink (0, proc, raproc26);
        /* propagate backwards to set visit in everything that depends on Vars_cc */
        while (v) {
                /* set visit on these */
                for (; v; v = v->ext.ra.f1) v->ext.ra.visit = 1;
                /* link everything that's not visited that neighbors a visited node */
                v = rafllink (0, proc, raproc28);
        }
        /* now pick off everything that's visited and is in L */
        if (v = rafllink (0, proc, raproc27)) {
                printf ("doing case 2: Vars_f = Vars_cc -> L\n");
                return rawritenew (v, proc);
        }
        printf ("no element of L depends on Vars_cc, try case 3\n");

case3:
        if (!vars) {
                printf ("Vars in M_o is empty, try case 4\n");
                goto case4;
        }
        /* clear ext.ra.visit and mark */
        rafllink (0, proc, raproc30);
        /* link L items */
        v = rafllink (0, proc, raproc29);
        for (u = v; u; u = u->ext.ra.f1) v->ext.ra.visit = 1;
        i = 0;
        /* propagate out until hit member of Vars */
        while (!i && (u = v)) {
                for (v = 0; u; u = u->ext.ra.f1) {
                        for (d = u->ext.ra.dep; d; d = d->next) {
                                if ((w = d->v)->ext.ra.visit) continue;
                                if (w->ext.ra.vars) i = 1;
                                w->ext.ra.visit = 1;
```

```
Nov 28 15:44 1994  patent.ra Page w->ext.ra.f1 = v;
                                        v = w;
                                }
                        }
                }
                if (!v) {
                        printf ("no member of L depends on Vars, try case 4\n");
                        goto case4;
                }
                /* set mark on the closest members of vars to L */
                for (u = v; u; u = u->ext.ra.f1) if (u->ext.ra.vars) u->ext.ra.mark = 1;
                if (v = raf1link (0, proc, raproc31)) {
                        printf ("doing case 3: Vars_f = Vars -> L\n");
                        return rawritenew (v, proc);
                }
case4:
                /* last resort, Vars_f = L */
                if (v = raf1link (0, proc, raproc32)) {
                        printf ("doing case 4: Vars_f = L\n");
                        return rawritenew (v, proc);
                } cerror (proc->line, "ranewfree botch, no case covering!\n");
                return 1;
}
/* write out new M_o model given Vars_f */
rawritenew (v)
Vertex *v;
{
        extern errno;
        Vertex *u, *w;
        Dchain *d;
        FILE *f;
        if (1||DUMP) ralist ("Vars_f:", v);
        /* propagate from Vars_f to STVARS clearing free&2 */
        for (u = v; u; u = u->ext.ra.f1) u->ext.ra.free &= ~2;
        if (1||DUMP) printf ("finding closest stvar fence from Vars_f:\n");
        while (u = v) {
                for (v = 0; u; u = u->ext.ra.f1) {
                        if (1||DUMP) { printf("\tfrom "); plays(u); printf(" visit:");}
                        for (d = u->ext.ra.dep; d; d = d->next) {
                                if ((w = d->v)->ext.ra.free != 2) continue;
                                w->ext.ra.free &= ~2;
                                if (1||DUMP) { printf(" "); plays(w);}
                                if (w->op != STVAR) {
                                        w->ext.ra.f1 = v;
                                        v = w;
                                }
                        }
                        if (1||DUMP) printf("\n");
                }
        }
        /* get free&2 items */
        v = rafreelink (0, proc, 2);
        M_o = (char*) zmalloc (0, 6);
        strcpy (M_o, "!M_o:");
        for (u = v; u; u = u->ext.ra.f1) {
                M_o = (char*) zmalloc (M_o, strlen (M_o) + 2);
                strcat (M_o, "\t");
                M_o = racatname (M_o, u);
        }
        printf ("new M_o: %s\n", M_o);
        if (!(f = fopen (rafile, "a"))) {
                cerror (proc->line, "can't append to file %s", rafile);
                exit (1);
        }
        fprintf (f, "%s\n", M_o);
        if (fclose (f)) {
                cerror (proc->line, "can't close file %s", rafile);
                exit (1);
        }
        printf ("new !M_o: appended to %s\n", rafile);
        errno = 0;
        sysmsg ("New M_o needs -#reduction run...");
        /* exit (2) is good status, but stops cc from happening */
        exit (2);
```

Nov 28 15:44 1994  patent.ra Page

```
}
=====
-#followT: in ccode for crank, read the next state wanted for each
stvar in both M_o and M_p, from a table set up by analyze.c and
pointed to by *qstateptr ccode.c:
                        out (1, "case BEG_INIT:\n");
                        if (inits > 1)
                                out (2, "S->j=%d;\n", inits - 1);
                        if (OPTq && stvar && ((w = stvar->ext.ra.qstvar) || stvar->ext.ra.zeeman && (w = stvar))
} {
                                tab (2);
                                cpath (w);
                                out (0, "= *qstateptr++;\n");
                        }
....
                        if (OPTq && stvar && stvar->ext.ra.qstvar) {
                                tab (2);
                                cpath (stvar);
                                out (0, "= ");
                                expl (u);
                                out (0, ";\n");
                                out (2, "if(");
                                cpath (stvar->ext.ra.qstvar);
                                out (0, "!=");
                                expl (stvar->ext.ra.qstvar->ext.ra.orange);
                                out (0,")initfail=1;\n");
....
                        out (1, "case BEG_SELECT:\n");
                        if (OPTq && stvar && stvar->ext.ra.qstvar) {
                                tab (2);
                                cpath (stvar->ext.ra.qstvar);
                                out (0, "= *qstateptr++;\n");
                        }
                        if (OPTq && stvar && stvar->ext.ra.zeeman) {
                                tab (2);
                                cpath (stvar);
                                out (0, "= *qstateptr++;\n");
                        }
....
note on above: a Zeeman state is created that is blindly set to whatever
qstateptr asks, and becomes part of the state vector directly.  This serves
to separate states that are repeated in the M_o error track (as from
an scc bad root cycle unrolling.)
analyze.c just counts the zeeman variable up for each M_o state in the error
track; it isn't otherwise part of the system.

note on below:  this becomes part of the condition for saving a new
resolution in BEG_RESOLVE in the resolution table S->...[S->n].
if the computed state doesn't match the desired one, no resolution
is saved.

the variable qi will have been incremented if a resolution gets this far,
to flag that blocking has happened.

/* c code for does -q state match error track state */
qmatch (v, stvar)
Vertex *v, *stvar;
{
        Vertex *sel, *code;
*)  v = v->child.v;
        out (0, "(!qstateout||");
        code = (sel = stvar->ext.ra.qstvar)->ext.ra.orange;
        if (!code->op && code->type.i == ASSIGN && code->child.v == stvar) {
                cpath (sel);
                out (0, "==");
                expl (v);
                out (0, ")");
                return;
        }
        out (0, "(");
        cpath3 (stvar, (Vertex*)0, 1);
        out (0, "= ");
        expl (v);
        out (0, ",");
        cpath (sel);
        out (0, "==");
```

```
Nov 28 15:44 1994  patent.ra Page expr (sel->ext.ra.orange, (Vertex*)0, 1);
        out (0, ")}");
}
...
if blocking has happened and no resolution survives, flag the transition
block that is responsible.
                                    out (0, "if(qi){qtrans[%d].val=1;qtrunc=1;if(more){f=CONT_SELECT; goto b
egin;} f=BEG_SELECT; return NO_MORE;}\n",
                                      transcnt++);

...
if a recur is used, flag the responsible recur if (recurs) {
                        char plusstr[32], minusstr[32];
                        /* record recur crossings on M_p stvars */
                        plusstr[0] = minusstr[0] = 0;
                        if (OPTq && !stvar->ext.ra.qstvar) {
                                sprintf (plusstr, "qrecur[%d].val++;", recurcnt);
                                sprintf (minusstr, "qrecur[%d].val--;", recurcnt);
                                recurcnt++;
                        }
...
                        out (0, "){if(!S->a){%splus++;S->a= %d;%s}}\n",
                          HOMf&&endom ? "homf" : "",
                          w->child.v->type.i=='*'?-1:1, plusstr);
                        out (3, "else if(S->a==%d){%splus--;S->a=0;%s}\n",
                              w->child.v->type.i=='*'?-1:1,
                              HOMf&&endom ? "homf" : "", minusstr);
=====
-#followT, defines in ccode.c for use in crank
-----
            if (OPTq) {
                    /* in BEGIN in crank: */
                    out (1, "#define QSTVAR_BI qstateptr=(qstateout=qstart)->st;qstatei=0;\n");
                    out (1, "#define QSTVAR_BS if((qstatei=((RST")(oldstate+STATESIZE))->Qindex)>=nqstate) r
eturn NO_MORE; qstateptr=(qstateout=qstate[qstatei].next)?qstateout->st:qstart->st; if(qtrunc){register i; qtrun
c=0; i=nqtrans; while(--i>=0)qtrans[i].val=0;}\n");
                    out (1, "#define QSTVAR_BR {register i=nqrecur; while(--i>=0)qrecur[i].val=0; }\n");
            }
=====
-#followT run, analyze.c
read the error track
-----
readetrack (file)
char *file;
{
    char *in;
    struct qstate *badcyc = 0;
    int *curstate;
    char *used;
    int iqstate, i, j, z;
    char *p, *q;
    int maxline;
    FILE *fp;
    struct stat buf;
    if (!(fp = fopen (file, "r"))) raerror ("can't read error track: ", file);
    fstat (fileno (fp), &buf);
    fprintf (stderr, "%s: %.24s\n", file, ctime (&buf.st_mtime));
    sqvars = (struct qvars **) malloc (nqvars * sizeof *sqvars);
    if (!sqvars) raerror ("can't malloc sqvars", "");
    for (i = 0; i < nqvars; i++) sqvars[i] = &qvars[i];
    /* sort sqvars for qlookup() */
    qsort (sqvars, nqvars, sizeof *sqvars, qvarcmp);
    /* read error track once to get max line and number of states */
    if (fseek (fp, 0, 0) < 0) raerror ("can't rewind error track", "");
    maxline = nqstate = i = 0;
    while ((j = getc (fp)) != EOF) {
            if (!i++ && j >= '0' && j <= '9') nqstate++;
            if (j == '\n') {
                    if (i > maxline) maxline = i;
                    i = 0;
            }
    }
    if (!maxline || !nqstate) raerror ("nothing on error track", "");
    warning ("read %s: %d states %d variables", file, nqstate, nqvars - 1);
    /* allocate memory for error track state table */
```

```
Nov 28 15:44 1994 patent.ra Page in = (char*) malloc (++maxline * sizeof *in);
        qstate = (struct qstate *) malloc (nqstate * sizeof *qstate);
        if (!in || !qstate) raerror ("can't malloc qstate", "");
        qstate[0].st = (int*) malloc ((nqstate + 1) * nqvars * sizeof *qstate[0].st);
        if (!qstate[0].st) raerror ("can't malloc qstate[0].st", "");
        for (i = 0; i < nqstate; i++) {
                qstate[i].st = qstate[0].st + i * nqvars;
                qstate[i].badcyc = 0;
                qstate[i].next = 0;
                qstate[i].used = 0;
        }
        curstate = qstate[0].st + nqstate * nqvars;
        used = (char*) malloc (nqvars * sizeof *used);
        if (!used) raerror ("can't malloc curstate/used array", "");
        for ( i = 0; i < nqvars; i++) curstate[i] = used[i] = 0;
        /* reread error track and set up states in qstate[] */
        if (fseek (fp, 0, 0) < 0) raerror ("can't rewind error track", "");
        iqstate = 0;
        while (fgets (in, maxline, fp)) {
                if (strcmp (in, "Post Mortem Track: C\n") == 0) {
                        if (iqstate >= nqstate) raerror ("bad cycle with no following state", "");
                        badcyc = &qstate[iqstate];
                        continue;
                }
                if (in[0] < '0' || in[0] > '9') continue;
                if (iqstate >= nqstate) raerror ("excess states botch!", "");
                qstate[iqstate].estate = atoi (in);
                if (p = strchr (in, '\n')) *p = 0;
                p = strchr (in, '\t');
                while (p) {
                        q = strchr (++p, '=');
                        if (!q) raerror ("no = in error track field ", p);
                        *q = 0;
                        i = qlookup (p);
                        used [i] = 1;
                        p = strchr (++q, '\t');
                        if (p) *p = 0;
                        if (qvars[i].type == 0) curstate[i] = atoi (q);
                        else curstate[i] = qvlookup (q);
                }
                for (i = 0; i < nqvars; i++) qstate[iqstate].st[i] = curstate[i];
                qstate[iqstate].badcyc = badcyc;
                iqstate++;
        }
        if (iqstate != nqstate) raerror ("error track reread botch", "");
        /* copy .badcyc field up if spans repeated state */
        if (badcyc) for (i = nqstate - 1; i > 0; i--)
                if (qstate[i].estate == qstate[i-1].estate)
                        qstate[i-1].badcyc = qstate[i].badcyc;
        /* compress out repeated states */
        for (i = j = 1; j < nqstate; j++)
                if (qstate[j].estate != qstate[j-1].estate)
                        qstate[i++] = qstate[j];
                else warning ("input state '%d' repeated, fixed", qstate[j].estate);
        nqstate = i;
        qstart = &qstate[0];
        if (badcyc)
                for (i = 0; i < nqstate; i++)
                        if (qstate[i].badcyc) {
                                badcyc = qstate + i;
                                break;
                        }
        for (i = 0; i < nqstate - 1; i++) qstate[i].next = &qstate[i+1];
        if (qstate[i].badcyc) qstate[i].next = badcyc;
        qbadcyc = badcyc != 0;
        for (z = 0; z < nqvars; z++) if (!used[z] && strncmp (qvars[z].name, ".Zeeman" ,7) == 0) break;
        if (z == nqvars) raerror ("Zeeman variable botch", "");
        used[z]++;
        for (i = j = 0; i < nqvars; i++) {
                if (used[i]) continue;
                if (!j++) fprintf (stderr, "error in %s, the following variables are expected but not seen:\n",
rafile_Ti);
                fprintf (stderr, "\t%s\n", qvars[i].name);
        }
        if (j) error ("%d of %d variables not seen in %s\n", j, nqvars, rafile_Ti);
        fclose (fp);
        /* fill in Zeeman variable to split repeated states (scc bad root) */
        for (i = 0; i < nqstate; i++) {
```

```
Nov 28 15:44 1994  patent.ra Page qstate[i].st[z] = i;
        }
}
=====
-#followT run, analyze.c
after crank() returns a resolution, check for plus edge of bad cycle
completion
-----
                if (qstateout) {
                        qstateout->used = 1;
                        if (qbadcyc) { /* && OPTq && qstateout, implied */
                                /* -q; if plus edge and spans error track bad cycle
                                        then update Vars_r status for active recurs */
                                if (plus) {
                                        if (qstate[qstatei].badcyc && qstateout->badcyc)
                                                for (i = 0; i < nqrecur; i++)
                                                        qrecur[i].used |= qrecur[i].val;
                                }
                                /* see if we closed bad cycle */
                                if (rst->status.qcycle && rst1->status.permanent && rst1->status.qcycle && !qloo
ped) {
                                        RST *v;
                                        for (v = rst->parent; v; v = v->parent)
                                                if (v == rst1) break;
                                        if (v) qlooped = 1;
                                }
                        }
                }
....
if no resolutions (would be lockup), save the Vars entries if any.
(qtrans[i].val will have been set in crank(), as well as qtrunc)
                if (lockup) {
                        if (OPTq && qstatei >= nqstate) {
                                lockup = 0;
                                rst->status.dead = 1;
                                continue;
                        }
                        if (OPTq && qtrunc) {
                                int i; /* save Vars entries */
                                lockup = 0;
                                rst->status.dead = 1;
                                for (i = 0; i < nqtrans; i++)
                                        qtrans[i].used |= qtrans[i].val;
                                continue;
                        }
                        warning ("Lockup at %u(%u).", rst->index, dfnumber);
                        if (verbose.error)
                                liststate (nodiff, rst, stderr);
                        goto fail;
                }
....
if any cyset matches a M_o bad cycle state, checkscc() sets set_cy_used.

int set_cy_used; /* -q, set by checkscc() if any state projects into input bad cycle */
...
        set_cy_used = 0;
...
                if (rst->status.qcycle) set_cy_used = 1;
...
then if set_cy_used is found set, the cyset is marked used in bad cycle.
                        /* mark cysets succeeding for -q */
                        if (set_cy_used) for (i = 0; i < cy_num; i++)
                                if (cyset[i].match) cyset[i].used = set_cy_used;
....
produce summary of crank run
        if (OPTq) {
                int i, lastreached;
                static char *tf[2] = {"false", "true"};
                for (i = 0; i < nqstate; i++) if (!qstate[i].used) break;
                if (i == nqstate) qallreached = 1;
                lastreached = i;
                for (i = 0; i < cy_num; i++) if (cyset[i].used) qcyused = 1;
                for (i = 0; i < nqrecur; i++) if (qrecur[i].used) qcyused = 1;
                if (1||verbose.advice) {
                        fprintf (stderr, "Summary of -#followT run::\n");
                        fprintf (stderr, "\tevery input error track state reached = %s\n", tf[qallreached]);
```

Nov 28 15:44 1994 patent.ra Page

```
                        if (!qallreached) {
                                fprintf (stderr, "\t\tcan't reach %d ('%d' in input)\n",
                                        lastreached, qstate[lastreached].estate);
                        }
                        if (!(qallreached && qbadcyc && !qlooped)) {
                                for (i = 0; i < nqtrans; i++) if (qtrans[i].used) break;
                                blocktrans = (i < nqtrans);
                                if (i < nqtrans) fprintf (stderr, "\t\tcumulative blocking trans's:\n");
                                for (i = 0; i < nqtrans; i++)
                                        if (qtrans[i].used) fprintf (stderr, "\t\t\t%s\n", qtrans[i].stvar);
                        }
                        fprintf (stderr, "\tcycled back to input error track bad cycle state = %s\n", tf[qlooped
]);
                        if (qallreached && qbadcyc && !qlooped) {
                                fprintf (stderr, "\t\tcumulative blocking trans's:\n");
                                for (i = 0; i < nqtrans; i++)
                                        if (qtrans[i].used) fprintf (stderr, "\t\t\t%s\n", qtrans[i].stvar);
                        }
                        fprintf (stderr, "\trecur or cyset used on input error track bad cycle state = %s\n", tf
[qcyused]);
                        for (i = 0; i < cy_num; i++) if (cyset[i].used) fprintf (stderr, "\t\tcyset %d %s\n", i,
 cyset[i].name);
                        for (i = 0; i < nqrecur; i++) if (qrecur[i].used) fprintf (stderr, "\t\trecur %d %s\n",
i, qrecur[i].name);
                }
        }
```

What is desired to be secured by Letters Patent is the invention as defined in the following claims:

1. A process of testing whether a system, defined by a specification S, accomplishes a task, defined by behavior T, comprising:
   a) defining a large model M_p and a small model M_o;
   b) testing for language containment of the following type: $L(M\_o) < L(T)$, and, if said containment is found to fail, further performing the steps of
   c) defining an error track E; and
   d) testing for language containment of the following type: $L(E) < L(M\_p)$.

2. In an apparatus for verifying whether a system, defined by a specification S, accomplishes a task, defined by behavior T, the improvement comprising:
   a) means for generating a candidate homomorphic reduction; and
   b) means for verifying said candidate.

3. A method of checking whether accomplishment of a task by an abstract model implies that a more complex model will also accomplish the task, comprising the following steps:
   a) generating the abstract model; and
   b) checking automata language containment, by a process which includes representing the more abstract model in terms of a transformation which represents it as a conjunction of elements from a different class of automata.

* * * * *